(12) United States Patent
Stark

(10) Patent No.: US 7,832,177 B2
(45) Date of Patent: Nov. 16, 2010

(54) INSULATED GLAZING UNITS

(75) Inventor: David H Stark, Evergreen, CO (US)

(73) Assignee: Electronics Packaging Solutions, Inc., Evergreen, CO (US)

( * ) Notice: Subject to any disclaimer, the term of this patent is extended or adjusted under 35 U.S.C. 154(b) by 690 days.

(21) Appl. No.: 11/381,733

(22) Filed: May 4, 2006

(65) Prior Publication Data

US 2006/0187608 A1 Aug. 24, 2006

Related U.S. Application Data

(63) Continuation-in-part of application No. 10/766,493, filed on Jan. 27, 2004, now abandoned, which is a continuation-in-part of application No. 10/713,475, filed on Nov. 14, 2003, now Pat. No. 6,962,834, which is a continuation-in-part of application No. 10/133,049, filed on Apr. 26, 2002, now Pat. No. 6,723,379, which is a continuation-in-part of application No. 10/104,315, filed on Mar. 22, 2002, now Pat. No. 6,627,814, application No. 11/381,733.

(60) Provisional application No. 60/707,367, filed on Aug. 11, 2005, provisional application No. 60/678,570, filed on May 6, 2005.

(51) Int. Cl.
*E04C 2/54* (2006.01)
*E04C 2/34* (2006.01)
*E06B 3/00* (2006.01)

(52) U.S. Cl. ............... 52/788.1; 52/786.11; 52/786.13; 428/34

(58) Field of Classification Search ............... 52/204.5, 52/204.591, 786.1, 786.11, 786.13, 795.1, 52/204.593, 660, 202, 203, 788.1; 428/34

See application file for complete search history.

(56) References Cited

U.S. PATENT DOCUMENTS

| 49,167 | A | 8/1865 | Stetson |
| 988,308 | A | 4/1911 | Campbell |
| 1,004,257 | A | 9/1911 | Higbee |
| 1,127,381 | A | 2/1915 | Byrnes |
| 1,388,126 | A | 8/1921 | Rohland |

(Continued)

OTHER PUBLICATIONS

"Diffusion Bonding-Ceramics and ceramic/metal joints"—TWI Knowledge Summary. 2000. http://www.twi.co.uk/content/ksjaf005.html.*

(Continued)

*Primary Examiner*—Richard E Chilcot, Jr.
*Assistant Examiner*—Ryan D Kwiecinski
(74) *Attorney, Agent, or Firm*—Howison & Arnott, L.L.P.

(57) ABSTRACT

A hermetically sealed multi-pane window assembly comprises first and second windowpane sheets formed of transparent materials. A first sealing member has an inner edge and an outer edge, the inner edge being hermetically attached around the periphery of the first windowpane sheet by diffusion bonding. A second sealing member has an inner edge and an outer edge, the inner edge being hermetically attached around the periphery of the second windowpane sheet by diffusion bonding and the outer edge being hermetically attached to the outer edge of the first sealing member. A spacer assembly is disposed between the first and the second windowpane sheets for maintaining a gap therebetween, whereby a hermetically sealed cavity is defined between the first and the second windowpanes.

35 Claims, 66 Drawing Sheets

U.S. PATENT DOCUMENTS

| | | | |
|---|---|---|---|
| 1,436,197 A | 11/1922 | Rohland | |
| 1,560,690 A | 11/1925 | Housekeeper | |
| 2,011,557 A | 8/1935 | Anderegg | |
| 2,057,969 A | 8/1935 | Payson et al. | |
| 2,119,009 A | 5/1938 | Elias | |
| 2,177,001 A | 10/1939 | Owen | |
| 2,206,558 A | 7/1940 | Bennet | |
| 2,220,690 A * | 11/1940 | Stupakoff | 420/34 |
| 2,625,717 A * | 1/1953 | Wampler et al. | 428/34 |
| 2,708,774 A * | 5/1955 | Seelen | 428/34 |
| 2,730,987 A | 1/1956 | Nelson | |
| 2,756,467 A | 7/1956 | Etling | |
| 3,232,732 A | 2/1966 | Wax | |
| 3,389,522 A * | 6/1968 | Hordis | 52/204.599 |
| 3,698,878 A | 10/1972 | Hale et al. | |
| 3,778,127 A | 12/1973 | Langston | |
| 3,778,244 A | 12/1973 | Nedelec | |
| 3,808,115 A | 4/1974 | Manion | |
| 3,828,960 A | 8/1974 | Walles | |
| 3,865,567 A | 2/1975 | Klomp | |
| 3,901,997 A | 8/1975 | Groth | |
| 3,902,883 A * | 9/1975 | Bayer | 65/43 |
| 3,922,705 A | 11/1975 | Yerman | |
| 3,940,898 A | 3/1976 | Kaufman | |
| 3,971,178 A | 7/1976 | Mazzoni | |
| 3,979,668 A | 9/1976 | Samulowitz | |
| 3,990,201 A | 11/1976 | Falbel | |
| 4,016,644 A | 4/1977 | Kurtz | |
| 4,035,539 A | 7/1977 | Luboshez | |
| 4,047,351 A | 9/1977 | Derner | |
| 4,060,660 A | 11/1977 | Carlson | |
| 4,063,271 A | 12/1977 | Bean et al. | |
| 4,065,539 A | 12/1977 | Nadel | |
| 4,089,143 A | 5/1978 | LaPietra | |
| 4,099,082 A * | 7/1978 | Chodil et al. | 313/358 |
| 4,132,218 A | 1/1979 | Bennett | |
| 4,186,725 A | 2/1980 | Schwartz | |
| 4,261,086 A | 4/1981 | Giachino et al. | |
| 4,274,936 A | 6/1981 | Love | |
| 4,303,732 A | 12/1981 | Torobin | |
| 4,355,323 A | 10/1982 | Kock | |
| 4,357,187 A | 11/1982 | Stanley | |
| 4,427,123 A | 1/1984 | Komeda et al. | |
| 4,444,821 A | 4/1984 | Young | |
| 4,468,423 A | 8/1984 | Hall | |
| 4,486,482 A | 12/1984 | Kobayashi | |
| 4,531,511 A | 7/1985 | Hochberg | |
| 4,547,432 A | 10/1985 | Pitts | |
| 4,649,085 A | 3/1987 | Landram | |
| 4,683,154 A | 7/1987 | Benson | |
| 4,687,687 A | 8/1987 | Terneu | |
| 4,736,529 A | 4/1988 | Kramer | |
| 4,737,475 A | 4/1988 | Thomas | |
| 4,780,164 A | 10/1988 | Ruckheim | |
| 4,928,448 A | 5/1990 | Phillip | |
| 5,005,557 A | 4/1991 | Bachli | |
| 5,009,218 A | 4/1991 | Bachli | |
| 5,014,466 A * | 5/1991 | Winner | 49/504 |
| 5,017,252 A | 5/1991 | Aldrich | |
| 5,032,439 A | 7/1991 | Glicksman | |
| 5,085,926 A | 2/1992 | Iida | |
| 5,086,729 A | 2/1992 | Katigiri | |
| 5,107,649 A | 4/1992 | Benson | |
| 5,115,299 A | 5/1992 | Wright | |
| 5,115,612 A | 5/1992 | Newton | |
| 5,118,924 A | 6/1992 | Mehra et al. | |
| 5,124,185 A * | 6/1992 | Kerr et al. | 428/34 |
| 5,157,893 A | 10/1992 | Benson et al. | |
| 5,175,975 A | 1/1993 | Benson et al. | |
| 5,227,206 A | 7/1993 | Bachli | |
| 5,270,084 A | 12/1993 | Parker | |
| 5,302,414 A | 4/1994 | Alkhimov et al. | |
| 5,330,816 A | 7/1994 | Rusek | |
| 5,378,527 A | 1/1995 | Nakanishi | |
| 5,423,119 A | 6/1995 | Yang | |
| 5,433,056 A | 7/1995 | Benson | |
| 5,489,321 A | 2/1996 | Benson et al. | |
| 5,508,092 A | 4/1996 | Kimock | |
| 5,525,430 A | 6/1996 | Chahroudi | |
| 5,582,866 A | 12/1996 | White | |
| 5,589,239 A * | 12/1996 | Tomono et al. | 428/34 |
| 5,610,431 A | 3/1997 | Martin | |
| 5,625,222 A | 4/1997 | Yoneda et al. | |
| 5,643,644 A | 7/1997 | Demars | |
| 5,657,607 A | 8/1997 | Collins et al. | |
| 5,719,979 A | 2/1998 | Furuyama | |
| 5,778,629 A | 7/1998 | Howes | |
| 5,789,857 A | 8/1998 | Ymaura | |
| 5,811,926 A * | 9/1998 | Novich | 313/495 |
| 5,846,638 A | 12/1998 | Meissner | |
| 5,855,638 A | 1/1999 | Demars | |
| 5,856,914 A | 1/1999 | O'Boyle | |
| 5,891,536 A | 4/1999 | Collins | |
| 5,897,927 A | 4/1999 | Tsai | |
| 5,902,652 A | 5/1999 | Collins et al. | |
| 5,920,463 A | 7/1999 | Thomas et al. | |
| 5,937,611 A | 8/1999 | Howes | |
| 5,945,721 A | 8/1999 | Tatoh | |
| 5,949,655 A | 9/1999 | Glenn | |
| 5,950,398 A | 9/1999 | Hubbard | |
| 5,982,010 A | 11/1999 | Namba et al. | |
| 5,983,593 A * | 11/1999 | Carbary et al. | 52/786.11 |
| 6,007,397 A | 12/1999 | Ju | |
| 6,020,628 A | 2/2000 | Mravic et al. | |
| 6,052,965 A | 4/2000 | Florentin | |
| 6,054,195 A | 4/2000 | Collins | |
| 6,071,575 A | 6/2000 | Collins | |
| 6,083,578 A | 7/2000 | Collins | |
| 6,101,783 A | 8/2000 | Howes | |
| 6,114,804 A | 9/2000 | Kawase | |
| 6,131,410 A | 10/2000 | Swierkowski | |
| 6,139,913 A | 10/2000 | Van Steenkiste et al. | |
| 6,141,925 A | 11/2000 | Halvorson, Jr. et al. | |
| 6,168,040 B1 | 1/2001 | Sautner et al. | |
| 6,191,359 B1 | 2/2001 | Sengupta et al. | |
| 6,291,036 B1 | 9/2001 | Wang | |
| 6,352,749 B1 | 3/2002 | Aggas | |
| 6,365,242 B1 | 4/2002 | Veerasamy | |
| 6,372,312 B1 | 4/2002 | Aggas | |
| 6,383,580 B1 | 5/2002 | Aggas | |
| 6,387,460 B1 | 5/2002 | Shukuri | |
| 6,399,169 B1 | 6/2002 | Wang | |
| 6,416,375 B1 | 7/2002 | Cho | |
| 6,420,002 B1 | 7/2002 | Aggas et al. | |
| 6,436,492 B1 | 8/2002 | Landa et al. | |
| 6,444,281 B1 | 9/2002 | Wang | |
| 6,468,610 B1 | 10/2002 | Morimoto | |
| 6,478,911 B1 | 11/2002 | Wang | |
| 6,479,112 B1 | 11/2002 | Shukuri | |
| 6,497,931 B1 | 12/2002 | Aggas | |
| 6,503,583 B2 | 1/2003 | Nalepka et al. | |
| 6,506,272 B1 | 1/2003 | Aggas | |
| 6,521,988 B2 | 2/2003 | Hauser et al. | |
| 6,537,121 B1 | 3/2003 | Baret | |
| 6,538,312 B1 | 3/2003 | Peterson et al. | |
| 6,541,083 B1 | 4/2003 | Landa et al. | |
| 6,541,084 B2 | 4/2003 | Wang | |
| 6,548,895 B1 | 4/2003 | Benavides et al. | |
| 6,558,494 B1 | 5/2003 | Wang | |
| 6,571,580 B1 | 6/2003 | Lodge | |
| 6,627,814 B1 | 9/2003 | Stark | |
| 6,635,321 B2 | 10/2003 | Wang et al. | |
| 6,637,644 B2 | 10/2003 | Bachli et al. | |
| 6,639,313 B1 | 10/2003 | Martin et al. | |

| | | |
|---|---|---|
| 6,641,689 B1 | 11/2003 | Aggas |
| 6,653,724 B1 | 11/2003 | Kim et al. |
| 6,656,768 B2 | 12/2003 | Thomas |
| 6,668,500 B1 | 12/2003 | Lamberts |
| 6,692,600 B2 | 2/2004 | Veerasamy |
| 6,696,849 B2 | 2/2004 | Ban et al. |
| 6,701,749 B2 | 3/2004 | Wang et al. |
| 6,723,379 B2 | 4/2004 | Stark |
| 6,736,295 B2 | 5/2004 | Lin et al. |
| 6,736,638 B1 | 5/2004 | Lin et al. |
| 6,759,590 B2 | 7/2004 | Stark |
| 6,763,638 B1 | 7/2004 | Berger, Jr. |
| 6,789,362 B1 | 9/2004 | Hessabi |
| 6,793,990 B1 | 9/2004 | Sakaguchi |
| 6,860,075 B2 | 3/2005 | Bachli et al. |
| 6,897,125 B2 | 5/2005 | Morrow et al. |
| 6,924,974 B2 | 8/2005 | Stark |
| 6,928,776 B2 | 8/2005 | Hornung |
| 6,946,171 B1 * | 9/2005 | Aggas .................. 428/34 |
| 6,966,208 B1 | 11/2005 | Collins |
| 6,974,518 B2 | 12/2005 | Hornung |
| 7,045,181 B2 | 5/2006 | Yoshizawa |
| 7,081,178 B2 | 7/2006 | Collins |
| 7,100,343 B2 | 9/2006 | France |
| 7,114,306 B2 | 10/2006 | Minaai |
| 7,141,130 B2 | 11/2006 | Minaai |
| 7,238,546 B2 | 7/2007 | Stark |
| 2001/0020738 A1 | 9/2001 | Iizima et al. |
| 2002/0043046 A1 * | 4/2002 | Cooper et al. .............. 52/786.1 |
| 2002/0113296 A1 | 8/2002 | Cho et al. |
| 2004/0104460 A1 | 6/2004 | Stark |
| 2004/0161530 A1 | 8/2004 | Stark |
| 2004/0187437 A1 | 9/2004 | Stark |
| 2004/0188124 A1 | 9/2004 | Stark |
| 2005/0067179 A1 | 3/2005 | Stark |
| 2005/0217319 A1 | 10/2005 | Yoshizawa |
| 2006/0187608 A1 | 8/2006 | Stark |
| 2006/0191215 A1 | 8/2006 | Stark |
| 2006/0207218 A1 | 9/2006 | Minaai et al. |

OTHER PUBLICATIONS

"diffusion Bonding", Sue Dunkerton, TWI Knowledge Summary. 2001. http://www.twi.co.uk/content/kssbd03.html.*

"Diffusion Bonding", TWI Knowledge Summary.2001. http://www.twi.co.uk/content/kssbd003.html.*

"Diffusion Bonding—Ceramics and ceramic/metal joints", TWI Knowledge Summary. 2000. http://www.twi.co.uk/content/ksjaf005.html.*

Kazakov. Diffusion Bonding of Materials. 1985 (English Translation. pp. 250-257.*

Arata et al. Pressure and Field Assisted Bonding of Glass to Aluminum; Transactions of JWRI is published by Welding Research Institute of Osaka University; vol. 13; No. 1; 1984; pp. 35-40.

Carpenter Specialty Alloys: Controlled-Expansion Alloys (Catalog/Brochure); Dec. 1999; pp. 1-24 (esp. 5-8); Carpenter Technology Corporation (Publ.); Wyomissing, PA USA.

Cerjak, H. (ed.); Mathematical Modelling of Weld Phenomena 5; Diffusion Bonding of Glass to Metal in an Electrostatic Field; M. Morsy et al.; pp. 945-959; London IOM Communications, 2001.

Doron Teomim, Avner Badihi, Gil Zilber; "An innovative approach to wafer-level MEMS packaging"; Solid State Technology (Magazine); Jan. 2002; Penwell (Publ.); Nashua, NH USA.

Dunkerton; TWI Knowledge Summary Diffusion Bonding; Copyright 2001; TWI World Centre for Materials Joinging Technology Website; www.twi.co.uk; United Kingdom; 4 pgs.

George S. Brady, et al., Materials Handbook, 12th Edition; 1986; pp. 28-29; McGraw-Hill Book Company; New York.

JPL Technology Reporting Office; "Hermetic Wafer Bonding by Use of Microwave Heating"; NASA Tech Brief, vol. 25, No. 5, from JPL New Technology Report NPO-20608 (NASA Contract No. NAS-7-918); May 1, 2001; Jet Propulsion Laboratory, California Institute of Technology (Publ.); Pasedena, CA, USA; including therein: NTR Inventors Report by Henry W Jackson, John D Mai, Martin B Barmatz, Nasser K Budraa, William T Pike; NASA Case No. 0205 20608; Mar. 1997(?); including therein: (same authors) "Low Pressure and Low Temperature Hermetic Wafer Bonding Using Microwave Heating"; Jet Propulsion Laboratory, California Institute of Technology; Pasadena, CA, USA.

Kazakov et al.; Equipment for Diffusion Welding of Rectangular Glass Plates to Kovar; Svarochnoe Proizvodstvo; Jun. 1977; p. 50; (in Russian, English translation provided).

Kazakov, N. F. (ed.); Diffusion Bonding of Materials; 1981; pp. 4-9, 248-257; Pergamon Press; U.S.A.

Nicholas, M.G. & Lee, R. J.; Joining Dissimilar Materials, Metals and Materials, The Journal of the Institute of Metals, vol. 5, No. 6, Jun. 1989; UK.

NTR Inventors Report by Henry W Jackson, John D Mai, Martin B Barmatz, Nasser K Budraa, William T Pike; NASA Case No. 0205 20608; Mar. 1997(?); Including therein: "Low Pressure and Low Temperature Hermetic Wafer Bonding Using Microwave Heating"; Jet Propulsion Laboratory, California Institute of Technology; Pasadena, CA, USA (Best Available Copy).

Ostyn, K. & Vinckier, A.; Joining of Different Materials Through Interfaces; Interfaces in Materials, Proceedings of the Colloquium; pp. 153-173; Brussels, Dec. 1988.

PCT: International Search Report of PCT/US03/07553 (related application); International Publication No. WO 03/083938 A1; Jun. 16, 2003; 2 pgs.

PCT: International Search Report of PCT/US04/02272 (related application); International Publication No. WO 2004/068189; Jan. 27, 2004; 1 pg.

R.C. Dykhuizen et al.; Gas Dynamic Principles of Cold Spray; Journal of Thermal Spray Technology; vol. 7(2); pp. 205-212; Jun. 1998.

Sadovsky et al.; Precision Welding of Glass to Kovar Without Melting; Svarochnoe Proizvodstvo; Feb. 1973; pp. 22; (in Russian, English translation provided).

PCT: Written Opinion of the International Searching Authority of PCT/US04/02272 (related application); International Publication No. WO 2004/068189; Mar. 16, 2005; 3 pgs.

PCT: International Search Report of PCT/US05/13237 (related application); International Publication No. WO 2005/118291 A3; Oct. 24, 2006; 1 pg.

PCT: Written Opinion of the International Searching Authority of PCT/US05/13237 (related application); International Publication No. WO 2005/118291; Oct. 24, 2006; 5 pgs.

PCT: International Search Report of PCT/US06/17595; International Publication No. WO 2006/121954; Aug. 20, 2008; 3 pgs.

PCT: Written Opinion of the International Searching Authority of PCT/US06/17595; International Publication No. WO 2006/121954; Aug. 20, 2008; 10 pgs.

* cited by examiner

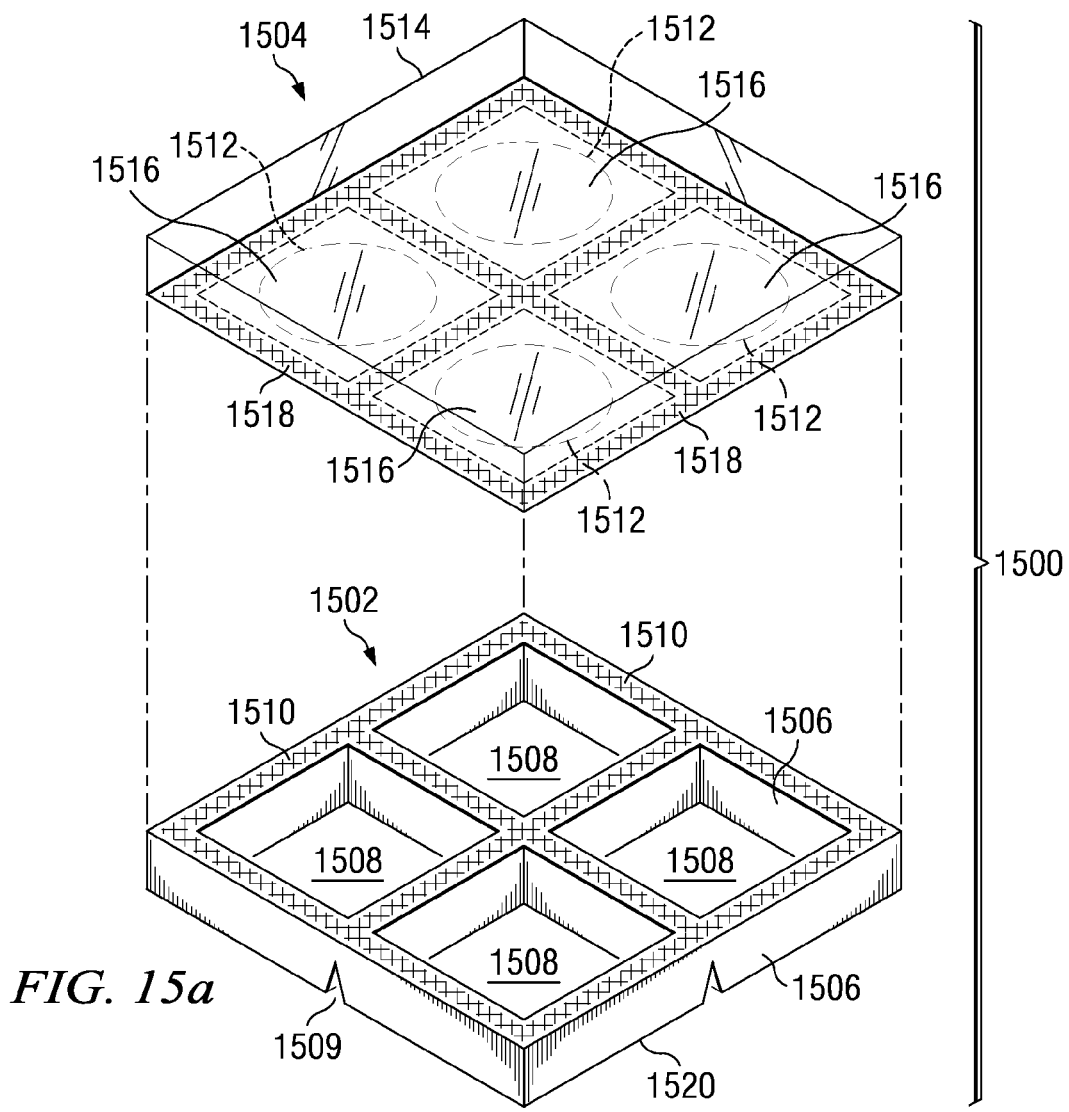
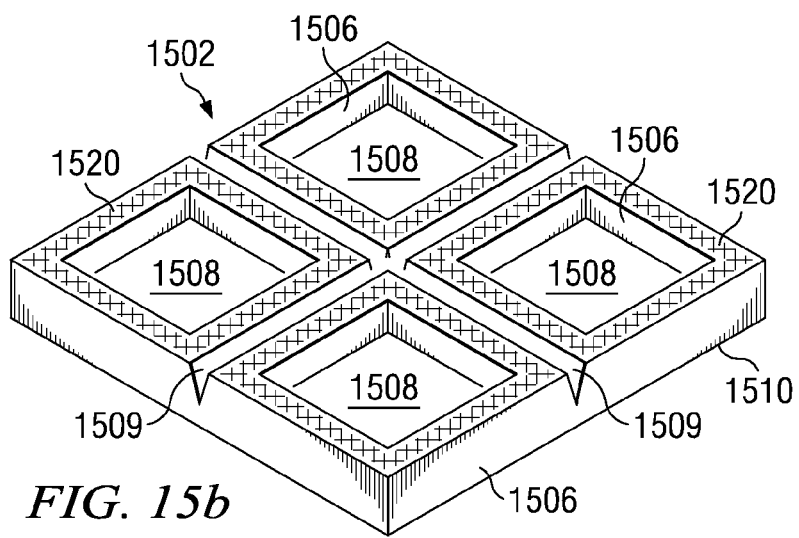
FIG. 15a
FIG. 15b

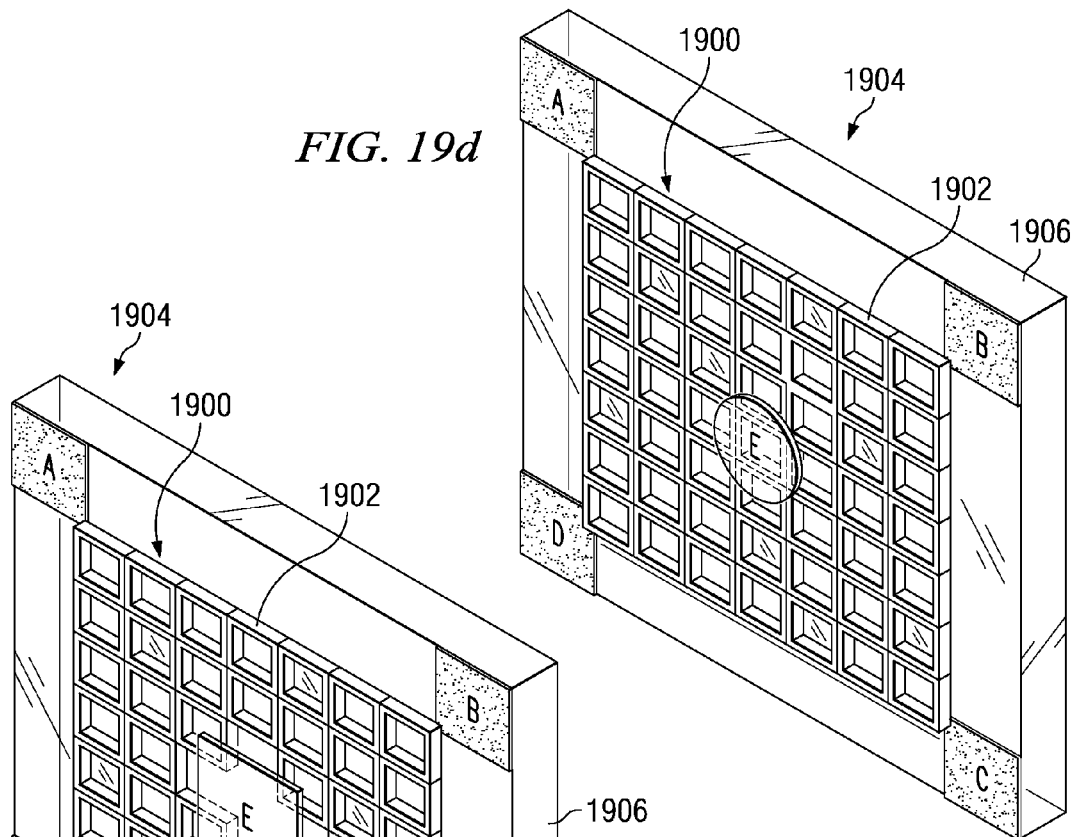
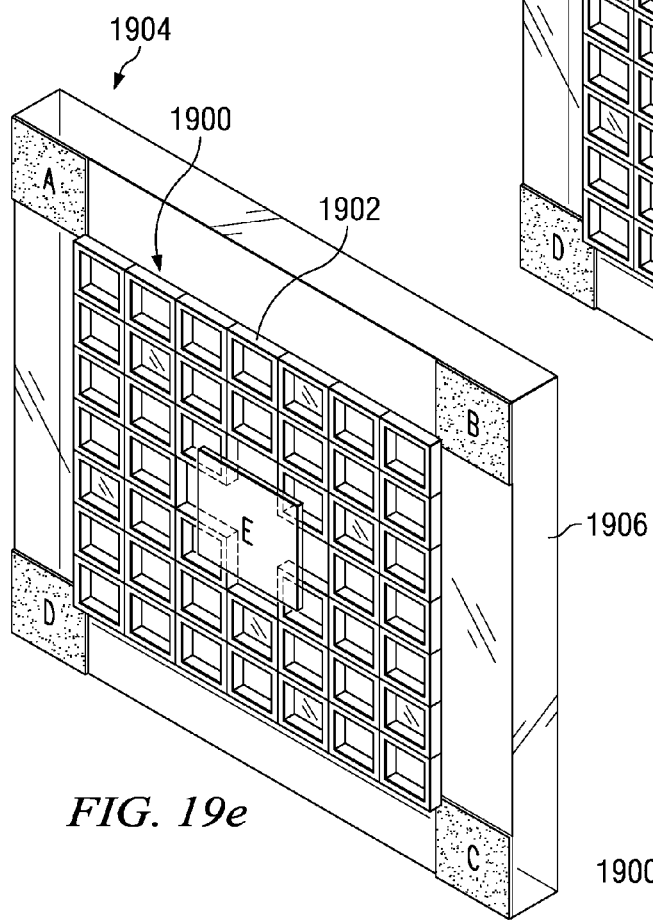
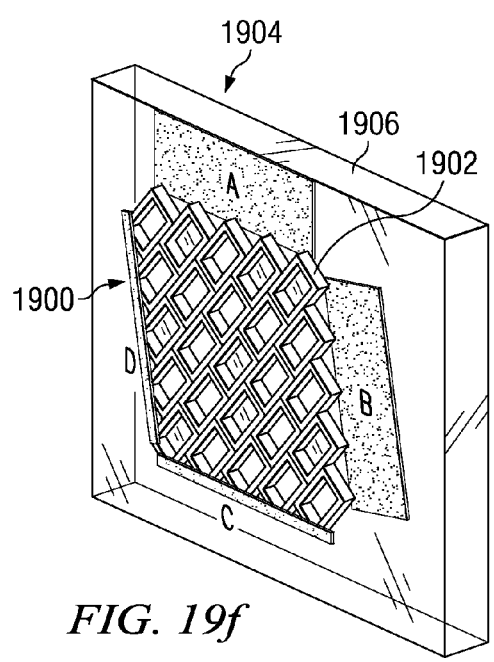
FIG. 19d
FIG. 19e
FIG. 19f

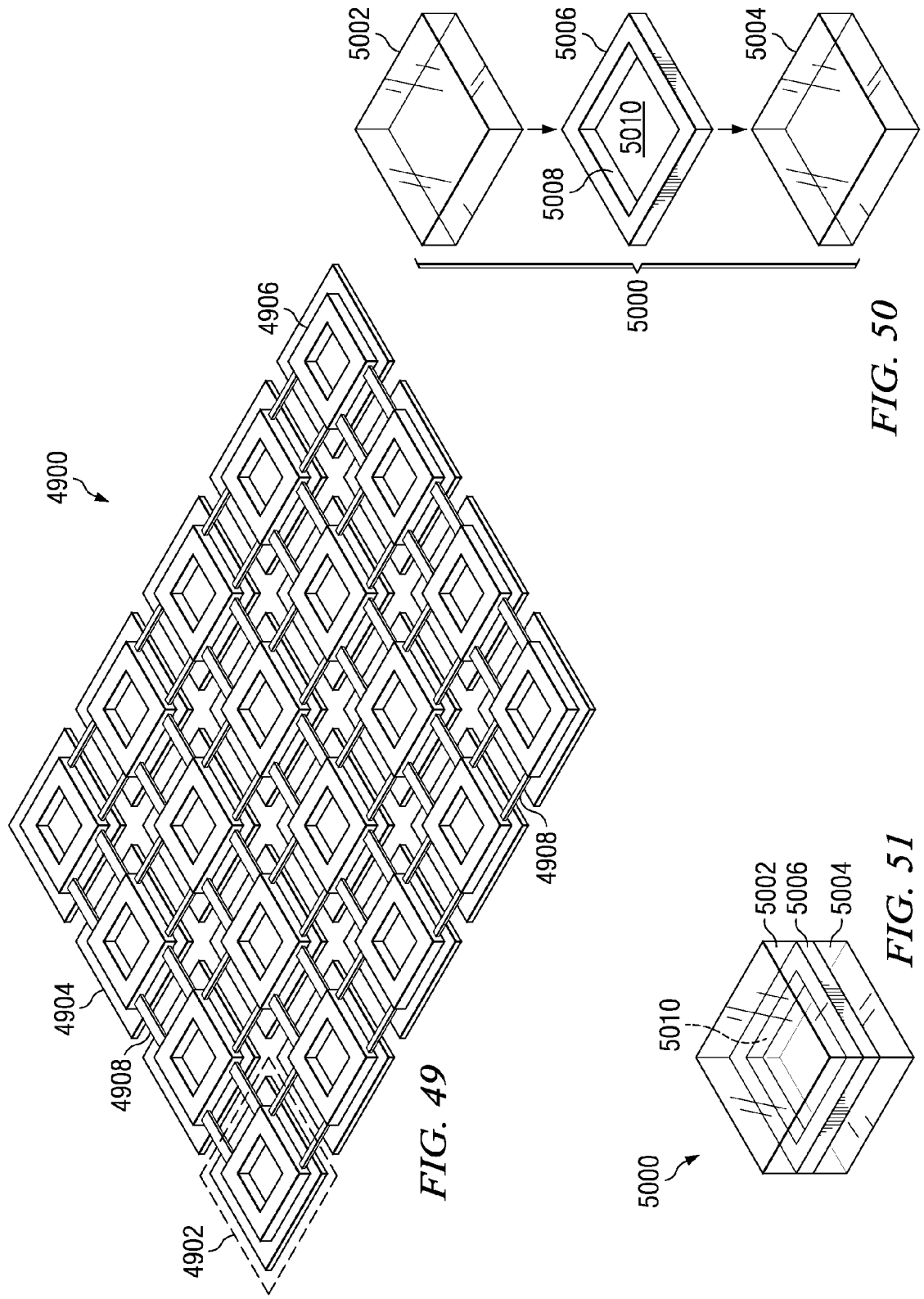

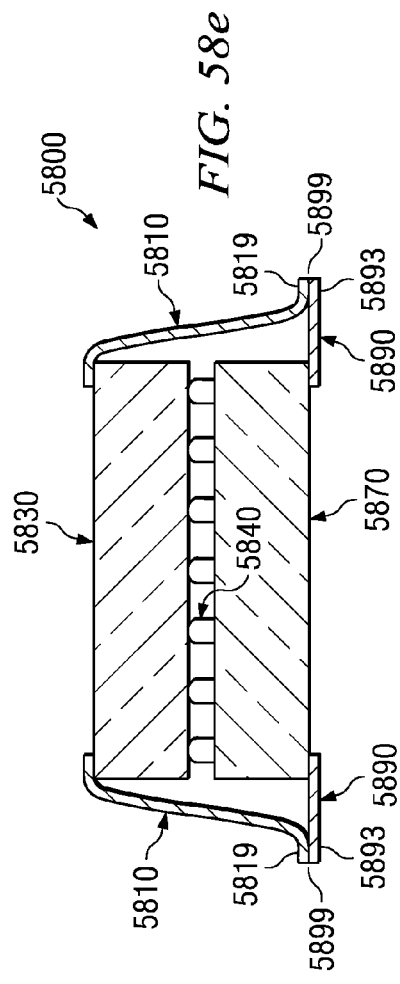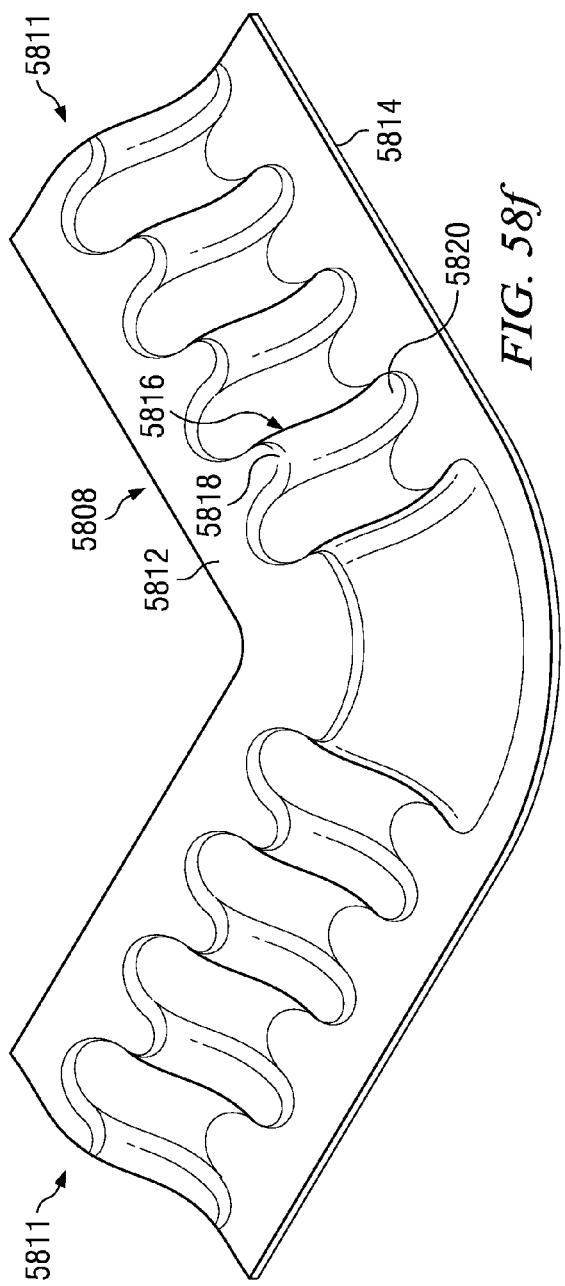

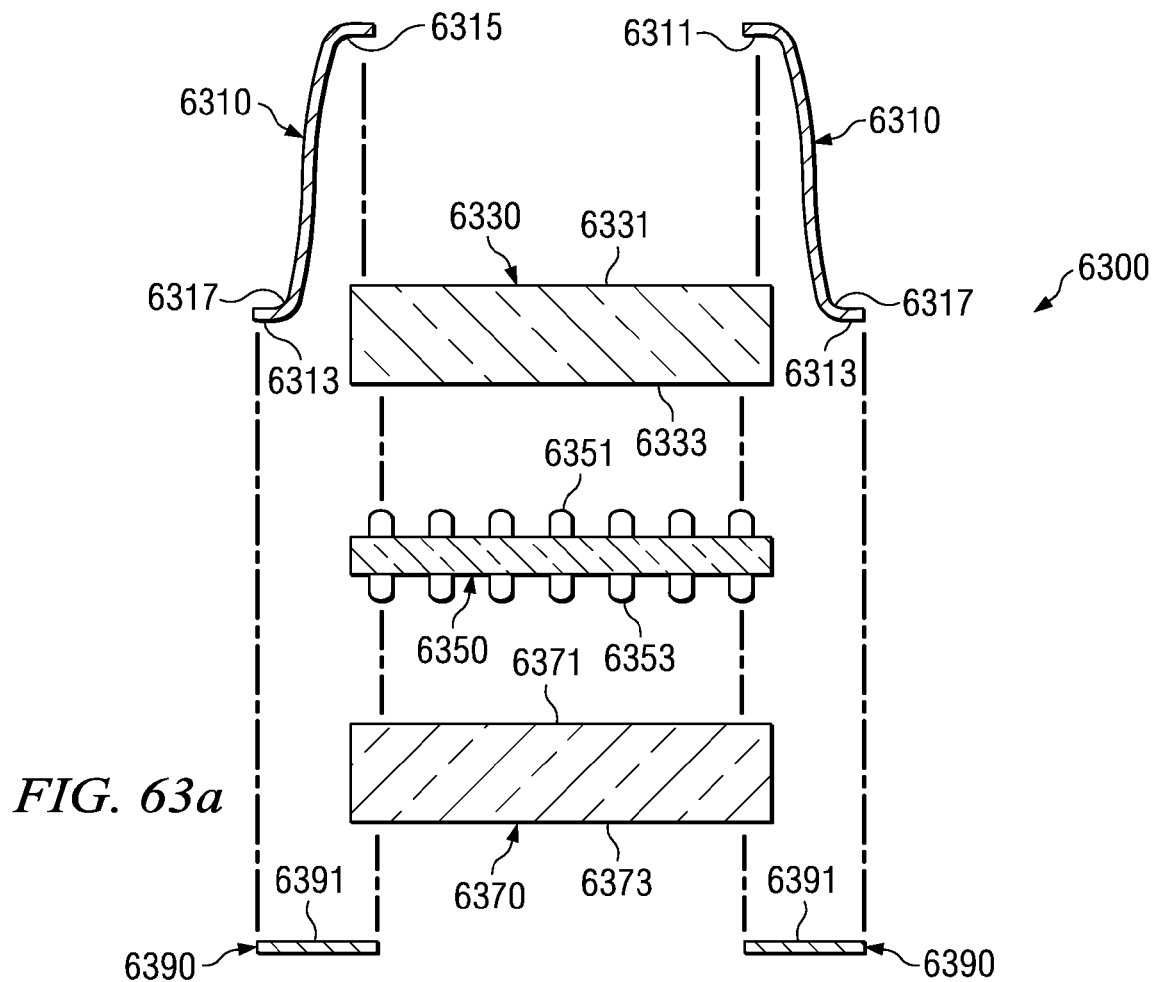
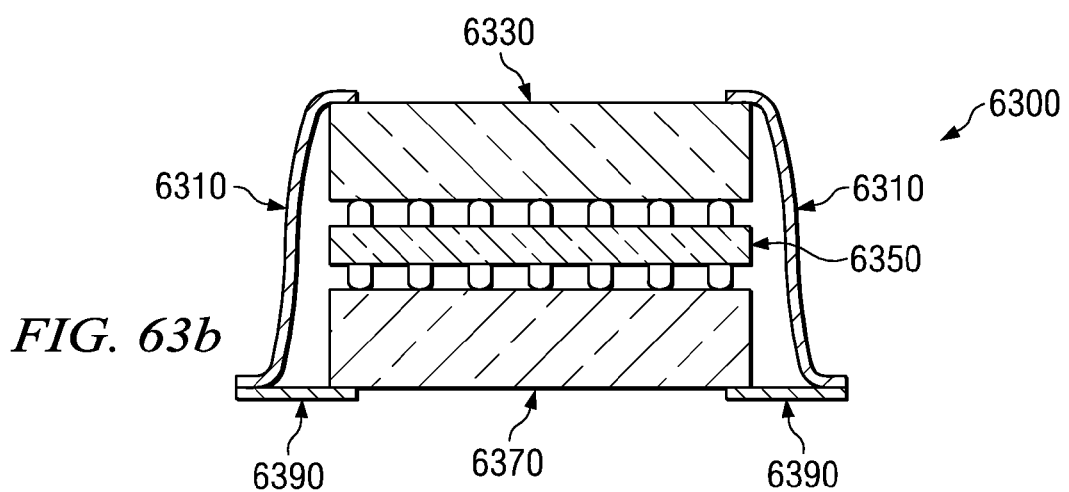

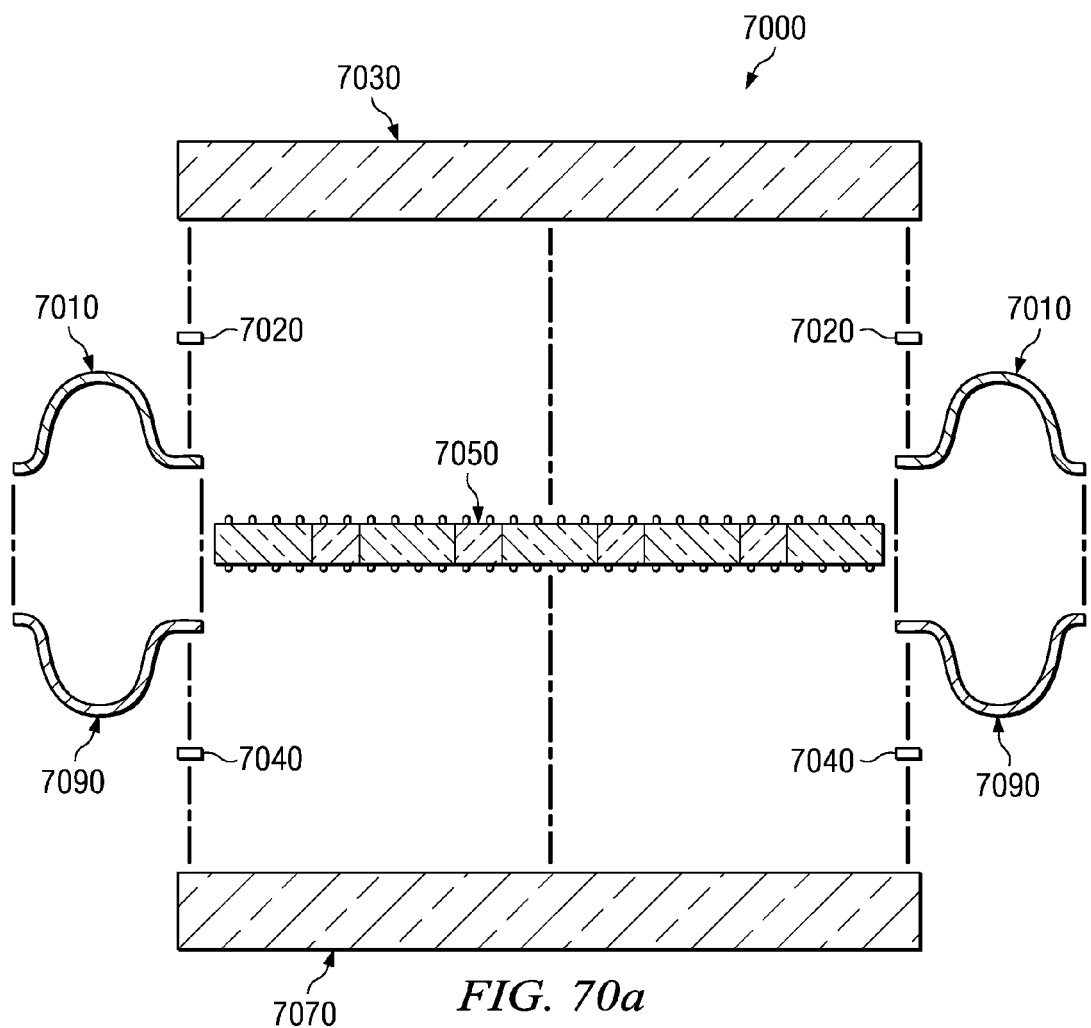
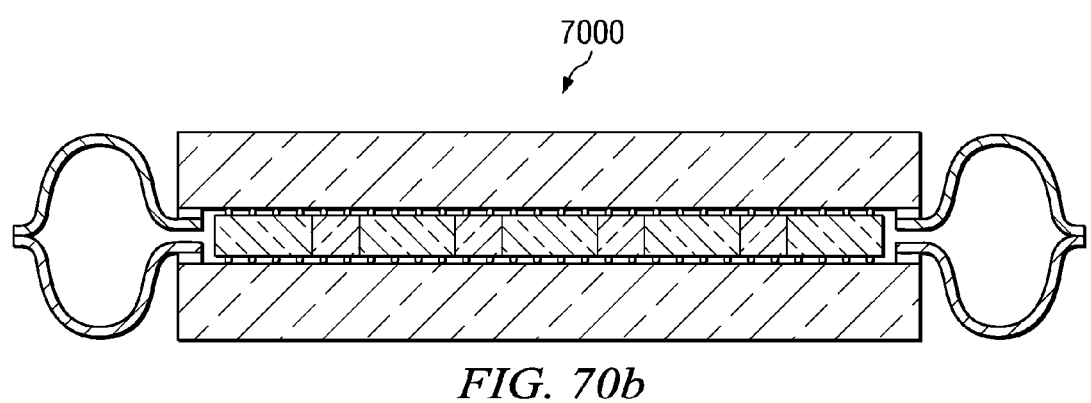

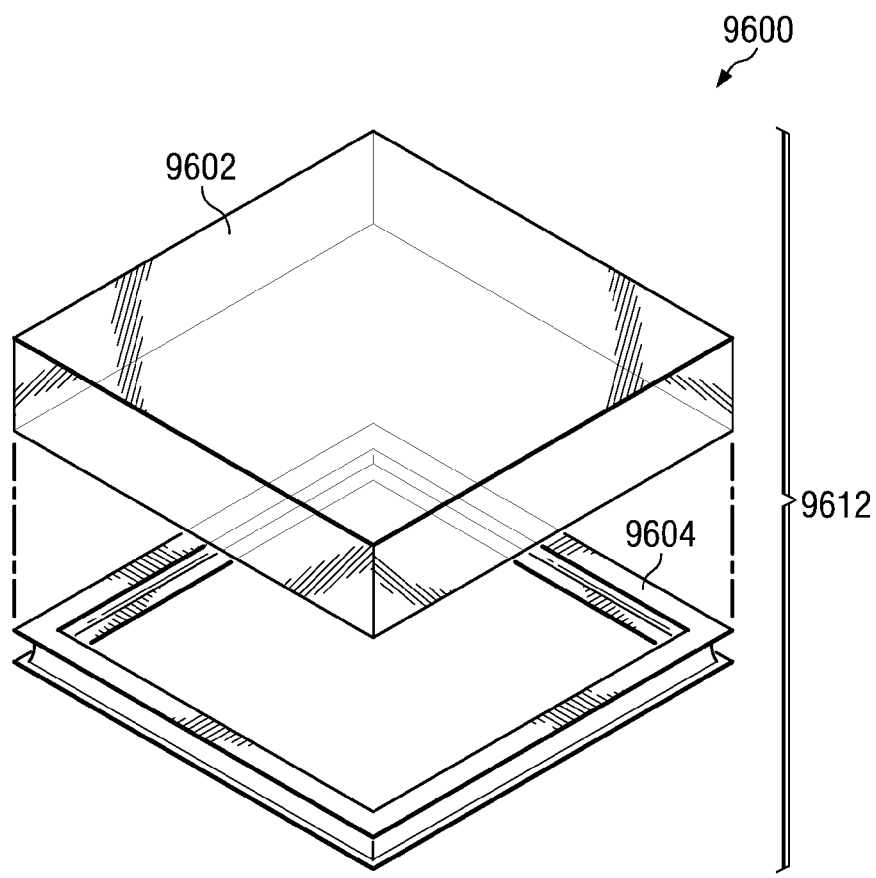
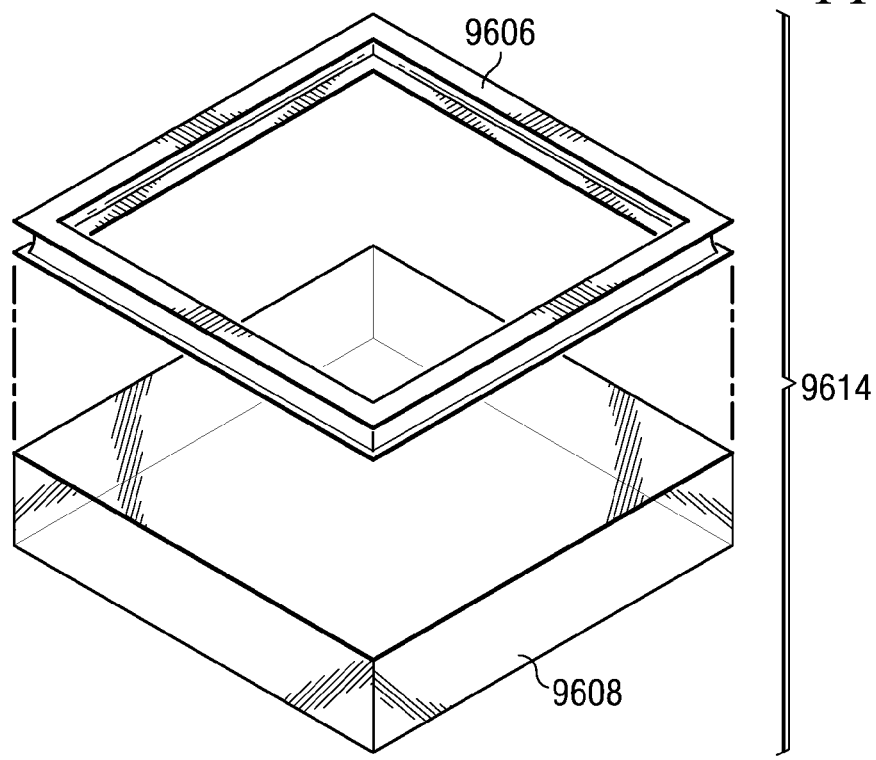
FIG. 96a

INSULATED GLAZING UNITS

CROSS REFERENCE TO RELATED APPLICATIONS

This application is a Continuation-In-Part of pending U.S. application Ser. No. 10/766,493 filed Jan. 27, 2004, which is a Continuation-In-Part of U.S. application Ser. No. 10/713, 475 filed Nov. 14, 2003, now U.S. Pat. No. 6,962,834, which is a Continuation-In-Part of U.S. application Ser. No. 10/133, 049 filed Apr. 26, 2002, now U.S. Pat. No. 6,723,379, which is a Continuation-In-Part of U.S. application Ser. No. 10/104, 315 filed Mar. 22, 2002, now U.S. Pat. No. 6,627,814. This application also claims the benefit of priority from U.S. Provisional Application No. 60/678,570, filed May 6, 2005, and from U.S. Provisional Application No. 60/707,367, filed Aug. 11, 2005.

TECHNICAL FIELD OF THE INVENTION

The current invention relates to thermally insulated building windows, and more particularly to multi-pane glazing units having a vacuum or a thermally insulating material disposed in the space between the windowpanes.

BACKGROUND OF THE INVENTION

Photonic, photovoltaic, optical and micro-mechanical devices are typically packaged such that the active elements (i.e., the emitters, receivers, micro-mirrors, etc.) are disposed within a sealed chamber to protect them from handling and other environmental hazards. In many cases, it is preferred that the chamber be hermetically sealed to prevent the influx, egress or exchange of gasses between the chamber and the environment. Of course, a window must be provided to allow light or other electromagnetic energy of the desired wavelength to enter and/or leave the package. In some cases, the window will be visibly transparent, e.g. if visible light is involved, but in other cases the window may be visibly opaque while still being "optically" transparent to electromagnetic energy of the desired wavelengths. In many cases, the window is given certain optical properties to enhance the performance of the device. For example, a glass window may be ground and polished to achieve certain curve or flatness specifications in order to disperse in a particular pattern and/or avoid distorting the light passing therethrough. In other cases, anti-reflective or anti-refractive coatings may be applied to the window to improve light transmission therethrough.

Hermetically sealed micro-device packages with windows have heretofore typically been produced using cover assemblies with metal frames and glass window panes. To achieve the required hermetic seal, the glass window pane (or other transparent window material) has heretofore been fused to its metallic frame by one of several methods. A first of these methods is heating it in a furnace at a temperature exceeding the window's glass transition temperature, $T_G$ and/or the window's softening temperature $T_S$ (typically at or above 900° C.). However, because the fusing temperature is above $T_G$ or $T_S$, the original surface finish of the glass pane is typically ruined, making it necessary to finish or re-finish (e.g., grinding and polishing) both surfaces of the window pane after fusing in order to obtain the necessary optical characteristics. This polishing of the windowpanes requires additional process steps during manufacture of the cover assemblies, which steps tend to be relatively time and labor intensive, thus adding significantly to the cost of the cover assembly, and hence to the cost of the overall package. In addition, the need to polish both sides of the glass after fusing requires the glass to project both above and below the attached frame. This restricts the design options for the cover assembly with respect to glass thickness, dimensions, etc., which can also result in increased material costs.

A second method to hermetically attach a transparent window to a frame is to solder the two items together using a separate preform made of a metal or metal-alloy solder material. The solder preform is placed between a pre-metallized window and a metal or metallized frame, and the soldering is performed in a furnace. During soldering, no significant pressure is applied, i.e., the parts are held together with only enough force to keep them in place. For this type of soldering, the most common solder preform material is eutectic gold-tin.

Eutectic gold-tin solder melts and solidifies at 280° C. Its CTE at 20° is 16 ppm/° C. These two characteristics cause three drawbacks to the reliability of the assembled window. First, the CTE of Mil-Spec kovar from 280° C. to ambient is approximately 5.15+/−0.2 ppm/0 C, while most window glasses intended for sealing to kovar have higher average CTEs over the same temperature range. During cooling from the set point of 280° down to ambient, the glass is shrinking at a greater rate than the kovar frame it's attached to. The cooled glass will be in tension, which is why it is prone to cracking. To avoid cracking, the glass should have an identical or slightly lower average CTE than the kovar so as to be stress neutral or in slight compression after cooling. Using solders with lower liquidus/solidus temperatures puts the kovar at a higher average CTE, more closely matching the average CTE of the glass. However, this worsens the second drawback of metal-allow solder seals.

The second drawback to soldering the glass to the kovar frame is that the window assembly will delaminate at temperatures above the liquidus temperature of the employed solder. Using lower liquidus/solidus temperature solders, while reducing the CTE mismatch between the kovar and glass, further limits the applications for the window assembly. Most lead-free solders have higher liquidus/solidus temperatures than the 183° C. of eutectic Sn/Pb. Surface-Mount Technology (SMT) reflow ovens are profiled to heat Printed-Wiring Board (PWB) assemblies 15-20 degrees above the solder's liquidus/solidus temperature. So the SMT reflow-soldering attachment to a PWB of a MOEMS device whose window was manufactured using lower melting-point solder preforms might have the unfortunate effect of reflowing the window assembly's solder, causing window delamination.

The third drawback is that the solder, which is the intermediate layer between the glass and the kovar frame, has a CTE up to three times greater than the two materials it's joining. An intermediate joining material would ideally have a compensating CTE in-between the two materials it's bonding.

A third method to hermetically attach a glass window to a frame is to solder the two items together using a solder-glass material. Solder-glasses are special glasses with a particularly low softening point. They are used to join glass to other glasses, ceramics, or metals without thermally damaging the materials to be joined. Soldering is carried out in the viscosity range h where his the range from $10^4$ to $10^6$ dPa s (poise) for the solder-glass; this corresponds generally to a temperature range T (for the glass solder or solder-glass) within the range from 350° C. to 700° C.

Once a cover assembly with a hermetically sealed window is prepared, it is typically seam welded to the device base (i.e., substrate) in order to produce the finished hermetically sealed package. Seam welding uses a precisely applied AC current to produce localized temperatures of about 1,100° C. at the frame/base junction, thereby welding the metallic cover assembly to the package base and forming a hermetic seal. To prevent distortion of the glass windowpane or package, the metal frame of the cover assembly should be fabricated from metal or metal alloy having a CTE (i.e., coefficient of thermal expansion) that is similar to that of the transparent window material and to the CTE of the package base.

While the methods described above have heretofore produced useable window assemblies for hermetically sealed micro-device packages, the relatively high cost of these window assemblies is a significant obstacle to their widespread application. A need therefore exists, for package and component designs and assembly methods which reduce the labor costs associated with producing each package.

A need still further exists for package and component designs and assembly methods that will minimize the manufacturing cycle time required to produce a completed package.

A need still further exists for package and component designs and assembly methods that reduce the number of process steps required for the production of each package. It will be appreciated that reducing the number of process steps will reduce the overhead/floor space required in the production facility, the amount of capital equipment necessary for manufacturing, and handling costs associated with transferring the work pieces between various steps in the process. A reduction in the cost of labor may also result. Such reductions would, of course, further reduce the cost of producing these hermetic packages.

A need still further exists for package and component designs and assembly methods that will reduce the overall materials costs associated with each package, either by reducing the initial material cost, by reducing the amount of wastage or loss during production, or both.

Many types of multi-pane insulated window assemblies are known. A conventional multi-pane insulated window assembly consists, at a minimum, of two windowpanes joined by a frame that maintains a space between them. The space is filled with air or another thermally insulating material, typically a gas. Multi-pane insulated window assemblies typically have better thermal insulation properties than single-pane windows, however, further improvement in insulating performance is often desired.

A vacuum-glazing unit (VGU) is a window assembly similar to a multi-pane insulated window assembly, except a vacuum or partial vacuum is maintained in the space between the windowpanes. The purpose of this type of construction is to produce an insulated window unit with a higher level of thermal insulation that can be obtained from air- or gas-filled insulated window assemblies. To date, however, many problems have been experienced in producing durable and reliable VGUs. For example, it has proven difficult to achieve seals between the windowpanes and the frame having the hermeticity necessary to maintain a vacuum (or partial vacuum) for an extended period. Further, it has proven difficult to produce VGUs for exterior wall installations (i.e., for use in the outside-facing (exterior) walls and doors of buildings) that can withstand large and/or rapid thermal cycling (e.g., caused by changes in outside temperatures and/or use of high-performance HVAC systems) without eventually leaking or cracking. A need therefore exists, for improved VGUs and methods of producing durable and reliable VGUs suitable for use in exterior walls and doors, as well as for other applications.

A Jun. 10, 2005 Department of Energy (DOE) solicitation states that the key technical challenges associated with highly insulating fenestration products include, but are not limited to: larger size (~25 sq. ft. and larger), improved durability, excessive weight, seal durability, and high cost. Without an aggressive program to change the energy-related role of windows in buildings, it will thus be virtually impossible to meet Zero Energy Buildings goals. The DOE's Window Technology Industry Roadmap (Roadmap), published by the Office of Building Technology, State and Community Programs (BTS), after listing several areas of window technology in need of improvements, states such improvements have not been realized due to factors including: High-first-cost of improved products; the cost and questionable durability of existing highly-insulating window technologies; the lack of industry collaboration to improve insulation technology and manufacturing methods; and the presumed high-risk-low-return ratio of investments in improved technologies.

In fact, the window industry has not improved the basic technology or reliability of insulating windows for decades. Manufacturers use an adhesive to bond pairs of windowpanes to an intermediate spacer to achieve an airtight cavity between the windowpanes. No epoxy, glue or other adhesive in use today is airtight. All permit some amount of gas exchange to occur. According to data published in 2002 by The Sealed Insulated Glass Manufacturers Association (SIGMA), warranty claims for installed insulated glass (IG) window units due to seal failures is 4% ten years after installation, and almost 10% fifteen years after installation. Most window units do not identify the manufacturer. Many homeowners consciously or inadvertently choose to live with the failed window seals and water condensation between the IG windowpanes that reduce energy efficiency. The majority of IG unit (IGU) seal failures are not considered in the SIGMA data. The actual number of IGU seal failures 15 years after installation is unknown and believed to be very high. All of these conditions are bleeding us of energy.

Some academic institutions, companies and government labs have tried achieving higher insulating values (higher R-value; lower U-value) while attempting to solve the issue of leaking seals. Their solutions all have four things in common: The units contain a vacuum between windows #1 and #2 to provide higher insulation than a fill gas; mechanical spacers are used to maintain the separation of the window lites (i.e., panes) #1 and #2 (if the lites come in physical contact with each other, this creates an undesirable thermal path that substantially reduces the IG unit's insulating value); the lites are hermetically sealed at their perimeters (most commonly, using reflowed solder glass to seal two closely separated lites, and less commonly, using a laser to melt the two lites together); and all currently produced or described vacuum glazing units employ a tube (i.e., "pinch-tube") to evacuate the IG unit, after which the tube is sealed shut.

These experimental solutions are not commercially available in the U.S. because they have failed or have not proven to be reliable. Problems include: the spacers are opaque or not aesthetically appealing so they fail to meet industry needs; laser attempts at sealing have resulted in broken lites due to thermal shocking of the glass; high thermal conductivity between the perimeter surfaces of the inside of the glass lites where they are sealed together; stress eventually causes either the seal or the lites to break because the sealing method is not compliant (flexible); elevated soldering temperatures eliminate the ability to use some soft-coat low-e coatings; and/or when a vacuum tube is added, it increases the unit's complexity and decreases its reliability.

A need therefor exists, for vacuum glazing units (VGUs) and insulated glass units (IGUs) having improved designs which address some of the aforesaid problems with the current technology.

SUMMARY OF THE INVENTION

The present invention disclosed herein comprises, in one aspect thereof, a hermetically sealed multi-pane window assembly. The window assembly comprises first and second windowpane sheets formed of transparent materials. A first sealing member has an inner edge and an outer edge, the inner edge being hermetically attached around the periphery of the first windowpane sheet by diffusion bonding. A second sealing member has an inner edge and an outer edge, the inner edge being hermetically attached around the periphery of the second windowpane sheet by diffusion bonding and the outer edge being hermetically attached to the outer edge of the first sealing member. A spacer assembly is disposed between the first and the second windowpane sheets for maintaining a gap therebetween, whereby a hermetically sealed cavity is defined between the first and the second windowpanes.

The present invention disclosed herein comprises, in another aspect thereof, a method for manufacturing a hermetically sealed multi-pane window assembly. A first windowpane sheet formed of a transparent material and having a periphery is provided, as is a first sealing member having an inner edge and an outer edge. The inner edge of the first sealing member is positioned against the first windowpane sheet. The inner edge of the first sealing member is pressed against the first windowpane sheet with sufficient force to produce a first predetermined contact pressure between the inner edge and the windowpane sheet along a first junction region. The first junction region is heated to produce a first predetermined temperature along the first junction region. The first predetermined contact pressure and an elevated temperature are maintained until a diffusion bond is formed between the first sealing member and the first windowpane sheet around the periphery of the first windowpane sheet. A second windowpane sheet formed of a transparent material and having a periphery is provided, as is a second sealing member having an inner edge and an outer edge. The inner edge of the second sealing member is positioned against the second windowpane sheet. The inner edge of the second sealing member is pressed against the second windowpane sheet with sufficient force to produce a second predetermined contact pressure between the inner edge and the windowpane sheet along a second junction region. The second junction region is heated to produce a second predetermined temperature along the second junction region. The second predetermined contact pressure and an elevated temperature are maintained until a diffusion bond is formed between the second sealing member and the second windowpane sheet around the periphery of the second windowpane sheet. A spacer assembly is positioned between the first and the second windowpane sheets for maintaining a gap therebetween. The outer end of the first sealing member is hermetically connected to the outer end of the second sealing member, whereby a hermetically sealed cavity is defined between the first and the second windowpanes.

The present invention disclosed herein comprises, in a further aspect thereof, a hermetically sealed multi-pane window assembly comprising a first windowpane formed of a transparent material and having a periphery. A first sealing member has an inner edge and an outer edge. The inner edge is hermetically sealed to the first windowpane around the periphery. A second windowpane is formed of a transparent material and has a periphery. The second windowpane is spaced-apart from the first windowpane. A second sealing member has an inner edge and an outer edge. The inner edge is hermetically sealed to the second windowpane around the periphery, and the outer edge is hermetically attached to the outer edge of the first sealing member. At least one of the first and second sealing members is compliant to enable relative movement between the first and second windowpanes. In this manner, a hermetically sealed cavity is formed between the first and the second windowpanes.

The present invention addresses many limitations of the prior art and, in various embodiments, provides VGUs and/or IGUs having some or all of the following advantages: diffusion bonding is used to make glass-to-metal, glass-to-glass and/or metal-to-metal bonds that are permanent, i.e., they cannot be disassembled by any known means such that the seals may last for up to 80 years; the hermetic sealing system incorporates a compliant (i.e., flexible) sleeve/frame unit (also called a "bellows") that acts as springs, allowing the outside-facing window lite (window #1) to expand and contract due to temperature changes independent of the inside-facing lite (window #2); the metal sleeves are bonded to the glass lites using a glass-to-metal diffusion bonding process, and thus are more hermetic (gas-tight) than other known glass-to-metal seals; the thin, flexible metal sleeves have a high thermal resistance so that they do not adversely impact the overall insulating value; the windowpanes of the invention are able to use any currently employed glazing and coating, including low-e and UV-blocking coatings, and are also be compatible with electrochromeric coatings; units of the current invention can be thinner to reduce the weight and depth of the product, whether the application is a commercial window wall or a fenestration product; and spacer systems that are nearly invisible from any viewing angle.

Additional embodiments of the invention address the need for a drop-in replacement system for the single-pane glass units still used in the majority of U.S. buildings. IGUs of the invention can be thin enough to replace the 6 mm (¼") thick single pane windows now in the majority of U.S. buildings, and may be economically installed so that vast numbers of owners could achieve significant heating and cooling energy reductions without incurring substantial window replacement costs.

Still further embodiments of the invention produce insulating windows addressing all of the DOE concerns and needs. In one such embodiment, the invention is an IGU that employs a partial vacuum instead of a fill gas to increase its insulating value.

In another embodiment, the invention comprises an IGU that contains a vacuum in the cavity between the pairs of windowpanes. A vacuum is the ultimate thermal insulator. The higher the level of vacuum, the fewer the molecules available to transfer heat between the pairs of windowpanes. Thus, window assemblies containing a vacuum instead of a gas will have the highest theoretical thermal insulation value (U-Value) of any window unit composed of two or more panes of glass or other materials.

In a further embodiment, the invention comprises an IGU having compliant (flexible) metal sleeves/frames (also known as "bellows") that hermetically seal the IG unit, providing highest reliability while also possessing high thermal resistance (low thermal conductance) to minimize their impact on the unit's overall thermal performance.

In a still further embodiment, the invention comprises an IGU employing glass-to-metal diffusion bonding to bond the flexible metal sleeves to the glass lites (windows #1 and #2). This bond is permanent because it is molecular in nature, and is more hermetic than any other known attachment method. The IGU may contain and maintain a vacuum upwards of 80 years.

In yet another embodiment, the invention comprises an IGU that employs a unique glass spacer system of a glass substrate with glass standoffs on the top and bottom substrate surfaces. Any coatings that can be applied to surfaces #2 or #3 of known IGUs can instead be applied to either surface of the glass spacer substrate. IGU surfaces #2 and #3 can be coated with a scratch-resistant thin-film material such as diamond-like coatings (DLC) so that the differential movement of the glass spacers and the lites they support do not produce scratches on the lites' inside surfaces.

In another embodiment, the invention comprises an IGU having thinner windows which reduce the weight and depth of the fenestration products. Reducing the frame and associated construction materials will also reduce weight.

In a further embodiment, the invention comprises an IGU for residential and small commercial use that may be made as thin or thinner than the 6 mm (¼") thick single-pane windows now installed in the majority of homes, thereby simplifying and/or reducing the cost of upgrading to a super insulating IG unit in existing fenestration products.

In a still further embodiment, the invention comprises an IGU that eliminates breakage due to bulging at high altitude.

The present invention disclosed and claimed herein comprises, in another aspect thereof, a frame assembly for hermetic attachment to one side of a sheet of transparent material having a plurality of window aperture areas defined thereon, each window aperture area being circumscribed by a frame attachment area having a predefined plan. The frame assembly comprises a plurality of continuous sidewalls circumscribing a plurality of frame apertures such that some sidewalls are disposed between two adjacent frame apertures. The sidewalls have an upper side plan configured to substantially correspond with the predefined plans of the frame attachment areas of the sheet. The sidewalls disposed between the adjacent frame apertures include two generally parallel sidewall members having an overall vertical thickness and a first connecting tab extending therebetween. When viewed in cross-section taken perpendicular to the plan view, the configuration of the sidewalls disposed between adjacent frame apertures is characterized by the first connecting tab having a relatively constant vertical thickness that is significantly smaller than the overall vertical thickness of the adjacent sidewall members.

The present invention disclosed and claimed herein comprises, in another aspect thereof, a frame assembly for hermetic attachment to one side of a sheet of transparent material having a plurality of window aperture areas defined thereon, each window aperture area being circumscribed by a frame attachment area having a predefined plan. The frame assembly comprises a first layer having a plan including a plurality of continuous sidewalls circumscribing a plurality of frame apertures such that some sidewalls are disposed between two adjacent frame apertures. The sidewalls have an upper side plan configured to substantially correspond with the predefined plans of the frame attachment areas of the sheet. A second layer has a plan including a plurality of continuous sidewalls. The sidewalls of the second layer have an upper side plan configured to at least partially overlap the plan of the sidewalls of the first layer all the way around each frame aperture. The first and second layers are joined to one another to create a hermetically gas-tight frame around each frame aperture.

The present invention disclosed and claimed herein comprises, in yet another aspect thereof, a hermetically sealed multi-pane window assembly. The window assembly comprises a spacer having a continuous sidewall circumscribing and thereby defining an aperture therethrough. The sidewall has an upper sealing surface and a lower sealing surface. The upper sealing surface is disposed on the upper side of the sidewall and continuously circumscribes the aperture, and the lower sealing surface is disposed on the lower side of the sidewall and continuously circumscribes the aperture. The window assembly further comprises a first and a second transparent windowpane sheets. The first sheet is disposed over at least a part of the upper sealing surface continuously around the aperture, and the second sheet is disposed over at least a part of the lower sealing surface continuously around the aperture, thereby defining a cavity enclosed by the sidewall and the windowpane sheets. The first and second transparent windowpane sheets are each hermetically bonded to the spacer without non-hermetic adhesives to form a continuous hermetic joint around the aperture.

BRIEF DESCRIPTION OF THE DRAWINGS

FIG. 4a showing a sheet having both sides contoured;

FIG. 4b showing a sheet having one side contoured;

FIG. 12a shows the initial transparent sheet;

FIG. 12b shows the transparent sheet after initial metallization;

FIG. 12c shows the transparent sheet after deposition of the integral frame/heat spreader;

FIG. 13a shows a partial cross-section of the sheet of FIG. 12a;

FIG. 13b shows a partial cross-section of the sheet of FIG. 12b;

FIG. 13c shows a partial cross-section of the sheet of FIG. 12c;

FIGS. 15a-15b illustrate a multi-unit assembly manufactured in accordance with another embodiment; specifically:

FIG. 15a illustrates an exploded view of a the multi-unit assembly;

FIG. 15b is bottom view of the frame of FIG. 15a;

FIG. 17a shows the transparent sheet in its original state;

FIG. 17b illustrates the sheet after deposition of the multi-aperture frame/heat spreader;

FIG. 18a illustrates the configuration of the sheet;

FIG. 18b illustrates the configuration of the frame;

FIG. 18c illustrates the joined sheet and frame;

FIGS. 19a-19f illustrate multi-unit assembly configurations suitable for heating with electrical resistance heating;

FIG. 20c illustrates an exploded view of a "sandwiched" window assembly before bonding;

FIG. 20d illustrates the completed assembly of FIG. 20c after bonding;

FIG. 20e illustrates an empty fixture and clamps;

FIG. 20f illustrates the fixture of FIG. 20e with a window assembly positioned therein for bonding;

FIG. 20g illustrates an alternative fixture designed to produce more axial pressure on the window assembly;

FIG. 21a shows a wafer-level hermetic micro-device packages having reverse-side electrical connections;

FIG. 21b shows a wafer-level hermetic micro-device package having same-side electrical connections;

FIG. 25a is a top view of a portion of a double frame member prior to singulation;

FIG. 25b is an end view of the double frame member of FIG. 25a;

FIG. 25c is a top view of a portion of a single frame member from the perimeter of the frame, or after device singulation; and FIG. 25d is an end view of the single frame member of FIG. 25c;

FIG. 49 is a perspective view of a PCM-fabricated multiple-frame array prior to singulation;

FIG. 50 is an exploded view of a double-pane hermetic window assembly;

FIG. 51 is a perspective view of the assembled double-pane hermetic window assembly of FIG. 50;

FIG. 58b is an assembled view of the VGU of FIG. 58a;

FIGS. 58c, 58d and 58e illustrate joining/bonding the upper frame member to the lower frame member;

FIG. 58f is a perspective view of a compliant frame in accordance with another embodiment;

FIG. 59b is an assembled view of the VGU of FIG. 59a;

FIG. 60b is an assembled view of the VGU of FIG. 60a;

FIG. 61b is an assembled view of the VGU of FIG. 61a;

FIG. 62b is a first perspective view of the windowpane with spacers of FIG. 62a;

FIG. 62c is a second perspective view of the windowpane with spacers of FIG. 62a;

FIG. 63a is an exploded view of the components of a VGU with a transparent sheet center spacer unit that is fabricated with stand-offs on (as part of) the sheet's top and bottom sides in accordance with another embodiment;

FIG. 63b is an assembled view of the VGU of FIG. 63a;

FIG. 64b is an assembled view of the VGU of FIG. 64a;

FIG. 65b is an assembled view of the VGU of FIG. 65a;

FIG. 68b is an assembled view showing the VGU of FIG. 68a;

FIG. 69b is an assembled view showing the VGU of FIG. 69a;

FIG. 70a is an exploded view of a VGU with inside-the-windowpane bonded frame members and optional interlayers between the frame members and the windowpanes in accordance with another embodiment;

FIG. 70b is an assembled view showing the VGU of FIG. 70a;

FIG. 71a shows a VGU with a center spacer unit in accordance with another embodiment;

FIG. 71b shows a VGU with a center spacer unit and an intermediate frame member that is attached to the center spacer unit in accordance with yet another embodiment;

FIG. 71c shows a VGU with a center spacer unit and an intermediate frame member that is attached to the center spacer unit in accordance with a still further embodiment;

FIG. 72a is an exploded view of the components of a VGU with upper and lower windowpanes having built-on spacers and a flat center spacer in accordance with another embodiment;

FIG. 72b is an assembled view of the VGU of FIG. 72a;

FIG. 73a is an exploded view of the components of a vacuum glazing unit in accordance with another embodiment;

FIG. 73b is an assembled view of the VGU of FIG. 73a;

FIG. 73c is a perspective view of a compliant frame in accordance with another embodiment;

FIG. 74 is a side view of a spacer unit for a vacuum glazing unit in accordance with one embodiment;

FIG. 75 is a side view of a spacer unit for a vacuum glazing unit in accordance with another embodiment;

FIG. 76 is a side view of a spacer unit for a vacuum glazing unit in accordance with a further embodiment having "laminated" or "sandwiched" construction;

Figure 77:
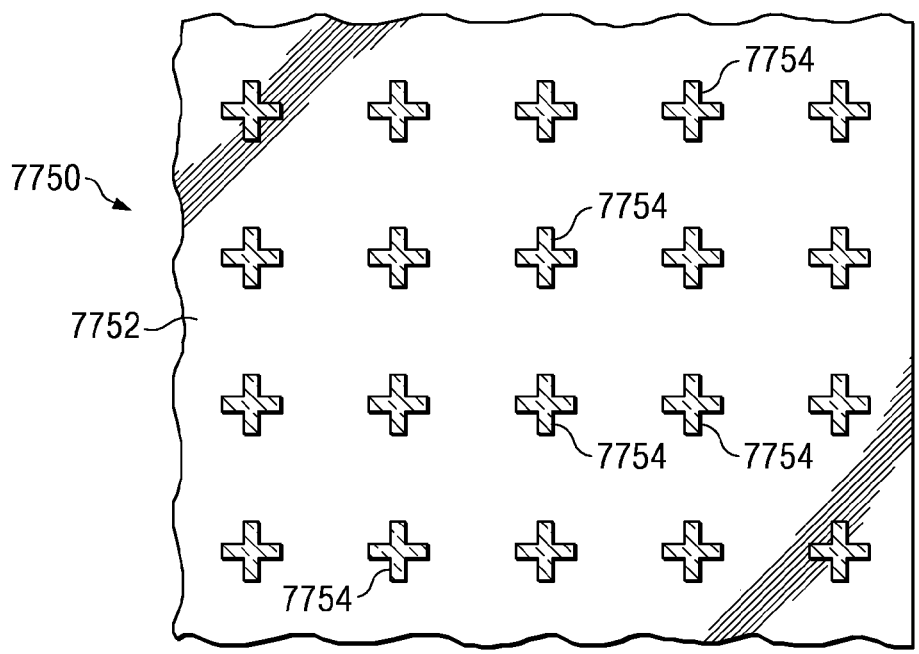
Figure 78:
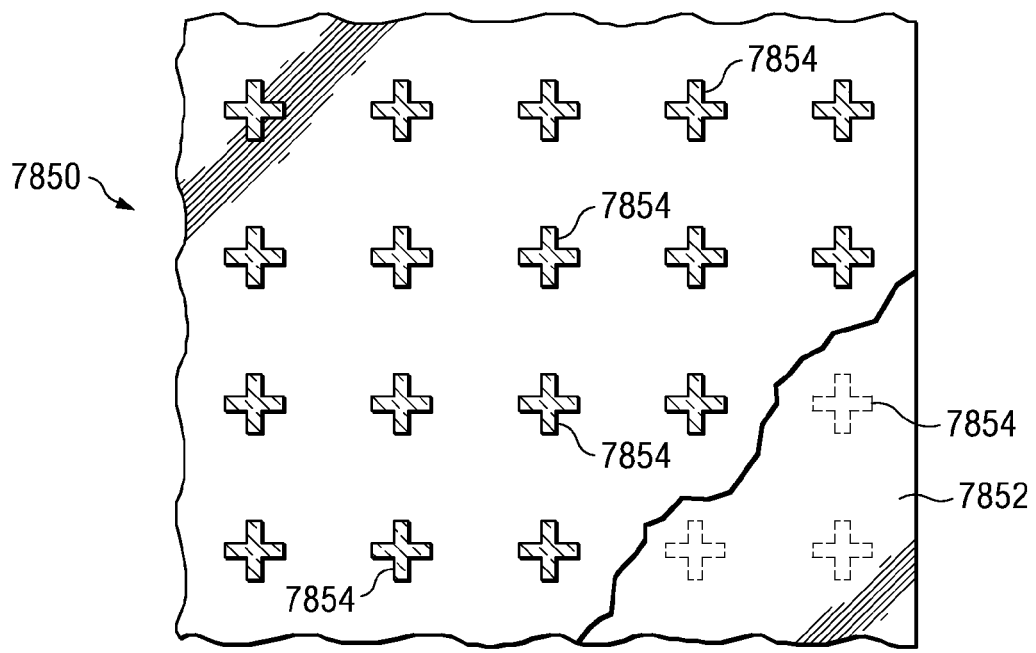
Figure 79:
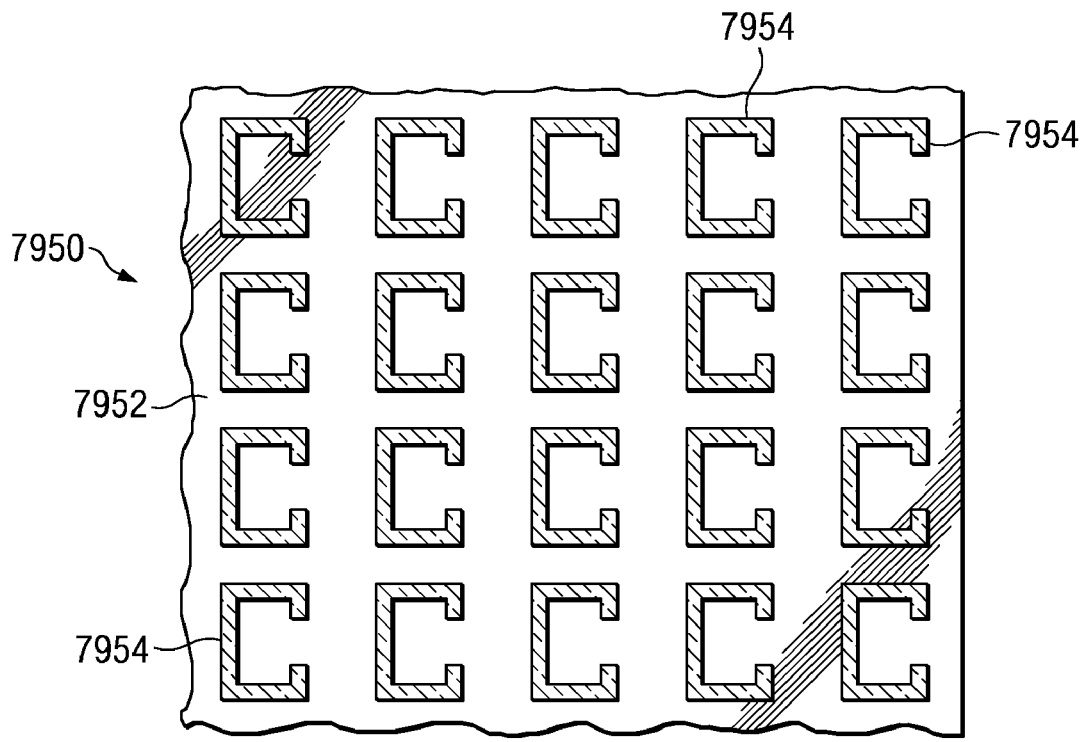

FIG. 77 is an enlarged elevation view of a portion of the spacer unit with cross-shaped stand-offs;

FIG. 78 is another elevation view of a portion of the spacer unit with cross-shaped stand-offs;

FIG. 79 is an enlarged elevation view of a portion of the spacer unit with "C"-shaped stand-offs.

Figure 80:
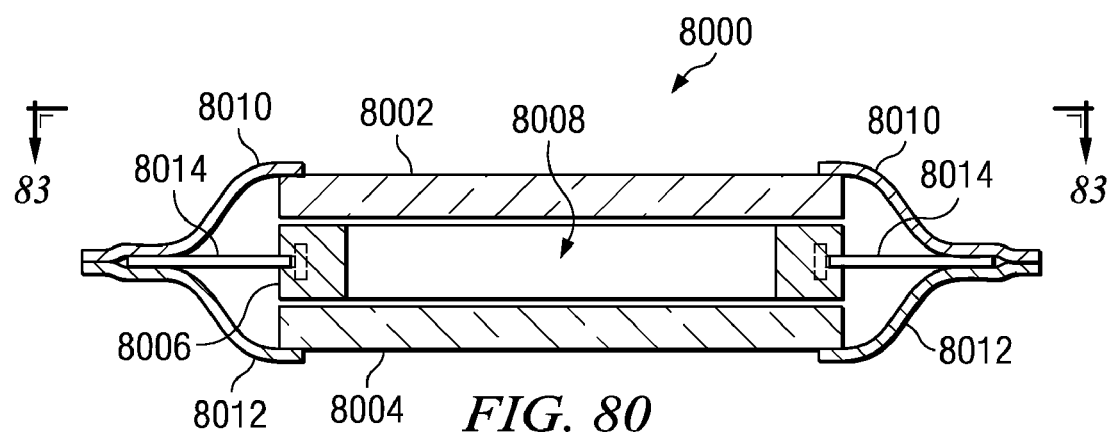
Figure 81:
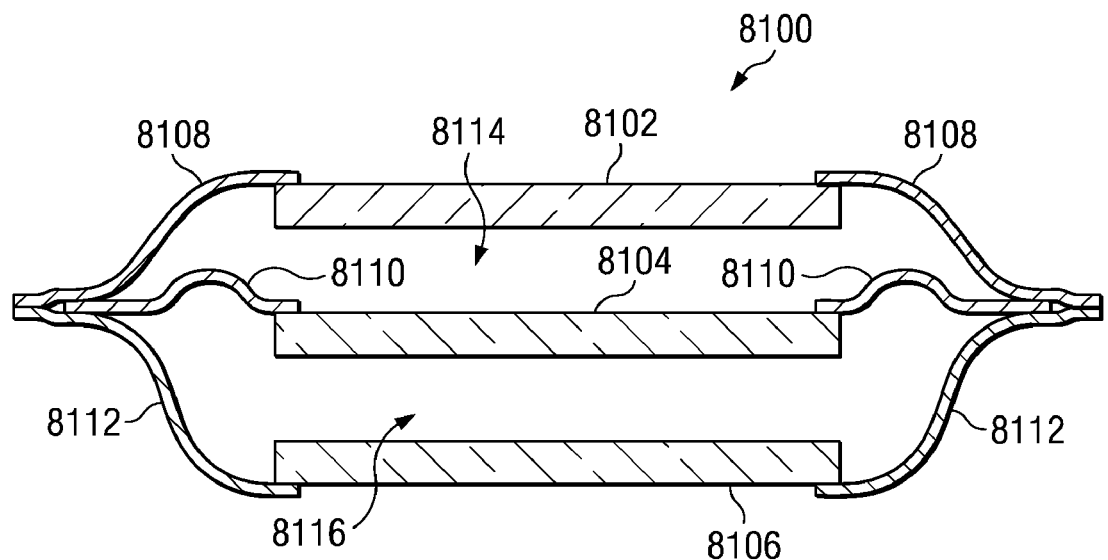
Figure 82:
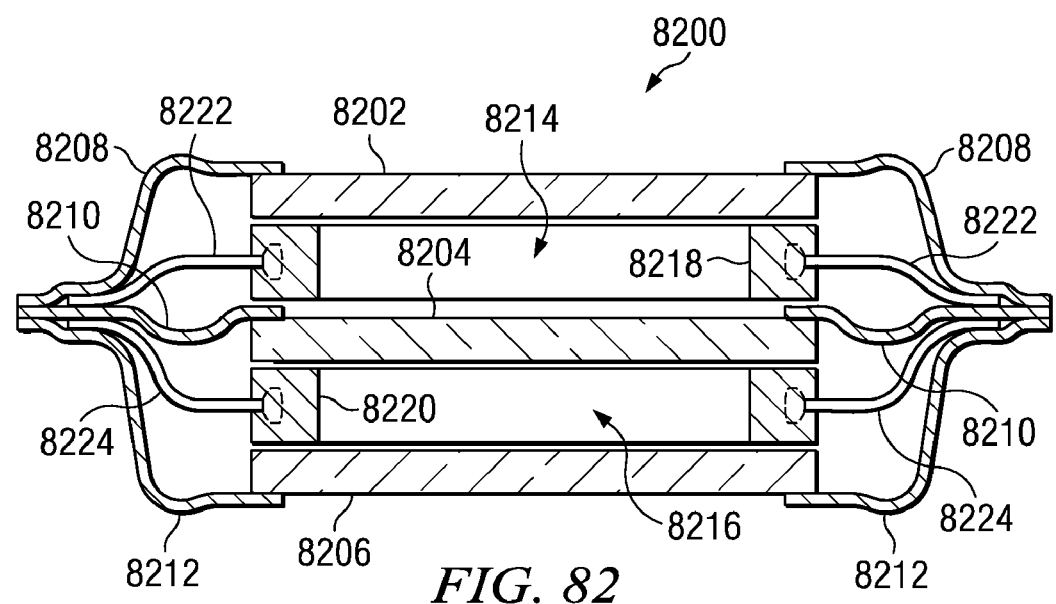
Figure 83:
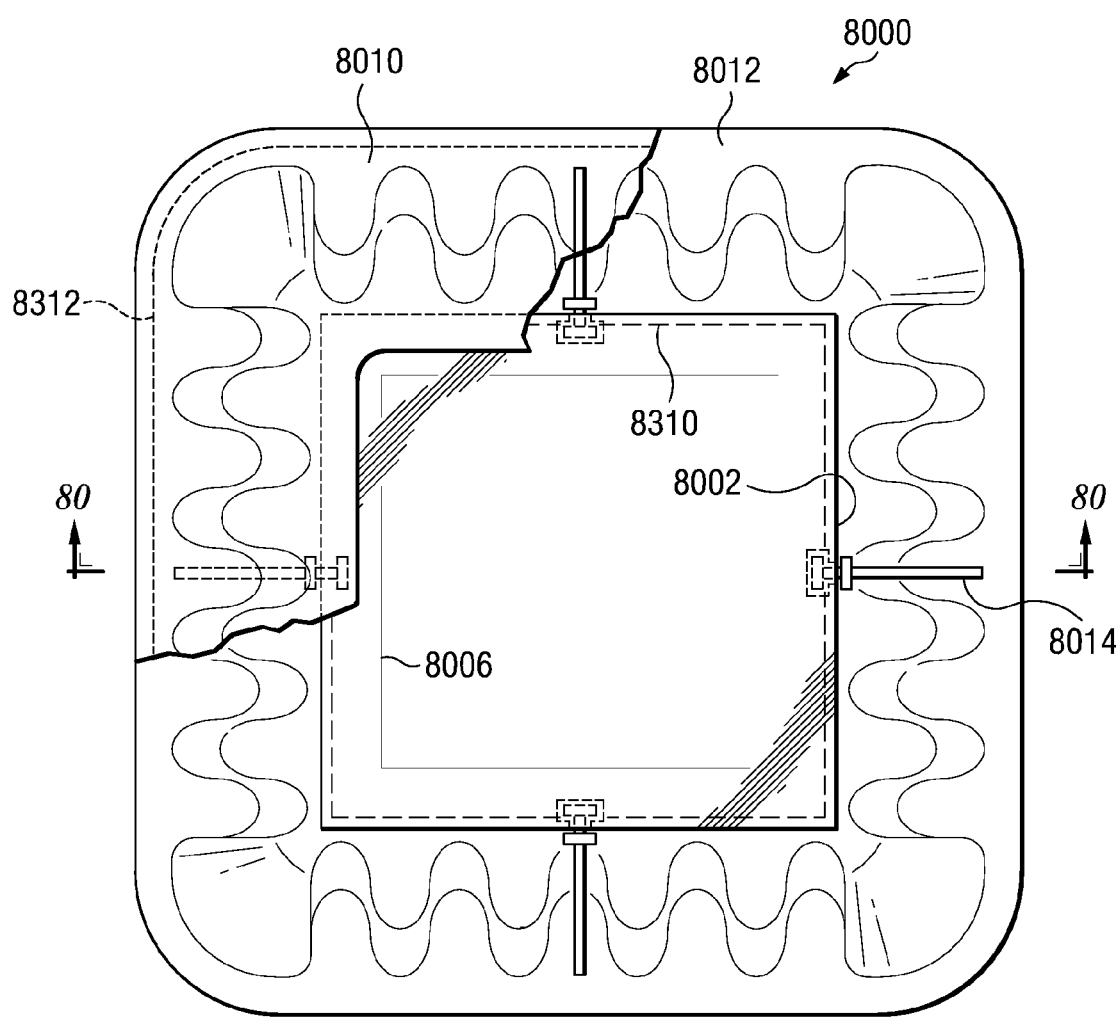
Figure 84:
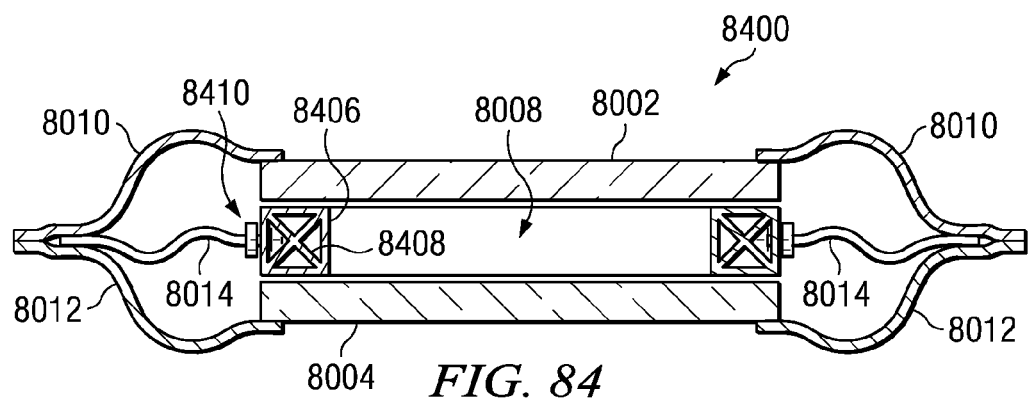
Figure 85:
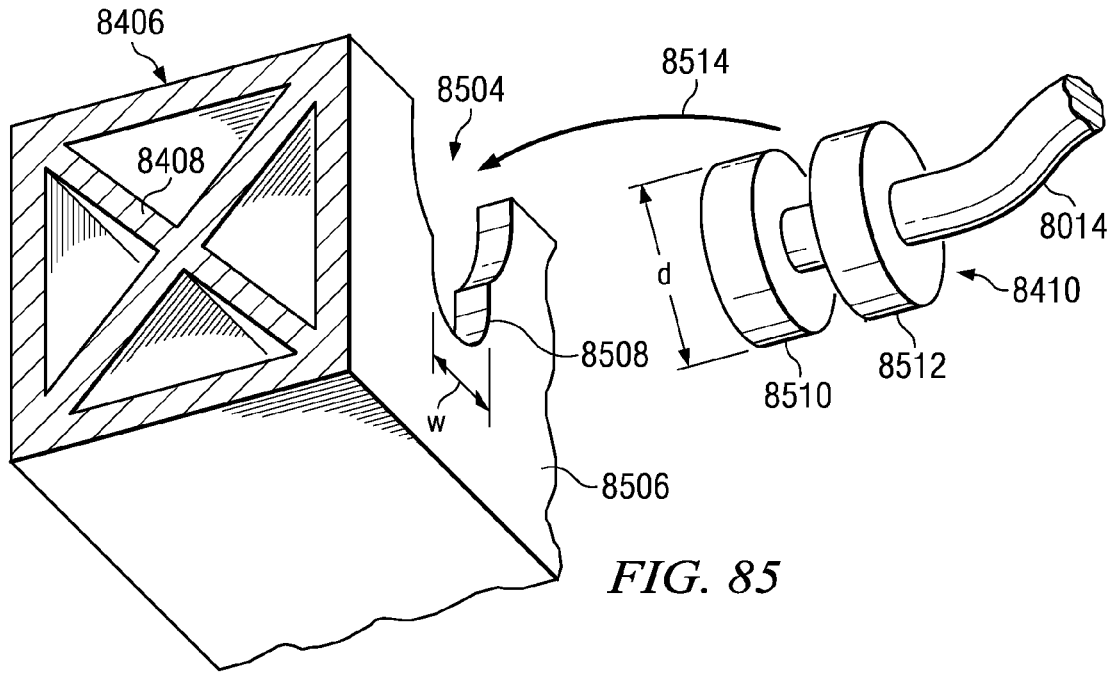
Figure 86:
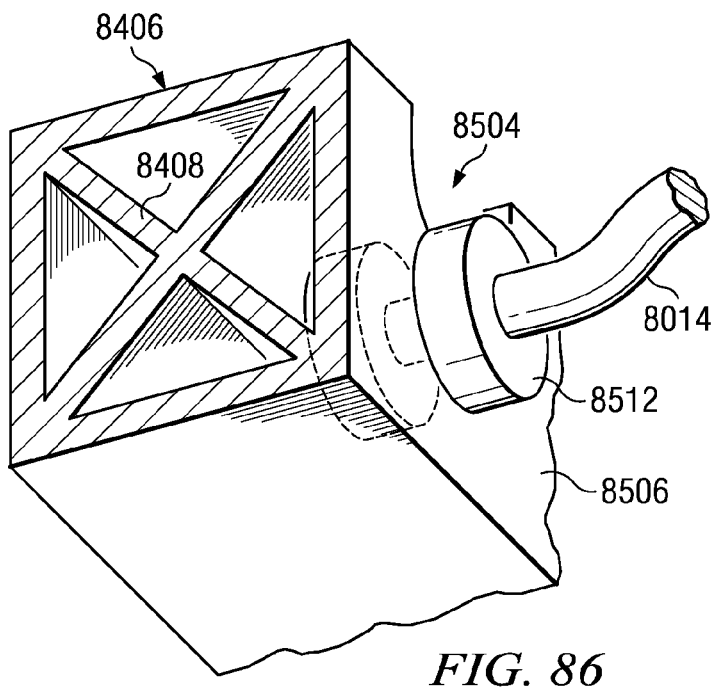
Figure 87:
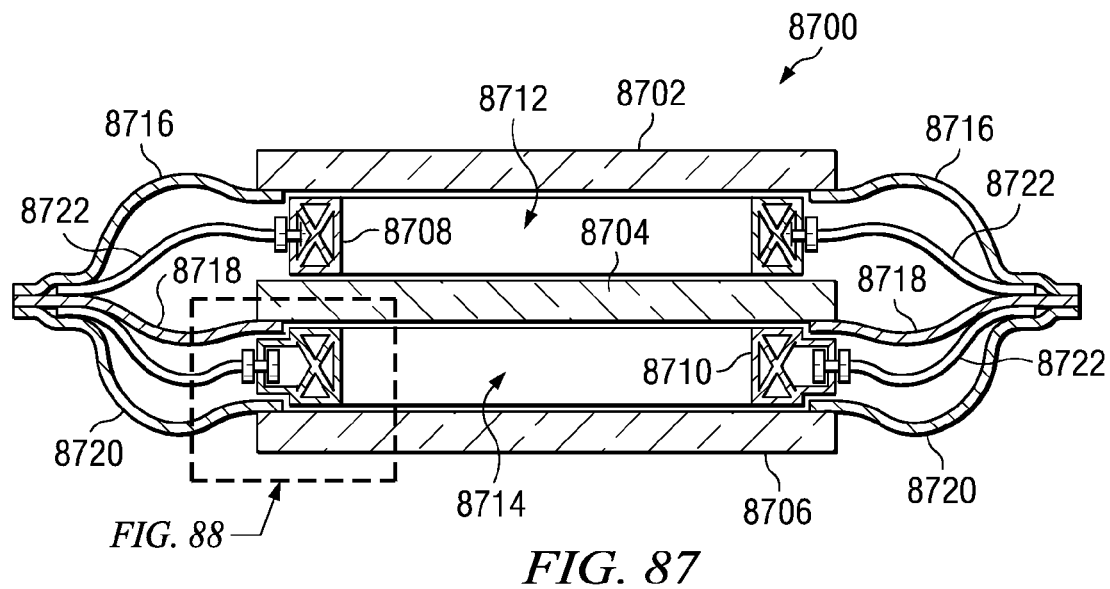
Figure 88:
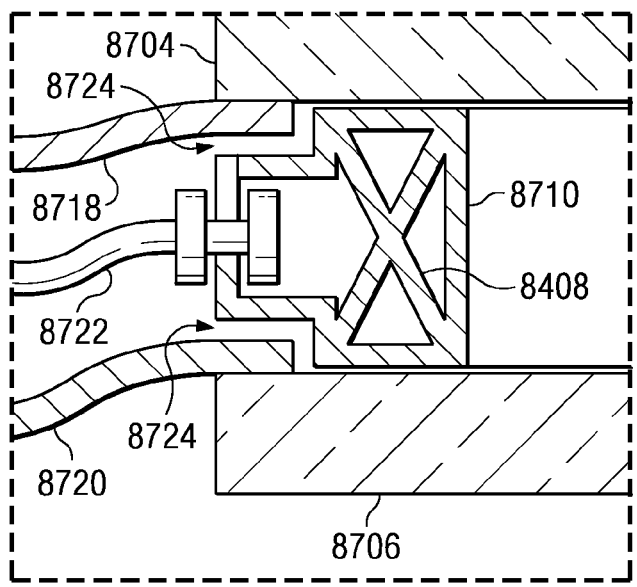
Figure 89:
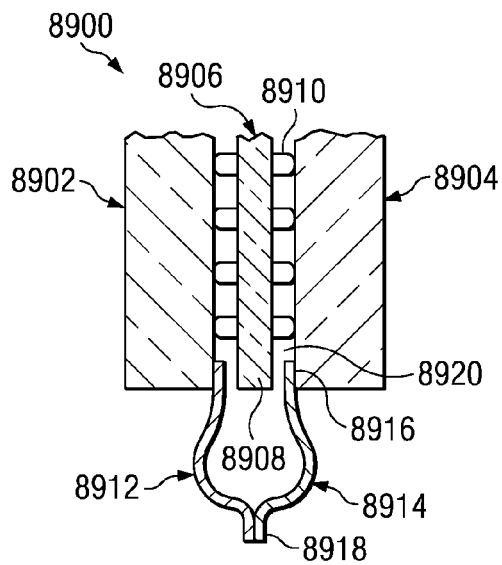
Figure 90:
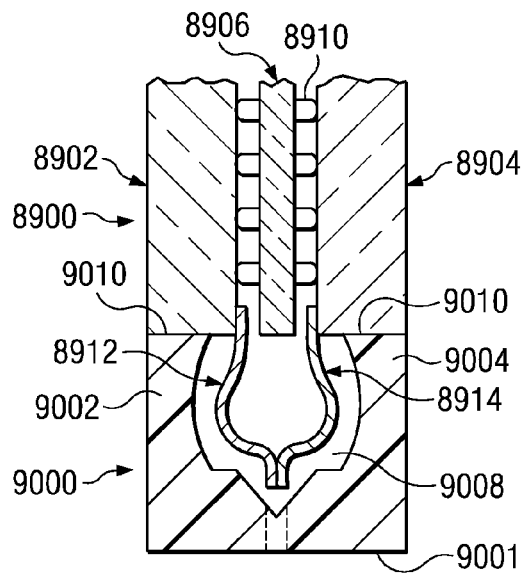
Figure 91A:
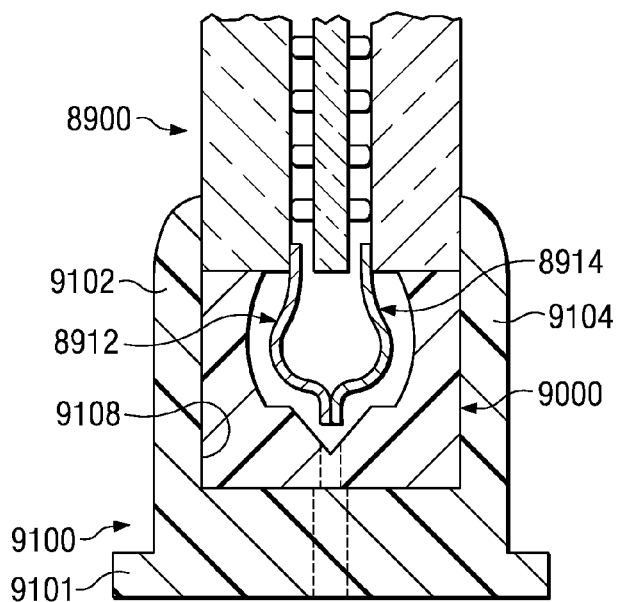
Figure 91B:
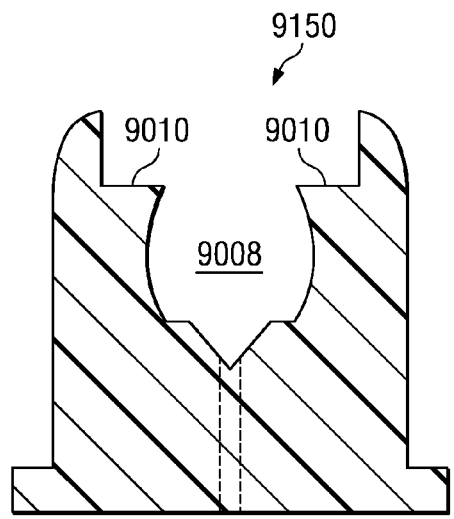
Figure 92:
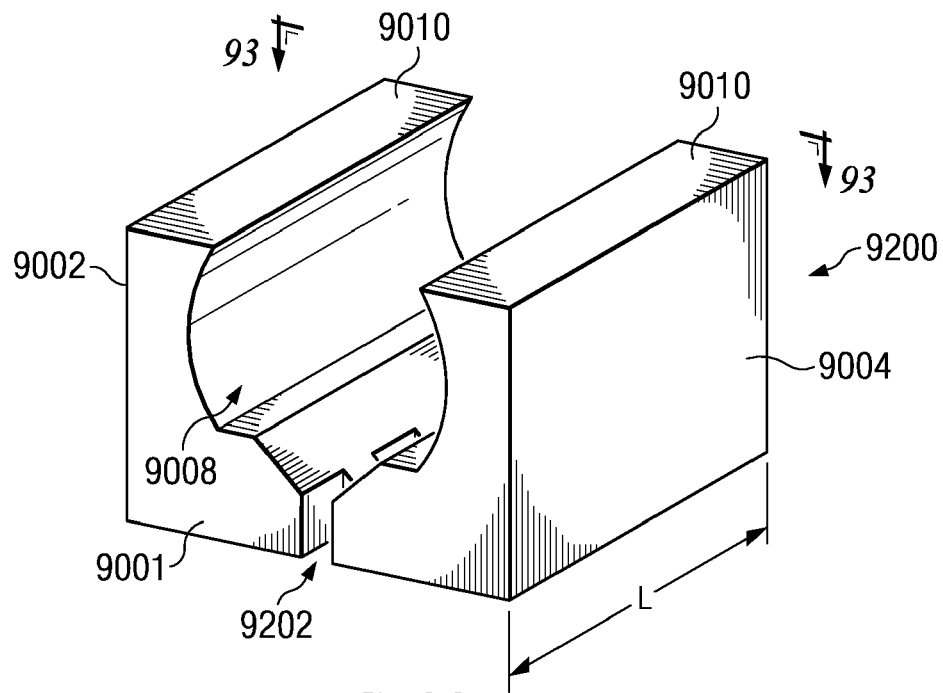
Figure 93:
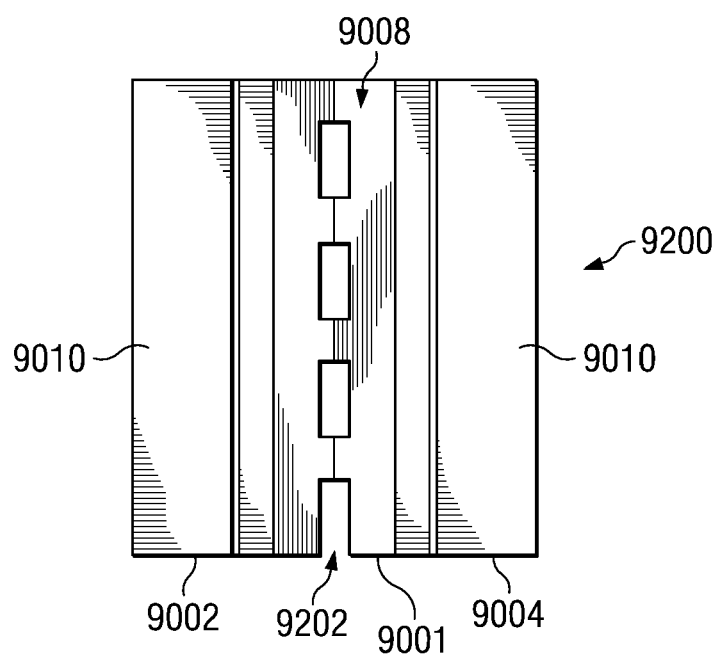
Figure 94A:
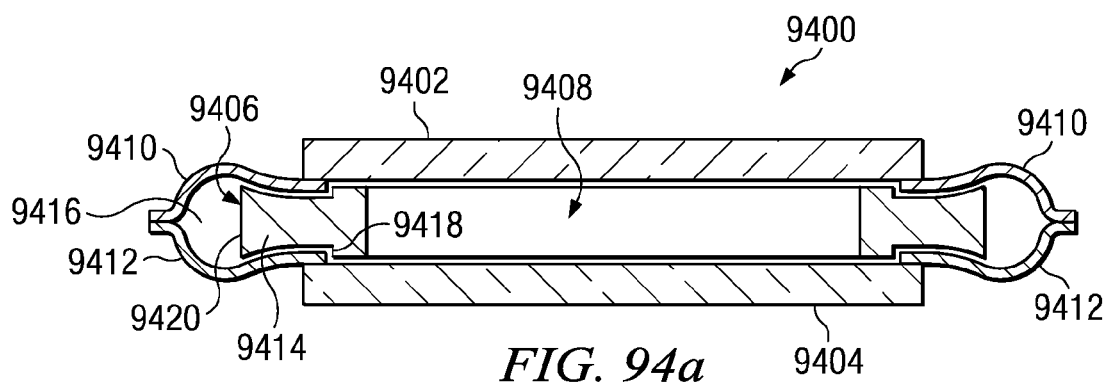
Figure 94B:
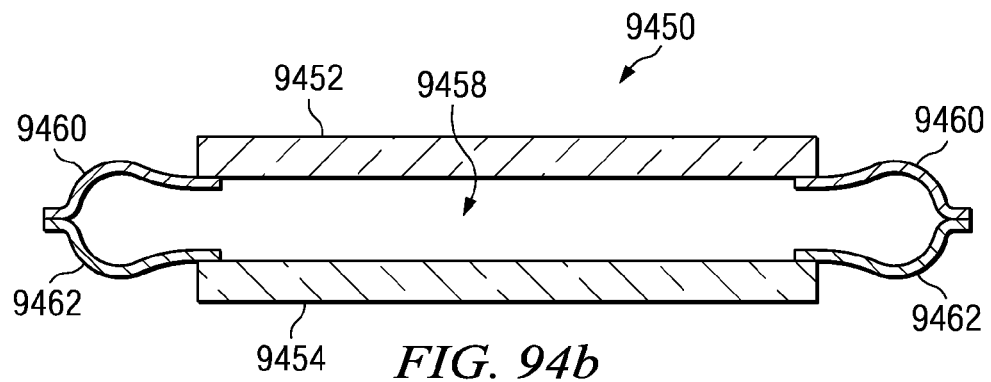
Figure 95:
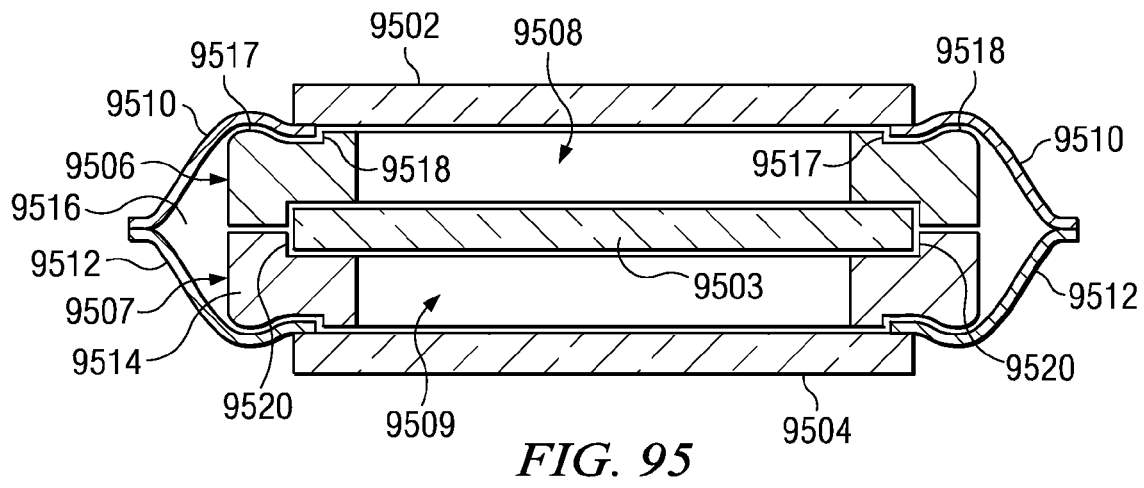
Figure 96B:
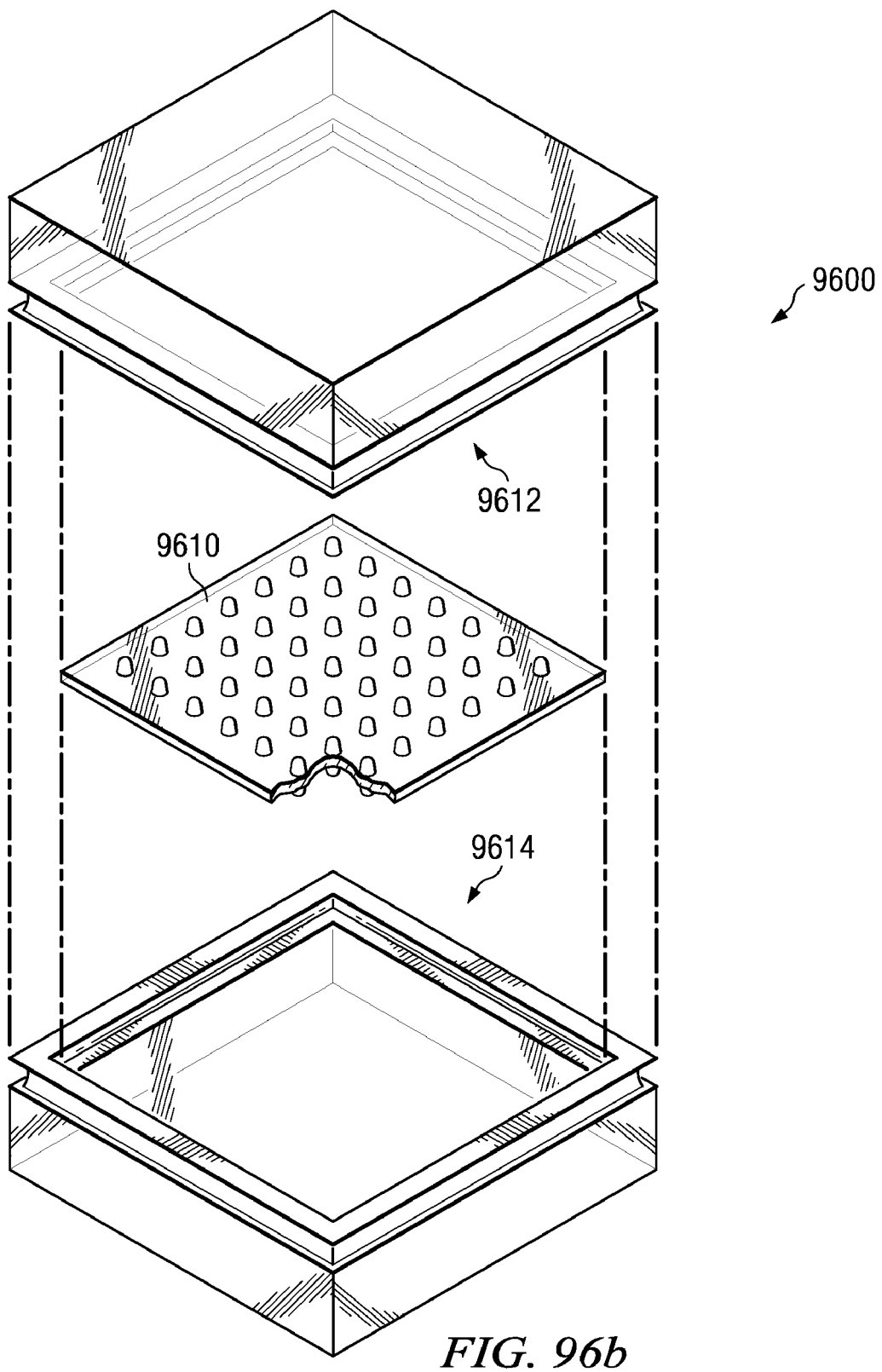
Figure 96C:
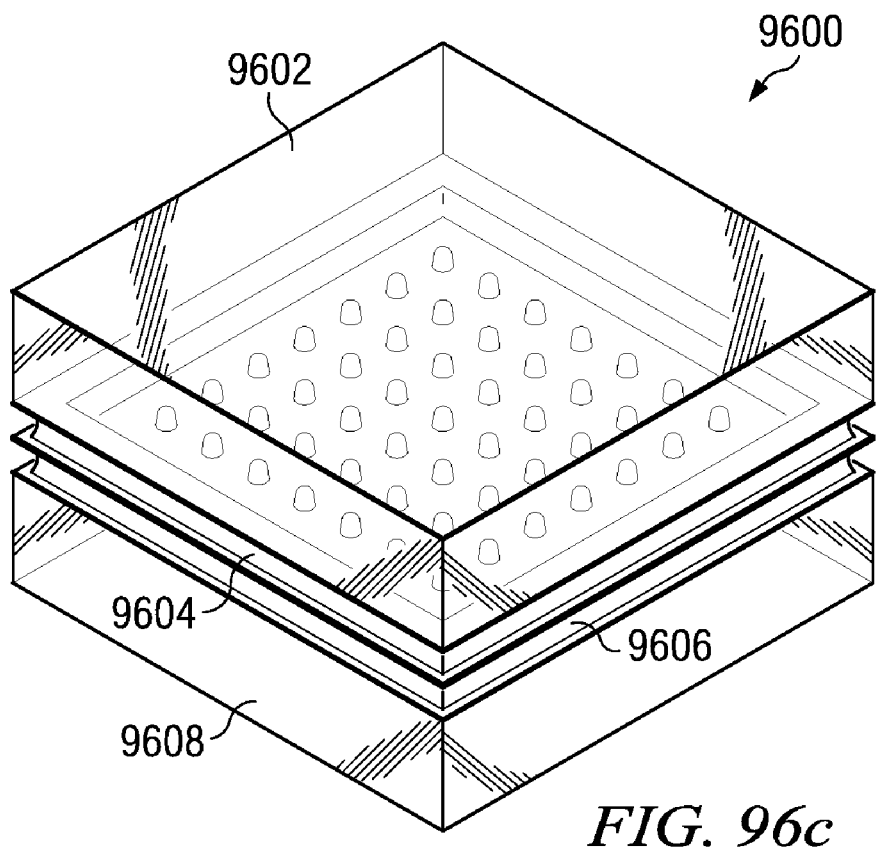

FIG. 80 is a cross-sectional view of a two-lite IGU with spacer in accordance with another embodiment;

FIG. 81 is a cross-sectional view of a three-lite gas-filled IGU in accordance with anther embodiment;

FIG. 82 is a cross-sectional view of a three-lite IGU with spacer in accordance with another embodiment;

FIG. 83 is a top view, with portions broken away, of the IGU of FIG. 80;

FIG. 84 is a cross-sectional view of a two-lite IGU with spacer in accordance with another embodiment;

FIG. 85 is an enlarged cross-sectional perspective view of the spacer and retainer bar of FIG. 84;

FIG. 86 is the spacer and retainer bar of FIG. 85 showing the connection thereof;

FIG. 87 is a cross-sectional view of a three-lite IGU with inside frame mounting and spacers in accordance with another embodiment;

FIG. 88 is an enlarged portion of the IGU of FIG. 87;

FIG. 89 is a cross-sectional view of a two-lite IGU with spacer in accordance with another embodiment;

FIG. 90 shows the IGU of FIG. 89 supported by a mounting block in accordance with another embodiment;

FIG. 91a shows the IGU and mounting block of FIG. 90 mounted in a frame;

FIG. 91b shows a unitary combined frame in accordance with another embodiment;

FIG. 92 is a perspective view of a portion of the mounting block of FIG. 90;

FIG. 93 is a top view of a portion of the mounting block of FIG. 92;

FIG. 94a shows a two-pane IGU having an anchored spacer in accordance with another embodiment;

FIG. 94b shows a two-pane IGU having no spacer in accordance with another embodiment;

FIG. 95 shows a three-pane IGU having split anchored spacers in accordance with still another embodiment; and FIGS. 96a, 96b and 96c are perspective views showing assembly of an IGU with flexible spacers in accordance with another embodiment.

DETAILED DESCRIPTION OF THE INVENTION

The current invention is described below in greater detail with reference to certain preferred embodiments illustrated in the accompanying drawings.

Figure 1:
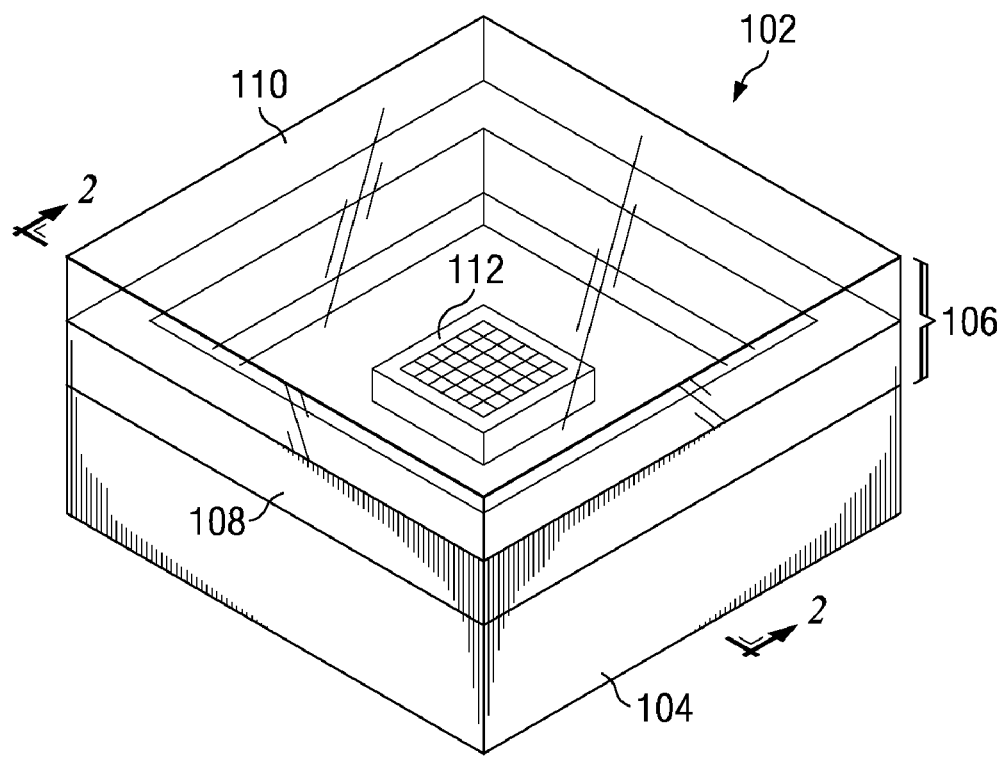
FIG. 1 is a perspective view of a hermetically sealed micro-device package.
Figure 2:
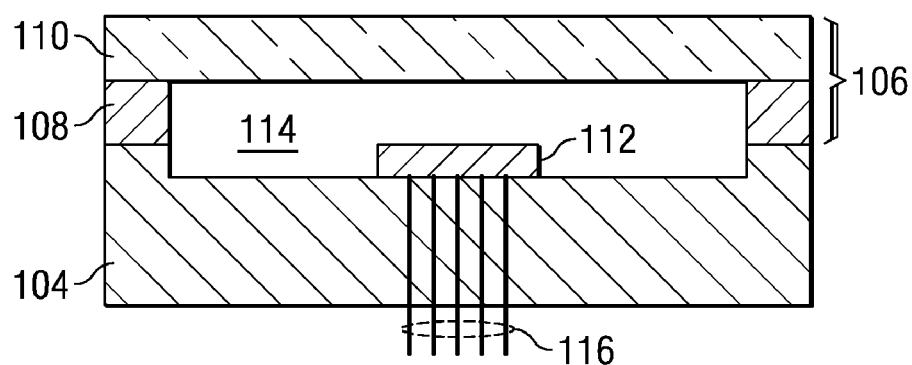
FIG. 2 is a cross-sectional view of the micro-device package of FIG. 1.

Referring now to FIGS. 1 and 2, there is illustrated a typical hermetically sealed micro-device package for housing one or more micro-devices. For purposes of this application, the term "micro-device" includes photonic devices, photovoltaic devices, optical devices (i.e., including reflective, refractive and diffractive type devices), electro-optical and electro-optics devices (EO devices), light emitting devices (LEDs), liquid crystal displays (LCDs), liquid crystal on silicon (LCOS) technologies, which include direct drive image light amplifiers (D-ILA), opto-mechanical devices, micro-opto-electromechanical systems (i.e., MOEMS) devices and micro-electromechanical systems (i.e., MEMS) devices. The package 102 comprises a base or substrate 104 which is hermetically sealed to a cover assembly 106 comprising a frame 108 and a transparent window 110. A micro-device 112 mounted on the base 104 is encapsulated within a cavity 114 when the cover assembly 106 is joined to the base 104. One or more electrical leads 116 may pass through the base 104 to carry power, ground, and signals to and from the micro-device 112 inside the package 102. It will be appreciated that the electrical leads 116 must also be hermetically sealed to maintain the integrity of the package 102. The window 110 is formed of an optically or electro-magnetically transparent material. For purposes of this application, the term "transparent" refers to materials which allow the transmission of electromagnetic radiation having predetermined wavelengths, including, but not limited to, visible light, infrared light, ultraviolet light, microwaves, radio waves, or x-rays. The frame 108 is formed from a material, typically a metal alloy, which preferably has a CTE close to that of both the window 110 and the package base 104.

Figure 3:
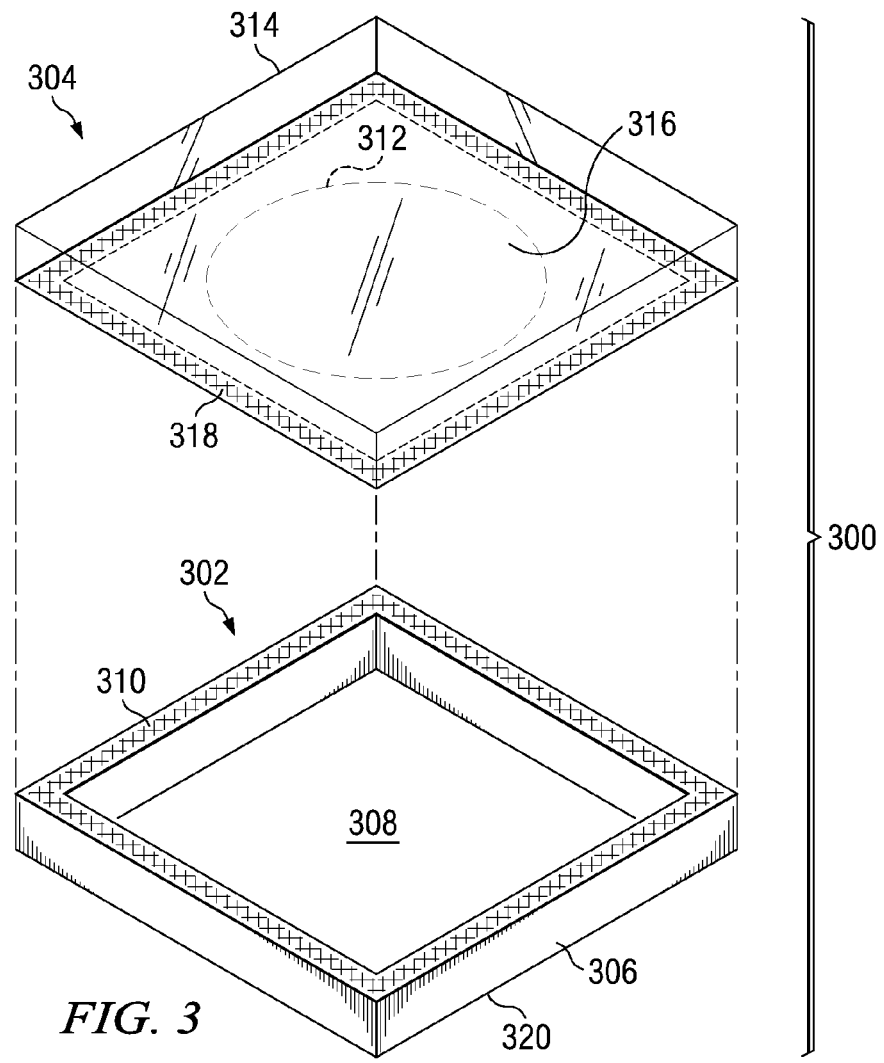
FIG. 3 is an exploded view of a cover assembly manufactured in accordance with one embodiment of the current invention.

Referring now to FIG. 3, there is illustrated an exploded view of a cover assembly manufactured in accordance with one embodiment of the current invention. The cover assembly 300 includes a frame 302 and a sheet 304 of a transparent material. The frame 302 has a continuous sidewall 306 which defines a frame aperture 308 passing therethrough. The frame sidewall 306 includes a frame seal-ring area 310 (denoted by crosshatching) circumscribing the frame aperture 308. Since the frame 302 will eventually be welded to the package base 104 (from FIGS. 1 and 2) it is usually formed of a weldable metal or alloy, preferably one having a CTE very close to that of the micro-device package base 104. In some embodiments, however, the cover assembly frame 304 may be formed of a non-metallic material such as ceramic or alumina. Regardless of whether the frame 302 is formed of a metallic or non-metallic material, the surface of the frame seal-ring area 310 is preferably metallic (e.g., metal plated if not solid metal) to facilitate the hermetic sealing of the sheet 304 to the frame. In a preferred embodiment, the frame is primarily formed of an alloy having a nominal chemical composition of 54% iron (Fe), 29% nickel (Ni) and 17% cobalt (Co). Such alloys are also known by the designation ASTM F-15 alloy and by the trade name Kovar Alloy. As used in this application, the term "Kovar Alloy" will be understood to mean the alloy having the chemical composition just described. In embodiments where a Kovar Alloy frame 302 is used, it is preferred that the surface of the frame seal-ring area 310 have a surface layer of gold (Au) overlying a layer of nickel (Ni), or a layer of nickel without the overlaying gold. The frame 302 also includes a base seal area 320 which is adapted for eventual joining, typically by welding, to the package base 104. The base seal area 320 frequently includes a layer of nickel overlaid by a layer of gold to facilitate seam welding to the package base. Although the gold over nickel surface layers are only required along the base seal-ring area 320, it will be appreciated that in many cases, for example, where solution bath plating is used to apply the surface materials, the gold over nickel layers may be applied to the entire surface of the frame 302. The sheet 304 can be any type of transparent material, for example, soft glass (e.g., soda-lime glass), hard glass (e.g. borosilicate glass), crystalline materials such as quartz and sapphire, or polymeric materials such as polycarbonate plastic. In addition to optically transparent materials, the sheet 304 may be visibly opaque but transparent to non-visible wavelengths of energy. As previously discussed, it is preferred that the material of the sheet 304 have a CTE that is similar to that of the frame 304 and of the package base 104 to which the cover assembly will eventually be attached. For many semiconductor photonic, photovoltaic, MEMS or MOEMS applications, a borosilicate glass is well suited for the material of the sheet 304. Examples of suitable glasses include Corning 7052, 7050, 7055, 7056, 7058, 7062, Kimble (Owens Corning) EN-1, and Kimble K650 and K704. Other suitable glasses include Abrisa soda-lime glass, Schott 8245 and Ohara Corporation S-LAM60.

The sheet 304 has a window portion 312 defined thereupon, i.e., this is the portion of the sheet 302 which must remain transparent to allow for the proper functioning of the encapsulated, i.e., packaged, micro-device 112. The window portion 312 of the sheet has top and bottom surfaces 314 and 316, respectively, that are optically finished in the preferred embodiment. The sheet 304 is preferably obtained with the top and bottom surfaces 314 and 316 of the window portion 312 in ready to use form, however, if necessary the material may be ground and polished or otherwise shaped to the desired surface contour and finish as a preliminary step of the manufacturing process. While in many cases the window portion 312 will have top and bottom surfaces of 314 and 316 that are optically flat and parallel to one another, it will be appreciated that in other embodiments at least one of the finished surfaces of the window portion will be contoured. A sheet seal-ring area 318 (denoted with cross-hatching) circumscribes the window portion 312 of the sheet 304, and provides a suitable surface for joining to the front seal-ring area 310.

Figure 4A:
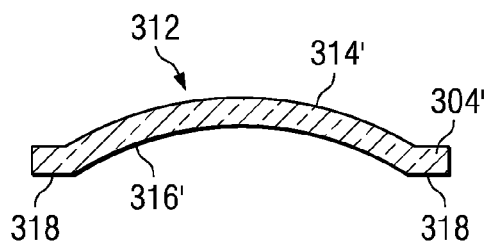
FIGS. 4a and 4b show transparent sheets having contoured sides, specifically.
Figure 4B:
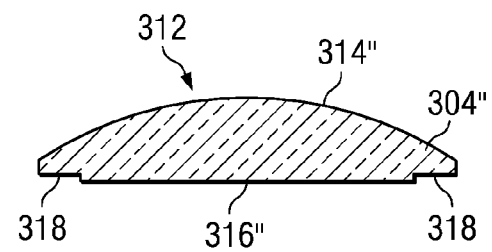

Referring now to FIGS. 4a and 4b, there are illustrated transparent sheets having contoured sides. In FIG. 4a, transparent sheet 304' has both a curved top side 314' and a curved bottom side 316' producing a window portion 312 having a curved contour with a constant thickness. In FIG. 4b, sheet 304" has a top side 314" which is curved and a bottom side 316" which is flat, thereby resulting in a window portion 312 having a plano-convex lens arrangement. It will be appreciated that in similar fashion (not illustrated) the finished surfaces 314 and 316 of the window portion 312 can have the configuration of a refractive lens including a plano-convex lens as previously illustrated, a double convex lens, a plano-concave lens or a double concave lens. Other surface contours may give the finished surfaces of the window portion 312 the configuration of a Fresnel lens or of a diffraction grating, i.e., "a diffractive lens."

In many applications, it is desirable that window portion 312 of the sheet 304 have enhanced optical or physical properties. To achieve these properties, surface treatments or coatings may be applied to the sheet 304 prior to or during the assembly process. For example, the sheet 304 may be treated with siliconoxynitride (SiOn) to provide a harder surface on the window material. Whether or not treated with SiOn, the sheet 304 may be coated with a scratch resistant/abrasion resistant material such as amorphous diamond-like carbon (DLC) such as that sold by Diamonex, Inc., under the name Diamond Shield®. Other coatings which may be applied in addition to, or instead of, the SiOn or diamond-like carbon include, but are not limited to, optical coatings, anti-reflective coatings, refractive coatings, achromatic coatings, optical filters, solar energy filters or reflectors, electromagnetic interference (EMI) and radio frequency (RF) filters of the type known for use on lenses, windows and other optical elements. It will be appreciated that the optical coatings and/or surface treatments can be applied either on the top surface 314 or the bottom surface 316, or in combination on both surfaces, of the window portion 312. It will be further appreciated, that the optical coatings and treatments just described are not illustrated in the figures due to their transparent nature.

In some applications, a visible aperture is formed around the window portion 312 of the sheet 304 by first depositing a layer of non-transparent material, e.g., chromium (Cr), sometimes coating the material over the entire surface of the sheet and then etching the non-transparent material from the desired aperture area. This procedure provides a sharply defined border to the window portion 312 which is desirable in some applications. This operation may be performed prior to or after the application of other treatments depending on the compatibility and processing economics.

The next step of the process of manufacturing the cover assembly 300 is to prepare the sheet seal-ring area 318 for metallization. The sheet seal-ring area 318 circumscribes the window portion 312 of the sheet 304, and for single aperture covers is typically disposed about the perimeter of the bottom surface 316. It will be appreciated, however, that in some embodiments the sheet seal-ring area 318 can be located in the interior portion of a sheet, for example where the sheet will be diced to form multiple cover assemblies (i.e., as described later herein). The sheet seal-ring area 318 generally has a configuration which closely matches the configuration of the frame seal-ring area 310 to which it will eventually be joined. Preparing the sheet seal-ring area 318 may involve a thorough cleaning to remove any greases, oils or other contaminants from the surface, and/or it may involve roughening the seal-ring area by chemical etching, laser ablating, mechanical grinding or sandblasting this area. This roughening increases the surface area of the sheet seal-ring, thereby providing increased adhesion for the subsequently deposited metallization materials, if the sheet seal-ring is to be metallized prior to joining to the frame seal-ring area 310 or to other substrates or device package bases.

Figure 5:
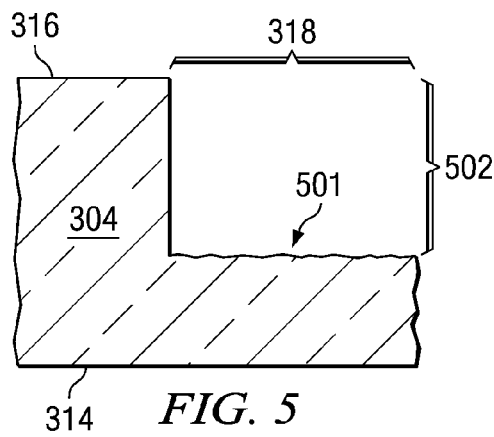
FIG. 5 shows an enlarged view of the sheet seal-ring area prior to metallization.

Referring now to FIG. 5, there is illustrated a portion of the sheet 304 which has been placed bottom side up to better illustrate the preparation of the sheet seal-ring area 318. In this example the seal-ring area 318 has been given a roughened surface 501 to improve adhesion of the metallic layers to be applied. Chemical etching to roughen glass and similar transparent materials is well known. Alternatively, laser ablating, conventional mechanical grinding or sandblasting may be used. A grinding wheel with 325 grit is believed suitable for most glass materials, while a diamond grinding wheel may be used for sapphire and other hardened materials. The depth 502 to which the roughened surface 501 of the sheet seal-ring area 318 penetrates the sheet 304 is dependent on at least two factors: first, the desired mounting height of the bottom surface 316 of the window relative to the package bottom and/or the micro-device 112 mounted inside the package; and second, the required thickness of the frame 306 including all of the deposited metal layers (described below). It is believed that etching or grinding the sheet seal-ring area 318 to a depth of 502 within the range from about 0 inches to about 0.05 inches will provide a satisfactory adhesion for the metallized layers as well as providing an easily detectable "lip" for locating the sheet 304 in the proper position against the frame 306 during subsequent joining operations.

It will be appreciated that it may be necessary or desirable to protect the finished surfaces 314 and/or 316 in the window portion 312 of the sheet (e.g., the portions that will be optically active in the finished cover assembly) from damage during the roughening process. If so, the surfaces 314 and/or 316 may be covered with semiconductor-grade "tacky tape" or other known masking materials prior to roughening. The mask material must, of course, be removed in areas where the etching/grinding will take place. Sandblasting is probably the most economical method of selectively removing strips of tape or masking material in the regions that will be roughened. If sandblasting is used, it could simultaneously perform the tape removal operation and the roughening of the underlying sheet.

Figure 6:
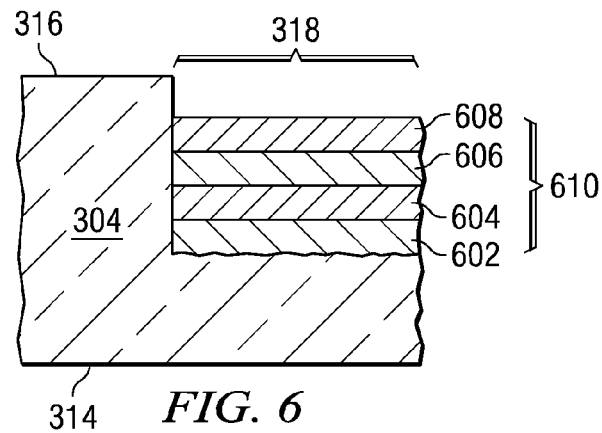
FIG. 6 shows an enlarged view of the sheet seal-ring area after metallization.

Referring now to FIG. 6, there is illustrated a view of the seal-ring area 318 of the sheet 304 after metallization. The next step of the manufacturing process may be to apply one or more metallic layers to the prepared sheet seal-ring area 318. The current invention contemplates several options for accomplishing this metallization. A first option is to apply metal layers to the sheet seal-ring area 318 using conventional chemical vapor deposition (CVD) technology. CVD technology includes atmospheric pressure chemical vapor deposition (APCVD), low pressure chemical vapor deposition (LPCVD), plasma assisted (enhanced) chemical vapor deposition (PACVD, PECVD), photochemical vapor deposition (PCVD), laser chemical vapor deposition (LCVD), metal-organic chemical vapor deposition (MOCVD) and chemical beam epitaxy (CBE). A second option for metallizing the roughened seal-ring area 318 is using physical vapor deposition (PVD) technology. PVD technology includes sputtering, ion plasma assist, thermal evaporation, vacuum evaporation, and molecular beam epitaxy (MBE). A third option for metallizing the roughened sheet seal-ring area 318 is using solution bath plating technology (SBP). Solution bath plating includes electroplating, electroless plating and electrolytic plating technology. While solution bath plating cannot be used for depositing the initial metal layer onto a nonmetallic surface such as glass or plastic, it can be used for depositing subsequent layers of metal or metal alloy to the initial layer. Further, it is envisioned that in many cases, solution bath plating will be the most cost effective metal deposition technique. Since the use of chemical vapor deposition, physical vapor deposition and solution bath plating to deposit metals and metal alloys is well known, these techniques will not be further described herein.

A fourth option for metallizing the sheet seal-ring area 318 of the sheet 304 is so-called cold-gas dynamic spray technology, also known as "cold-spray". This technology involves the spraying of powdered metals, alloys, or mixtures of metal and alloys onto an article using a jet of high velocity gas to form continuous metallic coating at temperatures well below the fusing temperatures of the powdered material. Details of the cold-gas dynamic spray deposition technology are disclosed in U.S. Pat. No. 5,302,414 to Alkhimov et al. It has been determined that aluminum provides good results when applied to glass using the cold-gas dynamic spray deposition. The aluminum layer adheres extremely well to the glass and may create a chemical bond in the form of aluminum silicate. However, other materials may also be applied as a first layer using cold-spray, including tin, zinc, silver and gold. Since the cold-gas dynamic spray technology can be used at low temperatures (e.g., near room temperature), it is suitable for metallizing materials having a relatively low melting point, such as polycarbonates or other plastics, as well as for metallizing conventional materials such as glass, alumina, and ceramics.

For the initial metallic layer deposited on the sheet 304, it is believed that any of chromium, nickel, aluminum, tin, tin-bismuth alloy, gold, gold-tin alloy can be used, this list being given in what is believed to be the order of increasing adhesion to glass. Other materials might also be appropriate. Any of these materials can be applied to the sheet seal-ring area 318 using any of the CVD or PVD technologies (e.g., sputtering) previously described. After the initial layer 602 is deposited onto the sheet seal-ring area 318 of the nonmetallic sheet 304, additional metal layers, e.g., second layer 604, third layer 606 and fourth layer 608 (as applicable) can be added by any of the deposition methods previously described, including solution bath plating. It is believed that the application of the following rules will result in satisfactory thicknesses for the various metal layers. Rule No. 1: the minimum thickness, except for the aluminum or tin-based metals or alloys which will be bonded to the gold-plated Kovar alloy frame: 0.002 microns. Rule 2: the minimum thickness for aluminum or tin-based metals or alloys deposited onto the sheet or as the final layer, which will be bonded to the gold-plated Kovar alloy frame: 0.8 microns. Rule 3: the maximum thickness for aluminum or tin-based metals or alloys deposited onto the sheet or as the final layer, which will be bonded to the gold-plated Kovar alloy frame: 63.5 microns. Rule 4: the maximum thickness for metals, other than chromium, deposited onto the sheet as the first layer and which will have other metals or alloys deposited on top of them: 25 microns. Rule 5: the maximum thickness for metals, other than chromium, deposited onto other metals or alloys as intermediate layers: 6.35 microns. Rule 6: the minimum thickness for metals or alloys deposited onto the sheet or as the final layer, which will act as the solder for attachment to the gold-plated Kovar alloy frame: 7.62 microns. Rule 7: the maximum thickness for metals or alloys deposited onto the sheet or as the final layer, which will act as the solder for attachment to the gold-plated Kovar alloy frame: 101.6 microns. Rule 8: the maximum thickness for chromium: 0.25 microns. Rule 9: the minimum thickness for gold-tin solder, applied via inkjet or supplied as a solder preform: 6 microns. Rule 10: the maximum thickness for gold-tin solder, applied via inkjet or supplied as a solder preform: 101.6 microns. Rule 11: The minimum thickness for immersion zinc; 0.889 microns. Note that the above rules apply to metals deposited using all deposition methods other than cold-gas dynamic spray deposition.

For cold spray applications, the following rules apply: Rule 1: the minimum practical thickness for any metal layer: 2.54 microns. Rule 2: the maximum practical thickness for the first layer, and all additional layers, but not including the final Kovar alloy layer: 127 microns. Rule 3: the maximum practical thickness for the final Kovar alloy layer: 12,700 microns, i.e., 0.5 inches.

By way of example, not to be considered limiting, the following metal combinations are believed suitable for seal-ring area 318 when bonding the prepared sheet 304 to a Kovar alloy-nickel-gold frame 302 (i.e., Kovar alloy core plated first with nickel and then with gold) using thermal compression (TC) bonding, or sonic, ultrasonic or thermosonic bonding.

The assembly sequence can also be to first bond the frame/spacer and window sheet together to form a hermetically sealed window unit, and later, to bond this window unit to the substrate. A third assembly sequence can also be to first bond the frame/spacer and substrate together and later, to bond this substrate/frame/spacer unit to the window. In some instances, an intermediate material, also referred to as an interlayer material, may be employed between the substrate and the frame/spacer and/or between the frame/spacer and the window sheet. It will be understood that, while the examples described herein are believed suitable for metallizing the seal-ring surface of a sheet or lens prior to bonding in applications where metallization is used, in some other embodiments employing diffusion bonding (i.e., thermal compression bonding), metallization of the seal-ring area on the sheet or lens may be omitted altogether when joining the sheet/lens to the frame or another substrate of the device package base.

Example 1

| Layers | Metal | Deposition | Min. (microns) | Max. (microns) |
|---|---|---|---|---|
| 1 | Al | CVD, PVD | 0.7 | 63.5 |

Example 2

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or SnBi | CVD, PVD, SBP | 0.7 | 63.5 |

Example 3

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

Example 4

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Sn or Sn—Bi | CVD, PVD, SBP | 0.7 | 63.5 |

Example 5

| Layers | Metal | Deposition | Min. (microns) | Max. (microns) |
|---|---|---|---|---|
| 1 | Sn (de-stressed) | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn or Sn—Bi | CVD, PVD, SBP | 0.7 | 63.5 |

Example 6

| Layers | Metal | Deposition | Min. (microns) | Max. (microns) |
|---|---|---|---|---|
| 1 | Sn—Bi | CVD, PVD | 0.7 | 63.5 |

Example 7

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn or Sn—Bi | CVD, PVD, SBP | 0.7 | 63.5 |

Example 8

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Al | CVD, PVD, SBP | 0.7 | 63.5 |

Example 9

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Zn | CVD, PVD, SBP | 0.002 | 6.35 |
| 4 | Al | CVD, PVD, SBP | 0.7 | 63.5 |

Example 10

| Layers | Metal | Deposition | Min. (microns) | Max. (microns) |
|---|---|---|---|---|
| 1 | Ni | CVD, PVD | 0.002 | 152.4 |
| 2 | Sn or Sn—Bi | CVD, PVD, SBP | 0.7 | 63.5 |

Example 11

| Layers | Metal | Deposition | Min. (microns) | Max. (microns) |
|---|---|---|---|---|
| 1 | Ni | CVD, PVD | 0.002 | 152.4 |
| 2 | Al | CVD, PVD, SBP | 0.7 | 63.5 |

Example 12

| Layers | Metal | Deposition | Min. (microns) | Max. (microns) |
|---|---|---|---|---|
| 1 | Ni | CVD, PVD | 0.002 | 152.4 |
| 2 | Zn | CVD, PVD, SBP | 0.002 | 6.35 |
| 3 | Al | CVD, PVD, SBP | 0.7 | 63.5 |

Example 13

| Layers | Metal | Deposition | Min. (microns) | Max. (microns) |
|---|---|---|---|---|
| 1 | Sn | CVD, PVD | 0.7 | 63.5 |

Example 14

| Layers | Metal | Deposition | Min. (microns) | Max. (microns) |
|---|---|---|---|---|
| 1 | Cr | CVD, PVD | 0.002 | 0.15 |

Example 15

| Layers | Metal | Deposition | Min. (microns) | Max. (microns) |
|---|---|---|---|---|
| 1 | Ni | CVD, PVD | 0.002 | 152.4 |

Example 16

| Layers | Metal | Deposition | Min. (microns) | Max. (microns) |
|---|---|---|---|---|
| 1 | Sn—Bi | CVD, PVD | 0.7 | 63.5 |

By way of further example, not to be considered limiting, the following metal combinations and thicknesses are preferred for seal-ring area 318 when bonding the prepared sheet 304 to a Kovar alloy-nickel-gold frame 302 using thermal compression (TC) bonding, or sonic, ultrasonic or thermosonic bonding.

Example 17

| Layers | Metal | Deposition | Min. (microns) | Max. (microns) |
|---|---|---|---|---|
| 1 | Al | CVD, PVD | 1 | 50.8 |

Example 18

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or SnBi | CVD, PVD, SBP | 1 | 50.8 |

Example 19

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn or Sn—Bi | CVD, PVD, SBP | 1 | 50.8 |

Example 20

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Sn or Sn—Bi | CVD, PVD, SBP | 1 | 50.8 |

Example 21

| Layers | Metal | Deposition | Min. (microns) | Max. (microns) |
|---|---|---|---|---|
| 1 | Sn (de-stressed) | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn or Sn—Bi | CVD, PVD, SBP | 1 | 50.8 |

Example 22

| Layers | Metal | Deposition | Min. (microns) | Max. (microns) |
|---|---|---|---|---|
| 1 | Sn—Bi | CVD, PVD | 1 | 50.8 |

Example 23

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn or Sn—Bi | CVD, PVD, SBP | 1 | 50.8 |

Example 24

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Al | CVD, PVD, SBP | 1 | 50.8 |

Example 25

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Zn | CVD, PVD, SBP | 0.3175 | 5.08 |
| 4 | Al | CVD, PVD, SBP | 1 | 50.8 |

Example 26

| Layers | Metal | Deposition | Min. (microns) | Max. (microns) |
|---|---|---|---|---|
| 1 | Ni | CVD, PVD | 0.1 | 5.08 |
| 2 | Sn or Sn—Bi | CVD, PVD, SBP | 1 | 50.8 |

Example 27

| Layers | Metal | Deposition | Min. (microns) | Max. (microns) |
|---|---|---|---|---|
| 1 | Ni | CVD, PVD | 0.1 | 5.08 |
| 2 | Al | CVD, PVD, SBP | 1 | 50.8 |

Example 28

| Layers | Metal | Deposition | Min. (microns) | Max. (microns) |
|---|---|---|---|---|
| 1 | Ni | CVD, PVD | 0.1 | 5.08 |
| 2 | Zn | CVD, PVD, SBP | 0.3175 | 5.08 |
| 3 | Al | CVD, PVD, SBP | 1 | 50.8 |

Example 29

| Layers | Metal | Deposition | Min. (microns) | Max. (microns) |
|---|---|---|---|---|
| 1 | Sn | CVD, PVD | 1 | 50.8 |

Example 30

| Layers | Metal | Deposition | Min. (microns) | Max. (microns) |
|---|---|---|---|---|
| 1 | Cr | CVD, PVD | 0.05 | 0.12 |

Example 31

| Layers | Metal | Deposition | Min. (microns) | Max. (microns) |
|---|---|---|---|---|
| 1 | Ni | CVD, PVD | 0.1 | 50.8 |

Example 32

| Layers | Metal | Deposition | Min. (microns) | Max. (microns) |
|---|---|---|---|---|
| 1 | Sn—Bi | CVD, PVD | 1 | 50.8 |

As indicated above, the previous examples are believed suitable for application of, among other processes, thermal compression bonding. TC bonding is a process of diffusion bonding in which two prepared surfaces are brought into intimate contact, and plastic deformation is induced by the combined effect of pressure and temperature, which in turn results in atom movement causing the development of a crystal lattice bridging the gap between facing surfaces and resulting in bonding. TC bonding can take place at significantly lower temperatures than many other forms of bonding such as braze soldering.

Figure 7:
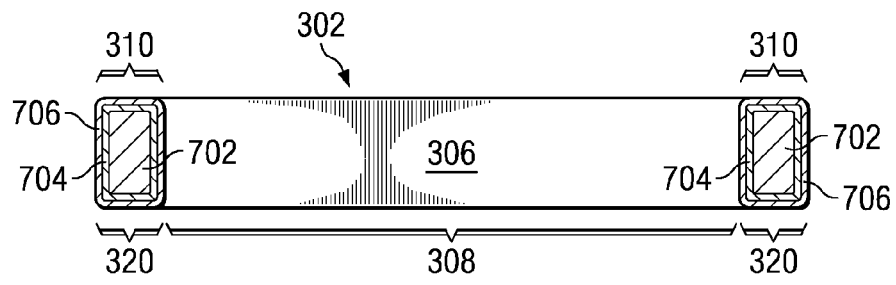
FIG. 7 shows a cross-sectional view through a pre-fabricated frame.

Referring now to FIG. 7, there is illustrated a cross-sectional view of the prefabricated frame 302 suitable for use in this embodiment. The illustrated frame 302 includes a Kovar alloy core 702, or a core of different metal or alloy, overlaid with a first metallic layer 704 of nickel which, in turn, is overlaid by an outer layer 706 of gold. The use of Kovar alloy for the core 702 of the frame 302 may be preferred where hard glass, e.g., Corning 7056 or 7058, is used for the sheet 304 and where Kovar alloy or a similar material is used for the package base 104, since these materials have a CTE for the temperature range 30° C. to 300° C. that is within the range from about $5.0 \cdot 10^{-6}/°$ K to about $5.6 \cdot 10^{-6}/°$ K (e.g. from about 5.0 to about 5.6 ppm/° K).

Referring still to FIG. 7, another step of the manufacturing process is the preparation of a prefabricated frame 302 for joining to the sheet 304. As previously described, the frame 302 includes a continuous sidewall 306 which defines an aperture 308 therethrough. The sidewall 306 includes a frame seal-ring area 310 on its upper surface and a base seal-ring area 320 on its lower surface. The frame seal-ring area 310 is generally dimensioned to conform with the sheet seal-ring area 318 of the transparent sheet 304, while the base seal-ring area 320 is generally dimensioned to conform against the corresponding seal area on the package base. The frame 302 may be manufactured using various conventional metal forming technologies, including stamping, casting, die casting, extrusion/parting, and machining. It is contemplated that stamping or die casting may be the most cost effective method for producing the frames 302. However, fabricating the frame 302 using photo-chemical machining (PCM), also known as chemical etching, may, in some instances be the most economical method. In some instances, several sheets of photo-chemical machined (i.e., etched) metals and/or alloy might be bonded together to form the frame 302. One of the bonding methods includes TC bonding, also known as diffusion bonding, the PCM'd layers together to create the frame 302. Depending upon the degree of flatness required for the contemplated bonding procedure and the degree achieved by a particular frame manufacturing method, surface grinding, and possibly even lapping or polishing, may be required on the frame seal-ring area 310 or base seal-ring area 320, to provide the final flatness necessary for a successful hermetic seal.

In this example, the base seal-ring area 320 is on the frame face opposite frame seal-ring area 310, and may utilize the same layers of nickel 704 overlaid by gold 706 to facilitate eventual welding to the package base 104. In some instances, the gold 706 will not be overlaid on the nickel 704.

In some embodiments, the frame 302 will serve as a "heat sink" and/or "heat spreader" when the cover assembly 300 is eventually welded to the package base 104. It is contemplated that conventional high temperature welding processes (e.g., manual or automatic electrical resistance seam welding or laser welding) may be used for this operation. If the metallized glass sheet 304 were welded directly to the package base 104 using these welding processes, the concentrated heat could cause thermal stresses likely to crack the glass sheet or distort its optical properties. However, when a metal frame is attached to the transparent sheet, it acts as both a heat sink, absorbing some of the heat of welding, and as a heat spreader, distributing the heat over a wider area such that the thermal stress on the transparent sheet 304 is reduced to minimize the likelihood of cracking or optical distortion. Kovar alloy is especially useful in this heat sink and heat spreading role as explained by Kovar alloy's thermal conductivity, 0.0395, which is approximately fourteen times higher than the thermal conductivity of Corning 7052 glass, 0.0028.

Another important aspect of the frame 302 is that it should be formed from a material having a CTE that is similar to the CTE of the transparent sheet 304 and the CTE of the package base 104. This matching of CTE between the frame 302, transparent sheet 304 and package base 104 is beneficial to minimize stresses between these components after they are joined to one another so as to ensure the long term reliability of the hermetic seal therebetween under conditions of thermal cycling and/or thermal shock environments.

For window assemblies that will be attached to package bases formed of ceramic, alumina or Kovar alloy, Kovar alloy is preferred for use as the material for the frame 304. Although Kovar alloy will be used for the frames in many of the embodiments discussed in detail herein, it will be understood that Kovar alloy is not necessarily suitable for use with all transparent sheet materials. Additionally, other frame materials besides Kovar alloy may be suitable for use with glass. Suitability is determined by the desire that the material of the transparent sheet 304, the material of the frame 302 and the material of the package base 104 all have closely matching CTEs to insure maximum long-term reliability of the hermetic seals.

Figure 8:
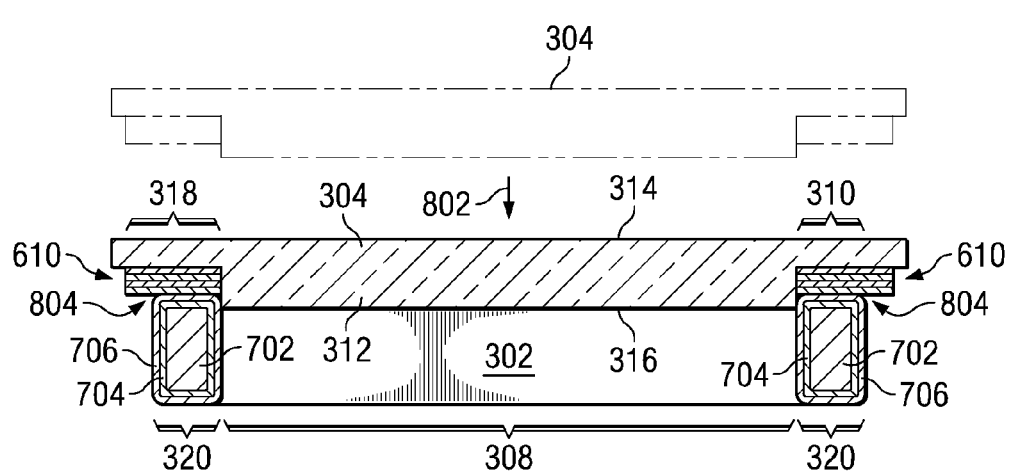
FIG. 8 illustrates placing the frame against the metallized sheet prior to bonding.

Referring now to FIG. 8, the next step of the manufacturing process is to position the frame 302 against the sheet 304 such that at least a portion of the frame seal-ring area 310 and a least a portion of the sheet seal-ring area 318 contact one another along a continuous junction region 804 that circumscribes the window portion 312. Actually, in some cases a plasma-cleaning operation and/or a solvent or detergent cleaning operation is performed on the seal-ring areas and any other sealing surfaces just prior to joining the components to ensure maximum reliability of the joint. In FIG. 8, the sheet 304 moves from its original position (denoted in broken lines) until it is in contact with the frame 302. It is, of course, first necessary to remove any remaining tacky tape or other masking materials left over from operations used to prepare the sheet seal-ring area 318 if they cannot withstand the elevated temperatures encountered in the joining process without degradation of the mask material and/or its adhesive, if an adhesive is used to attach the mask to the sheet. It will be appreciated that it is not necessary that the sheet seal-ring area 318 and the frame seal-ring area 310 have an exact correspondence with regard to their entire areas, rather, it is only necessary that there be some correspondence between the two seal-ring areas forming a continuous junction region 804 which circumscribes the window portion 312. In the embodiment illustrated in FIG. 8, the metallized layers 610 in the sheet seal-ring area 318 are much wider than the plated outer layer 706 of the frame seal-ring area 310. Further, the window portion 312 of the sheet 304 extends partway through the frame aperture 308, providing a means to center the sheet 304 on the frame 302.

The next step of the manufacturing process is to heat the junction region 804 until a joint is formed between the frame 302 and the sheet 304 all along the junction region, whereby a hermetic seal circumscribing the window portion 312 is formed. It is necessary that during the step of heating the junction region 804, the temperature of the window portion 312 of the sheet 304 remain below its glass transition temperature, $T_G$ as well as below the softening temperature of the sheet 304, to prevent damage to the finished surfaces 314 and 316. The softening point for glass is defined as the temperature at which the glass has a viscosity of 107.6 dPa s or 107.6 poise (method of measurement: ISO 7884-3). The current invention contemplates several options for accomplishing this heating. A first option is to utilize thermal compression (TC) bonding, also known as diffusion bonding, including conventional hot press bonding as well as Hot Isostatic Press or Hot Isostatic Processing (HIP) diffusion bonding. As previously described, TC bonding, also known as diffusion bonding involves the application of high pressures to the materials being joined such that a reduced temperature is required to produce the necessary diffusion bond. Rules for determining the thickness and composition of the metallic layers 610 on the sheet 304 were previously provided, for TC bonding to, e.g., a Kovar alloy, nickel or gold frame such as illustrated in FIG. 7. The estimated process parameters for the TC bonding of a Kovar alloy/nickel/gold frame 302 to a metallized sheet 304 having aluminum as the final layer would be a temperature of approximately 380° C. at an applied pressure of approximately 95,500 psi (6713.65 kg/cm$^2$). Under these conditions, the gold plating 706 on the Kovar alloy frame 302 will diffuse into/with the aluminum layer, e.g., layer 4 in Example 7. Since the 380° C. temperature necessary for TC bonding is below the approximately 500° C. to 900° C. $T_G$ for hard glasses such as Corning 7056, the TC bonding process could be performed in a single or batch mode by fixturing the cover assembly components 302, 304 together in compression and placing the compressed assemblies into a furnace (or oven, etc.) at approximately 380° C. The hermetic bond would be obtained without risking the finished surfaces 314 and 316 of the window portion 312. Vacuum, sometimes with some small amounts of specific gasses included, or other atmospheres with negative or positive pressures might be needed inside the furnace to promote the TC bonding process.

Alternatively, employing resistance welding at the junction area 804 to add additional heat in addition to the TC bonding could allow preheating the window assemblies to less than 380° C. and possibly reduce the overall bonding process time. In another method, the TC bonding could be accomplished by fixturing the cover assembly components 302 and 304 using heated tooling that would heat the junction area 304 by conduction. In yet another alternative method, electrical resistance welding can be used to supply 100% of the heat required to achieve the necessary TC bonding temperature, thereby eliminating the need for furnaces, ovens, etc. or specialized thermally conductive tooling.

After completion of TC bonding or other welding processes, the window assembly 300 is ready for final processing, for example, chamfering the edges of the cover assembly to smooth them and prevent chipping, scratching, marking, etc., during post-assembly, cleaning, marking or other operations. In some instances, the final processing may include the application of a variety of coatings to the window and/or to the frame.

Figure 9:
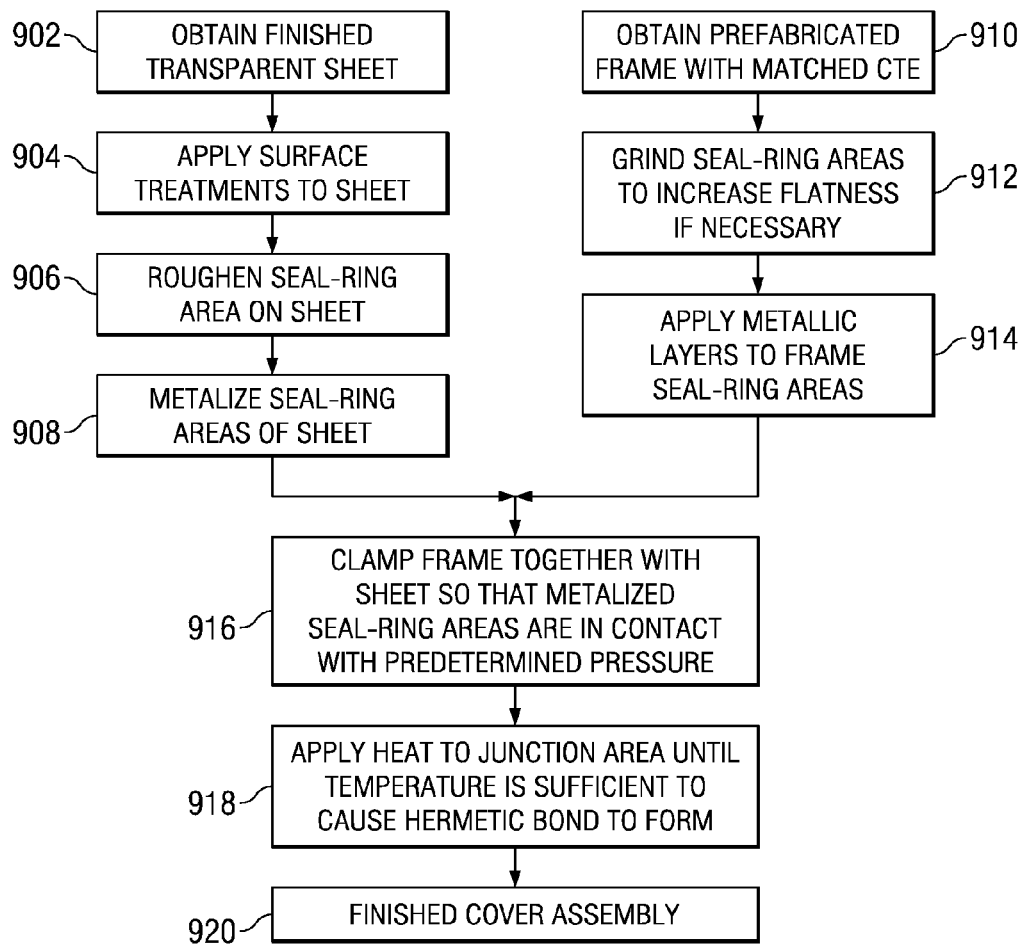
FIG. 9 is a block diagram of a process for manufacturing cover assemblies using prefabricated frames in accordance with one embodiment.

Referring now to FIG. 9, there is illustrated a block diagram of the manufacturing process just described in accordance with one embodiment of the current invention. Block 902 represents the step of obtaining a sheet of transparent material, e.g. glass or other material, having finished top and bottom surfaces as previously described. The process then proceeds to block 904 as indicated by the arrow.

Block 904 represents the step of applying surface treatments to the sheet, e.g., scratch-resistant or anti-reflective coatings, as previously described. In addition to these permanent surface treatments, block 904 also represents the sub-steps of applying tape or other temporary masks to the surfaces of the sheet to protect them during the subsequent steps of the process. It will be appreciated that the steps represented by block 904 are optional and that one or more of these steps may not be present in every embodiment of the invention. The process then proceeds to block 906 as indicated by the arrow.

Block 906 represents the step of preparing the seal-ring area on the sheet to provide better adhesion for the metallic layers, if such metallic layers are used. This step usually involves roughening the seal-ring area using chemical etching, mechanical grinding, laser ablating or sandblasting as previously described. To the extent necessary, block 906 also represents the sub-steps of removing any masking material from the seal-ring area. Block 906 further represents the optional steps of cleaning the sheet (or at least the seal-ring area of the sheet) to remove any greases, oils or other contaminants from the surface of the sheet. As previously discussed, such cleaning steps may be performed regardless of whether the seal-ring area is to be metallized (i.e., to promote better adhesion of the metallic layers) or is to be left unmetallized (i.e., to promote better diffusion bonding of the unmetallized sheet). It will be appreciated that the steps represented by block 906 are optional and that some or all of these steps may not be present in every embodiment of the invention. The process then proceeds to block 908 as indicated by the arrow.

Block 908 represents the step of metallizing the seal-ring areas of the sheet. The step represented by block 908 is mandatory only when the desired bond of sheet 304 to frame 302 is a metal-to-metal bond since at least one metallic layer must be applied to the seal-ring area of the sheet. It is possible, for instance by use of diffusion bonding processes, to bond the sheet 304 to frame 302 without first metallizing sheet 304. In most embodiments, block 908 will represent numerous sub-steps for applying successive metallic layers to the sheet, where the layers of each sub-step may be applied by processes including CVD, PVD, cold-spray or solution bath plating as previously described. Following the steps represented by block 908, the sheet is ready for joining to the frame. However, before the process can proceed to this joining step (i.e., block 916), a suitable frame must first be prepared.

Block 910 represents the step of obtaining a pre-fabricated frame, preferably having a CTE that closely matches the CTE of the transparent sheet from block 902 and the CTE of the package base. In most cases where the base is alumina or Kovar alloy, a frame formed of Kovar alloy will be suitable. As previously described, the frame may be formed using, e.g., stamping, die-casting or other known metal-forming processes. The process then proceeds to block 912 as indicated by the arrow.

Block 912 represents the step of grinding, polishing and/or otherwise flattening the seal-ring areas of the frame as necessary to increase its flatness so that it will fit closely against the seal-ring areas of the transparent sheet. It will be appreciated that the steps represented by block 912 are optional and may not be necessary or present in every embodiment of the invention. The process then proceeds to block 914 as indicated by the arrow.

Block 914 represents the step of applying additional metallic layers to the seal-ring areas of the frame. These metallic layers are sometimes necessary to achieve compatible chemistry for bonding with the metallized seal-ring areas of the transparent sheet. In most embodiments, block 914 will represent numerous sub-steps for applying successive metallic layers to the frame. Block 914 further represents the optional steps of cleaning the frame (or at least the seal-ring area of the frame) to remove any greases, oils or other contaminants from the surface of the frame. As previously discussed, such cleaning steps may be performed regardless of whether the seal-ring area of the frame is to be metallized with additional metal layers or is to be used without additional metallization. Once the steps represented by block 914 are completed, the frame is ready for joining to the transparent sheet. Thus, the results of process block 908 and block 914 both proceed to block 916 as indicated by the arrows.

Block 916 represents the step of clamping the prepared frame together with the prepared transparent sheet so that their respective metallized seal-ring areas are in contact with one another under conditions producing a predetermined contact pressure at the junction region circumscribing the window portion. This predetermined contact pressure between the seal-ring surfaces allows thermal compression (TC) bonding of the metallized surfaces to occur at a lower temperature than would be required for conventional welding (including most soldering and brazing processes). The process then proceeds to block 918 as indicated by the arrow.

Block 918 represents the step of applying heat to the junction between the frame and the transparent sheet while maintaining the predetermined contact pressure until the temperature is sufficient to cause thermal compression bonding to occur. In some embodiments, block 918 will represent a single heating step, e.g. heating the fixtured assembly in a furnace. In other embodiments, block 918 will represent several sub-steps for applying heat to the junction area, for example, first preheating the fixtured assembly (e.g. in a furnace) to an intermediate temperature, and then using resistance welding techniques along the junction to raise the temperature of the localized area of the metallic layers the rest of the way to the temperature where thermal compression bonding will occur. The thermal compression bonding creates a hermetic seal between the transparent sheet material and the frame. The process then proceeds to block 920 as indicated by the arrow.

In the illustrated example, metallized seal-ring areas are joined using diffusion bonding/thermal compression bonding in which the predetermined pressure is applied first (block 916) and the heat is applied second (block 918). It will be appreciated, however, that the use of diffusion bonding is not limited to these specific conditions. In some other embodiments, the sheet and/or frame may not be metallized prior to bonding. In still other embodiments, the heat may be applied first until the desired bonding temperature is reached, and the predetermined pressure may be applied thereafter until the diffusion bond is formed. In yet additional embodiments, the heat and pressure may be applied simultaneously until the diffusion bond is formed.

Block 920 represents the step of completing the window assembly. Block 920 may represent merely cooling the window assembly after thermal compression bonding, or it may represent additional finishing processes including chamfering the edges of the assembly to prevent chipping, cracking, etc., marking the assembly, coating the window and/or the frame with one or more materials, or other post-assembly procedures. The process of this embodiment has thus been described.

It will be appreciated that in alternative embodiments of the invention, conventional welding techniques (including soldering and/or brazing) may be used instead of thermal compression bonding to join the frame to the transparent sheet. In such alternative embodiments, the steps represented by blocks 916 and 918 of FIG. 9 would be replaced by the steps of fixturing the frame and transparent sheet together so that the metallized seal-ring areas are in contact with one another (but not necessarily producing a predetermined contact pressure along the junction) and then applying heat to the junction area using conventional means until the temperature is sufficient to cause the melting and diffusing of the metallic layers necessary to achieve the welded bond.

In an alternative embodiment, braze-soldering is used to join the frame 302 to the metallized sheet 304. In this embodiment, a solder metal or solder alloy may be utilized as the final layer of the metallic layers 610 on the metallized sheet 304, and clamping the sheet 304 to the frame 302 at a high predetermined contact pressure is not required. A solder metal or solder alloy preform may be utilized as a separate, intermediate item between the frame 302 and the sheet 304 instead of having a solder metal or solder alloy as the final layer of the metallic layers 610 on the metallized sheet 304. Light to moderate clamping pressure can be used: 1) to insure alignment during the solder's molten phase; and 2) to promote even distribution of the molten solder all along the junction region between the respective seal-ring areas; thereby helping to insure a hermetic seal, however, this clamping pressure does not contribute to the bonding process itself as in TC bonding. In most other respects, however, this embodiment is substantially similar to that previously described.

The following examples, not to be considered limiting, are provided to illustrate the details of the metallic layers 610 in the sheet seal-ring area 318 that are suitable for braze-soldering to a Kovar alloy/nickel/gold frame 302 such as that illustrated in FIG. 7.

Example 33

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

Example 34

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

Example 35

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

Example 36

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

Example 37

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Eutectic Au—Sn solder | CVD, PVD, SBP | 1.27 | 127 |

Example 38

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Eutectic Au—Sn solder | CVD, PVD, SBP | 1.27 | 127 |

Example 39

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi solder | CVD, PVD, SBP | 1.27 | 152.4 |

Example 40

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi solder | CVD, PVD, SBP | 1.27 | 152.4 |

Example 41

| Layers | Metal | Deposition | Min. (microns) | Max. (microns) |
|---|---|---|---|---|
| 1 | Cr | CVD, PVD | 0.002 | 0.15 |
| 2 | Sn—Bi solder | CVD, PVD, SBP | 1.27 | 152.4 |

Example 42

| Layers | Metal | Deposition | Min. (microns) | Max. (microns) |
|---|---|---|---|---|
| 1 | De-stressed Sn Solder | CVD, PVD | 1.27 | 152.4 |

Example 43

| Layers | Metal | Deposition | Min. (microns) | Max. (microns) |
|---|---|---|---|---|
| 1 | Sn—Bi Solder | CVD, PVD | 1.27 | 152.4 |

Example 44

| Layers | Metal | Deposition | Min. (microns) | Max. (microns) |
|---|---|---|---|---|
| 1 | Eutectic Au—Sn Solder | CVD, PVD | 1.27 | 127 |

Example 45

| Layers | Metal | Deposition | Min. (microns) | Max. (microns) |
|---|---|---|---|---|
| 1 | Ni | CVD, PVD | 0.002 | 152.4 |
| 2 | Eutectic Au—Sn Solder | CVD, PVD, SBP | 1.27 | 127 |

Example 46

| Layers | Metal | Deposition | Min. (microns) | Max. (microns) |
|---|---|---|---|---|
| 1 | Ni | CVD, PVD | 0.002 | 152.4 |
| 2 | Sn—Bi Solder | CVD, PVD, SBP | 1.27 | 152.4 |

While numerous examples herein show the use of eutectic Au—Sn, other applications may utilize non-eutectic Au—Sn, or other eutectic or non-eutectic solders for attaching the window. This allows subsequent use of a higher melting temperature solder to attach the unit to a higher level assembly without melting the window bond.

By way of further examples, not to be considered limiting, the following combinations are preferred for the metallic layers 610 in the sheet seal-ring area 318 for braze-soldering to a Kovar alloy/nickel/gold frame 302 such as that illustrated in FIG. 7.

Example 47

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Eutectic Au—Sn solder | CVD, PVD, SBP | 2.54 | 63.5 |

Example 47a

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Cu—Ag Solder | CVD, PVD, SBP | 2.54 | 63.5 |

Example 48

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi solder | CVD, PVD, SBP | 2.54 | 127 |

Example 49

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

Example 49a

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Cu—Ag Solder | CVD, PVD, SBP | 2.54 | 63.5 |

Example 50

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

Example 51

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Eutectic Au—Sn solder | CVD, PVD, SBP | 2.54 | 63.5 |

Example 51a

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Cu—Ag Solder | CVD, PVD, SBP | 2.54 | 63.5 |

Example 52

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Eutectic Au—Sn solder | CVD, PVD, SBP | 2.54 | 63.5 |

Example 52a

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Cu—Ag Solder | CVD, PVD, SBP | 2.54 | 63.5 |

Example 53

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi solder | CVD, PVD, SBP | 2.54 | 127 |

Example 54

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi solder | CVD, PVD, SBP | 2.54 | 127 |

Example 55

| Layers | Metal | Deposition | Min. (microns) | Max. (microns) |
|---|---|---|---|---|
| 1 | Cr | CVD, PVD | 0.05 | 0.12 |
| 2 | Sn—Bi solder | CVD, PVD, SBP | 2.54 | 127 |

Example 56

| Layers | Metal | Deposition | Min. (microns) | Max. (microns) |
|---|---|---|---|---|
| 1 | De-stressed Sn Solder | CVD, PVD | 2.54 | 127 |

Example 57

| Layers | Metal | Deposition | Min. (microns) | Max. (microns) |
|---|---|---|---|---|
| 1 | Sn—Bi Solder | CVD, PVD | 2.54 | 127 |

Example 58

| Layers | Metal | Deposition | Min. (microns) | Max. (microns) |
|---|---|---|---|---|
| 1 | Eutectic Au—Sn Solder | CVD, PVD | 2.54 | 63.5 |

Example 58a

| Layers | Metal | Deposition | Min. (microns) | Max. (microns) |
|---|---|---|---|---|
| 1 | Sn—Cu—Ag Solder | CVD, PVD | 2.54 | 63.5 |

Example 59

| Layers | Metal | Deposition | Min. (microns) | Max. (microns) |
|---|---|---|---|---|
| 1 | Ni | CVD, PVD | 0.1 | 5.08 |
| 2 | Eutectic Au—Sn Solder | CVD, PVD, SBP | 2.54 | 63.5 |

Example 59a

| Layers | Metal | Deposition | Min. (microns) | Max. (microns) |
|---|---|---|---|---|
| 1 | Ni | CVD, PVD | 0.1 | 5.08 |
| 2 | Sn—Cu—Ag Solder | CVD, PVD, SBP | 2.54 | 63.5 |

Example 60

| Layers | Metal | Deposition | Min. (microns) | Max. (microns) |
|---|---|---|---|---|
| 1 | Ni | CVD, PVD | 0.1 | 5.08 |
| 2 | Sn—Bi Solder | CVD, PVD, SBP | 2.54 | 127 |

Figure 10:
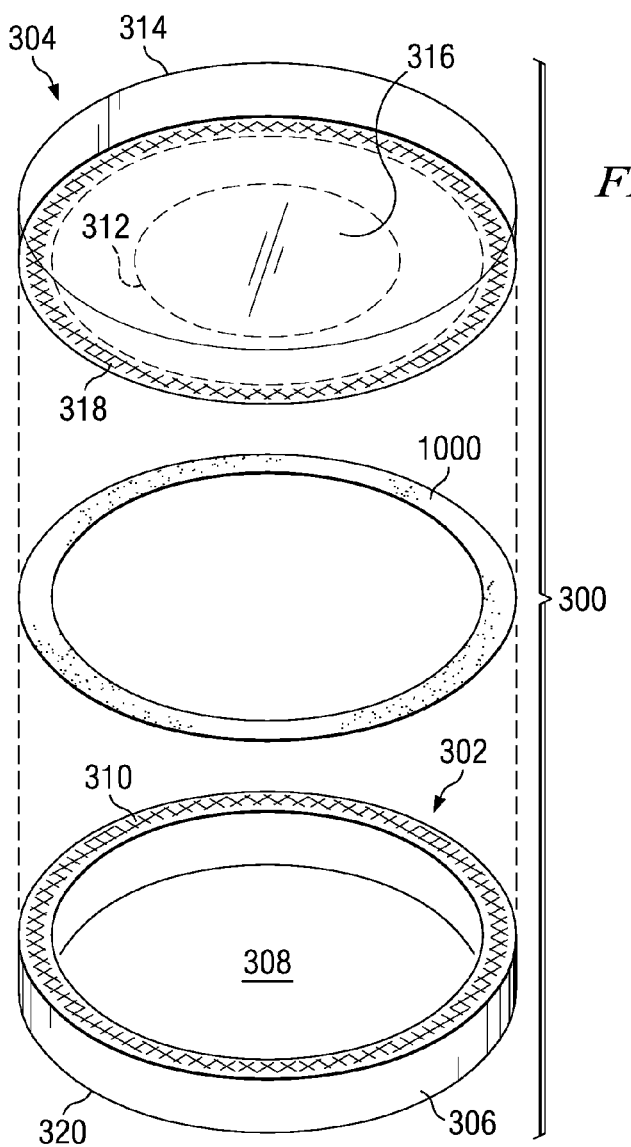
FIG. 10 is an exploded view of a cover assembly manufactured using a solder preform.

Referring now to FIG. 10, there is illustrated yet another embodiment of the current invention. Note that in this embodiment, the cover assembly 300 is circular in configuration rather than rectangular. It will be appreciated that this is simply another possible configuration for a cover assembly manufactured in accordance with this invention, and that this embodiment is not limited to configurations of any particular shape. As in the embodiment previously described, this embodiment also uses braze-soldering to hermetically join the transparent sheet 304 to the frame 302. However, in this embodiment, the solder for braze soldering is provided in the form of a separate solder preform 1000 having the shape of the sheet seal-ring area 318 or the frame seal-ring area 310. Also in this embodiment, preform 1000 can be of materials other than solder for use as an innerlayer or interlayer material between the transparent sheet 304 and the frame 302. When used as the innerlayer or interlayer for TC bonding, one or more elements of preform 1000 diffuses with one or more elements of sheet 304 and the frame 302.

In this embodiment, when the preform solder 1000 is used for braze-soldering to hermetically join the transparent sheet 304 to the frame 302, instead of positioning the frame and the sheet directly against one another, the frame 302 and the sheet 304 are instead positioned against opposite sides of the solder preform 1000 such that the solder preform is interposed between the frame seal-ring area 310 and the sheet seal-ring are 318 along a continuous junction region that circumscribes the window portion 312. After the frame 302 and sheet 304 are positioned against the solder preform 1000, the junction region is heated until the solder preform fuses forming a solder joint between the frame and sheet all along the junction region. The heating of the junction region may be performed by any of the procedures previously described, including heating or preheating in a furnace, oven, etc., either alone or in combination with other heating methods including resistance welding. It is required that during the step of heating the junction region, the temperature of the window portion 312 of the sheet 304 remain below the glass transition temperature $T_G$ and the softening temperature such that the finished surfaces 314 and 316 on the sheet are not adversely affected.

The current embodiment using a solder preform 1000 can be used for joining a metallized sheet 304 to a Kovar alloy/nickel/gold frame such as that illustrated in FIG. 7. In accordance with a preferred embodiment, the solder preform 1000 is formed of a gold-tin (Au—Sn) alloy, and in a more preferred embodiment, the gold-tin alloy is the eutectic composition. One of the alternative alloys for preform 1000 is tin-copper-silver (Sn—Cu—Ag). The thickness of the gold-tin preform 1000 will probably be within the range from about 6 microns to about 101.2 microns. The thickness of other alloys for preform 1000 will also probably be within the range of about 6 microns to about 101.2 microns.

The following examples, not to be considered limiting, are provided to illustrate the details of the metallic layers 610 and the sheet seal-ring area 318 that are suitable for braze-soldering to a Kovar alloy/nickel/gold frame in combination with a gold-tin solder preform or other suitable solder alloy preforms, including, but not limited to tin-copper-silver alloys.

Example 61

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

Example 62

| Layers | Metal | Deposition | Min. (microns) | Max. (microns) |
|---|---|---|---|---|
| 1 | Al | CVD, PVD | 0.002 | 25 |
| 2 | Cu | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

Example 63

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

Example 64

| Layers | Metal | Deposition | Min. (microns) | Max. (microns) |
|---|---|---|---|---|
| 1 | Al | CVD, PVD | 0.002 | 25 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

Example 65

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Au | CVD, PVD, SBP | 0.0508 | 0.508 |

Example 66

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Au | CVD, PVD, SBP | 0.0508 | 0.508 |

Example 67

| Layers | Metal | Deposition | Min. (microns) | Max. (microns) |
|---|---|---|---|---|
| 1 | Cr | CVD, PVD | 0.002 | 0.15 |
| 2 | Zn | CVD, PVD, SBP | 0.002 | 6.35 |
| 3 | Ni | CVD, PVD, SBP | 0.002 | 6.35 |
| 4 | Sn—Bi | CVD, PVD, SBP | 0.635 | 12.7 |

Example 68

| Layers | Metal | Deposition | Min. (microns) | Max. (microns) |
|---|---|---|---|---|
| 1 | Cr | CVD, PVD | 0.002 | 0.15 |
| 2 | Ni | CVD, PVD, SBP | 0.002 | 6.35 |
| 3 | Sn—Bi | CVD, PVD, SBP | 0.635 | 12.7 |

Example 69

| Layers | Metal | Deposition | Min. (microns) | Max. (microns) |
|---|---|---|---|---|
| 1 | Cr | CVD, PVD | 0.002 | 0.15 |
| 2 | Sn—Bi | CVD, PVD, SBP | 0.635 | 12.7 |

Example 70

| Layers | Metal | Deposition | Min. (microns) | Max. (microns) |
|---|---|---|---|---|
| 1 | Cr | CVD, PVD | 0.002 | 0.15 |

Example 71

| Layers | Metal | Deposition | Min. (microns) | Max. (microns) |
|---|---|---|---|---|
| 1 | De-stressed Sn or Sn—Bi | CVD, PVD | 0.635 | 12.7 |

Example 72

| Layers | Metal | Deposition | Min. (microns) | Max. (microns) |
|---|---|---|---|---|
| 1 | Au | CVD, PVD | 0.0508 | 0.508 |

Example 73

| Layers | Metal | Deposition | Min. (microns) | Max. (microns) |
|---|---|---|---|---|
| 1 | Ni | CVD, PVD | 0.002 | 152.4 |
| 2 | Au | CVD, PVD, SBP | 0.0508 | 0.508 |

Example 74

| Layers | Metal | Deposition | Min. (microns) | Max. (microns) |
|---|---|---|---|---|
| 1 | Ni | CVD, PVD | 0.002 | 152.4 |
| 2 | Sn—Bi | CVD, PVD, SBP | 0.635 | 12.7 |

Example 75

| Layers | Metal | Deposition | Min. (microns) | Max. (microns) |
|---|---|---|---|---|
| 1 | Ni | CVD, PVD | 0.002 | 152.4 |
| 2 | Sn (De-stressed after deposition) | CVD, PVD, SBP | 0.635 | 12.7 |

By way of further examples, not to be considered limiting, the following combinations are preferred for the metallic layers 610 and the sheet seal-ring area 318 for braze-soldering to a Kovar alloy/nickel/gold frame in combination with a gold-tin soldered preform. In addition to having a frame of Kovar alloy/nickel/gold, materials other than Kovar may be employed as the frame's base material and the overlying layer or layers may be nickel without the gold, or combinations of two or more metals including, but not limited to nickel and gold.

Example 76

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Au | CVD, PVD, SBP | 0.127 | 0.381 |

Example 77

| Layers | Metal | Deposition | Min. (microns) | Max. (microns) |
|---|---|---|---|---|
| 1 | Al | CVD, PVD | 0.1 | 2.54 |
| 2 | Cu | CVD, PVD, SBP | 0.25 | 2.54 |
| 3 | Ni | CVD, PVD, SBP | 1 | 5.08 |
| 4 | Sn—Bi | CVD, PVD, SBP | 2.54 | 7.62 |

Example 78

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

Example 79

| Layers | Metal | Deposition | Min. (microns) | Max. (microns) |
|---|---|---|---|---|
| 1 | Al | CVD, PVD | 0.1 | 2.54 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

Example 80

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Au | CVD, PVD, SBP | 0.127 | 0.381 |

Example 81

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Au | CVD, PVD, SBP | 0.127 | 0.381 |

Example 82

| Layers | Metal | Deposition | Min. (microns) | Max. (microns) |
|---|---|---|---|---|
| 1 | Cr | CVD, PVD | 0.05 | 0.12 |
| 2 | Zn | CVD, PVD, SBP | 0.3175 | 5.08 |
| 3 | Ni | CVD, PVD, SBP | 1 | 5.08 |
| 4 | Sn—Bi | CVD, PVD, SBP | 2.54 | 7.62 |

Example 83

| Layers | Metal | Deposition | Min. (microns) | Max. (microns) |
|---|---|---|---|---|
| 1 | Cr | CVD, PVD | 0.05 | 0.12 |
| 2 | Ni | CVD, PVD, SBP | 1 | 5.08 |
| 3 | Sn—Bi | CVD, PVD, SBP | 2.54 | 7.62 |

Example 84

| Layers | Metal | Deposition | Min. (microns) | Max. (microns) |
|---|---|---|---|---|
| 1 | Cr | CVD, PVD | 0.05 | 0.12 |
| 2 | Sn—Bi | CVD, PVD, SBP | 2.54 | 7.62 |

Example 85

| Layers | Metal | Deposition | Min. (microns) | Max. (microns) |
|---|---|---|---|---|
| 1 | Cr | CVD, PVD | 0.05 | 0.12 |

Example 86

| Layers | Metal | Deposition | Min. (microns) | Max. (microns) |
|---|---|---|---|---|
| 1 | De-stressed Sn or Sn—Bi | CVD, PVD | 2.54 | 7.62 |

Example 87

| Layers | Metal | Deposition | Min. (microns) | Max. (microns) |
|---|---|---|---|---|
| 1 | Au | CVD, PVD | 0.127 | 0.381 |

Example 88

| Layers | Metal | Deposition | Min. (microns) | Max. (microns) |
|---|---|---|---|---|
| 1 | Ni | CVD, PVD | 0.1 | 5.08 |
| 2 | Au | CVD, PVD, SBP | 0.127 | 0.381 |

Example 89

| Layers | Metal | Deposition | Min. (microns) | Max. (microns) |
|---|---|---|---|---|
| 1 | Ni | CVD, PVD | 0.1 | 5.08 |
| 2 | Sn—Bi | CVD, PVD, SBP | 2.54 | 7.62 |

Example 90

| Layers | Metal | Deposition | Min. (microns) | Max. (microns) |
|---|---|---|---|---|
| 1 | Ni | CVD, PVD | 0.1 | 5.08 |
| 2 | Sn (De-stressed after deposition) | CVD, PVD, SBP | 2.54 | 7.62 |

Figure 11:
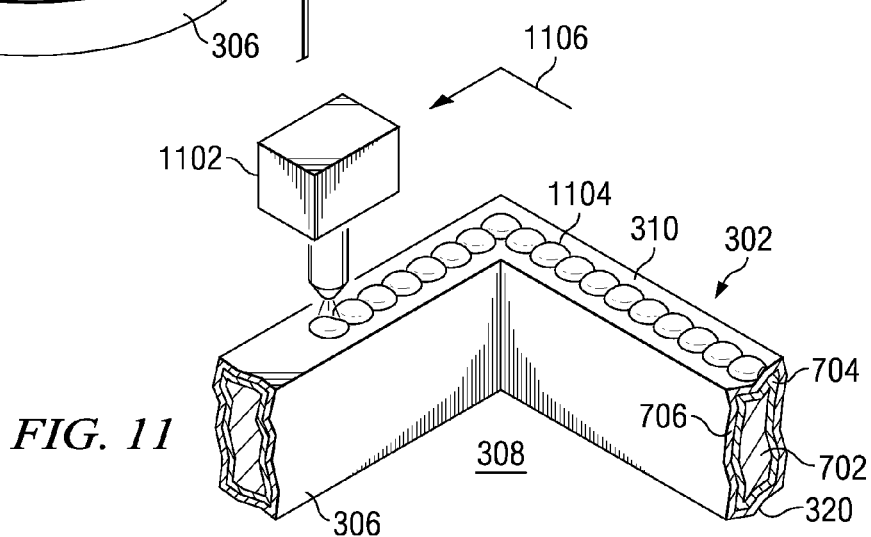
FIG. 11 is a partial perspective view of another embodiment utilizing solder applied by inkjet.

Referring now to FIG. 11 there is illustrated yet another embodiment of the current invention. This embodiment also uses soldering, however, in this embodiment the solder is applied via inkjet technology to either the metallized area 610 in the sheet seal-ring area 318 or the sheet seal-ring 310 of the frame assembly. FIG. 11 shows a portion of the Kovar alloy/nickel/gold frame 302 (or other frame alloy and overlayer combination) and an inkjet dispensing head 1102 which is dispensing overlapping drops of solder 1104 onto the frame seal-ring area 310 as the dispensing head moves around the frame aperture 308 or the frame aperture is moved underneath the dispensing head, as indicated by arrow 1106. Preferably, the inkjet dispensed solder is a gold-tin (Au—Sn) alloy, and more preferably it is the eutectic composition. The preferred thickness of the gold-tin solder applied by dispensing head 1102 in this embodiment is within the range from about 6 microns to about 101.2 microns. It will be appreciated that while the example illustrated in FIG. 11 shows the dispensing head 1102 depositing the solder droplets 1104 onto the frame 302, in other embodiments the inkjet deposited solder may be applied to the sheet seal-ring area 318, either alone or in combination with applications on the frame seal-ring area 310. In still other embodiments, the inkjet deposited solder may be used to create a discrete solder preform that would be employed as described in the previous examples herein. In still other embodiments, the inkjet deposited material, which may or may not be solder, may be used to create an innerlayer or interlay preform that would be employed for use in TC bonding or HIP diffusion bonding as described in previous examples herein. Details of the metallic layers 610 in the sheet seal-ring area 318 that are suitable for a soldering to a Kovar alloy/nickel/gold frame 302 such as that illustrated in FIG. 7 using inkjet supplied solder are substantially identical to those layers illustrated in previous Examples 21 through 32.

Referring now to FIGS. 12a through 12c and FIGS. 13a through 13c, there is illustrated yet another alternative method for manufacturing cover assemblies constituting another embodiment of the current invention. Whereas, in the previous embodiments a separate prefabricated metal frame was joined to the transparent sheet to act as a heat spreader/heat sink needed for subsequent welding, in this embodiment a cold gas dynamic spray deposition process is used to fabricate a metallic frame/heat spreader directly on the transparent sheet material. In other words, in this embodiment the frame is fabricated directly on the transparent sheet as an integral part, no subsequent joining operation is required. In addition, since cold gas dynamic spray deposition can be accomplished at near room temperature, this method is especially useful where the transparent sheet material and/or surface treatments thereto have a relatively low $T_G$, melting temperature, or other heat tolerance parameter.

Figure 12A:
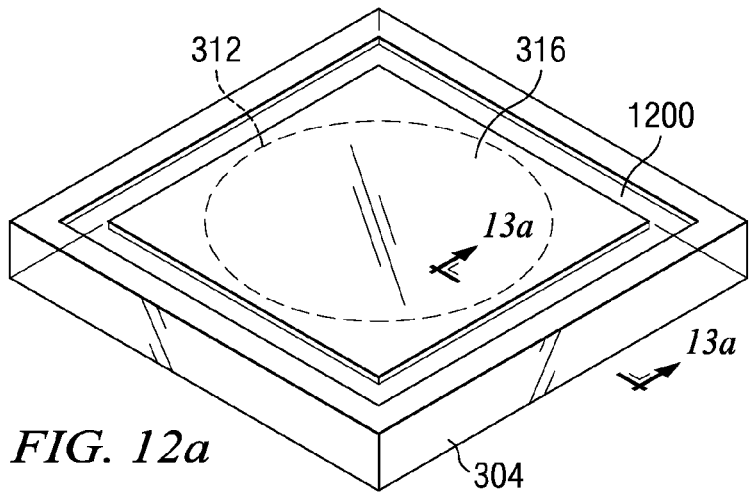
FIGS. 12a-c and FIGS. 13a-c illustrate a process of manufacturing cover assemblies in accordance with yet another embodiment of the invention, specifically.

Referring specifically to FIG. 12a, there is illustrated a sheet of transparent material 304 having a window portion 312 defined thereupon. The window portion 312 has finished top and bottom surfaces 314 and 316 (note that the 304 sheet appears bottom side up in FIGS. 12a through 12c). A frame attachment area 1200 is defined on the sheet 304, the frame attachment area circumscribing the window portion 312. It will be appreciated in the embodiment illustrated in FIGS. 12a-c that the frame attachment area 1200 need not follow the specific boundaries of the window area 312 (i.e., which in this case are circular) as long as the frame attachment area 1200 completely circumscribes the window portion.

It will be appreciated that, unless specifically noted otherwise, the initial steps of obtaining a transparent sheet having a window portion with finished top and bottom surfaces, preparing the seal-ring area of the sheet and metallizing the seal-ring area of the sheet are substantially identical to those described for the previous embodiments and will not be described in detail again.

Figure 12B:
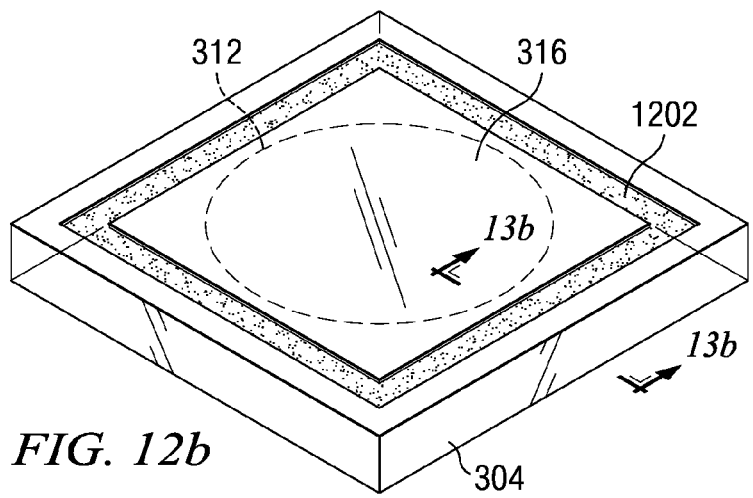
Figure 13A:
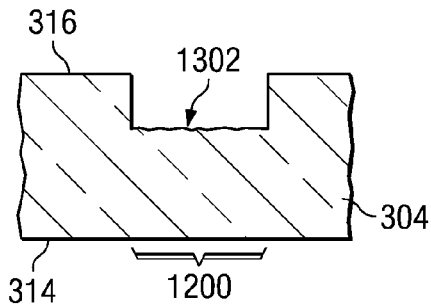

Referring now also to FIG. 13a, there is illustrated a partial cross-sectional view to the edge of the sheet 304. In this example, the step of preparing a frame attachment area 1200 on the sheet 304 comprises an optional step of roughening the frame attachment area by roughening and/or grinding the surface from its original level (shown in broken line) to produce a recessed area 1302. After the frame attachment area 1200 has been prepared, metal layers are deposited into the frame attachment area of the sheet using cold gas dynamic spray deposition. In FIG. 12b, an initial metal layer 1202 has been applied into the frame attachment area 1200 using cold gas dynamic spray deposition.

Figure 13B:
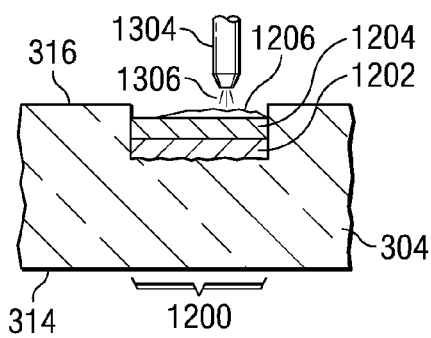

Referring now also to FIG. 13b, the cold gas dynamic spray nozzle 1304 is shown depositing a stream of metal particles 1306 onto the frame attachment area 1200. The initial layer 1202 has now been overlaid with a secondary layer 1204 and the spray nozzle 1304 is shown as it begins to deposit the final Kovar alloy layer 1206. Layer 1206 need not be Kovar.

Figure 12C:
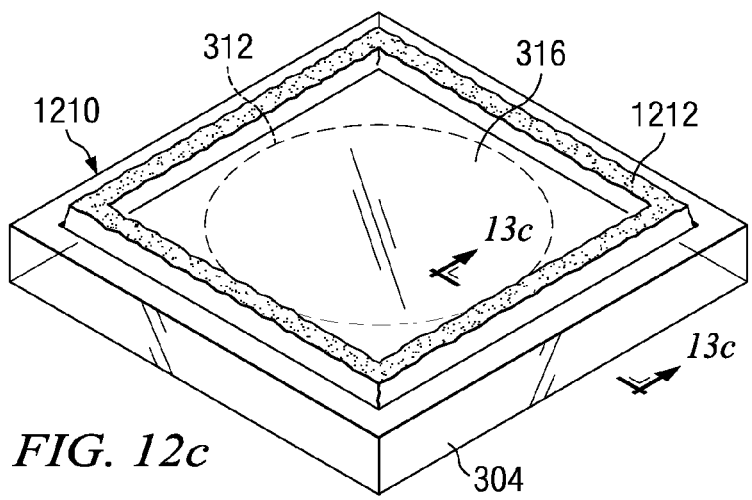
Figure 13C:
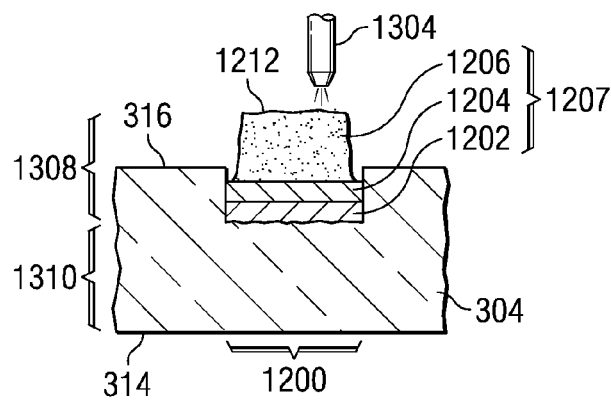

Referring now to FIGS. 12c and 13c, the completed cover assembly 1210 is illustrated including the integral frame/heat spreader 1212, which has been built up from layer 1206 to a predetermined height, denoted by reference numeral 1308, above the finished surface of the sheet. In a preferred embodiment, the predetermined height 1308 of the built-up metal frame above the frame attachment area 1200 is within the range from about 5% to about 100% of the thickness denoted by reference numeral 1310 of the sheet 304 beneath the frame attachment area. In the embodiment shown, the step of depositing metal using cold gas dynamic spray included depositing a layer of Kovar alloy onto the sheet to fabricate the built-up frame/heat spreader 1212. The use of cold gas dynamic spray deposition allows a tremendous range of thickness for this Kovar alloy layer, which thickness may be within the range from about 2.54 microns to about 12,700 microns. It will, of course, be appreciated that the frame/heat spreader 1212 may be fabricated through the deposition of materials other than Kovar alloy, depending upon the characteristics of the transparent sheet 304 and of the package base 104, especially their respective CTEs.

The following examples, not to be considered limiting, are provided to illustrate the details of the metallic layers, denoted collectively by reference numeral 1207 for forming a frame/heat spreader compatible with hard glass transparent sheets and Kovar alloy or ceramic package bases. The deposition of materials other than Kovar alloy may be used as the final layer whenever Kovar Alloy is indicated as the final layer, depending upon the characteristics of the transparent sheet 304 and of the package base 104, especially their respective CTEs.

Example 91

| Layers | Metal | Deposition | Min. (microns) | Max. (microns) |
|---|---|---|---|---|
| 1 | Al | cold gas spray | 2.54 | 127 |
| 2 | Cu | cold gas spray | 2.54 | 127 |
| 3 | Ni | cold gas spray | 2.54 | 127 |
| 4 | Kovar Alloy | cold gas spray | 127 | 12,700 |

Example 92

| Layers | Metal | Deposition | Min. (microns) | Max. (microns) |
|---|---|---|---|---|
| 1 | Al | cold gas spray | 2.54 | 127 |
| 2 | Ni | cold gas spray | 2.54 | 127 |
| 3 | Kovar Alloy | cold gas spray | 127 | 12,700 |

Example 93

| Layers | Metal | Deposition | Min. (microns) | Max. (microns) |
|---|---|---|---|---|
| 1 | Al | cold gas spray | 2.54 | 127 |
| 2 | Kovar Alloy | cold gas spray | 127 | 12,700 |

Example 94

| Layers | Metal | Deposition | Min. (microns) | Max. (microns) |
|---|---|---|---|---|
| 1 | Kovar Alloy | cold gas spray | 127 | 12,700 |

Example 95

| Layers | Metal | Deposition | Min. (microns) | Max. (microns) |
|---|---|---|---|---|
| 1 | Zn | cold gas spray | 2.54 | 127 |
| 2 | Ni | cold gas spray | 2.54 | 127 |
| 3 | Kovar alloy | cold gas spray | 127 | 12,700 |

Example 96

| Layers | Metal | Deposition | Min. (microns) | Max. (microns) |
|---|---|---|---|---|
| 1 | Zn | cold gas spray | 2.54 | 127 |
| 2 | Kovar alloy | cold gas spray | 127 | 12,700 |

Example 97

| Layers | Metal | Deposition | Min. (microns) | Max. (microns) |
|---|---|---|---|---|
| 1 | Cr | cold gas spray | 2.54 | 127 |
| 2 | Ni | cold gas spray | 2.54 | 127 |
| 3 | Kovar alloy | cold gas spray | 127 | 12,700 |

Example 98

| Layers | Metal | Deposition | Min. (microns) | Max. (microns) |
|---|---|---|---|---|
| 1 | Cr | cold gas spray | 2.54 | 127 |
| 2 | Kovar alloy | cold gas spray | 127 | 12,700 |

Example 99

| Layers | Metal | Deposition | Min. (microns) | Max. (microns) |
|---|---|---|---|---|
| 1 | Al | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

Example 100

| Layers | Metal | Deposition | Min. (microns) | Max. (microns) |
|---|---|---|---|---|
| 1 | Ni | cold gas spray | 2.54 | 127 |
| 2 | Kovar Alloy | cold gas spray | 127 | 12,700 |

Example 101

| Layers | Metal | Deposition | Min. (microns) | Max. (microns) |
|---|---|---|---|---|
| 1 | Sn or Sn—Bi | cold gas spray | 2.54 | 127 |
| 2 | Zn | cold gas spray | 2.54 | 127 |
| 3 | Ni | cold gas spray | 2.54 | 127 |
| 4 | Kovar Alloy | cold gas spray | 127 | 12,700 |

Example 102

| Layers | Metal | Deposition | Min. (microns) | Max. (microns) |
|---|---|---|---|---|
| 1 | Sn or Sn—Bi | cold gas spray | 2.54 | 127 |
| 2 | Ni | cold gas spray | 2.54 | 127 |
| 3 | Kovar Alloy | cold gas spray | 127 | 12,700 |

By way of further examples, not to be considered limiting, the following combinations are preferred for the metallic layers 1207 for forming a frame/heat spreader compatible with hard glass transparent sheets and Kovar or other alloys or ceramic package bases. The deposition of materials other than Kovar alloy may be used as the final layer whenever Kovar Alloy is indicated as the final layer, depending upon the characteristics of the transparent sheet 304 and of the package base 104, especially their respective CTEs.

Example 103

| Layers | Metal | Deposition | Min. (microns) | Max. (microns) |
|---|---|---|---|---|
| 1 | Al | cold gas spray | 12.7 | 76.2 |
| 2 | Cu | cold gas spray | 12.7 | 76.2 |
| 3 | Ni | cold gas spray | 12.7 | 76.2 |
| 4 | Kovar Alloy | cold gas spray | 635 | 2,540 |

Example 104

| Layers | Metal | Deposition | Min. (microns) | Max. (microns) |
|---|---|---|---|---|
| 1 | Al | cold gas spray | 12.7 | 76.2 |
| 2 | Ni | cold gas spray | 12.7 | 76.2 |
| 3 | Kovar Alloy | cold gas spray | 635 | 2,540 |

Example 105

| Layers | Metal | Deposition | Min. (microns) | Max. (microns) |
|---|---|---|---|---|
| 1 | Al | cold gas spray | 12.7 | 76.2 |
| 2 | Kovar Alloy | cold gas spray | 635 | 2,540 |

Example 106

| Layers | Metal | Deposition | Min. (microns) | Max. (microns) |
|---|---|---|---|---|
| 1 | Kovar Alloy | cold gas spray | 635 | 2,540 |

Example 107

| Layers | Metal | Deposition | Min. (microns) | Max. (microns) |
|---|---|---|---|---|
| 1 | Zn | cold gas spray | 12.7 | 76.2 |
| 2 | Ni | cold gas spray | 12.7 | 76.2 |
| 3 | Kovar alloy | cold gas spray | 635 | 2,540 |

Example 108

| Layers | Metal | Deposition | Min. (microns) | Max. (microns) |
|---|---|---|---|---|
| 1 | Zn | cold gas spray | 12.7 | 76.2 |
| 2 | Kovar alloy | cold gas spray | 635 | 2,540 |

Example 109

| Layers | Metal | Deposition | Min. (microns) | Max. (microns) |
|---|---|---|---|---|
| 1 | Cr | cold gas spray | 12.7 | 76.2 |
| 2 | Ni | cold gas spray | 12.7 | 76.2 |
| 3 | Kovar alloy | cold gas spray | 635 | 2,540 |

Example 110

| Layers | Metal | Deposition | Min. (microns) | Max. (microns) |
|---|---|---|---|---|
| 1 | Cr | cold gas spray | 12.7 | 76.2 |
| 2 | Kovar alloy | cold gas spray | 635 | 2,540 |

Example 111

| Layers | Metal | Deposition | Min. (microns) | Max. (microns) |
|---|---|---|---|---|
| 1 | Al | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

Example 112

| Layers | Metal | Deposition | Min. (microns) | Max. (microns) |
|---|---|---|---|---|
| 1 | Ni | cold gas spray | 12.7 | 76.2 |
| 2 | Kovar Alloy | cold gas spray | 635 | 2,540 |

Example 113

| Layers | Metal | Deposition | Min. (microns) | Max. (microns) |
|---|---|---|---|---|
| 1 | Sn or Sn—Bi | cold gas spray | 12.7 | 76.2 |
| 2 | Zn | cold gas spray | 12.7 | 76.2 |
| 3 | Ni | cold gas spray | 12.7 | 76.2 |
| 4 | Kovar Alloy | cold gas spray | 635 | 2,540 |

Example 114

| Layers | Metal | Deposition | Min. (microns) | Max. (microns) |
|---|---|---|---|---|
| 1 | Sn or Sn—Bi | cold gas spray | 12.7 | 76.2 |
| 2 | Ni | cold gas spray | 12.7 | 76.2 |
| 3 | Kovar Alloy | cold gas spray | 635 | 2,540 |

After the deposition of the metal layers using the cold gas dynamic spray deposition, it may be necessary to grind or shape the top surface of the built-up frame 1212 to a predetermined flatness before performing additional steps to ensure that a good contact will be made in later bonding. Another process which may be used, either alone or in combination with shaping the top surface of the built-up frame, is the depositing of additional metal layers onto the built-up frame/heat spreader 1212 using solution bath plating. The most common reason for such plated layers is to promote a good bonding when the frame/heat spreader is adjoined to the package base 104. In a preferred embodiment, the additional metallic layers applied to the built-up frame 1212 include a layer of nickel directly over the cold gas dynamic spray deposited metal having a thickness within the range of about 0.002 microns to about 25 microns and, in some instances, then solution bath plating a layer of gold over the nickel layer until the gold layer has a thickness within the range from about 0.0508 microns to about 0.508 microns.

Figure 14:
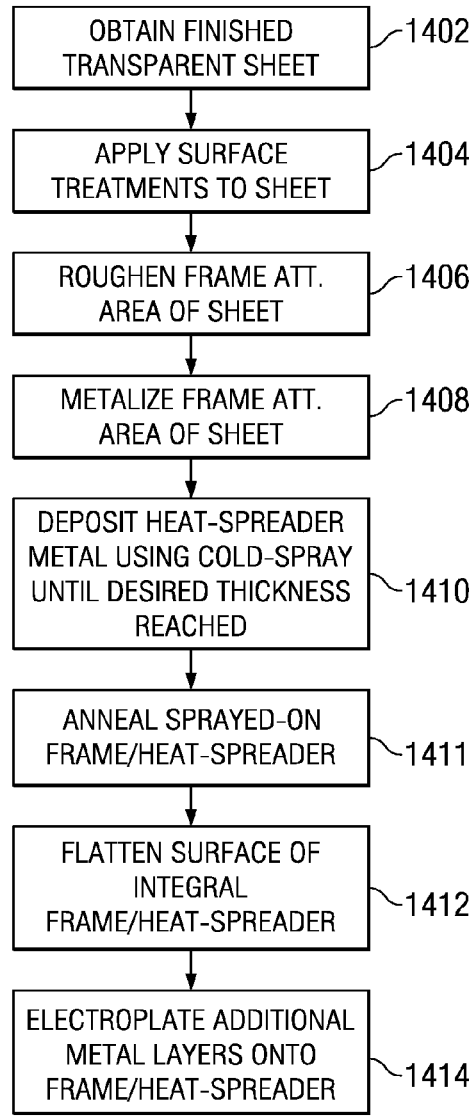
FIG. 14 is a block diagram of a process for manufacturing cover assemblies using cold gas dynamic spray technology in accordance with another embodiment.

Referring now to FIG. 14, there is illustrated a block diagram of the alternative embodiment utilizing cold gas dynamic spray deposition. It will be appreciated that, unless specifically noted otherwise, the initial steps of obtaining a transparent sheet having finished surfaces, applying surface treatments to the sheet, cleaning, roughening or otherwise preparing the frame attachment area of the sheet are substantially identical to those described for the previous embodiments and will not be described in detail again. For example, block 1402 of FIG. 14 represents the step of obtaining a sheet of transparent material having finished surfaces and corresponds directly with block 902, and with the description of suitable transparent materials. Similarly, except as noted, blocks 1404, 1406 and 1408 of FIG. 14 correspond directly with blocks 904, 906 and 908, respectively, of FIG. 9 and with the previous descriptions of the steps and sub-steps provided herein. Thus, it will be understood that all of the options described for performing the various steps and sub-steps represented by the blocks 902-908 in the previous (i.e., prefabricated frame) embodiments are applicable to the blocks 1402-1408 in the current (i.e., cold spray) embodiment.

The next step of the process is to use cold gas dynamic spray deposition to deposit frame/heat spreader metal onto any previously deposited metal layers in the frame attachment area 1200. This step is represented by block 1410. As previously described in connection with FIGS. 13*b* and 13*c*, the high velocity particles 1306 from the gas nozzle 1304 form a new layer on the previous metallic layers, and by directing the cold spray jet across the frame attachment area 1200 repeatedly, the new material can become a continuous metallic layer around the entire periphery of the frame attachment area, i.e., it will circumscribe the window portion 312 of the transparent sheet 304. Where the material of the package base 104 (to which the cover assembly 1210 will eventually be joined) is Kovar alloy or appropriately metallized alumina, Kovar alloy is preferred for the material 1206 to be cold sprayed to form the integral frame. In other cases, a heat spreader material should be selected which has a CTE that is closely matched to the CTE of the package base 104. Of course, that material must also be compatible with the cold gas dynamic spray process.

The cold spraying of the powdered heat spreader material is continued until the new layer 1206 reaches the thickness required to serve as a heat spreader/integral frame. This would represent the end of the process represented by block 1410. For some applications, the built-up heat spreader/frame 1212 is now complete and ready for use. For other applications, however, performing further finishing operations on the heat spreader/frame 1212 may be desirable.

For example, it is known that significant residual stresses may be encountered in metal structures deposited using cold-gas dynamic spray technology as a result of the mechanics of the spray process. These stresses may make the resulting structure prone to dimensional changes, cracking or other stress-related problems during later use. Annealing by controlled heating and cooling is known to reduce or eliminate residual stresses. Thus, in some applications, the integral heat spreader/frame 1212 is annealed following its deposition on the sheet 304. This optional step is represented by block 1411 in FIG. 14. In some embodiments, the annealing step 1411 may include the annealing of the totality of the sprayed-on metals and alloys constituting the heat spreader/frame 1212. In other embodiments, however, the annealing step 1411 includes annealing only the outermost portions of the integral built-up heat spreader/frame 1212, while the inner layers are left unannealed.

It will be appreciated that there are flatness requirements for the sealing surface at the "top" of the heat spreader (which is actually projecting from the bottom surface 316 of the sheet). If these flatness requirements are not met via the application of the heat spreader material by the cold spray process, it will be necessary to flatten the sealing surface at the next step of the process. This step is represented by block 1412 in FIG. 14. There are a number of options for achieving the required surface flatness. First, it is possible to remove surface material from the heat spreader to achieve the required flatness. This may be accomplished by conventional surface grinding, by other traditional mechanical means, or it may be accomplished by the laser removal of high spots. Where material removal is used, care must be taken to avoid damaging the finished window surfaces 314 and 316 during the material removal operations. Special fixturing and/or masking of the window portion 312 may be required. Alternatively, if the cold spray deposited heat spreader 1212 is ductile enough, the surface may be flattened using a press operation, i.e., pressing the frame against a flat pattern or by employing a rolling operation. This would reduce the handling precautions as compared to using a surface grinder or laser operations.

Finally, as previously described, in some embodiments additional metal layers are plated onto the integral frame/heat spreader 1212. These optional plating operations, such as solution bath plating layers of nickel and gold onto a Kovar alloy frame, are represented by block 1414 in FIG. 14. In the embodiment shown in FIG. 14, the optional plating operation 1414 is performed after the optional flattening operation 1412, which in turn is performed after the optional annealing operation 1411. While such order is preferred, it will be appreciated that in other embodiments the order of the optional finishing steps 1411, 1412 and 1414 may be rearranged. The primary considerations for the ordering of these finishing steps is whether later steps will damage the results of earlier steps. For example, it would be impractical to perform plating step 1414 before the flattening step 1412 if the flattening was to be carried out by grinding, while it might be acceptable if the flattening was to be carried out by pressing.

Referring now to FIGS. 15*a* and 15*b*, there is illustrated a method for manufacturing multiple cover assemblies simultaneously in accordance with another embodiment of the current invention. Shown in FIG. 15*a* is an exploded view of a multi-unit assembly which can be subdivided after fabrication to produce individual cover assemblies. The multi-unit assembly 1500 includes a frame 1502 and a sheet 1504 of a transparent material. The frame 1502 has sidewalls 1506 defining a plurality of frame apertures 1508 therethrough. Each frame aperture 1508 is circumscribed by a continuous sidewall section having a frame seal-ring area 1510 (denoted by cross-hatching). Each frame seal-ring area 1510 has a metallic surface, which may result from the inherent material of the frame 1502 or it may result from metal layers which have been applied to the surface of the frame. In some embodiments, the frame 1502 includes reduced cross-sectional thickness areas 1509 formed on the frame sidewalls 1506 between adjacent frame apertures 1508. FIG. 15*b* shows the bottom side of the frame 1502, to better illustrate the reduced cross-sectional thickness areas 1509 formed between each aperture 1508. Also illustrated is the base seal-ring area 1520 (denoted by cross-hatching) which surrounds each aperture 1508 to allow joining to the package bases 104.

Further regarding the multi-aperture frames illustrated in FIGS. 15*a* and 15*b*, it will be understood that the frame 1502 can be attached as shown, with the open ends of the V-shaped notches facing away from the sheet, or alternatively, with the open ends of the V-shaped notches facing toward the sheet.

Except for the details just described, the multiple-aperture frame 1502 of this embodiment shares material, fabrication and design details with the single aperture frame 302 previously described. In this regard, a preferred embodiment of the frame 1502 is primarily formed of Kovar alloy or similar materials and more preferably, will have a Kovar alloy core with a surface layer of gold overlaying an intermediate layer of nickel as previously described.

The transparent sheet 1504 for the multi-unit assembly can be formed from any type of transparent material as previously discussed for sheet 304. In this embodiment, however, the sheet 1504 has a plurality of window portions 1512 defined thereupon, with each window portion having finished top and bottom surface 1514 and 1516, respectively. A plurality of sheet seal-ring areas 1518 are denoted by cross-hatching surrounding each window portion in FIG. 15*a*. With respect to the material of the sheet 1504, with respect to the finished configuration of the top and bottom surfaces 1514 and 1516, respectively, of each window portion 1512, with respect to surface treatments, and/or coatings, the sheet 1504 is substantially identical to the single window portion sheet 304 previously discussed.

The next step of the process of manufacturing the multi-unit assembly 1500 is to prepare the sheet seal-ring areas 1518 for metallization. As noted earlier, each sheet seal-ring area 1518 circumscribes a window portion of the sheet 1504. The sheet seal-ring areas 1518 typically have a configuration which closely matches the configuration of the frame seal-ring areas 1510 to which they will eventually be joined. It will be appreciated, however, that in some cases other considerations will affect the configuration of the frame grid, e.g., when electrical resistance heating is used to produce bonding, then the seal-ring areas 1518 must be connected to form the appropriate circuits. The steps of preparing the sheet seal-ring areas 1518 for metallization is substantially identical to the steps and options presented during discussion of preparing the frame seal-ring area 310 on the single aperture frame 302. Thus, at a minimum, preparing the sheet seal-ring area 1518 typically involves a thorough (e.g., plasma, solvent or detergent) cleaning to remove any contaminants from the surfaces and typically also involves roughening the seal-ring area by chemical etching, laser ablating, mechanical grinding or sandblasting this area.

The step of metallizing the prepared sheet seal-ring areas 1510 of the sheet 1502 are substantially identical to the steps described for metallizing the frame seal-ring area 310 on the single aperture frame 302. For example, the metal layers shown in Examples 1 through 120 can be used in connection with thermal compression bonding, for soldering where the solder material is plated onto the sheet as a final metallic layer, and can be used in connection with soldering in combination with a separate gold-tin of solder preform and also for soldering in connection with solders deposited or formed using inkjet technology.

The next step of the process is to position the frame 1502 against the sheet 1504 (it being understood that solder preforms or solder layers would be interposed between the frame and the sheet if braze soldering is used to join the frame 1502 to the sheet 1504) such that each of the window portions 1512 overlays one of the frame apertures 1508, and that for each such window portion/frame aperture combination, at least a portion of the associated frame seal-ring area 1510 and at least a portion of the associated sheet seal-ring area 1518 contact one another along a continuous junction region that circumscribes the associated window portion. This operation is generally analogous to the steps of positioning the frame against the sheet in the single aperture embodiment previously described. If diffusion bonding is used to join the frame 1502 to the sheet 1504, an interlayer or innerlayer between the frame 1502 to the sheet 1504 may or may not be employed.

Figure 16A:
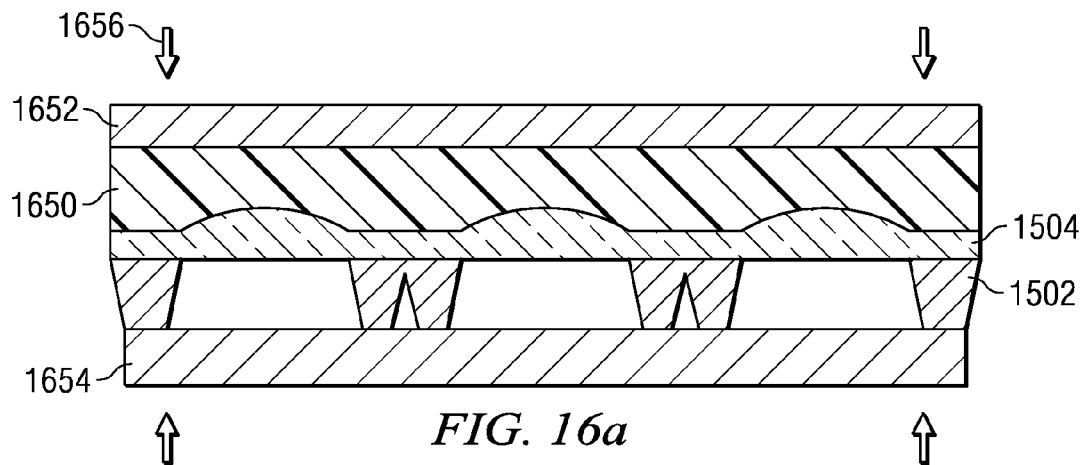
FIG. 16a illustrates compliant tooling formed in accordance with another embodiment.

Referring now to FIG. 16*a*, there is illustrated the positioning of a multi-window sheet 1504 (in this case having window portions 1512 with contoured surfaces) against a multi-aperture frame 1502 using compliant tooling in accordance with another embodiment. The compliant tooling includes a compliant element 1650 and upper and lower support plates 1652, 1654, respectively. The support plates 1652 and 1654 receive compressive force, denoted by arrows 1656, at discrete locations from tooling fixtures (not shown). The compliant member 1650 is positioned between one of the support plates and the cover assembly pre-fab (i.e., frame 1502 and sheet 1504). The compliant member 1650 yields elastically when a force is applied, and therefore can conform to irregular surfaces (such as the sheet 1504) while at the same time applying a distributed force against the irregular surface to insure that the required contact pressure is achieved all along the frame/sheet junction. Such compliant tooling can also be used to press a sheet or frame against the other member when the two members are not completely flat, taking advantage of the inherent flexibility (even if small) present in all materials. In the illustrated example, the compliant member 1650 is formed from a solid block of an elastomer material, e.g., rubber, however in other embodiments the compliant member may also be fabricated from discrete elements, e.g., springs. The compliant material must be able to withstand the elevated temperatures experienced during the bonding operation.

The next step of the process is heating all of the junction regions until a metal-to-metal joint is formed between the frame 1502 and the sheet 1504 all along each junction region, thus creating the multi-unit assembly 1500 having a hermetic frame/sheet seal circumscribing each window portion 1512. If diffusion bonding is used to join the frame 1502 and the sheet 1504, the bond could be between the outermost metal layer of the frame and the non-metallized sheet 1504. It will be appreciated that any of the heating technologies previously described for joining the single aperture frame 302 to the single sheet 304 are applicable to joining the multi-aperture frame 1502 to the corresponding multi-window sheet 1504.

Figure 16B:
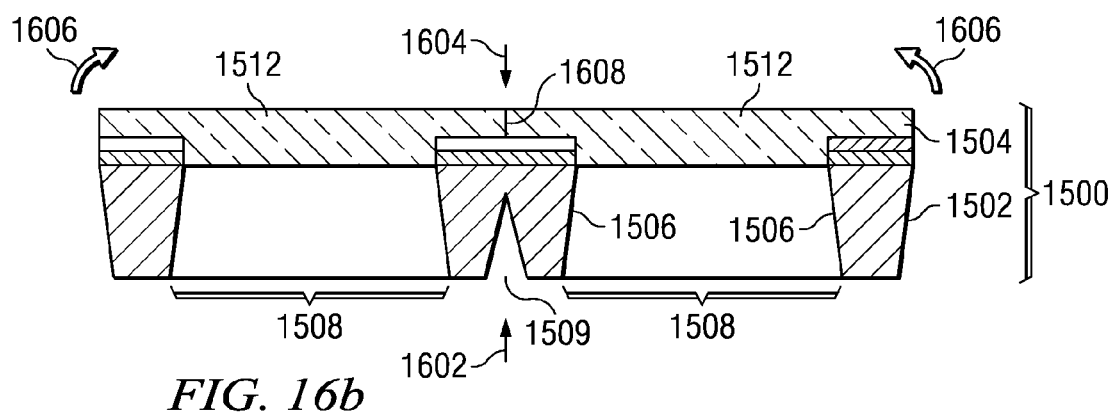
FIG. 16b is a side view of a multi-unit assembly illustrating the method of separation.

Referring now to FIG. 16*b*, the final step of the current process is to divide the multi-unit assembly 1500 along each junction region that is common between two window portions 1512 taking care to preserve and maintain the hermetic seal circumscribing each window portion. A plurality of individual cover assemblies are thereby produced. FIG. 16*b*, illustrates a side view of a multi-unit assembly 1500 following the hermetic bonding of the sheet 1504 to the frame 1502. Where the frame 1502 includes reduced cross-sectional thickness areas 1509, the step of dividing the multi-unit assembly may include scoring the frame along the back side of the reduced cross-sectional thickness area at the position indicated by arrow 1602, preferably breaking through or substantially weakening the remaining frame material below area 1509, and also simultaneously scoring the sheet 1504 along a line vertically adjacent to area 1509, i.e., at the point indicated by arrow 1604, followed by flexing the assembly 1500, e.g., in the direction indicated by arrows 1606 such that a fracture will propagate away from the score along line 1608, thereby separating the assembly into two pieces. This procedure can be repeated along each area of reduced cross-sectional thickness 1509 until the multi-unit assembly 1500 has been completely subdivided into single aperture cover assemblies that are substantially identical to those produced by the earlier method described herein. In other embodiments, instead of using the score-and-break method, the cover assemblies may be cut apart, preferably from the frame side along the path indicated by arrow 1602 (i.e., between the window portions 1512), using mechanical cutting, dicing wheel, laser, water jet or other parting technology.

Figure 17A:
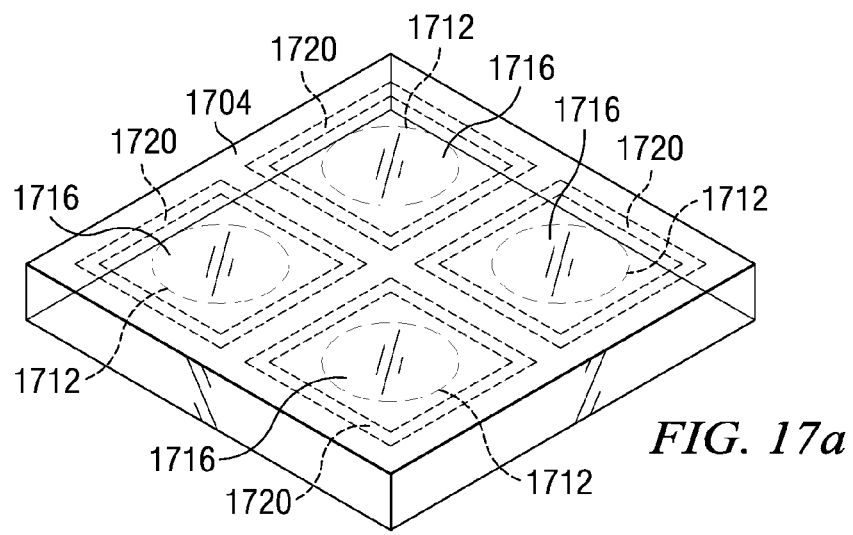
FIGS. 17a and 17b illustrate the manufacture of multiple cover assemblies in accordance with yet another embodiment, specifically.
Figure 17B:
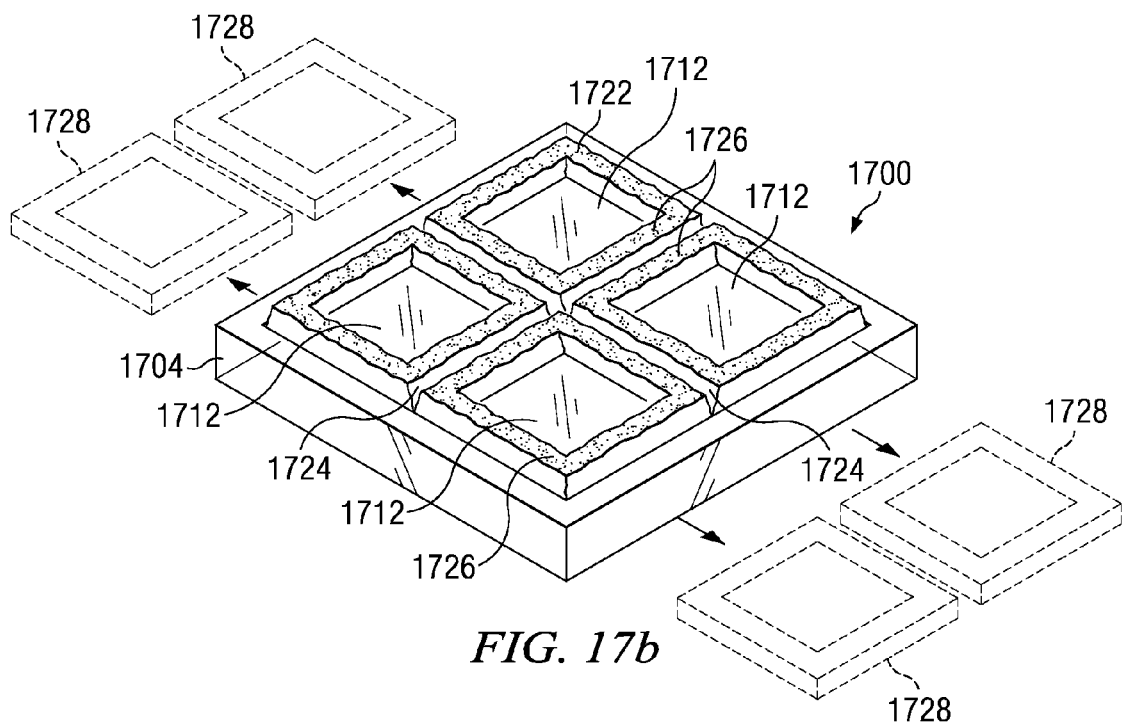

Referring now to FIGS. 17*a* and 17*b*, there is illustrated yet another method for simultaneously manufacturing multiple cover assemblies. This method expands upon the cold gas dynamic spray technique used to build an integral frame/heat spreader directly upon the transparent sheet material as previously illustrated in connection with FIGS. 12*a* through 12*c* and FIGS. 13*a* through 13*c*. As shown in FIG. 17*a*, the process starts with a sheet of nonmetallic transparent material 1704 having a plurality of window portions 1712 defined thereupon, each window portion having finished top and bottom surfaces 1714 and 1716, respectively. The properties and characteristics of the transparent sheet 1704 are substantially identical to those in the embodiments previously discussed. The next step of the process involves preparing a plurality of frame attachment areas 1720 (denoted by the path of the broken line surrounding each window portion 1712), each frame attachment area 1720 circumscribing one of the window portions 1712. As in previous embodiments, the step of preparing the frame attachment areas may comprise cleaning, roughening, grinding or otherwise modifying the frame attachment areas in preparation for metallization.

The next step in this process is metallizing the prepared frame attachment areas on the sheet, i.e., this metallization may be performed using a cold gas dynamic spray technology or where the layers are relatively thin, using a CVD, physical vapor deposition or other conventional metal deposition techniques. It will be appreciated that the primary purpose of this step is to apply metal layers necessary to obtain good adhesion to the transparent sheet 1704 and/or to meet the metallurgical requirements for corrosion prevention, etc.

Referring now to FIG. 17*b*, the next step of the process is depositing metal onto the prepared/metallized frame attachment areas of the sheet 1704 using cold gas dynamic spray deposition techniques until a built-up metal frame 1722 is formed upon the sheet having a seal-ring area 1726 that is a predetermined vertical thickness above the frame attachment areas, thus creating a multi-unit assembly having an inherent hermetic seal between the frame 1722 and the sheet 1704 circumscribing each window portion 1712. In some embodiments, reduced cross-sectional thickness areas 1724 are formed by selectively depositing the metal during the cold spray deposition. In other embodiments, the reduced cross-sectional area sections 1724 may be formed following deposition of the frame/heat spreader 1722 through the use of grinding, cutting or other mechanical techniques such as laser ablation and water jet. In addition, the reduced cross-sectional area sections 1724 may be formed following deposition of the frame/heat spreader 1722 through the use of photochemical machining (PCM).

The next step of the process which, while not required is strongly preferred, is to flatten, if necessary, the seal-ring area 1726 of the sprayed-on frame 1722 to meet the flatness requirements for joining it to the package base 104. This flattening can be accomplished by mechanical means, e.g., grinding, lapping, polishing, etc., or by other techniques such as laser ablation.

The next step of the process, which, while not required, is strongly preferred, is to add additional metallic layers, e.g., a nickel layer and preferably also a gold layer, to the seal-ring area 1726 of the sprayed-on frame 1722 to facilitate welding the cover assembly to the package base 104. These metallic layers are preferably added using a solution bath plating process, e.g., solution bath plating, although other techniques may be used.

The next step of the process is dividing the multi-unit assembly 1700 along each frame wall section common between two window portions 1712 while, at the same time, preserving and maintaining the hermetic seal circumscribing each window portion. After dividing the multi-unit 1700, a plurality of single aperture cover assemblies 1728 (shown in broken line) will be produced, each one being substantially identical to the single aperture cover assemblies produced using the method described in FIGS. 12*a* through 12*c* and FIGS. 13*a* through 13*c*. All of the options, characteristics and techniques described for use in the single unit cover assembly produced using cold gas dynamic spray technology are applicable to this embodiment. It will be appreciated that certain operations for example, the flattening of the frame and the plating of the frame with additional metallic layers, may be performed on the multi-unit assembly 1700, prior to separation of the individual units, or on the individual units after separation.

Figure 18A:
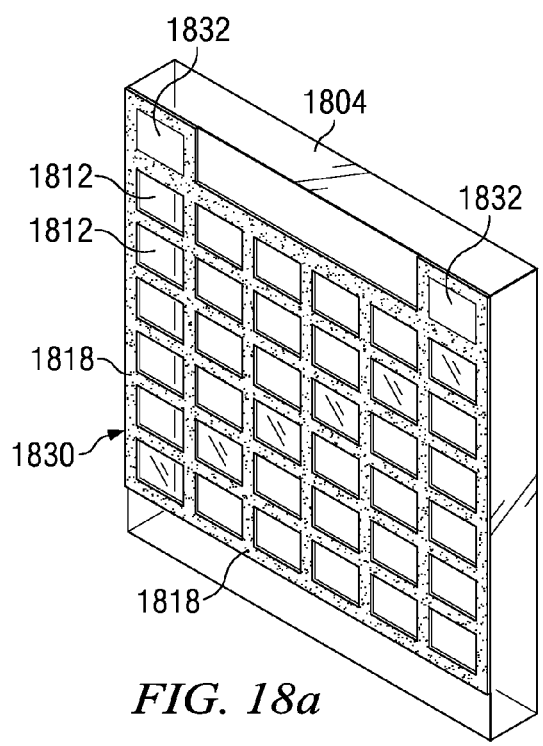
FIGS. 18a-18c illustrate an assembly configuration suitable for use with electrical resistance heating; specifically.
Figure 18B:
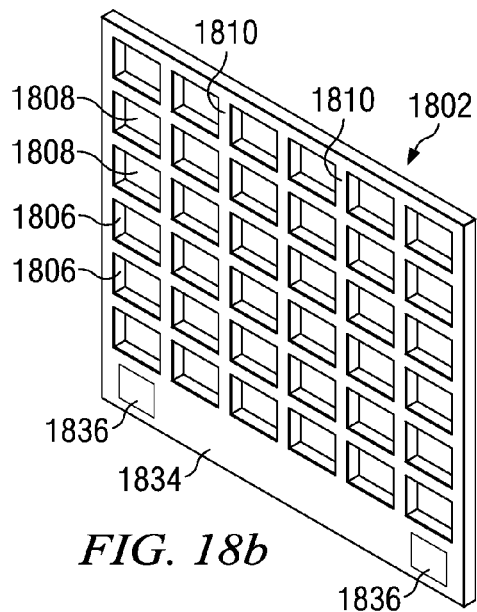
Figure 18C:
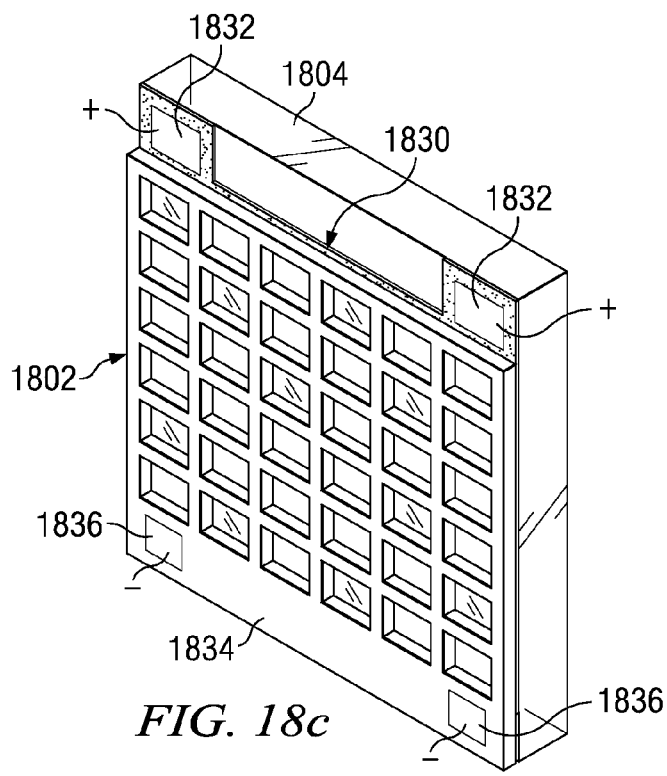
Figure 19A:
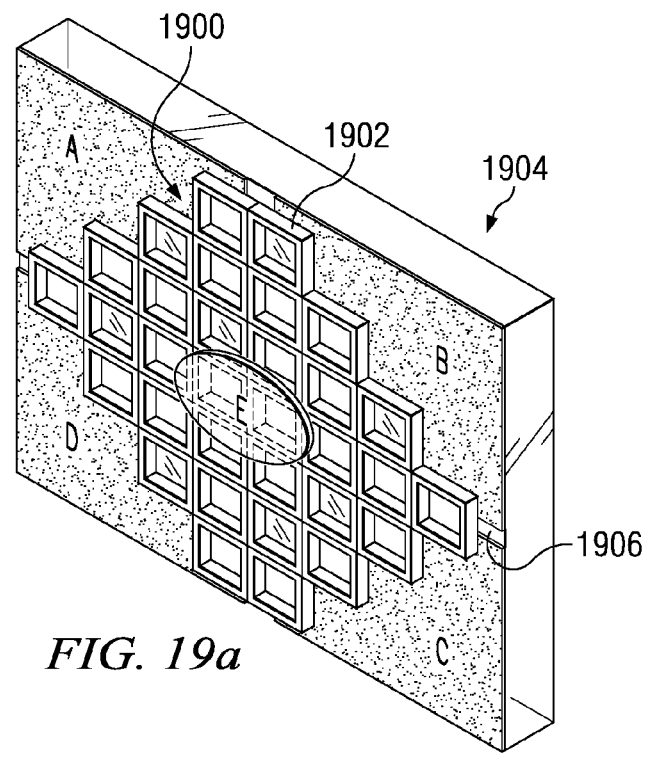
Figure 19B:
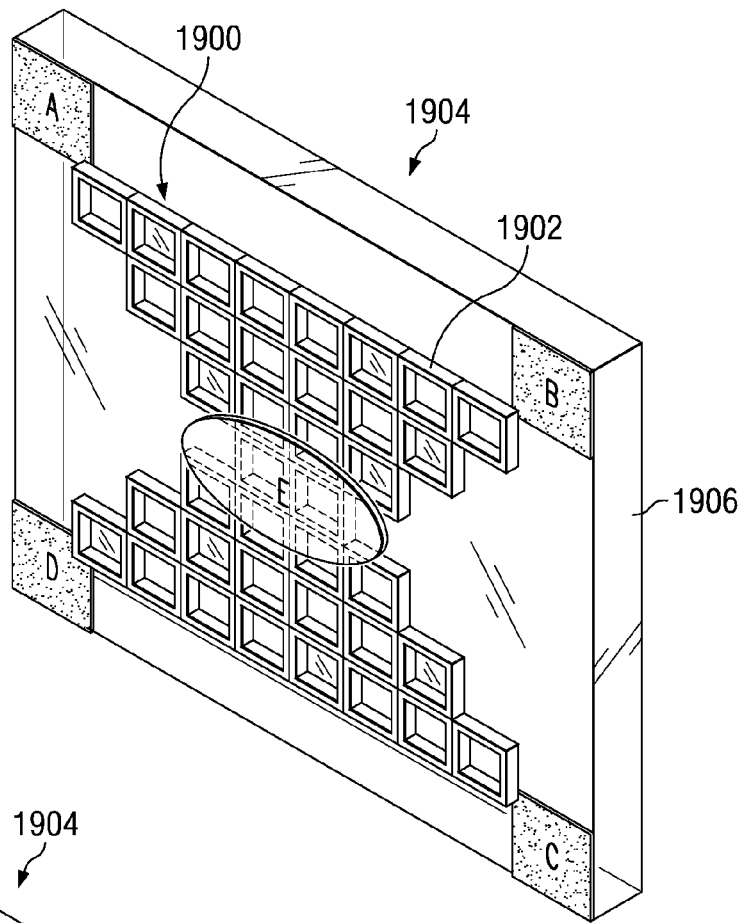
Figure 19C:
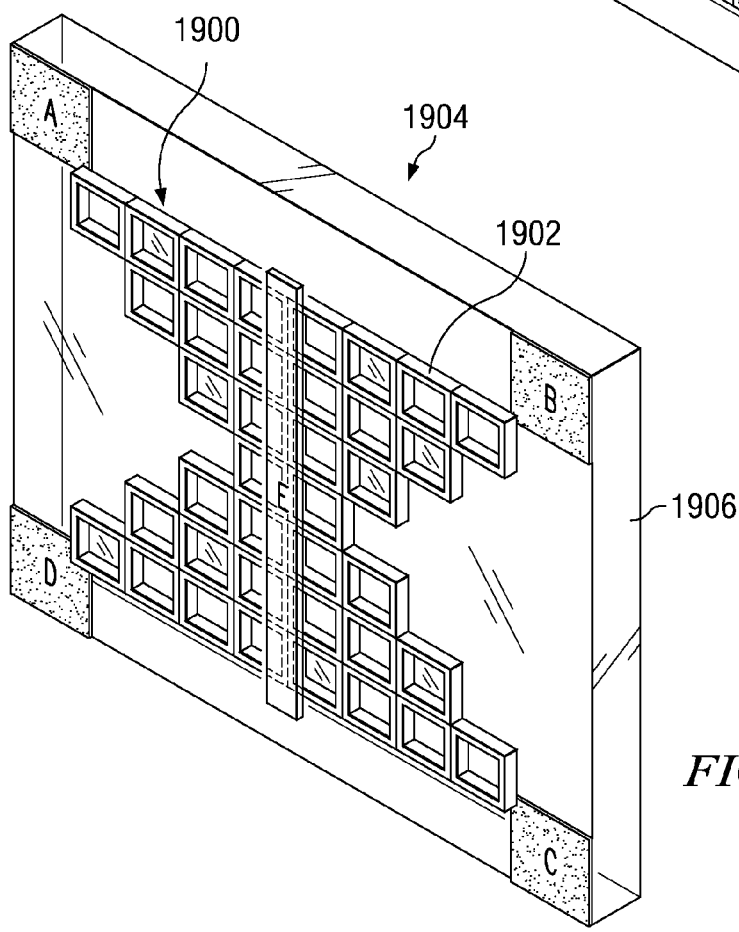

As previously described, heating the junction region between the metallized seal-ring area of the transparent sheet and the seal-ring area of the frame is required for forming the hermetic seal therebetween. Also as previously described, this heating may be accomplished using a furnace, oven, or various electrical heating techniques, including electrical resistance heating (ERH). Referring now to FIGS. 18*a*-18*c*, there is illustrated methods of utilizing electric resistance heating to manufacture multiple cover assemblies simultaneously.

Referring first to FIG. 18*a*, there is illustrated a transparent sheet 1804 having a plurality of seal-ring areas 1818 laid out in a rectangular arrangement around a plurality of window portions 1812. These seal-ring areas 1818 have been first prepared, and then metallized with one or more metal or metal alloy layers, as previously described herein. The transparent sheet 1804 further includes an electrode portion 1830 which has been metallized, but does not circumscribe any window portions 1812. This electrode portion is electrically connected to the metallized seal-ring areas 1818 of the sheet. One or more electrode pads 1832 may be provided on the electrode portion 1830 to receive electrical energy from electrodes during the subsequent ERH procedure.

Referring now to FIG. 18*b*, there is illustrated a frame 1802 having a plurality of sidewalls 1806 laid out in a rectangular arrangement around a plurality of frame apertures 1808. The apertures 1808 are disposed so as to correspond with the positions of the window portions 1812 of the sheet 1804, and the sidewalls 1806 are disposed so that frame seal-ring areas 1810 (located thereupon) correspond with the positions of the sheet seal-ring areas 1818 of the sheet. The frame is metallic or metallized in order to facilitate joining as previously described herein. The frame 1802 further includes an electrode portion 1834 that does not circumscribe any frame apertures 1808. This frame electrode portion 1834 is positioned so as not to correspond to the position of the sheet electrode portion 1830, and preferably is disposed on an opposing side of the sheet-window/frame-grid assembly (i.e., when the sheet is assembled against the frame). The frame electrode portion 1834 is electrically connected to the metallized frame seal-ring areas 1810. One or more electrode pads 1836 may be provided on the electrode portion 1834 to receive electrical energy from electrodes during the subsequent ERH procedure.

Referring now to FIG. 18*c*, the sheet 1804 is shown positioned against the frame 1802 in preparation for heating to produce the hermetic seal therebetween. If applicable, solder or a solder preform has been positioned therebetween as previously described. It will be appreciated that when the transparent sheet 1804 is brought against the frame 1802, the metallized seal-ring areas 1818 on the lower surface of the sheet will be in electrical contact with the metallized seal-ring areas 1810 on the upper surface of the frame. However, the sheet electrode portion 1830 and the frame electrode portion 1834 will not be in direct contact with one another, but instead will be electrically connected only through the metallized seal-ring areas 1818 and 1810 to which they are, respectively, electrically connected. When an electrical potential is applied from electrode pads 1832 to electrode pads 1836 (denoted by the "+" and "−" symbols adjacent to the electrodes), electrical current flows through the junction region of the entire sheet-window/frame-grid assembly. This current flow produces electrical resistance heating (ERH) due to the resistance inherent in the metallic layers. In some embodiments, this electrical resistance heating may be sufficient to supply the necessary heat, in and of itself, to result in TC bonding, soldering, or other hermetic seal formation between the sheet 1804 and the frame 1802 in order to form a multi-unit assembly. In other embodiments, however, electrical resistance heating may be combined with other heating forms such as furnace or oven pre-heating in order to supply the necessary heat required for bonding to form the multi-unit assembly.

After bonding the sheet 1804 to the frame 1802 to form the multi-unit assembly, the sheet electrode portion 1830 and the frame electrode portion 1834 can be cut away and discarded, having served their function of providing electrical access for external electrodes (or other electrical supply members) to the metallized seal-ring areas of the sheet and frame, respectively. The removal of these "sacrificial" electrode portions 1830 and 1834 may occur before or during the "dicing" process step, i.e., the separating of the multi-unit assembly into individual cover assemblies. It will be appreciated that any of the technologies previously described herein for separating a multi-unit assembly into individual cover assemblies can be used for the dicing step of separating a multi-unit assembly fabricated using ERH heating.

Where ERH is to be used for manufacturing multiple cover assemblies simultaneously, the configuration of the sheet-window/frame-grid array and/or the placement of the electrodes portions within the sheet-window/frame-grid array may be selected to modify the flow of current through the junction region during heating. The primary type of modification is to even the flow of current through the various portions of the sheet-window/frame-grid during heating to produce more even temperatures, i.e., to avoid "hot spots" or "cold spots."

Referring now to FIGS. 19*a*-19*f*, there are illustrated various sheet-window/frame-grid configurations adapted for producing more even temperatures during ERH. In each of FIGS. 19*a*-19*f*, there is shown a sheet-window/frame-grid array 1900 comprising a prepared, metallized transparent sheet 1904 overlying a prepared, metallic/metallized frame 1902. The window portions of the sheet 1904 directly overlie the frame apertures of the frame 1902, and the metallized seal-ring areas of the sheet directly overlie the seal-ring areas of the frame (it will be appreciated that metallized portions of the sheet 1904 and the frame 1902 appear coincident in these figures). Metallized electrode portions formed on the transparent sheet 1904 are denoted by reference letters A, B, C and D. These electrode portions A, B, C and D are electrically connected to the adjoining sheet seal-ring areas of the sheet, but are electrically insulated from one another by non-metallized areas 1906 of the sheet. An external electrode is applied to the top of the metallic/metallized frame (on the side opposite from the sheet) across the area denoted by reference letter E. For bonding or soldering, electrical power is applied at the electrodes, e.g., one line to electrodes A, B, C and D simultaneously, and the other line to electrode E, or alternatively, one line in sequence to each of electrode A, B, C and D, and the other line to electrode E. It will be appreciated that many other combinations of electrode powering are within the scope of the invention.

Referring to FIG. 19*f*, this embodiment illustrates a sheet-window/frame-grid 1900 having a "shingle" configuration, i.e., where the seal-ring areas between the window portions/frame apertures do not form continuous straight lines across the assembly array. Shingle-arrangement frame assemblies are more labor-intensive to separate using scribe-and-break or cutting procedures. Separating such assemblies requires that each row first be separated from the overall grid, and then that individual cover assemblies be separated from the row by separate scribe-and-break or cutting operations. Nevertheless, use of shingle-arrangement assemblies may have benefits relating to heating using ERH techniques.

It will be understood that a metal frame such as 1802 or 1902, which may contain one or more added layers on its exterior, including but not limited to metal or metal alloy layers, may be diffusion bonded to a non-metallized sheet using ERH techniques to apply heat to the frame. The amount of temperature rise throughout the thickness of the non-metallized sheet will depend on the intensity and duration of the application of the electrical power (voltage and amperage) to the frame, as well as other factors. An innerlayer or interlayer material may be employed between the frame and the sheet during the diffusion bonding process, as discussed previously.

It will further be appreciated that the terms "thermal compression bonding" (and its abbreviation "TC bonding") and "diffusion bonding" are used interchangeably throughout this application. The term "diffusion bonding" is preferred by metallurgists while the term "thermal compression bonding" is preferred in many industries (e.g., semiconductor manufacturing) to avoid possible confusion with other types of "diffusion" processes used for creating semiconductor devices. Regardless of which term is used, as previously discussed, diffusion bonding refers to the family of bonding methods using heat, pressure, specific positive or negative pressure atmospheres and time alone to create a bond between mating surfaces at a temperature below the normal fusing temperature of either mating surface. In other words, neither mating surface is intentionally melted, and no melted filler material is added, nor any chemical adhesives used.

As previously described, diffusion bonding utilizes a combination of elevated heat and pressure to hermetically bond two surfaces together without first causing one or both of the adjoining surfaces to melt (as is the case with conventional soldering, brazing and welding processes). When making optical cover assemblies, wafer level assemblies or other temperature-sensitive articles, it is almost always required that the bonding temperatures remain below some upper limit. For example, in optical cover assemblies, the bonding temperature should be below the $T_G$ and the softening temperature, $T_S$, of the sheet material so as not to affect the pre-existing optical characteristics of the sheet. As another example, in wafer level assemblies, the bonding temperature should be below the upper temperature limit for the embedded micro device and/or its operating atmosphere (i.e., the gas environment inside the sealed package). However, the specific temperature and pressure parameters required to produce a hermetic diffusion bond can vary widely depending upon the nature and composition of the two mating surfaces being joined. Therefore, it is possible that some combinations of transparent sheet material (e.g., glass) and frame material (e.g., metals or metallized non-metals), or some combinations of frame materials and substrate materials (e.g., silicon, alumina or metals), will have a diffusion bonding temperature that exceeds the $T_G$ and/or the $T_S$ of the sheet material, or that exceeds some other temperature limit. In such cases, it might appear that diffusion bonding is unsuitable for use in hermetically joining the components together if the temperature limits are to be followed. In fact, however, it has been discovered that the use of "interlayers," i.e., intermediate layers of specially selected material, placed between the sheet material and the frame, or between the frame material and the substrate material, can cause hermetic diffusion bonding to take place at a substantially lower temperature than if the same sheet material was bonded directly to the same frame material, or if the same frame material was bonded directly to the same substrate material. Note that the terms "interlayers" and "innerlayers" are used interchangeably throughout this application, as both terms may be encountered in the art for the same thing.

A properly matched interlayer improves the strength and hermeticity (i.e., gas tightness or vacuum tightness) of a diffusion bond. Further it may promote the formation of compatible joints, produce a monolithic bond at lower bonding temperatures, reduce internal stresses within the bond zone, and prevent the formation of extremely stable oxides which interfere with diffusion, especially on the surface of Al, Ti and precipitation-hardened alloys. The interlayer is believed to diffuse into the parent material, thereby raising the melting point of the joint as a whole. Depending upon the materials to be joined by diffusion bonding, the interlayer material could be composed of a metal, a metal alloy, a glass material, a solder glass material including solder glass in tape or sheet form, or other materials. In the diffusion bonding of BT5-1 Ti alloy to Armco iron, an interlayer of molybdenum foil 0.3 mm thick has been used. Reliable glass-to-glass and glass-to-metal bonds are achieved with metal interlayers such as Al, Cu, Kovar, Niobium and Ti in the form of foil, usually not over 0.2 mm thick. The interlayers are typically formed into thin preforms shaped like the seal ring area of the mating surfaces to be joined.

It is important to distinguish the use of diffusion bonding interlayers from the use of conventional solder preforms and other processes previously disclosed. For purposes of this application, an interlayer is a material used between sealing surfaces to promote the diffusion bonding of the surfaces by allowing the respective mating surfaces to diffusion bond to the interlayer rather than directly to one another. For example, with the proper interlayer material, the diffusion bonding temperature for the joint between the sheet material and interlayer material, and for the joint between the interlayer material and the frame material, may be substantially below the diffusion bonding temperature of a joint formed directly between the sheet material and the frame material. Thus, use of the interlayer allows diffusion bonding of the sheet to the frame at a temperature which is substantially below the diffusion bonding temperature that would be necessary for bonding that sheet material and that frame material directly. The hermetic joint is still formed by the diffusion bonding process, i.e., none of the materials involved (the sheet material, the interlayer material nor the frame material) melts during the bonding process. This distinguishes diffusion bonding using interlayers from other processes such as the use of solder preforms in which the solder material actually melts to form the bond between the materials being joined. It is possible to use materials conventionally used for solders, for example, Au—Sn solder preforms, as interlayers for diffusion bonding. However, when used as interlayers they are used for their diffusion bonding properties and not as conventional solders (in which they melt).

The use of interlayers in the production of window assemblies or other packaging may provide additional advantages over and above their use as promoting diffusion bonding. These advantages include interlayers which serve as activators for the mating surfaces. Sometimes the interlayer materials will have a higher ductility in comparison to the base materials. The interlayers may also compensate for stresses which arise when the seal involves materials having different coefficients of thermal expansion or other thermal expansion properties. The interlayers may also accelerate the mass transfer or chemical reaction between the layers. Finally, the interlayers may serve as buffers to prevent the formation of undesirable chemical or metallic phases in the joint between components.

Figure 20A:
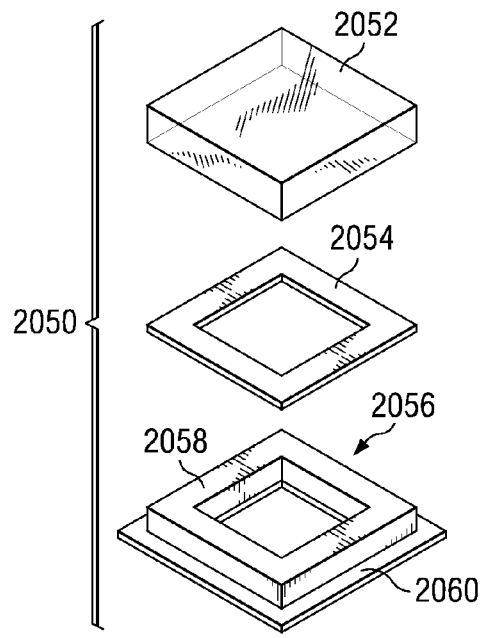
FIG. 20a illustrates an exploded view of a window assembly including interlayers for diffusion bonding.
Figure 20C:
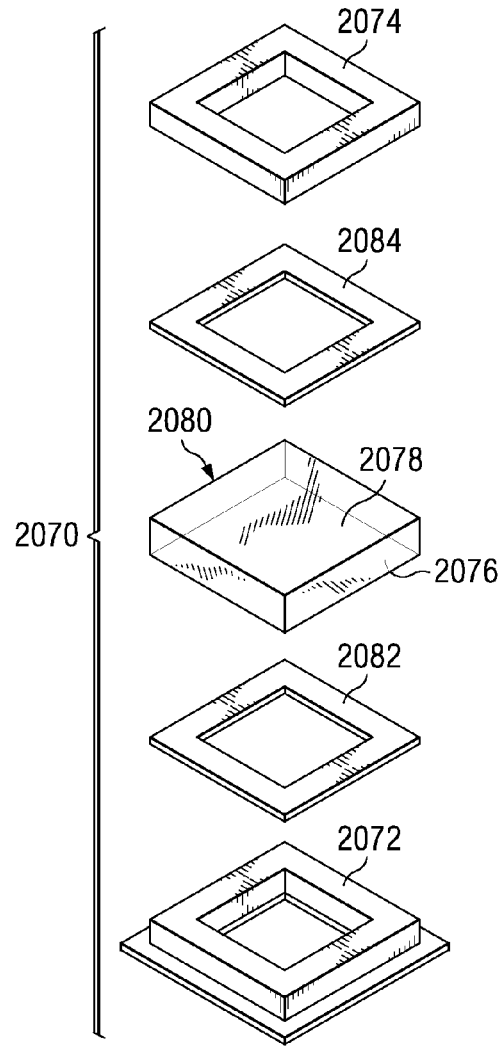
FIGS. 20c and 20d illustrate an additional embodiment of the invention having internal and external frames; specifically.
Figure 20B:
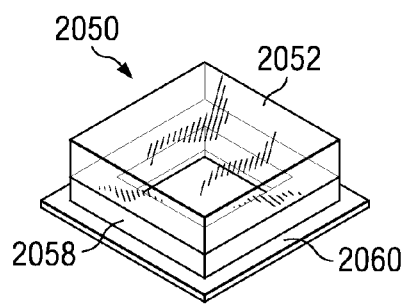
FIG. 20b illustrates the window assembly of FIG. 20a after diffusion bonding.

Referring now to FIGS. 20a and 20b, there is illustrated a window cover assembly including interlayers to promote joining by diffusion bonding. In this embodiment, the window assembly 2050 includes a transparent glass sheet 2052, an interlayer 2054 and a metal or metal alloy base 2056. The base 2056 includes a built-up seal ring area 2058 and a flange 2060 which facilitates the subsequent electric resistance seam welding of the finished window assembly to a package base or other higher level portion of the final component. The interlayer 2054 in this embodiment takes the form of a metallic preform which has the configuration selected to match the seal ring area 2058 of the frame. To form the hermetic window assembly, the sheet 2052, interlayer 2054 and frame 2056 are placed in a fixture (i.e., tooling) or mechanical apparatus (not shown) which can provide the required predetermined bonding pressure between the seal ring areas of the respective components. In some cases, the fixture may serve only to align the components during bonding, while the elevated bonding pressure is applied from a mechanical apparatus such as a ram. In other cases, however, the fixture may be designed to constrain the expansion of the stacked components during heating (i.e., along the stacking axis), whereby the thermal expansion of the assembly components toward the fixture, and of the fixture itself toward the components, will "self-generate" some or all of the necessary bonding pressures between the components as the temperature increases.

Figure 20D:
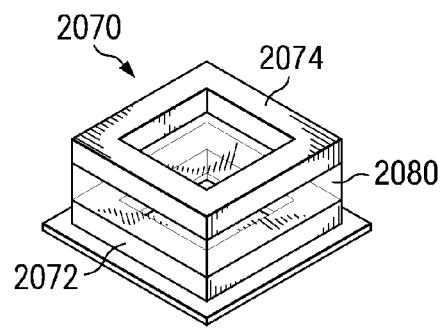
Figure 20E:
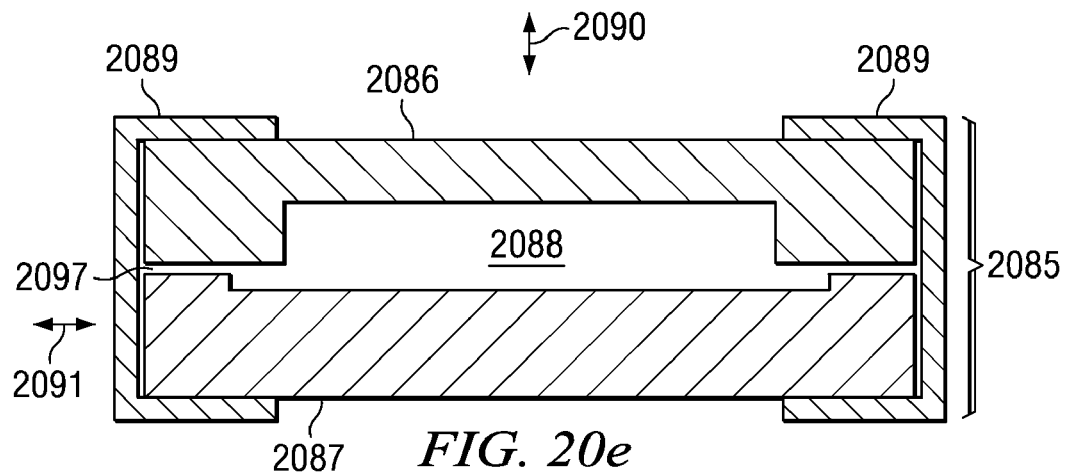
FIGS. 20e, 20f and 20g, illustrate fixtures for aligning and compressing the window assemblies during diffusion bonding; specifically.
Figure 20F:
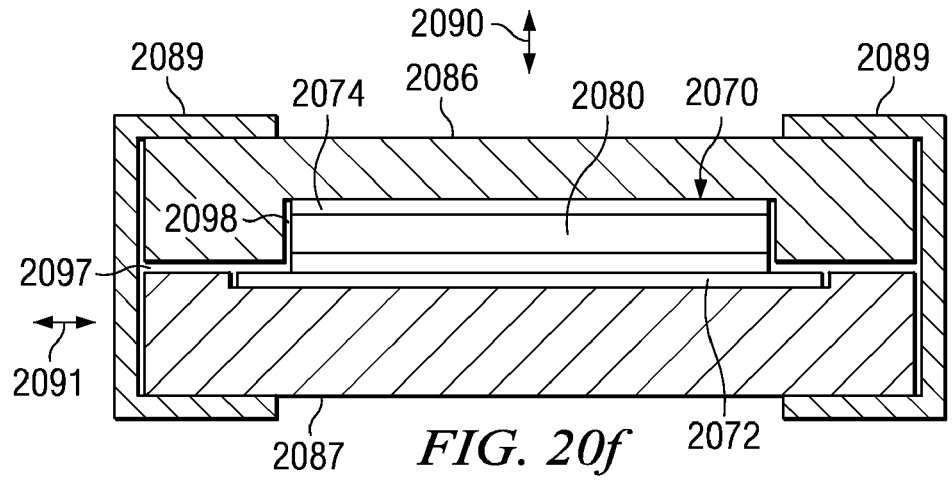

Referring now to FIGS. 20e and 20f, an example of a "self-compressing" fixture assembly is shown. As best seen in FIG. 20e, the fixture 2085 includes an upper fixture member 2086 and a lower fixture member 2087 which together define a cavity 2088 for receiving the window assembly components to be bonded. Clamps 2089 are provided which constrain the outward movement of the fixture members 2086 and 2087 in the axial direction (denoted by arrow 2090). Generally, the CTE of the material forming the clamps 2089 will be lower than the CTE of the material forming the fixture members 2086 and 2087. FIG. 20f shows the components for the window assembly 2070 (FIGS. 20c and 20d) loaded into the cavity 2088 of the fixture 2085 in preparation for bonding. Note that while the fixture members 2086 and 2087 are in contact with the upper and lower surfaces of the window components, a small gap 2097 is left between the fixture members themselves to allow the members to expand axially toward one another when heated (since they are constrained by the clamps). Also note that a small gap 2098 is generally left between the lateral sides of the window assembly components and the fixture members 2086 and 2087 to minimize the lateral force exerted on the components by the fixture members during heating. When the fixture 2085 is heated, the inner surfaces (i.e., facing the cavity 2088) of the fixture members 2086 and 2087 will expand (due to thermal expansion) axially toward one another against the window components, and the window components will expand outward against the fixture. These thermal expansions can press the window components against one another with great force in the axial direction to facilitate diffusion bonding. It will be appreciated that thermal expansion of the fixture members 2086 and 2087 will also occur in the lateral direction (denoted by arrow 2091). While this lateral expansion is not generally desired, in most cases is will not present an obstacle to the use of self-compressing fixtures.

Figure 20G:
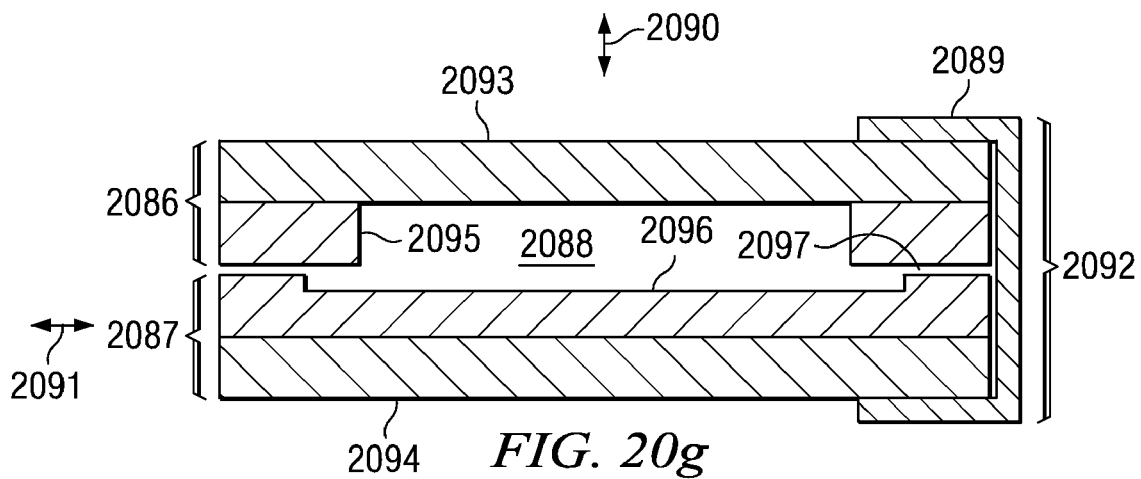

Referring now to FIG. 20g, there is illustrated an alternative self-compressing fixture adapted to enhance thermal expansion (and hence compression) in the axial direction 2090 without causing excessive thermal expansion in the lateral direction 2091. As with the previous example, alternative fixture 2092 includes an upper fixture member 2086 and a lower fixture member 2087 defining a cavity 2088 for receiving the window assembly components to be bonded, and clamps 2089 (only one of which is shown for purposes of illustration) which constrain the outward movement of the fixture members in the axial direction 2090. Also as in the previous embodiment, a first small gap 2097 is present between the fixture members 2086 and 2087 themselves, and a second small gap 2098 is present between the lateral sides of the window components and the fixture members. Unlike the previous embodiment, however, each fixture member 2086 and 2087 of the alternative fixture 2092 comprises two sub-members, namely, first sub-members 2093 and 2094, respectively, adapted to bear primarily axially against the window assembly components (not shown), and second sub-members 2095 and 2096, respectively, adapted to hold and align the window assembly components in the cavity. By selecting a material for the first sub-members 2093 and 2094 having a high CTE, axial expansion (and hence compression) during heating will be correspondingly high. However, lateral expansion and relative lateral movement between the second sub-members 2095 and 2096 and the window components can be minimized by selecting a different material for the second sub-members, namely, a material having a lower CTE (i.e., lower than the CTE for the first sub-members). Preferably, the CTE of the second sub-members 2095 an 2096 will be close to the CTE for the adjacent window components.

Referring again to FIGS. 20a and 20b, the assembled (but not yet bonded) components of the window assembly 2050 are then heated until the diffusion bonding pressure/temperature conditions are reached, and these conditions are maintained until a first diffusion bond is formed between the sheet 2052 and the interlayer 2054, and a second diffusion bond is formed between the interlayer 2054 and the seal ring area 2058 of the frame 2056. It will be understood that the first bond between the sheet and the interlayer may actually occur before, after or simultaneously with, the second bond between the interlayer and the frame. As previously explained, it will also be understood that the order of applying heat and pressure to form the diffusion bond is not believed to be significant, i.e., in other words whether the pre-determined pressure is applied, and then the heat is applied or whether the heat is applied and then the predetermined pressure is applied, or whether both heat and pressure are increased simultaneously is not believed to be significant, rather the diffusion bonding will occur when the preselected pressure and temperature are present in the bond region for a sufficient amount of time. After the diffusion bonds are formed, the sheet 2052 will be hermetically bonded to the frame 2056 to form a completed window assembly 2050 as shown in FIG. 20b.

In further embodiments of the current invention, it has been discovered that clean, i.e., unmetallized, glass windows may be directly bonded to frames of Kovar or other metallic materials using diffusion bonding. This is in addition to the diffusion bonding of metallized glass windows to Kovar frames as previously described. Optionally, the direct diffusion bonding of unmetallized glass windows to metallic frames may be enhanced through the use of certain compounds, e.g., molybdenum-manganese, on the frames. Whether the glass is metallized or unmetallized, the diffusion bonding is most commonly performed in a vacuum, however, it may be performed in various other atmospheres. The use of oxidizing atmospheres is typically not required, however, as any resulting oxides tend to be dispersed by pressures encountered in the bonding operation. In still other embodiments, of the invention, diffusion bonding can be used for joining frames made of Kovar and other metallic materials directly to sheets or wafers of semiconductor materials including silicon and gallium arsenide (GaAs).

Since successful diffusion bonding requires the mating surfaces being bonded to be brought into intimate contact with one another, the surface finish characteristics of the mating surfaces may be important parameters of the invention. It is believed that the following mating surface parameters will allow successful diffusion bonding between the mating surfaces of Kovar frames and thin sheet materials including, but not limited to, Kovar to metallized glass, Kovar to clean (i.e., unmetallized) glass, Kovar to metallized silicon, Kovar to clean (i.e., unmetallized) silicon, Kovar to metallized gallium arsenide (GaAs) and Kovar to clean (i.e., unmetallized) GaAs: Parallelism of sheet material (i.e., uniformity of thickness) within the range of ± about 12.7 microns; Surface flatness (i.e., deviation in height per unit length when placed on ideal flat surface) within range from 5 mils/inch to about 10 mils/inch; Surface roughness not more than about 16 micro-inches (0.4064 microns). These surface parameters can also be used for diffusion bonding of Kovar directly to Kovar, e.g., to manufacture built-up metallic frames.

The temperature parameters for diffusion bonding between the mating surfaces of Kovar frames and the thin sheet materials described above are believed to be within the range from about 40% to about 70% of the absolute melting temperature, in degrees Kelvin, of the parent material having the lower melting temperature. When diffusion bonding is used for bonding optically finished glass or other transparent materials, the bonding temperature may be selected to be below the $T_G$ and/or the softening temperature of the for the glass other transparent materials, thereby avoiding damage to the optical finish. Depending upon the bonding temperature selected, in some embodiments the application of optical and/or protective coatings to the transparent sheets (i.e., that become the windows) may be performed after the bonding of the sheets to the frames, rather than before bonding. In other embodiments, some of the optical and/or protective coatings may be applied to the glass sheets prior to bonding, while other coatings may be applied subsequent to bonding. With regard to pressure parameters, a pressure of 105.5 kg/cm$^2$ (500 psi) is believed suitable for diffusion bonding Kovar frames and the thin sheet materials previously described.

It will be noted that since the diffusion bonding occurs at high temperature, the CTE of the glass sheet should be matched to the CTE of the metallic frame. To the extent that the CTEs cannot be completely matched (e.g., due to non-linearities in the CTEs over the range of expected temperatures), then it is preferred that the CTE of the glass sheet be lower than the CTE of the metallic frame. This will result in the metallic frame shrinking more than the glass sheet as the combined window/frame assembly cools from its elevated bonding temperature (or from an elevated operational temperature) back to room temperature. The glass will therefore be subjected primarily to compression stress rather than tension, which reduces the tendency for cracking.

Referring now to FIGS. 20c and 20d, there is illustrated an additional embodiment of the invention, a window assembly having internal and external frames. FIG. 20c illustrates the components of window assembly 2070 before assembly, while FIG. 20d illustrates the completed assembly. The window assembly 2070 includes separate frame members 2072 and 2074, which are bonded (using diffusion bonding, soldering, brazing or other techniques disclosed herein) to the inner and outer surfaces 2076 and 2078, respectively, of the transparent sheet 2080. In other words, the transparent window material is "sandwiched" between a layer of frame material on the top of the window and a layer of frame material on the bottom of the window. Interlayers 2082 and 2084 may be provided for diffusion bonding as previously described, or alternatively, solder preforms (also shown as 2082 and 2084) may be provided for bonding by soldering as previously described.

Typically, the same bonding technique will be used for bonding both the internal and external frames to the window, however, this is not required. Similarly, the internal and external bonds will typically be formed at the same time, however, this in not required. The internal frame 2072 must, however, be hermetically bonded to the window 2080 to produce a hermetic window assembly. A hermetic bond is not typically required for bonding the external frame 2074 to the window 2080, however, it may be preferred for a number of reasons.

One benefit of window assemblies having the so-called "sandwiched" frame configuration is to equalize the stresses on the internal and external surfaces, 2076 and 2078, respectively, of the transparent sheet 2080 that are caused by differential thermal expansion characteristics of the frames 2072 and 2074 and sheet (due to unequal CTE), e.g., during cooling after bonding, or during thermal cycling. Put another way, when a window assembly has a frame bonded to only one surface, uneven expansion and contraction between the frame and sheet may produce significant shear stresses within the sheet. These shear stresses may be strong enough to cause shear failure (e.g., cracking or flaking) within the transparent sheet even though the window-to-frame bond itself remains intact. When a frame is bonded to both the internal and external surfaces of the window, however, the shear stresses within the glass (or other transparent material) may be significantly reduced. This is particularly true if the same material or material having similar CTEs are used for both the internal and external frames. This stress-equalization through the thickness of the window increases the reliability and durability of the assembled window during subsequent thermal cycling and/or physical shock.

Sandwiched construction may be used in window assemblies or in WLP assemblies. Sandwiched construction with internal and external frames is especially advantageous where the sheet and frame materials have significantly different CTEs. In addition to the stress balancing features of sandwiched construction, use of an external frame on the sheet may have additional benefits, including: enhancing thermal spreading across the window; enhancing heat dissipation from the assembly; serving as an optical aperture; facilitating the aligning/fixturing or clamping of the device during bonding or assembly to higher level assemblies; and to display working symbolization.

Figure 21A:
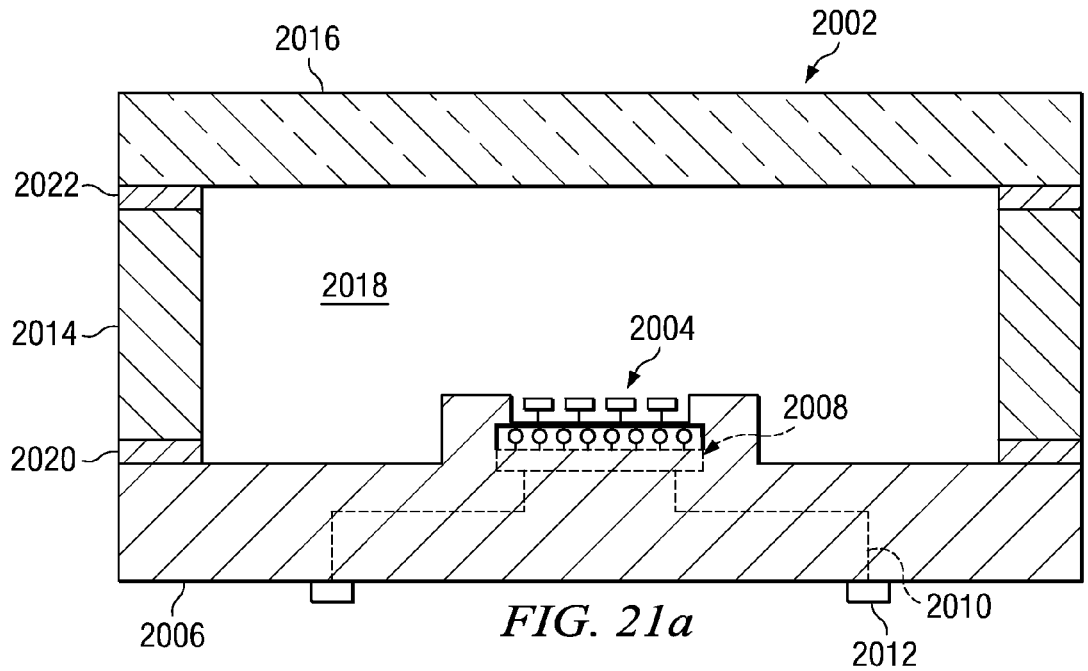
FIGS. 21a-21b are cross-sectional views of wafer-level hermetic micro-device packages in accordance with other embodiments of the invention; specifically.
Figure 21B:
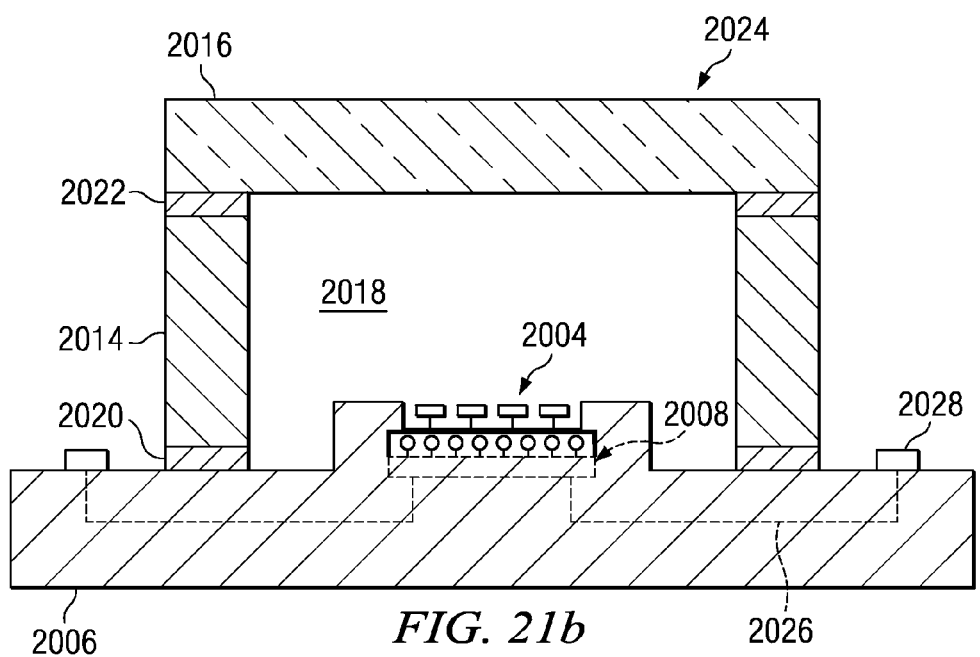

Referring now to FIGS. 21a and 21b, there are illustrated two examples of hermetically sealed wafer-level packages (also known as "WLPs") for micro-devices in accordance with other embodiments of the invention. These embodiments are substantially similar to one another, except that wafer-level package 2002 (FIG. 21a) has reverse-side external electrical connections while wafer-level package 2024 (FIG. 21b) has same-side external electrical connections. The wafer-level packages, while similar in many respects to the discrete device packages previously disclosed herein, utilize the substrate of the micro-device itself, typically a semiconductor substrate, as a portion of the package's hermetic envelope. Such wafer-level packaging provides a very economical method for hermetically encapsulating wafer-fabricated micro-devices, especially where high production volumes are involved. As will be described below, a single micro-device may be packaged using WLP technology, or multiple micro-devices on the original production wafer may be packaged simultaneously using WLP technology in accordance with various aspects of the current invention.

Referring now specifically to FIG. 21a, the wafer-level package 2002 encloses one or more micro-devices 2004, e.g., a MEMS device or MOEMS device fabricated on a substrate 2006. The substrate 2006 is typically a wafer of silicon (Si) or gallium arsenide (GaAs) upon which electronic circuitry 2008 associated with the micro-device 2004 is formed using known semiconductor fabrication methods. Electrical vias 2010 (shown in broken line) may be formed in the substrate 2006 using known methods to connect the circuitry 2008 to externally accessible connection pads 2012 disposed on the reverse side (i.e., with respect to the device) of the substrate. It will be appreciated that the path of vias 2010 shown in FIG. 20 has been simplified for purposes of illustration. One end of a frame 2014 made of Kovar or other metallic material is hermetically bonded to the substrate 2006, and a transparent window 2016 is, in turn, hermetically bonded to the other end of the frame to complete the hermetic envelope sealing the micro-device within the cavity 2018. The frame-mating surfaces of the substrate 2006 may be prepared or metallized with one or more metal layers 2020 to facilitate bonding to the frame, and similarly the frame-mating surfaces of the window 2016 may be prepared or metallized with one or more metal layers 2022 for the same purpose.

Referring now specifically to FIG. 21b, the wafer-level package 2024 is substantially identical to the package 2002 previously described, except that in this case the vias 2026 are routed to external connection pads 2028 disposed on the same side of the substrate 2006. Obviously, in such embodiments, the frame 2014 and window 2016 are dimensioned to leave uncovered a portion of the substrate's upper surface.

Figure 21C:
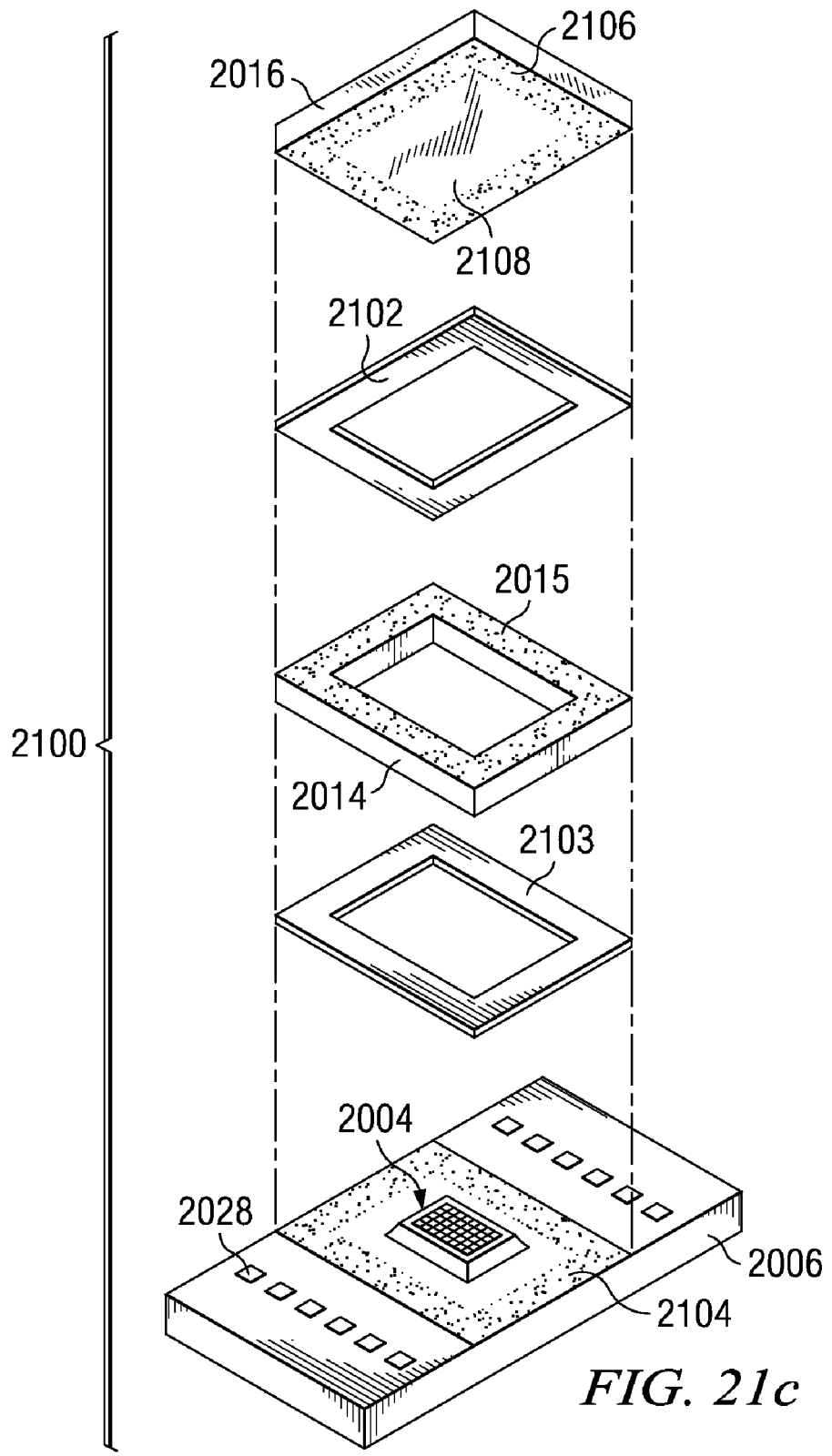
FIG. 21c is an exploded view illustrating the method of assembly of the package of FIG. 21b.

Referring now to FIG. 21c, there is shown an exploded view of a WLP 2100 illustrating one possible method of manufacture. To package individual or multiple micro-devices using WLP methods, the following components are necessary: a substrate 2006 having a micro-device 2004 thereupon; a frame/spacer 2014 having a continuous sidewall 2015 and that is "taller" than the device to be encapsulated (to provide clearance); and a transparent sheet or window 2016. Depending upon the bonding method to be used, solder preforms of a metal alloy or glass composition, or interlayers for diffusion bonding 2102 and 2103 may also be required. It will be appreciated that the top preform 2102 (between the window 2106 and the frame 2014) may be a different material than the bottom preform 2103 (between the frame 2014 and the substrate 2006).

Briefly, the steps for forming the package 2100 are as follows: A first frame-attachment area 2104 is prepared on the surface of the wafer substrate 2006 of the subject micro-device. This first frame-attachment area 2104 has a plan (i.e., configuration when viewed from above) that circumscribes the micro-device or micro-devices 2004 on the substrate 2006. A second frame-attachment area 2106 is prepared on the surface of the window 2016. The second frame-attachment area 2106 typically has a plan substantially corresponding to the plan of the first frame-attachment area 2104. The execution order of the previous two steps is immaterial. Next, the frame/spacer 2014 is positioned between the substrate 2006 and the window 2016. The frame/spacer 2014 has a plan substantially corresponding to, and in register with, the plans of the first and second frame-attachment areas 2104 and 2106, respectively. If applicable, the solder preforms 2102 and 2103 or diffusion bonding interlayers 2102 and 2103 are interposed at this time between the frame/spacer 2014 and the frame-attachment areas 2104 and/or 2106. Finally, the substrate 2006, frame/spacer 2014 and window 2016 are bonded together (facilitated by solder or glass preforms 2102 and 2103 or diffusion bonding interlayers 2102 and 2103, if applicable) to form a hermetically sealed package encapsulating micro-device 2004 within, but allowing light to travel to and/or from the micro-device through the transparent aperture area 2108 of the window.

It will be understood that diffusion bonding of the package 2100 can be performed in a single (combined) step or in a number of sub-steps. For example, all five components (sheet 2016, first interlayer 2102, frame 2014, second interlayer 2103 and substrate 2006) could be stacked in a single fixture and simultaneously heated and pressed together to cause diffusion bonds to form at each of the sealing surfaces. Alternatively, the window sheet 2016 may be first diffusion bonded to the frame 2014 using first interlayer 2102 (making a first subassembly), and then this first subassembly may be subsequently diffusion bonded to the substrate 2006 using second interlayer 2103. In another alternative, the frame 2014 could be diffusion bonded to the substrate 2006 using second interlayer 2103, and then the transparent sheet 2016 may subsequently be bonded to the sub-assembly using first interlayer 2102. The choice of which bonding sequence to be used would, of course, depend upon the exact materials to be used, the heat sensitivity of the transparent material in the sheet 2016, the heat sensitivity of the micro device 2004 and, perhaps, other parameters such as the expansion characteristics of the frame 2014 and interlayer materials.

It will further be appreciated that the current invention is similar in several respects to the manufacturing of the "stand-alone" hermetic window assemblies previously described. The preparing of the frame-attachment areas 2106 of the window 2016 may be performed using the same techniques previously described for use in preparing the sheet seal-ring area 318, including cleaning, roughening, and/or metallizing with one or more metallic layers as set forth in the earlier Examples 1-96.

While the transparent windowpane 2016 may be roughened (e.g., in preparing the frame-attachment area 2106) to promote adhesion of the first metallic layer being deposited onto it (e.g., by CVD or PVD), the wafer substrate 2006 will not typically be roughened in the same manner. Instead, the initial metallic layer on the wafer substrate 2006 will typically be deposited using conventional wafer fabrication techniques. Where conventional methods of wafer fabrication include the requirement or option of etching a silicon or GaAs wafer to promote adhesion of a metal's deposition, then the same practice may be followed in preparing the frame attachment area 2104 on the wafer substrate 2006 when building WLP devices.

Other wafer or substrate materials include, but are not limited to, glass, diamond and ceramic materials. Some ceramic wafers are known as alumina wafers. These alumina wafers or substrates may be multi-layer substrates, and may be manufactured using Low-Temperature Co-Fired (LTCC) or High-Temperature Co-Fired (HTCC) materials and processes. LTCC and HTCC substrates often have internal and external electrical circuitry or interconnections. This circuitry is typically screen printed onto the ceramic or alumina material layer(s) prior to co-firing the layers together.

Also, any of the bonding techniques and parameters previously described for use on window assemblies may be used to hermetically bond the WLP components to one another, including diffusion bonding/TC bonding with or without the use of interlayers, soldering using a solder preform and soldering using inkjet-dispensed solders. The primary difference is that when making "stand-alone" window assemblies, only two primary components (namely, the transparent sheet/window 304 and frame 302) are bonded together, while when making WLPs, three primary components (namely, the window 2016, frame 2014 and substrate 2006) are bonded together (sometimes simultaneously). Of course, when producing WLPs using soldering techniques, additional components may be required, for example one or more solder preforms 2102 or a quantity of inkjet-dispensed solder. The solder preforms, if used, may be attached to the top and/or bottom of the frame 2014 as one step in the manufacture of that item. This will simplify the alignment of the three major components of the WLP assembly. It will, of course, be appreciated that this pre-attachment of the solder preforms to the frame is also applicable to the "stand-alone" window assemblies previously described. One of the methods for attaching solder preforms to the window 2016, frame 2014 and/or substrate 2006 is to tack the preform in place using a localized heat source.

Prior to soldering components together, cleaning the surfaces of the solder preforms and/or the metallized surfaces of the window 2016, frame 2014 and/or substrate 2006 may be necessary to remove surface oxides. It is desirable to avoid using fluxes during the soldering process to eliminate the need for post-soldering or defluxing. Several surface preparation technologies are available to prepare the metal and solder surfaces for fluxless soldering.

Several other processes may be used for preparing the surfaces of window assemblies or WLP components for soldering to avoid the need to remove fluxes after soldering. A first option is to use what is known in the trade as a no-clean flux. This type of flux is intended to be left in place after soldering. A second option is the use of gas plasma treatments for improving solderability without flux. For example, a non-toxic fluorine-containing gas may be introduced that reacts at the surface of the solder. This reaction forms a crust on the solder and dissolves upon remelt. The welds and joints formed are equal to or better than those formed when using flux. Such plasmas offer benefits including the removal by reduction of oxides and glass to promote improvements in solderability and wire bondability. Such treatments have been indicated on thick film copper, gold and palladium. Additional candidate gases for leaving a clean oxide-free surface include hydrogen and carbon monoxide plasma. Still further candidate gases include hydrogen, argon and freon gas combinations. One version of plasma treatment is known as Plasma-Assisted Dry Soldering (PADS). The PADS process coverts tin oxide (present in fluxless solders when unstable reduced tin oxide reoxidizes upon exposure to air) to oxyfluorides that promote wetting. The conversion film breaks up when the solder melts and allows reflow. The film is understood to be stable for more than a week in air and for more than two weeks when the parts are stored in nitrogen.

As in the previously described methods for manufacture of individual and multiple window assemblies for hermetically packaging discrete micro-devices, the selection of compatible materials for the various components for the manufacture of WLPs is another aspect of the invention. For example, each of the primary components (e.g., window, frame/spacer and wafer substrate) of the WLP will preferably have closely matched CTEs to insure maximum long-term reliability of the hermetic seal. The frame/spacer 2014 may be formed of either a metallic material or of a non-metallic material. The best CTE match will be achieved by forming the frame/spacer 2014 from the same material as either the wafer substrate 2006 or the window 2016. However, gallium arsenide (GaAs) and silicon (Si) (i.e., the materials typically used for the wafer substrate) and most glasses (i.e., the material that is typically used for the window) are relatively brittle, at least in comparison to most metals and metal alloys. These non-metallic materials are therefore typically not as preferred for forming the frame/spacer 2014 as are metals or metal alloys, because the metals and metal alloys typically exhibit better resistance to cracking. In fact, the use of a metal or metal alloy for the frame/spacer 2014 is believed to provide additional resistance to accidental cracking or breaking of the wafer substrate 2006, window 2016 and complete WLP 2002 after bonding. When a metallic frame/spacer 2014 is employed, it will preferably be plated with either gold alone, or with nickel and then gold, sometimes to facilitate diffusion bonding or soldering, but more often, to provide a surface on the frame/spacer that provides various kinds of protection between the frame/spacer and the atmosphere inside the package. If, however, a non-metallic frame/spacer 2014 is employed, then it might be metallized to facilitate diffusion bonding or soldering. The metal layers used on the frame/spacer 2014 may be the same as those used on the windowpane 304 for the manufacture of window assemblies, e.g., the final layer might be one of chromium, nickel, tin, tin-bismuth and gold.

In selecting compatible materials for the components of WLPs, it is recognized that silicon (Si) has a CTE ranging from about 2.6 PPM/° K at 293° K to about 4.1 PPM/° K at 1400° K. If it is assumed that the operating temperatures for micro-devices such as MEMS and MOEMS will be within the range from about −55° C. to about +125° C., and that the expected diffusion bonding or soldering temperatures will be within the range from about +250° C. to about +500° C., it may be interpolated that silicon wafers of the type used for WLP substrates will have a CTE within the range from about 2.3 PPM/° K to about 2.7 PPM/° K. One metallic material believed suitable for use in frame/spacers 2014 that will be bonded to silicon (Si) substrates is the alloy known as "Low Expansion 39 Alloy," developed by Carpenter Specialty Alloys. Low Expansion 39 Alloy is understood to have a composition (weight percent; nominal analysis) as follows: about 0.05% C, about 0.40% Mn, about 0.25% Si, about 39.0% Ni, and the balance Fe. Low Expansion 39 Alloy has a CTE that is understood to range from about 2.3 PPM/° K over the interval of 25° C. to 93° C., to about 2.7 PPM/° K at 149° C., to about 3.2 PPM/° K at 260° C., and to about 5.8 PPM/° K at 371° C.

Similarly, it is recognized that gallium arsenide (GaAs) of the type used for WLP wafer substrates has a nominal CTE of about 5.8 PPM/° K. Based on material suppliers' data, Kovar alloy is understood to have a CTE ranging from about 5.86 PPM/° K at 20° C. to about 5.12 PPM/° K at 250° C. Thus, Kovar alloy appears to be a good choice for frame/spacers 2014 that will be bonded to GaAs substrates. Another material believed suitable for frame/spacers 2014 that will be bonded to GaAs substrates is the alloy known as Silvar™, developed by Texas Instruments Inc.'s Metallurgical Materials Division, of Attleboro, Mass. It is understood that Silvar™ is a derivative of Kovar with CTE characteristics closely matched to GaAs devices.

With regard to the window/lens for WLPs, it is believed that all of the glasses previously described for use in the manufacture of individual and multiple window assemblies having Kovar frames, e.g., Corning 7052, 7050, 7055, 7056, 7058 and 7062, Kimble (Owens Corning) EN-1, Kimble K650 and K704, Abrisa soda-lime glass, Schott 8245 and Ohara Corporation S-LAM60, will be suitable for the window/lens 2016 of WLPs having a GaAs substrate 2006. Pyrex glasses and similar formulations are believed suitable for the window/lens 2016 of WLPs having silicon substrates 2006. The properties of Pyrex, per the Corning website, are: softening point of about 821° C., annealing point of about 560° C., strain point of about 510° C., working point of about 1252° C., expansion (0-300° C.) of about $32.5 \times 10^{-7}$/° C., density of about 2.23 g/cm$^3$, Knoop hardness of about 418 and refractive index (at 589.3 nm) of about 1.474.

Figure 22:
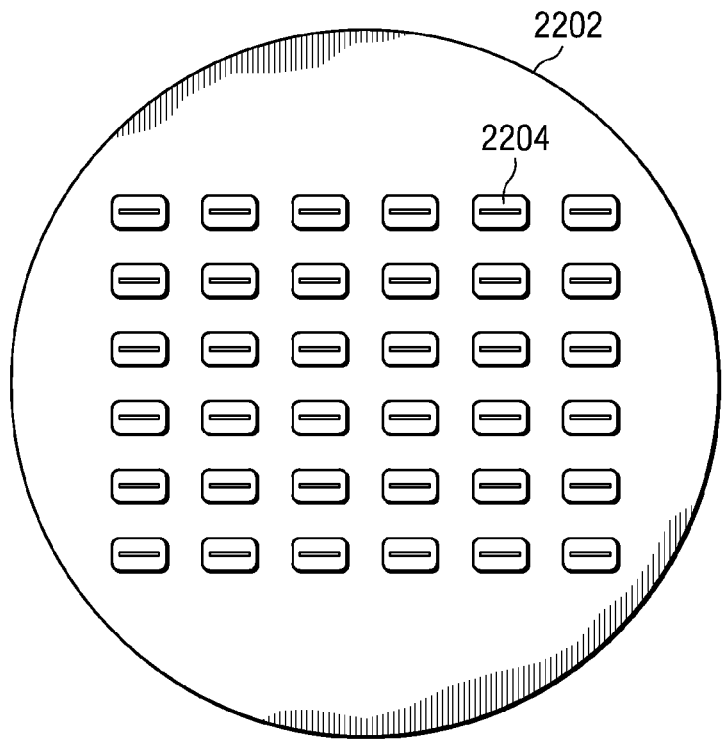
FIG. 22 illustrates a semiconductor wafer having a multiple micro-devices formed thereupon suitable for multiple simultaneous wafer-level packaging.

Referring now to FIG. 22, there is illustrated a semiconductor wafer 2202 having a plurality of micro-devices 2204 formed thereupon. It will be appreciated that methods for the production of multiple micro-devices on a single semiconductor wafer are conventional. Heretofore, however, when the micro-devices 2204 are of the type which must be hermetically packaged prior to use, e.g., MEMS, MOEMS, optoelectronic or optical devices, it has been standard practice in the industry to first "individuate" or "singulate" the micro-devices, e.g., by cutting-apart, dicing (apart) or breaking-apart the wafer 2202 into sections having, typically, only a single micro-device on each, and then packaging the individuated micro-devices in separate packages. Now, in accordance with additional embodiments of the current invention, multiple micro-devices may be individually hermetically packaged, or hermetically packaged in multiples, in a WLP prior to individuation or singulation of the substrate wafer. This process is referred to as multiple simultaneous wafer-level packaging, or "MS-WLP."

Referring now to FIGS. 23 through 29, there is illustrated one method for MS-WLP of micro-devices. Briefly, this method includes the steps of: a) preparing a first frame-attachment area on the surface of a semiconductor wafer substrate having a plurality of micro-devices, the first frame-attachment area having a plan circumscribing individual (or multiple) micro-devices on the substrate; b) preparing a second frame-attachment area on the surface of a window (i.e., a sheet of transparent material), the second frame-attachment area having a plan substantially corresponding to the plan of the first frame-attachment area; c) positioning a frame/spacer between the substrate and the window, the frame/spacer having a plan substantially corresponding to, and in register with the plans of the first and second frame-attachment areas, respectively; and d) hermetically bonding the substrate, frame/spacer and window together so as to encapsulate the micro-device. If applicable, solder preforms or other materials including, but not limited to, innerlayers of interlayers for diffusion bonding, are also positioned between the frame/spacer and the window and/or substrate before bonding.

Figure 23:
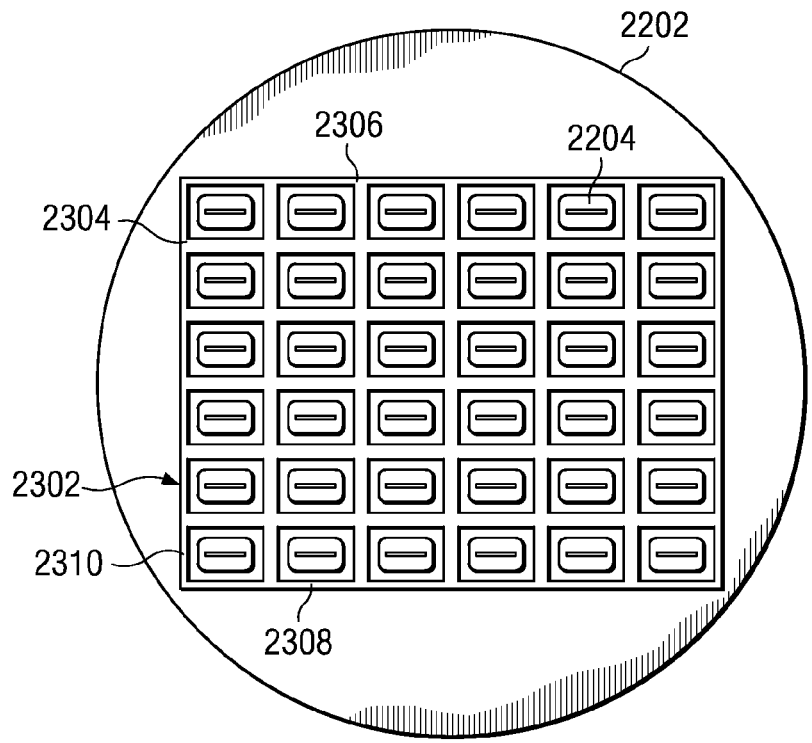
FIG. 23 illustrates the semiconductor wafer of FIG. 22 after metallization of the wafer surface.

Referring now specifically to FIG. 23, the frame-attachment area 2302 of semiconductor wafer 2202 has been prepared by depositing metallized layers onto the surface of the wafer substrate completely around (i.e., circumscribing) each micro-device 2204. In the embodiment shown, the prepared frame-attachment area 2302 includes a rectangular grid consisting of double-width metallized rows 2304 and columns 2306 (interposed between the micro-devices 2204) surrounded by single-width outer rows 2308 and columns 2310. The composition and thickness of the metallized layers in frame-attachment area 2302 may be any of those previously described for use in preparing the sheet seal-ring area 318 as set forth in Examples 1-96.

Figure 24:
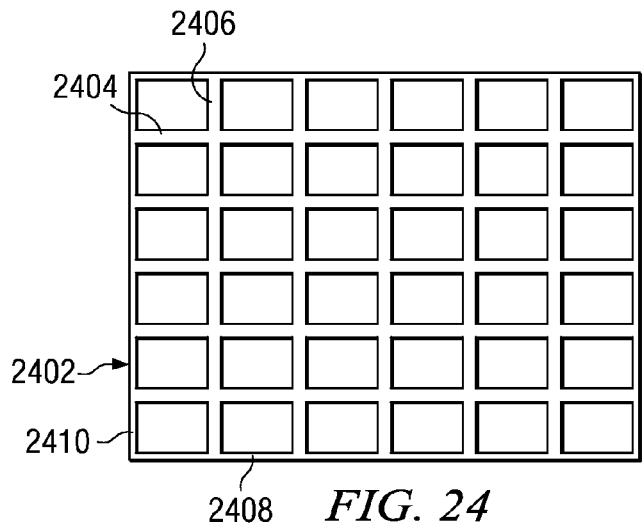
FIG. 24 illustrates a metallic frame for attachment between the wafer surface and the window sheet of a hermetic package.

Referring now to FIG. 24, there is illustrated a MS-WLP frame/spacer 2402 for attachment between the wafer 2202 and the window sheet 2602 of the MS-WLP assembly. It will be appreciated that in this embodiment, the MS-WLP frame/spacer 2402 has double-width row members 2404 and column members 2406 surrounded by single-width outer row members 2408 and column members 2410, resulting in a plan which corresponds substantially with the plan of the frame-attachment area 2302 on the wafer substrate 2202. As will be further described below, the purpose of the double-width row and column members 2404 and 2406 is to allow room for cutting the frame during singulation of the MS-WLP assembly after bonding. It will be appreciated that, in other embodiments, the MS-WLP frame/spacer may have a different configuration. In this embodiment, the MS-WLP frame/spacer 2402 is formed of a metal alloy having a CTE substantially matched to the CTE of wafer substrate, however, in other embodiments the frame/spacer may be formed of non-metallic materials as previously described. Also as previously described, the frame/spacer 2402 will preferably be plated or metallized to facilitate the bonding process.

Figure 25A:
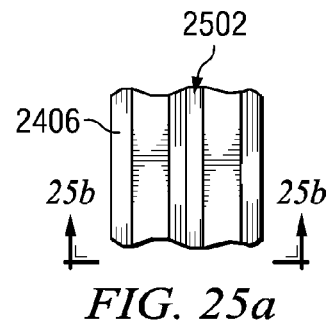
FIGS. 25a-25d show enlarged views of the frame members of FIG. 24; specifically.
Figure 25B:
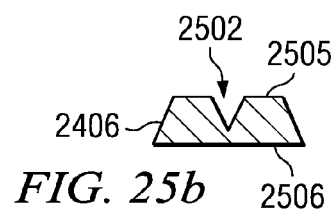
Figure 25C:
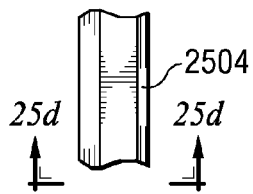
Figure 25D:
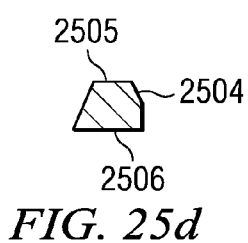

Referring now to FIGS. 25a-25d, there are illustrated details of a preferred configuration for the frame/spacer 2402. FIG. 25a shows an enlarged plan view of a portion of the double-width column member 2406 and FIG. 25b shows an end view of the same portion. It will be appreciated that the row members 2404 of the frame/spacer 2402 preferably have a similar configuration. The member 2406 is formed to have a "groove" 2502, or reduced thickness area, running along the central portion of each member, i.e., between the adjacent micro-devices in the completed MS-WLP assembly. As will be further described below, the groove 2502 facilitates cutting apart of the MS-WLP assembly during singulation of the packaged micro-devices. After being cut apart along the groove 2502, the frame member 2406 will be divided into two single-width members 2504, each one having the configuration shown in FIGS. 25c and 25d. During assembly, the grooved side 2505 of the frame member is preferably positioned against the wafer substrate 2202, while the ungrooved side 2505 is positioned against the window sheet.

Figure 26:
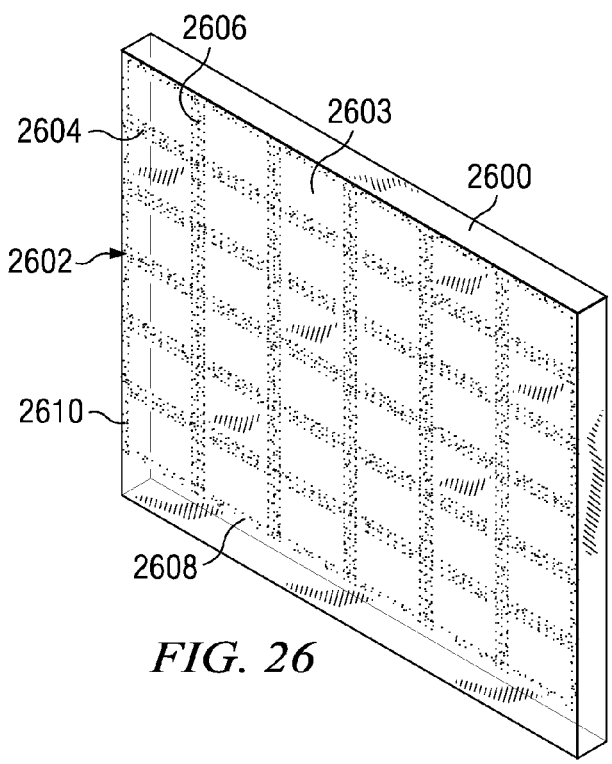
FIG. 26 illustrates a metallized window sheet for attachment to the frame of FIG. 24.

Referring now to FIG. 26, there is illustrated a MS-WLP window sheet 2600 for attachment to the MS-WLP frame/spacer 2402. The window sheet 2600 is formed of glass or other transparent material having a CTE compatible with the other principal components of the assembly as previously described. At least the inner side (i.e., the side that will be inside the hermetic envelope) of the sheet 2600, and preferably both sides, must be optically finished. Any desired optical or protective coatings are preferably present on at least the inner side, and preferably on both sides, of the sheet 2600 at this point. However, if the sheet 2600 is attached to only the frame/spacer 2402 in the first of two bonding operations, then the optical or protective coatings may be applied prior to the second, later bonding step of attaching the window assembly to the wafer. A frame-attachment area 2602 is prepared on the MS-WLP window sheet 2600 so as to circumscribe a plurality of window apertures 2603 that will ultimately be aligned with the micro-devices 2204 in the final MS-WLP assembly. In the embodiment shown, the prepared frame-attachment area 2602 takes the form of metallic layers deposited on the sheet 2600 in a rectangular grid consisting of double-width rows 2604 and columns 2606 surrounded by single-width outer rows 2608 and columns 2610. This results in a plan for the frame-attachment area 2602 which corresponds substantially with the plan of the frame/spacer 2402. The composition and thickness of the metallized layers 2604, 2606, 2608 and 2610 in the frame-attachment area 2602 may be any of those previously described for use in preparing the sheet seal-ring area 318 of the "stand-alone" windows set forth in Examples 1-96.

In some embodiments, the inner surface of the window sheet 2600 may be scribed, e.g., with a diamond stylus, through each portion of the frame-attachment area 2602 to facilitate breaking apart of the MS-WLP assembly during singulation. The scribing of the window sheet 2600 would obviously be performed prior to bonding or joining it to the frame/spacer 2402. Where the frame/spacer 2402 includes grooved members such as those illustrated in FIGS. 25a-25b, then the scribe lines on the sheet 2600 will preferably be in register with the grooves 2502 of the frame members in the MS-WLP assembly.

Figure 27:
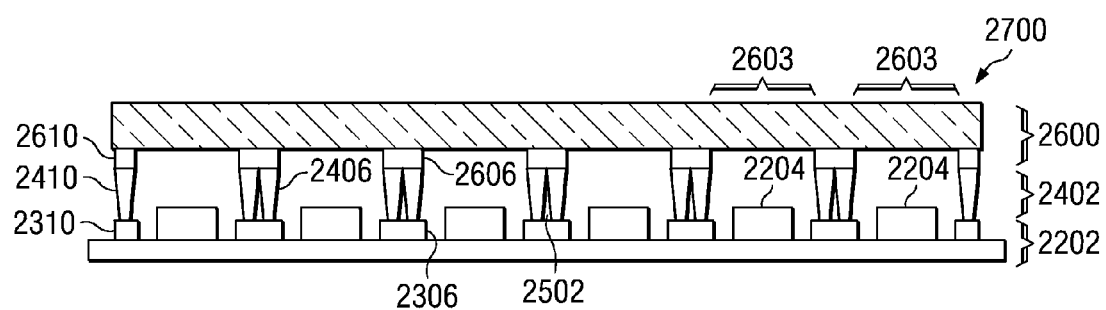
FIG. 27 shows a cross-sectional side view of a multiple-package assembly prior to singulation.

Referring now to FIG. 27, there is illustrated a side view of a complete MS-WLP assembly 2700. It will be appreciated that the proportions of some of the components shown in FIG. 27 (e.g., the thicknesses of the metallic layers) may be exaggerated for purposes of illustration. The frame/spacer 2402 is positioned between the wafer substrate 2202 (with associated micro-devices 2204) and the window sheet 2600, with the plans of the frame-attachment areas 2302 and 2602 being substantially in register with the plan of the frame/spacer 2402 such that each micro-device or set of micro-devices 2204 is positioned beneath a window aperture area 2603 of the window sheet. Of course, if the assembly 2700 is bonded using solder technology, then solder preforms (not shown) having a plan substantially corresponding with the frame-attachment areas 2302 and 2602 are also positioned between the frame/spacer 2402 and the frame-attachment areas prior to bonding. Also, if innerlayers or interlayers are used in conjunction with diffusion bonding, these interlayers (not shown) having a plan substantially corresponding with the frame-attachment areas 2302 and 2602 are also positioned between the frame/spacer 2402 and the frame-attachment areas prior to bonding. Any of the previously described bonding technologies may be used to effectuate the bond between the components. The MS-WLP assembly 2700 will look essentially the same before bonding and after bonding (except for incorporation into the bond area of any solder preforms).

After bonding, the MS-WLP assembly 2700 is cut apart, or singulated, to form a plurality of hermetically sealed packages containing one or more micro-devices each. There are several options carrying out the singulation procedure. However, since the window sheet 2600, frame 2402 and wafer substrate 2202 are bonded together, simply scribing and breaking the window sheet (as was done for the multiple stand-alone window assemblies) is not practical. Instead, at least the window sheet 2600 or the wafer substrate 2202 must be cut. The remaining portion may then either be cut, or scribed and broken. It is believed that the best result will be obtained by cutting the wafer substrate 2202 using a wafer-dicing saw, and then either scribing-and-breaking the window sheet 2600, or cutting the window sheet using a similar dicing saw.

Figure 28:
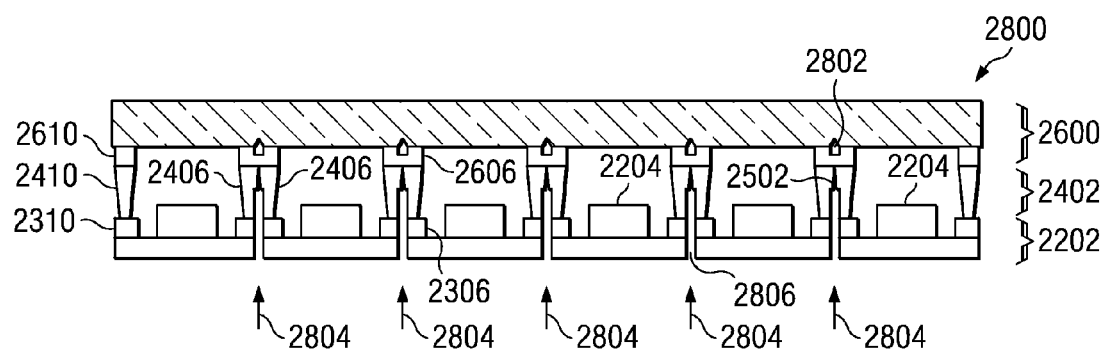
FIG. 28 illustrates one option for singulation of the multiple-package assembly of FIG. 27.

Referring now to FIG. 28, there is illustrated one option for singulation of a MS-WLP assembly. The MS-WLP assembly 2800 shown in FIG. 28 is similar in most respects to the assembly 2700 shown in FIG. 27, however, in this case the window sheet 2600 was pre-scribed (as denoted by reference number 2802) through the metallic layers 2406, if employed (and also layers 2404 running perpendicular thereto, also if employed) of the interior frame-attachment areas. After bonding, the assembly 2800 is cut from the outer side of the wafer substrate 2202 (as indicated by arrow 2804) completely through the substrate and into the groove 2502 of interior frame/spacer members 2606 (and also members 2604 running perpendicular thereto). The cut 2804 does not, however, continue through the window sheet 2600. Instead, after the wafer substrate 2202 and frame 2402 are cut, the window sheet 2600 is broken by bending it along the pre-scribed lines 2802. The assembly 2800 may be first broken into rows, then each row broken into individual packages along the column lines, or vice versa. In one variation of this method, the window sheet 2600 is not pre-scribed, but instead is scribed through the kerf 2806 formed by cutting through the wafer substrate 2202 and frame 2402. It will be appreciated that this scribing must be sufficiently forceful to cut through the remaining portion of the frame member 2406 and metallic layers 2606 under the groove 2502. The assembly is then broken into individual packages along the scribe lines as before.

Figure 29:
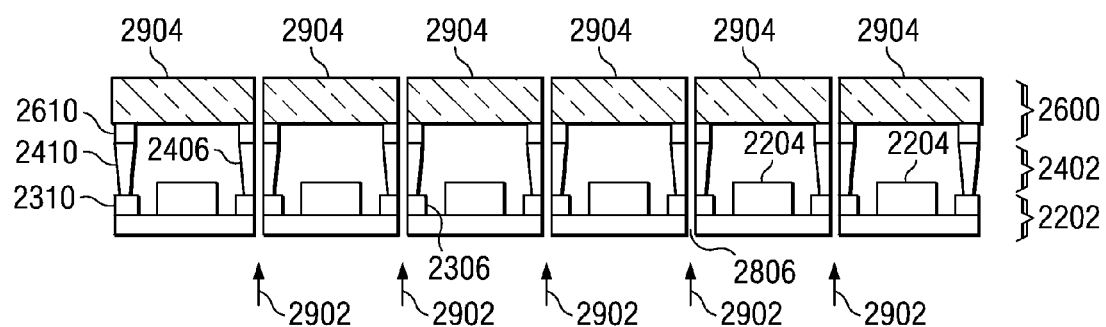
FIG. 29 illustrates another option for singulation of the multiple-package assembly of FIG. 27.

Referring now to FIG. 29, in another variation, a MS-WLP assembly 2900 is individuated by simply cutting completely through the wafer substrate 2202, frame/spacer 2402 and window sheet 2600 between each micro-device 2204 as indicated by arrow 2902. The result is a plurality of individually WLP micro-devices 2904. The individuating cuts may be made from either the window side or the substrate side, however, it may be necessary to protect the outer surface of the window sheet (e.g., with masking tape, etc.) to protect it from damage during the sawing operation.

When electrical-resistance heating ("ERH") is used to facilitate diffusion bonding or soldering of the components of a MS-WLP assembly, the electrical current is typically applied so that it flows through both the window/frame junction and the frame/substrate junction simultaneously. To facilitate this ERH heating, the configuration of the MS-WLP assembly may be modified to provide "sacrificial" metallized areas (i.e., areas that will be discarded later) on the window sheet and wafer substrate for placement of ERH electrodes. Preferably, the electrode placement areas on the substrate and window will be accessible from directions substantially perpendicular to the wafer.

Figure 30:
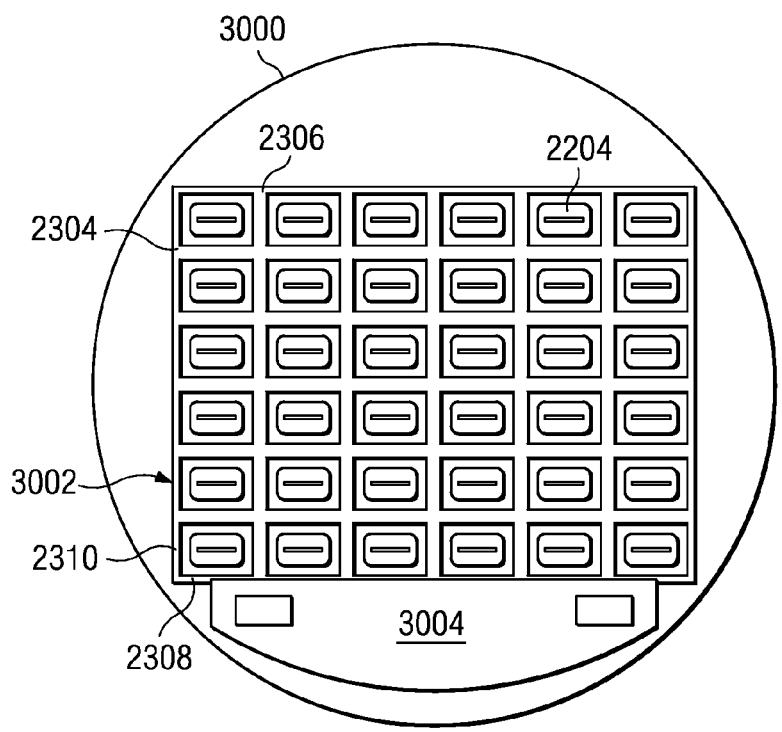
FIG. 30 illustrates a semiconductor wafer after metallization of the wafer surface in accordance with another embodiment having an electrode placement portion.

Referring now to FIG. 30, there is illustrated a wafer 3000 similar in most respects to the wafer 2002 of FIG. 23, i.e., having a plurality of micro-devices 2204 formed thereon and a metallized frame-attachment area 3002 formed thereon so as to surround the micro-devices. In this case, however, the wafer 3000 further includes a metallized electrode placement pad 3004 positioned at one end of the wafer. The electrode placement pad 3004 is in electrical contact with the metallized layers 2304, 2306, 2308 and 2310 of the frame-attachment area 3002.

Figure 31:
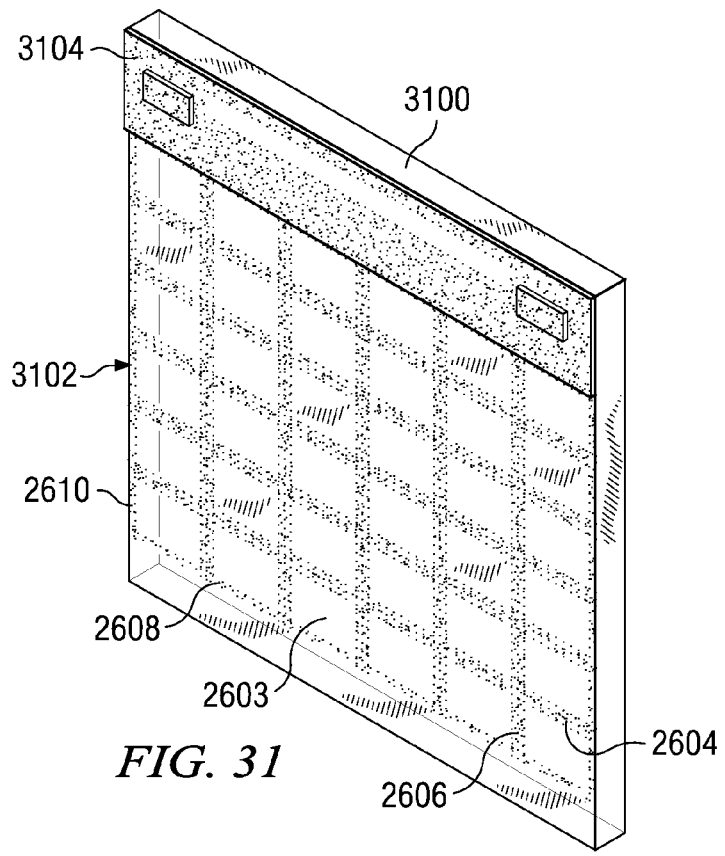
FIG. 31 illustrates a metallized window sheet in accordance with another embodiment having an electrode placement portion.

Referring now to FIG. 31, there is illustrated window sheet 3100 similar in most respects to the sheet 2600 of FIG. 26, i.e., having a metallized frame-attachment area 3102 formed thereon so as to surround the window aperture areas 2603 on the sheet. In this case, however, the sheet 3100 further includes a metallized electrode placement pad 3104 positioned at one end of the sheet. The electrode placement pad 3104 is in electrical contact with the metallized layers 2604, 2606, 2608 and 2610 of the frame-attachment area 3102.

Figure 32:
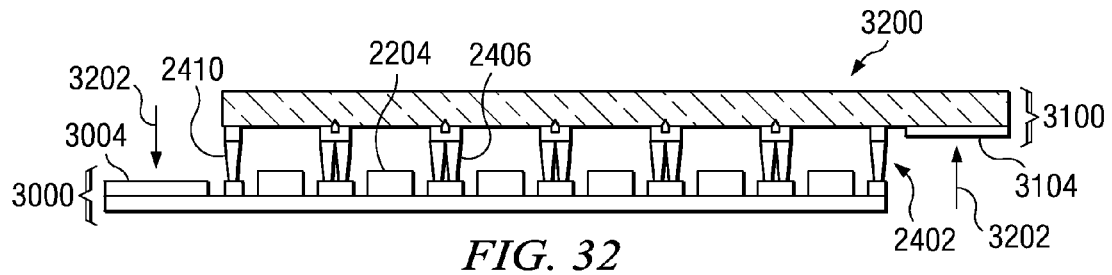
FIG. 32 is a cross-sectional side view of a multiple-package assembly prior to singulation in accordance with another embodiment having direct electrode access.

Referring now to FIG. 32, there is illustrated a MS-WLP assembly 3200 in accordance with another embodiment. The components of the assembly 3200 are positioned such that the wafer substrate 3000 and the window sheet 3100 are adjacent to the frame/spacer 2402, but the respective metallized electrode placement pads 3004 and 3104 overhang on opposite sides of the assembly. This configuration provides unobstructed access to the pads 3004 and 3104 in a direction perpendicular to the wafer (as denoted by arrows 3202), allowing easy attachment of electrodes for ERH procedures.

During bonding of WLP assemblies, there are two bonds that should typically occur simultaneously: the junction between the frame/spacer and the window sheet and the junction between the frame/spacer and the wafer substrate. As was described previously, however, the window may first be bonded only to the frame, and later, using ERH, the window/frame assembly can be attached to the substrate of the device. As was previously described in the process for the manufacturing of stand-alone window assemblies, the configuration of the metal frame and placement of ERH electrodes may be critical for even heating using ERH heating techniques. Similarly, for MS-WLP devices, the metallization patterns and ERH electrode placement locations on the wafer substrate and the window sheet may be important to achieving even heating. Therefore, the size/shape of the frame including possibly excess or sacrificial features, and the metallization patterns on both the window sheet and the wafer substrate should be concurrently designed, modeled (e.g., using software simulation) and prototyped to ensure even heating of the bonded surfaces/features.

Figure 33:
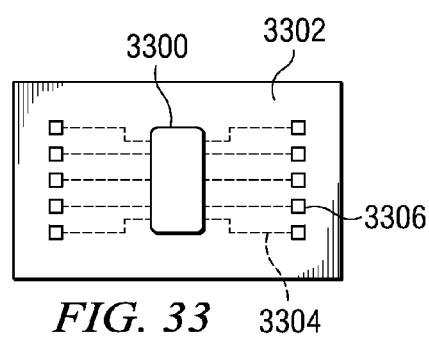
FIG. 33 is a top view of a micro-device with same-side pads.

It will be appreciated that the previous embodiment describes a method for manufacturing MS-WLP assemblies which is suited for micro-devices having opposite-side electrical connection pads. Referring now to FIG. 33, there is illustrated a micro-device having same-side electrical connections. The micro-device 3300 is disposed on one side of a semiconductor substrate 3302. A plurality of vias 3304 run from the active areas of the micro-device, through the substrate, and to a plurality of connection pads 3306 located on the same side of the substrate. Obviously, the electrical connection pads 3306 must be accessible even after the micro-device 3300 has been sealed within its hermetic package. In the following embodiment, there is presented another method for manufacturing MS-WLP assemblies suited for use with such micro-devices with same-side connections.

Figure 34:
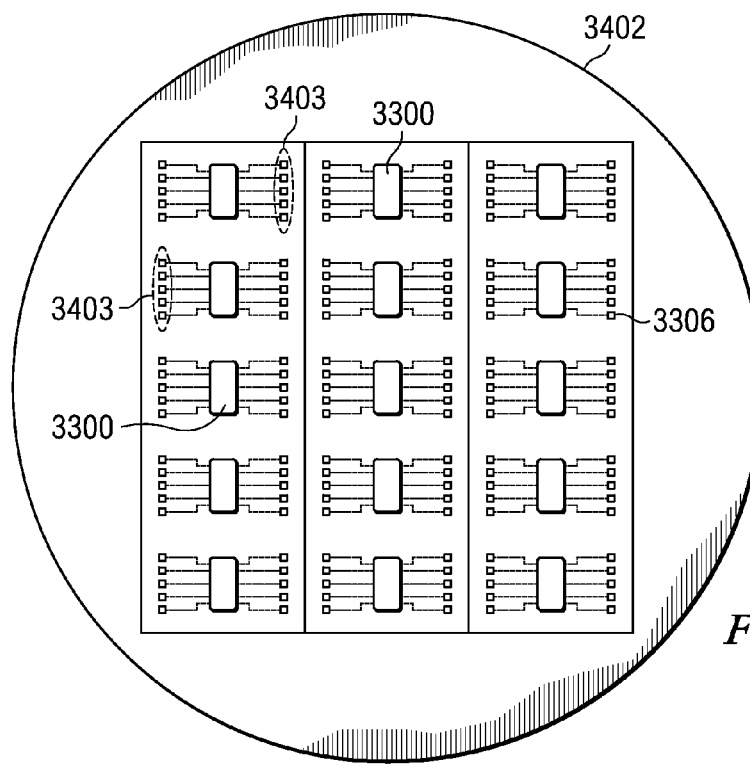
FIG. 34 illustrates a semiconductor wafer having formed thereon a plurality of the micro-devices of FIG. 33.

Referring now to FIG. 34, there is illustrated a wafer 3402 having a plurality of micro-devices 3300 formed thereupon, each micro-device having one or more sets 3403 of associated same-side connection pads 3306. In accordance with this embodiment, the multiple micro-devices 3300 are individually hermetically packaged in a WLP prior to individuation of the substrate wafer 3402, however the same-side electrical connection pads 3306 remain accessible. The steps of this embodiment are similar in many respects to those of the previous embodiment, except for the changes described below.

Figure 35:
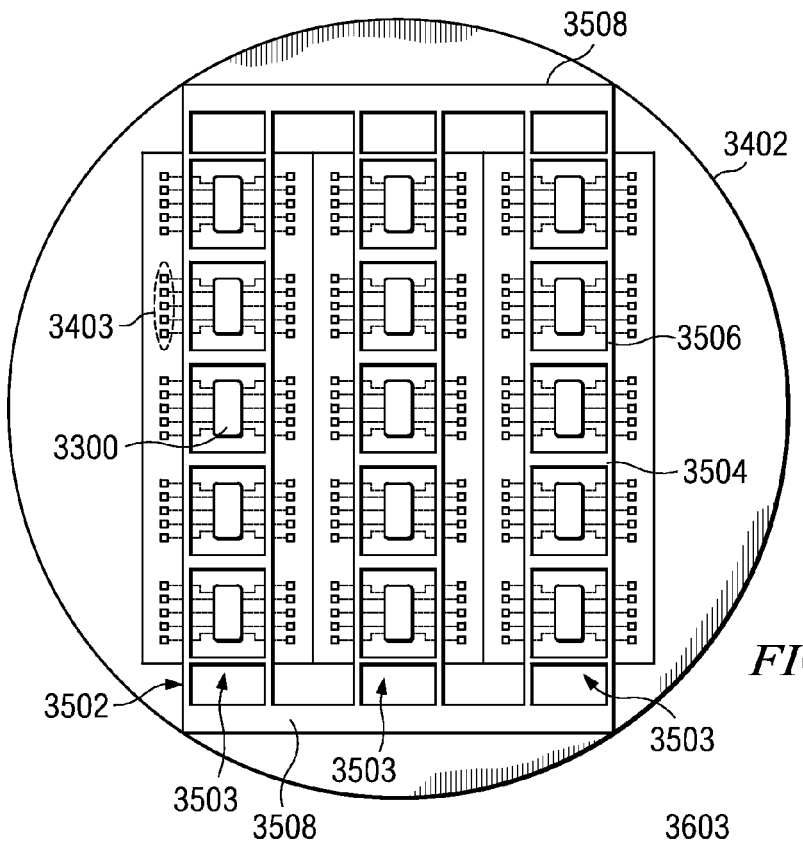
FIG. 35 illustrates the semiconductor wafer of FIG. 34 after metallization of the wafer surface.

Referring now to FIG. 35, the frame-attachment area 3502 of the semiconductor wafer 3402 is first prepared, in this case by depositing metallized layers onto the surface of the wafer substrate circumscribing each micro-device 3300. In the embodiment shown, the prepared frame-attachment area 3502 includes three "ladder-shaped" grids 3503, each consisting of double-width metallized rows 3504 (i.e., the "rungs" of the ladder) and single-width columns 3506 (the "sides" of the ladder) connected by buss strips 3508 at each end. The composition and thickness of the metallized layers in frame-attachment area 3502 may be any of those previously described for use in preparing the sheet seal-ring area or frame attachment areas.

Figure 36:
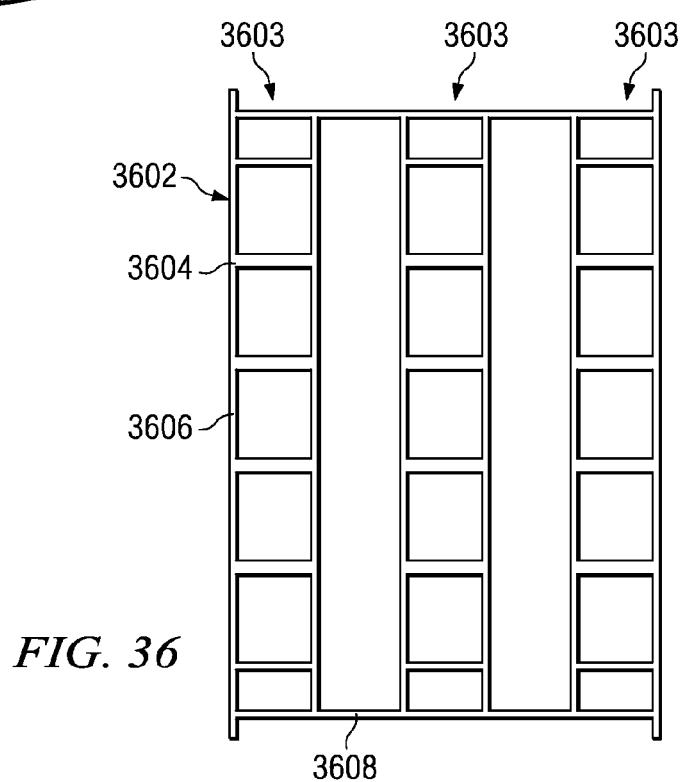
FIG. 36 illustrates a metallic frame for attachment to the wafer surface of FIG. 35.

Referring now to FIG. 36, there is illustrated a MS-WLP frame/spacer 3602 for attachment between the wafer 3402 and the window sheet 3702 (FIG. 37) of the MS-WLP assembly. It will be appreciated that in this embodiment, the MS-WLP frame/spacer 3602 is configured into multiple ladder shaped portions 3603, each portion having double-width rung members 3604 and single-width side members 3606 that are configured to have a plan substantially corresponding to the ladder-shaped plans 3503 of the frame-attachment area 3502 on the wafer substrate 3402. The ladder-shaped portions 3603 are attached to, and held in relative position to one-another by, connecting members 3608 located at opposite ends of the frame/spacer 3602. As in the previous embodiment, the double-width members 3604 allow room for cutting the frame 3602 between micro-devices during singulation of the MS-WLP assembly (i.e., after bonding). In a preferred embodiment, the double-width members may have a grooved cross-section (e.g., similar to that shown in FIGS. 25a and 25b) to facilitate their cutting apart. It will be appreciated however, that in other embodiments the MS-WLP frame/spacer may have a different configuration. In this embodiment, the MS-WLP frame/spacer 3602 is formed of a metal alloy having a CTE substantially matched to the CTE of the wafer substrate, however, in other embodiments the frame/spacer may be formed of non-metallic materials as previously described. Also as previously described, the frame/spacer 3602 will preferably be plated or metallized to facilitate the subsequent bonding process.

Figure 37:
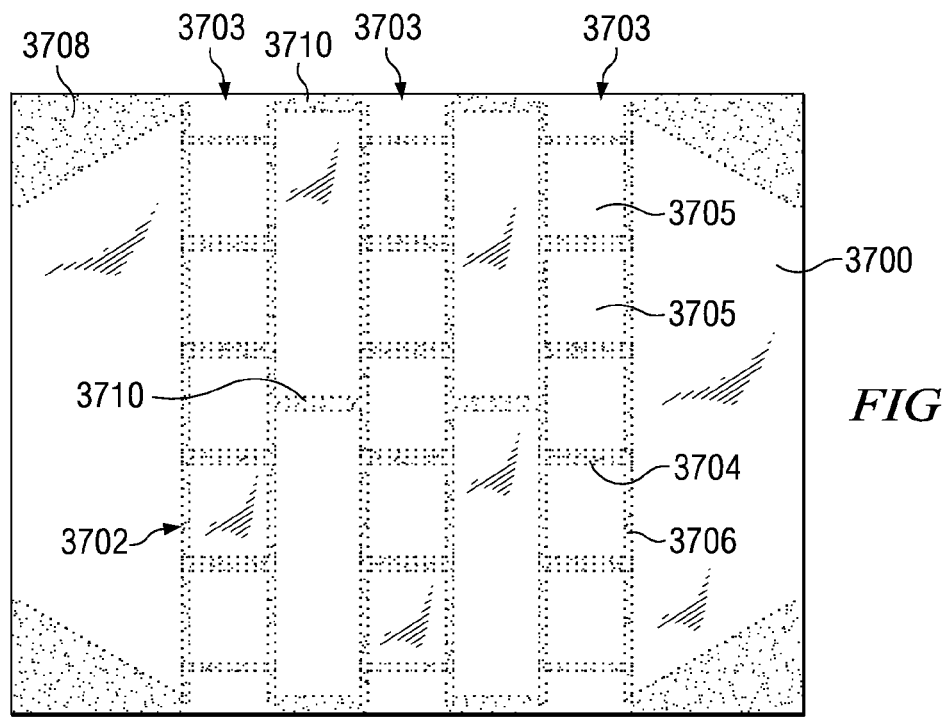
FIG. 37 illustrates a metallized window sheet for attachment to the frame of FIG. 36.

Referring now to FIG. 37, there is illustrated a MS-WLP window sheet 3700 for attachment to the MS-WLP frame/spacer 3602. The window sheet 3700 is formed of glass or other transparent material having a CTE compatible with the other principal components of the assembly as previously described. At least the inner side (i.e., the side that will be inside the hermetic envelope) of the sheet 3700 (and preferably both sides) is optically finished, and any desired optical or protective coatings are in place on the inner side. Either before or after any desired optical or protective coatings are in place on the inner side of sheet 3700 (and preferably both sides), a frame-attachment area 3702 is prepared on the MS-WLP window sheet 3700 so as to circumscribe a plurality of window apertures 3705 that will ultimately be aligned with the micro-devices 3300 in the final MS-WLP assembly. In the embodiment shown, the prepared frame-attachment area 3702 includes metallic layers deposited on the sheet 3700 in multiple ladder-shaped portions 3703, each portion including double-width rung members 3704 and single-width side members 3706. Each ladder portion 3703 has a plan which corresponds substantially with the plan of the ladder portions 3603 of the frame/spacer 3602. The methods and procedures for preparation of the window sheet 3700, including the composition and thickness of the metallized layers 3704 and 3706 in the frame-attachment area 3702, may be any of those previously described for use in preparing the sheet seal-ring area 318 of the "stand-alone" window assemblies or the frame attachment areas 2602 of the window sheet 2600 of the MS-WLP.

In the embodiment illustrated in FIG. 37, the metallized layers of window sheet 3700 extend beyond the ladder-shaped portions 3703, and included additional portions configured to facilitate electric resistance heating (ERH). These additional portions include electrode attachment portions 3708 and bridge portions 3710, both of which are electrically connected to the metallized layers 3704 and 3706 of the ladder portions 3703. The configuration, e.g., placement and thickness, of these electrode attachment portions 3708 and bridge portions 3710 are selected to manage the flow of ERH current through the interfaces between the metallized portions of the window sheet 3700 and the frame/spacer 3602, and through the interface between the frame/spacer 3602 and the metallized portions of the substrate 3402, thereby controlling the heating at these interfaces during ERH-facilitated bonding operations.

As in previous embodiments, the inner surface of the window sheet 3700 may be scribed, e.g., with a laser or diamond stylus, through each portion of the frame-attachment area 3702 to facilitate breaking apart of the MS-WLP assembly during singulation. Where the frame/spacer 3602 includes grooved members such as those illustrated in FIGS. 25a-25b, then the scribe lines on the window sheet 3700 will preferably be in register with the grooves 2502 of the frame members in the MS-WLP assembly.

Figure 38:
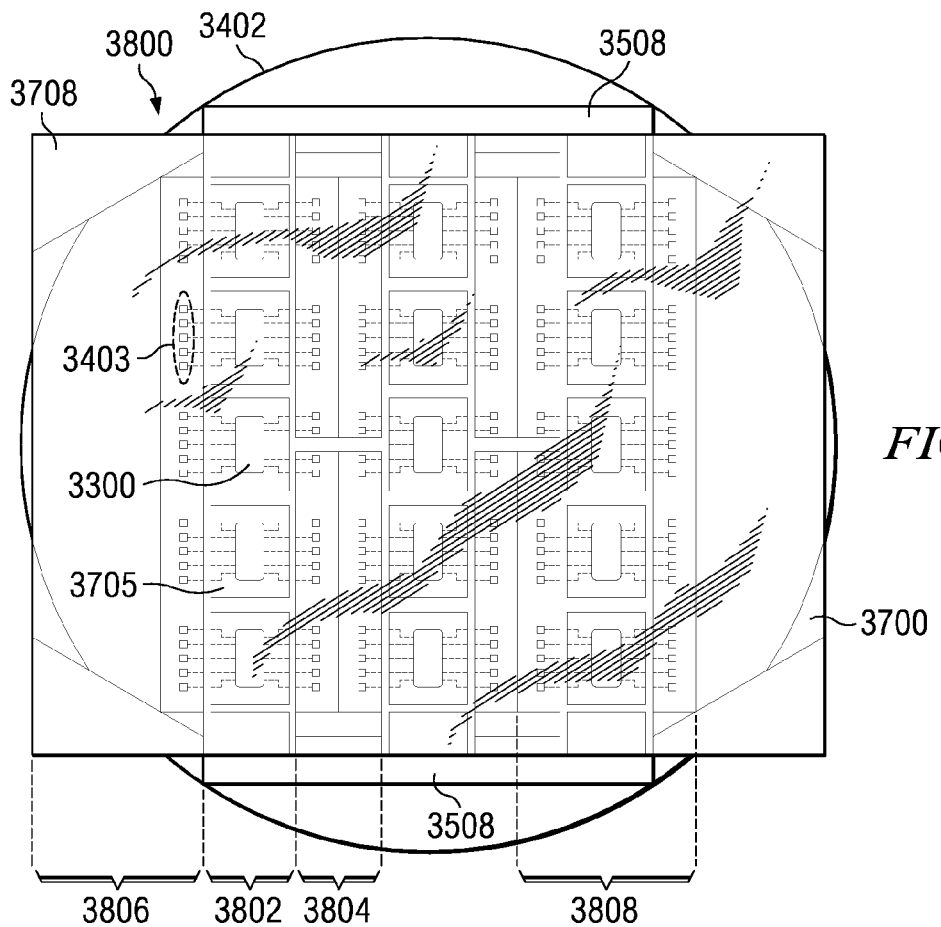
FIG. 38 shows a top view a complete multiple-package assembly.

Referring now to FIG. 38, there is illustrated a top view of a complete MS-WLP assembly 3800 including the wafer substrate 3402, frame/spacer 3602 and window sheet 3700 stacked on one another such that the ladder-shaped areas 3503, 3603 and 3703 of each respective component are substantially in register with one another, and such that each of the micro-devices 3300 is positioned beneath a window aperture area 3705 of the window sheet. It will be appreciated that in this embodiment, the configurations of the wafer 3402 and window sheet 3700 are complementary to facilitate the placement of ERH electrodes. Specifically, the portions of the wafer 3402 having the metallized buss strips 3508 project past the edges of the sheet 3700 (when viewed from above), allowing one set of ERH electrodes to make contact from vertically above, while the portions of the sheet having the metallized contact portions 3708 project past the edge of the wafer (when viewed from below), allowing another set of ERH electrodes to make contact from vertically below.

Of course, if the assembly 3800 is to be bonded using solder technology, then solder preforms (not shown) having a plan substantially corresponding with the frame-attachment areas are also positioned between the frame/spacer 3602 and the frame-attachment areas of the window sheet 3700 and substrate 3402 prior to bonding. Any of the previously described bonding technologies may be used to effectuate the bond between the components. If the assembly 3800 is to be bonded using diffusion bonding technology, then when using interlayer preforms (not shown), these preforms will have a plan substantially corresponding with the frame-attachment areas and are also positioned between the frame/spacer, 3602 and the frame-attachment areas of the window sheet 3700 and/or between the frame/spacer 3602 and substrate 3402 prior to bonding. The MS-WLP assembly 3800 will look essentially the same before bonding and after bonding (except for incorporation into the bond area of any solder preforms or interlayers for diffusion bonding).

After bonding, the window sheet 3700 of the assembly 3800 may be viewed as including primary strip portions 3802, which overlie the plurality of encapsulated micro-devices 3300, secondary strip portions 3804, which are interposed between the primary strips and overlie rows of non-encapsulated contact pads 3403, and end strip portions 3806, which are disposed at each end of the window sheet and also overlie rows of non-encapsulated contact pads 3403. During singulation of the assembly 3800, the secondary and end strip portions 3804 and 3806, respectively, of the window sheet are cut away and discarded, these parts being essentially "sacrificial." Further during singulation, the substrate 3402 is divided along cut lines (denoted by arrows 3808) between the columns of micro-devices 3300 and contact pads 3403 to form multi-unit strips. The separating of the window sheet may be performed using saws, lasers or other conventional means, while the dividing of the substrate may be performed using saws, lasers, or by snapping along a score line.

Figure 39:
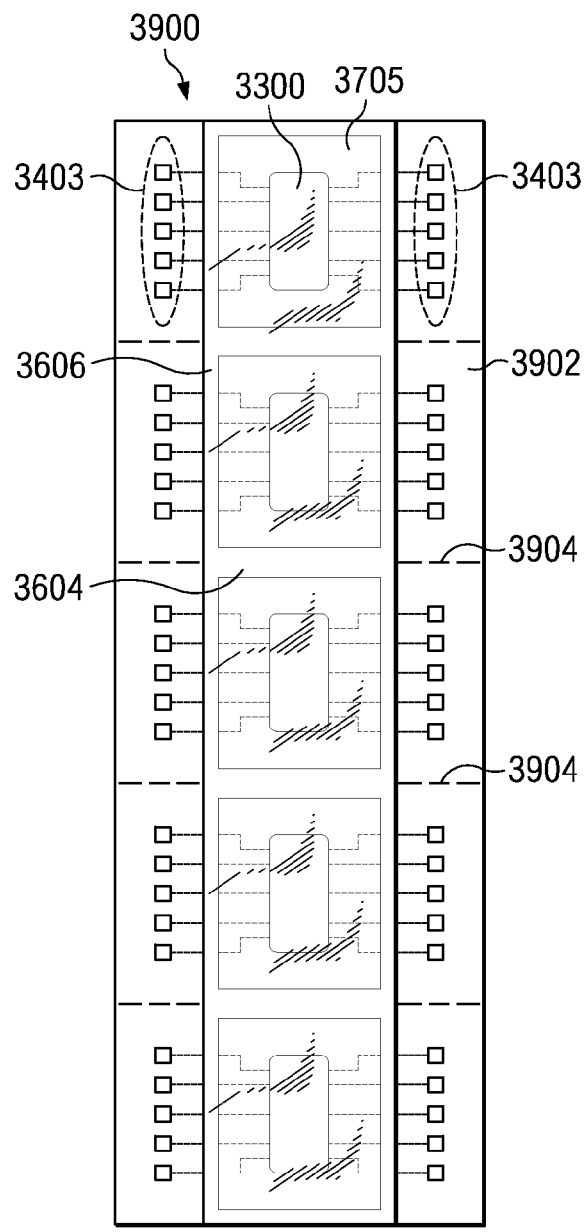
FIG. 39 illustrates a multi-package strip after column separation of the multiple-package assembly of FIG. 38.
Figure 40:
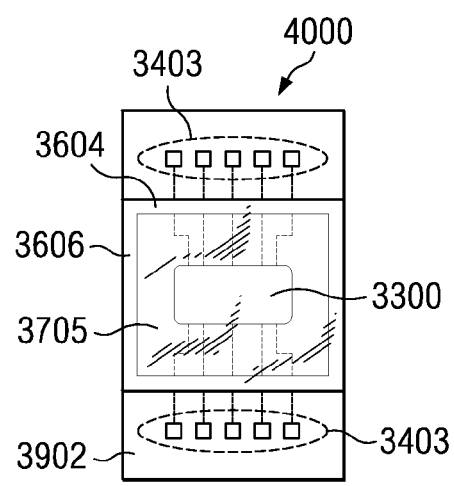
FIG. 40 illustrates a single packaged micro-device after singulation of the multiple-package strip of FIG. 39.

Referring now to FIGS. 39 and 40, singulation of the MS-WLP assembly 3800 is illustrated. Referring first to FIG. 39, there is illustrated a multi-unit strip 3900 which has been separated from the MS-WLP assembly 3800. The multi-unit strip 3900 includes a plurality of micro-devices 3300 on a portion 3902 of the original wafer substrate 3402, the micro-devices being encapsulated within adjacent hermetic envelopes having one or more micro-devices under each window portion 3705 of the original window sheet, but with their associated electrical contact pads 3403 being non-encapsulated. The multi-unit strip 3900 is further cut apart, or singulated, along cut lines 3904, which in this embodiment corresponds to the center of the frame members 3604 separating the adjacent hermetic envelopes. The result is a plurality of discrete hermetically sealed WLP packages containing one or more micro-devices under each window portion 3705. An example of an individual WLP package 4000 produced by this method is illustrated in FIG. 40.

During the singulation of multi-unit strips 3900, at least the window sheet 3700 or the wafer substrate portion 3902 must be cut. The remaining portion may then either be cut, or scribed and broken. It is believed that the best result will be obtained by cutting the wafer substrate portion 3902 using a wafer-dicing saw, and then either scribing-and-breaking the window sheet 3700, or cutting the window sheet using a similar dicing saw.

When making multiple cover assemblies simultaneously, as previously described and illustrated (e.g., in FIGS. 15a-19f), or making multiple wafer-level packages simultaneously, as previously described and illustrated (e.g., in FIGS. 22-40), the frame sidewalls between adjacent frame apertures may include reduced cross-sectional thickness areas to facilitate the singulation (i.e., dividing) of the joined multiple-unit assembly into individual window assemblies or individual wafer-level packages. As best seen in FIGS. 15a-16b, 17b, 25a-25b, 27 and 32, this reduced cross-sectional thickness area may take the form of a V-shaped notch formed in the frame sidewalls between adjacent frame apertures. It will be appreciated, however, that alternative frame designs may substituted for those previously illustrated to provide for easier frame fabrication and/or easier singulation of a joined multiple-unit assembly into individual window assemblies or individual wafer-level packages.

Figure 41:
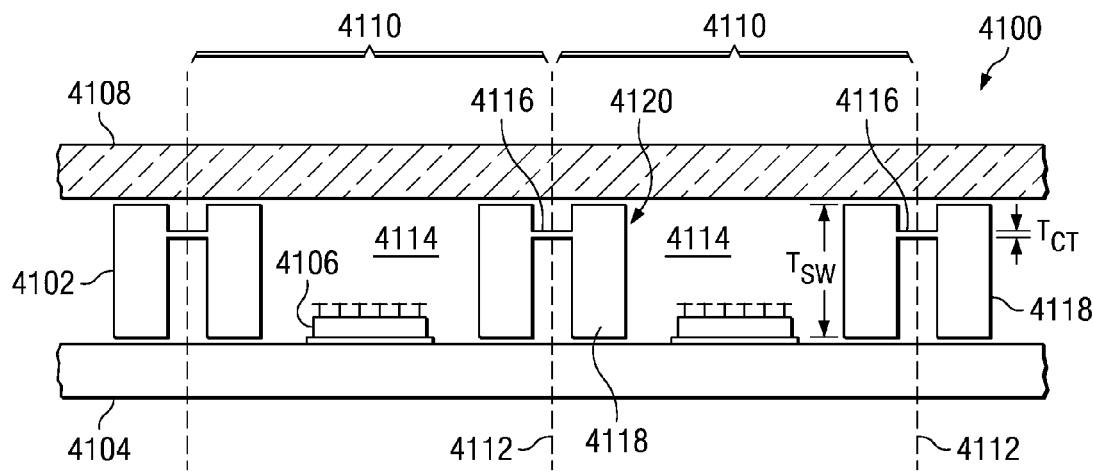
FIG. 41 illustrates a partial cross-sectional side view of a multiple-package assembly having an alternative frame design prior to singulation.

Referring now to FIG. 41, there is illustrated (in side elevation view) a portion of a multiple simultaneous wafer-level packaging assembly 4100 incorporating one alternative frame design. It will be appreciated that the assembly 4100 is shown prior to singulation into individual packages. It will further be appreciated that the assembly 4100 is similar in most ways to the MS-WLP assemblies previously described and illustrated in FIGS. 27-29. The assembly 4100 includes a frame 4102 hermetically joined to a wafer substrate 4104 having micro-devices 4106 formed (and/or mounted) thereupon and to a transparent window sheet 4108, thereby forming a plurality of individual hermetically sealed units 4110 that can be singulated (e.g., along lines 4112) between the adjacent frame apertures 4114 to form discrete hermetically sealed packages. Diffusion bonding, or any of the other previously described bonding technologies may be used to effectuate the hermetic seal between the frame 4102, substrate 4104 and sheet 4108. As in previous designs, when viewed in plan (i.e., from above as in FIG. 24), the sidewalls of the frame 4102 circumscribe the frame apertures 4114 and have an upper side plan which substantially corresponds to the plan of the predefined frame attachment areas of the sheet 4108. Also as in previous designs, when viewed in elevation, the sidewalls disposed between adjacent frame apertures 4114 include reduced cross-sectional thickness areas. However, in this embodiment, the reduced cross-sectional thickness areas of the frame 4102 take the form of a relatively thin connecting tab 4116 extending between two relatively thick sidewall members 4118. In FIG. 41, the undivided interior frame sidewall is denoted by reference number 4120.

The connecting tab 4116 of the sidewall 4120 is characterized by a relatively constant vertical thickness $T_{CT}$, which is significantly smaller than the overall vertical thickness $T_{SW}$ of the adjacent sidewall members 4118. Preferably, the value of connecting tab thickness $T_{CT}$ is less than 25% of the value of the overall sidewall member thickness $T_{SW}$. More preferably, the value of connecting tab thickness $T_{CT}$ is less than 10% of the value of sidewall member thickness $T_{SW}$, and in some cases the value of $T_{CT}$ is less than 5% of the value of $T_{SW}$. During fabrication of multiple-unit assemblies, the relatively thin connecting tabs 4116 of this design are sufficiently strong to maintain the structural integrity of the overall frame 4102. However, during singulation, the relatively thin connecting tabs 4116 can be severed with little chance of damaging or distorting the adjacent, relatively thick sidewall members 4118, or of damaging the unit's hermetic seal. In addition, the relatively thin connecting tabs 4116 make it easier for the singulating device, e.g., dicing saw, laser, etc., to cut through the frame's reduced cross-section area, and sometimes also the substrate 4104 and/or window sheet 4108 in the same operation.

Figure 42A:
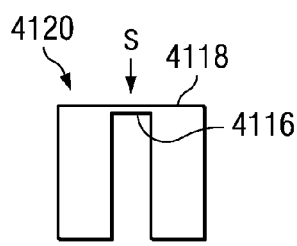
FIGS. 42a-42e are cross-sectional side views of alternative frame designs, each showing a pair of adjacent frame side members joined by a connecting tab.
Figure 42B:
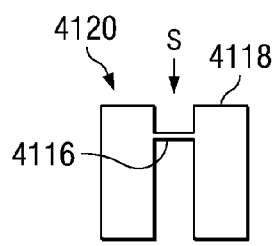
Figure 42C:
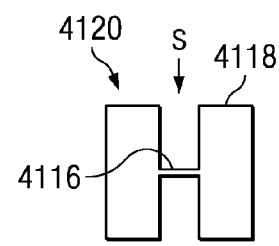
Figure 42D:
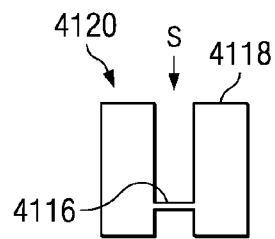
Figure 42E:
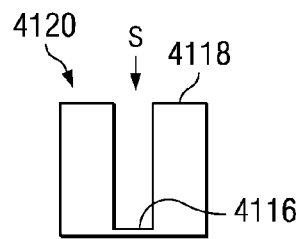

Referring now to FIGS. 42a-42e, there are illustrated several alternative frame designs which can be used for making either multiple cover assemblies simultaneously or multiple wafer-level packages simultaneously. In each figure, there is shown a cross-sectional view of an undivided interior sidewall 4120 having a reduced cross-sectional thickness area comprising a relatively thin connecting tab 4116 extending between two relatively thick sidewall members 4118. The sidewall 4120 is designed to be singulated along a line denoted by arrow S. It will be understood that the entire frame 4102 will comprise many such sidewalls laid out in a grid pattern to form discrete apertures. The connecting tab 4116 may be positioned at any desired vertical position between the sidewall members 4118, including, but not limited to, at the top (FIG. 42a), middle (FIG. 42c), bottom (FIG. 42e), upper or lower intermediate positions (FIGS. 42b and 42d). It will be appreciated that illustrating all possible vertical locations for the connecting tab 4116 would be impractical, but nonetheless such designs fall within the scope of the current invention, provided that the connecting tab has a relatively constant vertical thickness $T_{CT}$ that is significantly smaller than the overall vertical thickness $T_{SW}$ of the adjacent sidewall members 4118, preferably less than 25% of $T_{SW}$, more preferably less than 10% of $T_{SW}$ and sometimes less than 5% of $T_{SW}$.

Figure 43A:
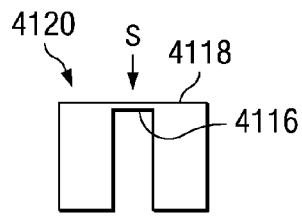
FIGS. 43a-43e are cross-sectional side views of additional alternative frame designs, each showing a pair of adjacent frame side members joined by one or more connecting tabs.
Figure 43B:
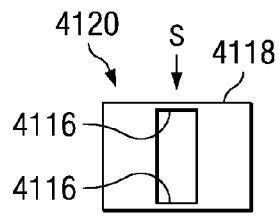
Figure 43C:
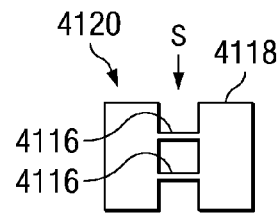
Figure 43D:
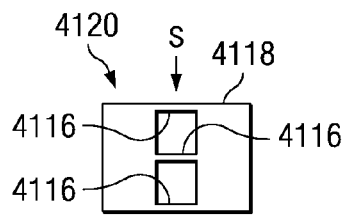
Figure 43E:
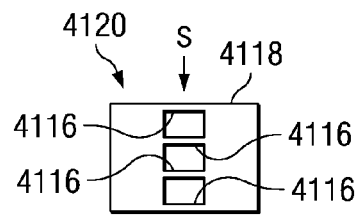

Referring now to FIGS. 43a-43e, additional frame designs are illustrated by showing an undivided sidewall 4120 in the same fashion as those of FIGS. 42a-42e. While a sidewall 4120 may have only a single connecting tab 4116 extending between the sidewall members 4118 (FIG. 43a), it may also have two (FIGS. 43b and 43c), three (FIG. 43d), four (FIG. 43e), or even more connecting tabs extending between the sidewall members. Further, these multiple connecting tabs 4116 may be positioned at any desired vertical position between the sidewall members 4118, including, but not limited to, at the top and bottom (FIG. 43b) or at intermediate positions (FIG. 43c). It will be appreciated that illustrating all possible numbers of connecting tabs 4116 and all possible vertical locations for the connecting tabs would be impractical, but nonetheless such designs fall within the scope of the current invention, provided that each connecting tab has a relatively constant vertical thickness $T_{CT}$ that is significantly smaller than the overall vertical thickness $T_{SW}$ of the adjacent sidewall members 4118, preferably less than 25% of $T_{SW}$, more preferably less than 10% of $T_{SW}$ and sometimes less than 5% of $T_{SW}$.

Figure 44A:
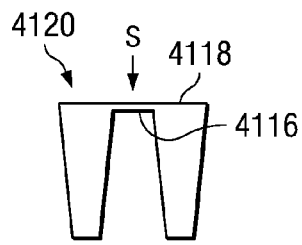
FIGS. 44a-44e are cross-sectional side views of further alternative frame designs, each showing a pair of adjacent frame side members joined by a connecting tab.
Figure 44B:
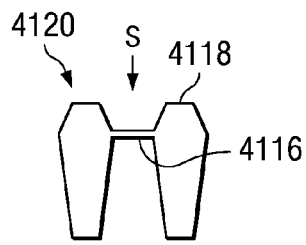
Figure 44C:
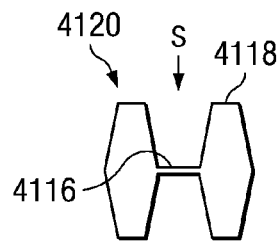
Figure 44D:
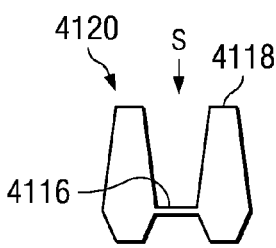
Figure 44E:
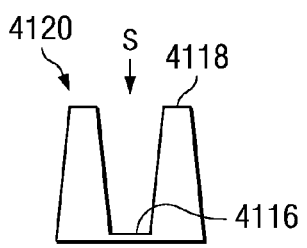
Figure 45A:
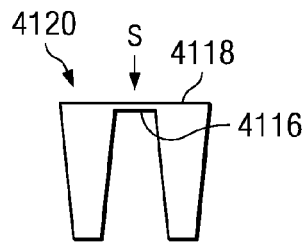
FIGS. 45a-45f are cross-sectional side views of still other alternative frame designs, each showing a pair of adjacent frame side members joined by one or more connecting tabs.
Figure 45B:
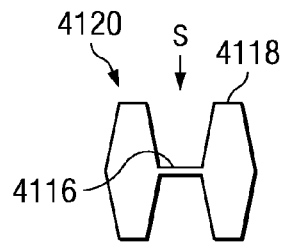
Figure 45C:
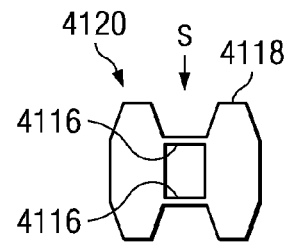
Figure 45D:
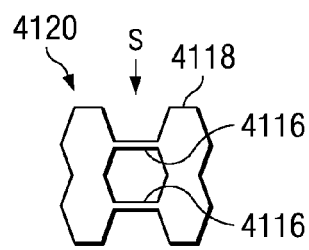
Figure 45E:
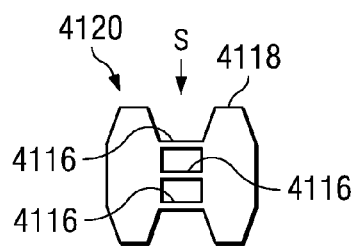
Figure 45F:
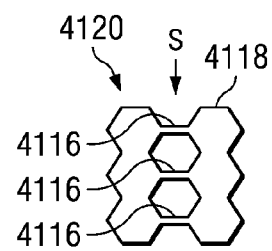

Referring now to FIGS. 44a-44e, further frame designs are illustrated by showing an undivided sidewall 4120 in the same fashion as those of FIGS. 42a-43e. While the sidewall members 4118 may be generally rectangular in cross-sectional configuration (as shown in FIGS. 42a-43e), this is not required. Rather, the sidewall members 4118 may have cross-sectional configurations which taper (i.e., narrow) as they get vertically farther from the location of the connecting tab 4116. The connecting tab 4116 may still be positioned at any desired vertical position between the sidewall members 4118, including, but not limited to, at the top (FIG. 44a), middle (FIG. 44c), bottom (FIG. 44e), upper or lower intermediate positions (FIGS. 44b and 44d). This results in some designs with tapers in a single direction (e.g., FIGS. 44a and 44e) and some with tapers in two directions (e.g., FIGS. 44b-44d). The tapered sidewalls 4118 of these designs may result in improved manufacturing qualities, e.g., where the frame is molded or stamped and must release cleanly from the tooling. It will be appreciated that illustrating all possible vertical locations for the connecting tab 4116 and taper configurations for the sidewall members 4118 would be impractical, but nonetheless such designs fall within the scope of the current invention, provided that at least one of the sidewall members has a tapered cross-sectional configuration and provided that the connecting tab has a relatively constant vertical thickness $T_{CT}$ that is significantly smaller than the overall vertical thickness $T_{SW}$ of the adjacent sidewall members, preferably less than 25% of $T_{SW}$, more preferably less than 10% of $T_{SW}$ and sometimes less than 5% of $T_{SW}$.

Referring now to FIGS. 45a-45f, still further frame designs are illustrated by showing an undivided sidewall 4120 in the same fashion as those of FIGS. 42a-44e. In these designs, single, double, or multiple connecting tabs 4116 extend between sidewall members 4118 having cross-sectional configurations with single, double or multiple tapers. For example, the sidewall 4120 of FIG. 45a has a single connecting tab and a single direction taper, while the design of FIG. 45f has multiple (i.e., three) connecting tabs and multiple (i.e., six) tapers. Some of the more complex configurations may be unsuited for manufacture by conventional stamping or molding, and must instead be formed using other processes such as extrusion or photo-chemical machining (further described below). It will be appreciated that illustrating all possible cross-sectional configurations for these sidewalls 4120 would be impractical, but nonetheless such designs fall within the scope of the current invention, provided that at least one of the sidewall members has a tapered cross-sectional configuration and provided that each connecting tab has a relatively constant vertical thickness $T_{CT}$ that is significantly smaller than the overall vertical thickness $T_{SW}$ of the adjacent sidewall members, preferably less than 25% of $T_{SW}$, more preferably less than 10% of $T_{SW}$ and sometimes less than 5% of $T_{SW}$.

Figure 46A:
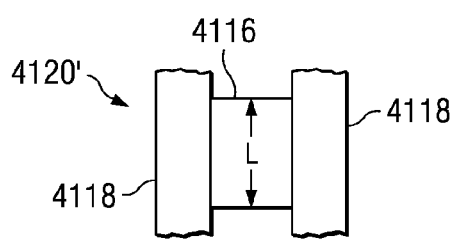
FIGS. 46a-46d are partial plan views of alternative frame designs, each showing a pair of adjacent frame side members joined by a connecting tab.
Figure 46B:
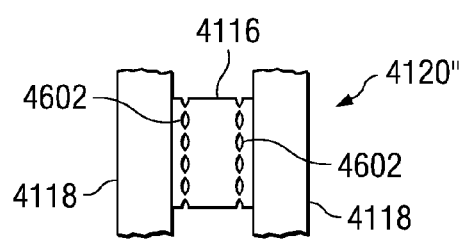
Figure 46C:
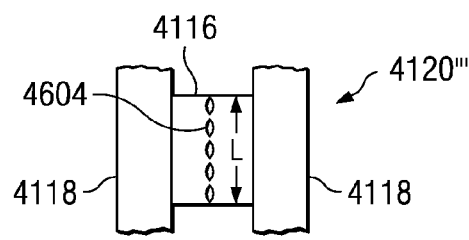
Figure 46D:
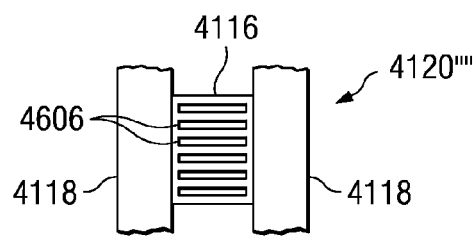

Referring now to FIGS. 46a-46d, portions of several interior sidewalls 4120 are shown in plan (i.e., from above) to better illustrate the configurations of the connecting tabs 4116. It will be understood that the sidewalls 4120 extend beyond what is shown in the figures to form the complete frame grid. When seen in plan, the paired sidewall members 4118 of an interior sidewall 4120 typically run parallel to one another, but the connecting tabs 4116 may extend continuously between the sidewall members, or they may be intermittent. In addition, the connecting tabs 4116 may be perforated with longitudinal or lateral perforations. For example, in FIG. 46a, an interior sidewall (denoted 4120') has a connecting tab 4116 that is a solid piece extending between the two sidewall members 4118. In this embodiment, the tab 4116 is not continuous everywhere between the sidewall members 4118, but rather has a fixed length L. Additional similar discrete connecting tabs 4116 may be provided intermittently at other locations between the sidewall members 4118 as required. In contrast, another interior sidewall (denoted 4120") in FIG. 46b has a connecting tab 4116 that extends continuously between the two sidewall members 4118. In this embodiment, longitudinal perforations 4602 are formed in the connecting tab along each sidewall member to facilitate separation of the sidewall members during singulation. In FIG. 46c, a third interior sidewall (denoted 4120''') is shown. The connecting tab 4116 of the sidewall 4120''' has a fixed length L, and it also has longitudinal perforations 4604, this time formed along the center of the tab to facilitate separation of the sidewall members 4118 during singulation. In FIG. 46d, a fourth interior sidewall (denoted 4120'''') is shown. The connecting tab 4116 of the sidewall 4120'''' has a fixed length L and perforations 4606 formed laterally across the tab from one sidewall member to the other. Solid tabs will preferably be cut apart by laser or by mechanical (e.g., sawing, shearing, etc.) means. Perforated tabs may be cut apart in similar fashion, but may also be separated by twisting or repeated bending along the perforation.

Frames for cover assemblies or wafer-level packages, whether for individual or for multiple units, may be fabricated using photo-chemical machining (also known as "PCM"). Photo-chemical machining is a material removal process that uses an etchant (e.g., acid) to "machine" precision parts without cutting. PCM is typically used for forming metal parts, although it can also be used for non-metallic materials (e.g., glasses, semiconductors, ceramics, etc.) with a suitable etchant. Briefly, the silhouette of the desired part is first photographically imaged on a sheet of metal or other material treated with a photo-sensitive resist material. After processing, the unwanted material (i.e., that not protected by the resist material) is etched away, leaving a finished part that duplicates the original silhouette and is stress-free, burr-free and as flat as the parent sheet from which it was etched. Because of certain characteristics of the etching process, the maximum sheet thickness that can be satisfactorily processed using PCM is limited. However, when frames thicker than this maximum sheet thickness are desired, multi-layer frame assemblies may be used as described below.

In yet another aspect, multi-layer frame assemblies (also known as laminated frames) are fabricated from a plurality of thin, pre-shaped sheets that are stacked together and bonded into a single unit frame. Each sheet may be pre-formed to have the silhouette of the desired cross section for its respective position in the finished frame, thereby reducing or eliminating the need for further processing after bonding. The sheets may be formed by PCM, stamping, cutting, molding or other known processing methods. The sheets in a multi-layer frame may be made of any of the frame materials disclosed herein. Diffusion bonding (i.e., thermal compression bonding) may be used to laminate the sheets together, as well as other processes such as conventional soldering, brazing, etc. Multi-layer frame assemblies can also be used to fabricate frames having more complex structures, e.g., the flanged frame shown in FIG. 20a, by using different silhouettes for different layers.

It will be appreciated that the various layers of a multi-layer frame do not necessarily need to be made of the same material. It is only necessary that the materials of directly adjacent sheets be hermetically bondable to one another. Thus, various metals, non-metals, or combinations of metals and non-metals may be laminated together to form a multi-layer frame. Such "mixed-material" laminated frames allow the mechanical, thermal, electrical and/or chemical properties of the frame to be customized. For example, a multi-layer frame can be made with different materials on the upper and lower surfaces to promote bonding to different window and substrate materials. In another example, by laminating sheets of materials having different CTEs, the overall CTE of the resulting multi-layer frame may be customized.

Figure 47:
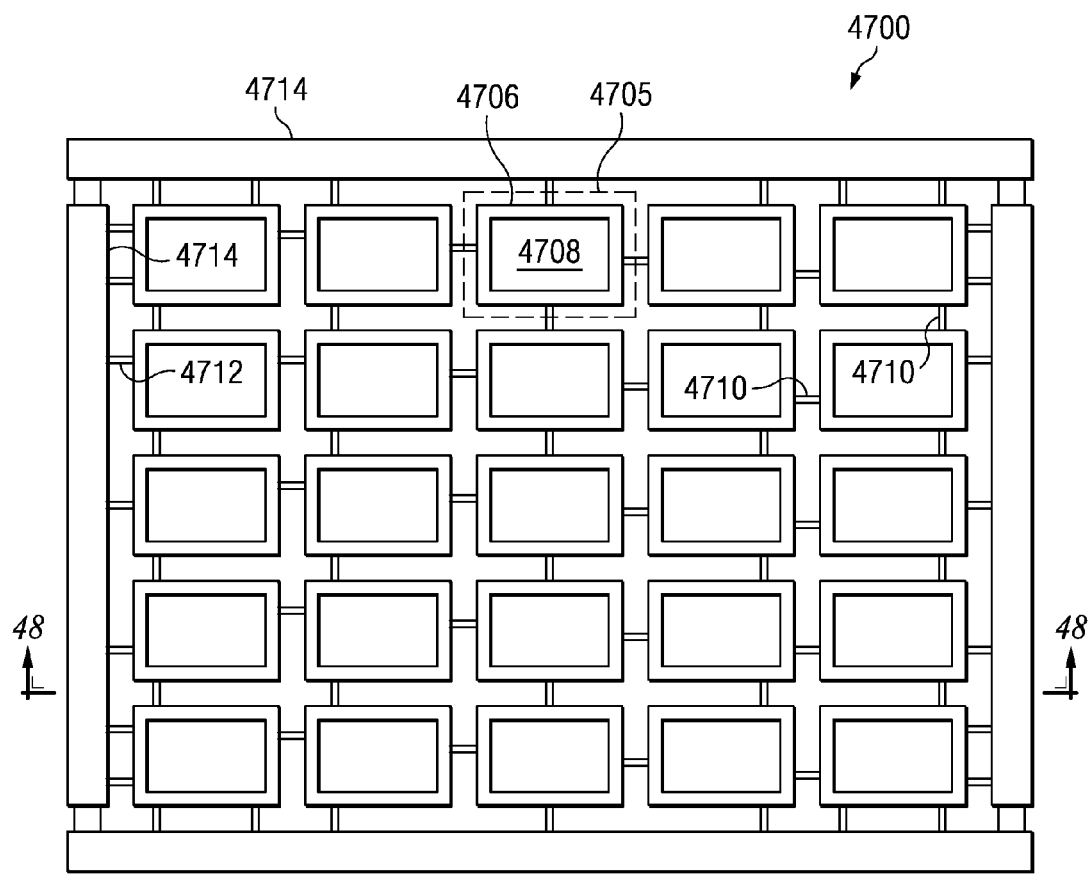
FIG. 47 is a plan view of a frame assembly fabricated by photo-chemical machining (PCM)
Figure 48:
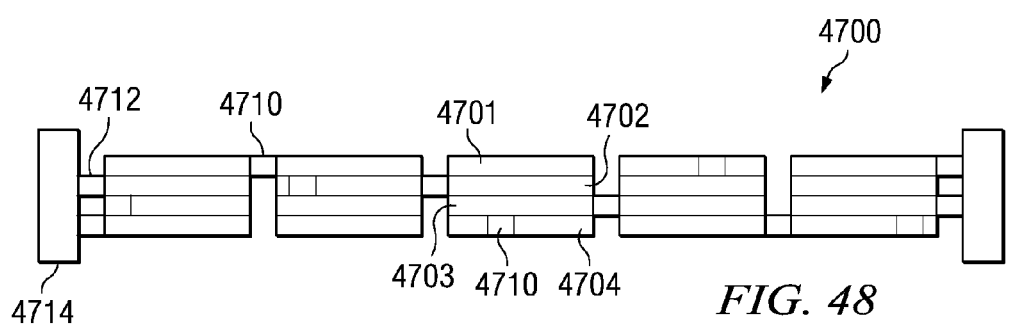
FIG. 48 is a cross-sectional side view of the frame assembly of FIG. 47.

Referring now to FIGS. 47 and 48, there is illustrated is a multi-layer frame assembly fabricated from sheets made by photo-chemical machining (PCM). While PCM is used for this example, the same general process would be used, with only minor changes, if the sheets were fabricated using the alternative methods previously described. FIG. 47 shows a plan view of the assembly 4700, while FIG. 48 shows a cross-sectional elevation view. The assembly 4700 of this embodiment includes four layers, denoted 4701, 4702, 4703 and 4704. Each layer is fabricated by PCM, and includes a plurality of individual frames 4705, each frame having a continuous sidewall 4706 circumscribing and defining a frame aperture 4708. It will be understood that the plans of the sidewalls 4706 on each layer 4701, 4702, 4703 and 4704 of the assembly 4700 will at least partially overlap the plans of sidewalls of the adjacent layers all the way around each of the frame apertures 4708, and the plan of the uppermost layer 4701 will also substantially correspond to the plan of the frame attachment areas on the window sheet (not shown) to which the frame assembly will be joined. In the embodiment illustrated, the plans of the sidewalls 4706 on each layer 40701, 4702, 4703 and 4704 are substantially identical, however, such identity of structure is not required for all embodiments (e.g., a flanged frame would have at least some layers with plans that are non-identical). The frame sidewalls 4706 disposed between two frame apertures 4708 in each sheet are held in place by connecting tabs 4710 similar to those shown in FIGS. 46a and 46c. In this case, however, the connecting tabs 4710 will usually (although not always) have a vertical thickness that is the same as the thickness of the original sheet. To facilitate later singulation, the connecting tabs 4710 for the different layers 4701, 4702, 4703 and 4704 may be "staggered" to different positions on each layer, thereby minimizing the thickness of any single tab that must be cut. In addition, these connecting tabs 4710 may be solid or perforated as desired. Additional connecting tabs 4712 are used to connect the frame sidewalls 4706 of each layer to an exterior frame 4714.

After PCM machining, the four layers 4701, 4702, 4703 and 4704 are stacked and joined to one another as described above. The finished frame assembly 4700 may then hermetically joined to a single window sheet and/or to a substrate as previously described to create a multiple-unit cover assembly or a multiple-unit wafer-level package assembly. The completed multiple-unit assembly is later singulated by cutting through the window sheet, connecting tabs and substrate (if applicable) between the individual frame units 4705 to form a plurality of discrete units. Alternatively, rather than bonding the finished frame assembly 4700 to a single window sheet, a plurality of smaller individual window sheets may be placed on top of each individual frame unit 4705 (i.e., one window sheet per frame unit), held in position with appropriate tooling, and hermetically bonded en masse. This eliminates the need to cut through the window sheets during singulation after bonding. In a similar manner, instead of bonding the finished frame assembly 4700 to a single substrate, a plurality of smaller individual substrates (i.e., one substrate per frame unit 4705) may be hermetically bonded to the frame assembly 4700 en masse. While these fabrication methods may be used, it will be understood that many of the other fabrication methods and tooling apparatus previously disclosed herein in connection with the hermetic bonding of window assemblies and wafer-level packages may also be applied to PCM frame assemblies.

Referring now to FIG. 49, shown is a perspective view of a multiple-unit assembly 4900 of PCM-fabricated frames suitable for resistance-seamwelding. It will be noted that the individual frames 4902 are of flanged design, using a flange profile for the bottom PCM layer 4904 and unflanged profile for upper PCM layer(s) 4906. As previously described, temporary connecting tabs 4908 hold together the individual frame units 4902 for easier material handing and simpler tooling requirements during the process of joining the frame assembly to a single large window sheet, or to multiple smaller window sheets (i.e., one per frame unit 4902).

In yet another application of this discovery, transparent windowpanes can be hermetically joined to opposite sides of metallic or non-metallic spacers to create hermetically sealed multi-pane thermally insulated window assemblies for residential and commercial buildings, for household appliances and industrial equipment, and for aircraft and other vehicle windows. As in conventional insulated windows, the spacer maintains a gap between adjacent pairs of windowpanes. The space within this gap (i.e., the "gap cavity") may contain a gas, such as air, nitrogen or argon, or may be a partial vacuum. The contents of the gap cavity reduce the flow of heat through the window, thereby providing thermal insulation. However, conventional insulated windows use either non-hermetic mechanical means (e.g., clamping, gaskets) or non-hermetic adhesives, such as rubber, glues, epoxies and resins, to mount the windowpanes to the spacer. As a result, conventional insulated windows are well known for developing leaks between the gap cavity and the outside environment as they age. In contrast, true hermetically sealed multi-pane insulated window assemblies can maintain their gas-tight integrity indefinitely.

Referring now to FIGS. 50 and 51, there is illustrated the basic hermetically sealed multi-pane window assembly, namely, a hermetically sealed double-pane window assembly 5000. It will be understood that the relative dimensions of the assembly 5000 have been exaggerated for purposes of illustration. The hermetic window assembly 5000 includes a transparent upper windowpane 5002, a transparent lower windowpane 5004, and a spacer 5006 having a continuous sidewall 5008 that defines a gap cavity 5010 therewithin. The upper windowpane 5002 and spacer 5006 are stacked on the lower windowpane 5004 (as indicated by the arrows in FIG. 50) and then joined or bonded to form a hermetic seal between each windowpane and the spacer. If a particular gas mixture, pressure or other condition is desired for the gap cavity 5010, it may be introduced prior to, or during the bonding phase of assembly. After bonding, the gap cavity 5010 is hermetically sealed against any transfer of gas to or from the environment.

The completed assembly 5000 (FIG. 51) can be used "as is," or incorporated into higher level assemblies as described below.

In some instances, it is desirable or necessary to introduce the desired gas or partial vacuum into the gap cavity 5010 between the windowpanes 5002 and 5004 after the bonding of the windowpanes to the spacer 5006. To do this, a passage may be formed through the wall 5008 of the spacer 5006 and provided with a valve or pinch-off tube on the outside of the spacer. This may be done before or after bonding. Then, after bonding, the desired atmosphere (including a vacuum or partial vacuum) may be introduced into the gap cavity 5010 through the valve or pinch-off tube. Obviously, if any undesirable gases are left in the gap cavity as a by product of the bonding process, the valve or pinch-off tube may be used to first evacuate them from the gap cavity, and then to introduce the desired gas or atmosphere. Once the gap cavity atmosphere is as desired, the valve or pinch-off tube may be sealed, e.g., by soldering or welding it closed, to preserve the desired long-term hermeticity of the window assembly.

The mating surfaces (i.e., the "seal ring areas") of the windowpanes 5002, 5004 and/or of the spacer 5006 may require various preparation or finishing operations prior to the joining operation. Suitable preparations and finishing operations are described herein in detail in connection with window assemblies and wafer-level packages, and therefore will not be repeated. It will however, be understood that such preparation and finishing operations may be applicable to the fabrication of hermetically sealed multi-pane window assemblies.

The windowpanes 5002 and 5004 of the hermetic window assembly 5000 will typically be formed of glass, however, other transparent materials may also be used. For example, quartz, silicon, sapphire and other transparent minerals may be used. In certain radiological applications, certain metals, metal alloys and ceramics are considered "transparent" (e.g., to X-rays), so in such applications these materials may also be used for windowpanes 5002 and 5004. Transparent plastics such as polycarbonate may also be used, however, these materials may allow diffusion of gas through the windowpane itself (as opposed to through the hermetic bond with the spacer) such that a true "hermetically sealed" assembly cannot be maintained indefinitely.

Further, while the windowpanes 5002 and 5004 of the hermetic window assembly 5000 will typically be flat in profile (i.e., viewed from the side) and rectangular in shape (i.e., viewed perpendicular to the sheet), this is not required. The windowpanes 5002 and 5004 may be concave, convex or otherwise curved in profile, and each of the windowpanes may have a different profile, as long as each windowpane mates with the spacer 5006 continuously around its entire upper or lower (as the case may be) periphery. In other words, during the bonding process, the respective surfaces of the windowpanes 5002 and 5004 must be in intimate contact with the respective surface of the spacer 5006 to which they are being joined. Similarly, the windowpanes 5002 and 5004 may have any shape, including circular, oval and triangular, providing a correspondingly-shaped spacer 5006 is used.

It is envisioned that the spacer 5006 of the hermetic window assembly 5000 will typically be a metal or metal alloy stamping, extrusion, casting or other part fabricated and joined together (if necessary) to continuously surround the gap cavity (it being understood that the spacer itself must hermetically withstand gas diffusion through it to and from the gap cavity). For large window assemblies, especially where cost is a significant consideration, aluminum or aluminum alloys may be used for the spacer 5006. However, the use of metals or metal alloys for the spacer 5006 is not required, and in some applications, may not even be preferred. Other materials believed suitable for forming the spacer 5006, include, but are not limited to, glasses, ceramics, composite materials, woven materials encapsulated in composite materials, and materials comprising a combination the materials listed above (including metals and metal alloys). In addition, some or all of the surfaces of the spacer 5006 may be coated or plated to promote bonding to the windowpanes. Suitable coatings are believed to include, but are not limited to glasses, metals, metal alloys, ceramics, composite materials, and woven materials encapsulated in a composite material.

It is currently believed that the preferred process for hermetically joining the transparent windowpanes 5002 and 5004 to the spacer 5006 is diffusion bonding. As previously described, diffusion bonding is a process by which a joint can be made between similar or dissimilar metals, alloys, and/or nonmetals by causing the diffusion of atoms across the surface interface. This diffusion is brought about by the application of pressure and heat to the surface interface for a specified length of time. The bonding variables, e.g., temperature, load (i.e., pressure) and time, vary according to the kinds of materials to be joined, the surface finishes, and the expected service conditions.

As previously described, a very important characteristic of diffusion bonding is the high quality of the joints produced. Diffusion bonding is the only process known to preserve the properties inherent in monolithic materials, both in metal-to-metal joints and in joints involving non-metals. With properly selected process variables, i.e., temperature, pressing load, and time, the material at the joint (and adjacent thereto) will have the same strength and plasticity as the bulk of the parent material(s). When the process is conducted in vacuum, the mating surfaces are not only protected against further contamination, such as oxidation, but may be cleaned, because the oxides present dissociate, sublime, or dissolve and diffuse into the bulk of the material. A good diffusion bond (sometimes known as a "diffusion weld") is free from incomplete bonding, oxide inclusions, cold and hot cracks, voids, warpage, loss of alloying elements, etc. If the interfacing surfaces are brought into truly intimate contact, then there is no need for fluxes, electrodes, solders, filler materials, etc. Diffusion-bonded parts typically retain the original values of ultimate tensile strength, angle of bend, impact toughness, vacuum tightness, etc.

It is envisioned that in some instances, the bonding process for joining windowpanes 5002 and 5004 to the spacer 5006 will be done in vacuum or partial vacuum (i.e., an evacuated chamber), in partial vacuum with the addition of one or more gases to increase or accelerate reduction of oxides (such as, but not limited to hydrogen), or in partial vacuum with the addition of one or more inert gases such as argon. In other instances, the bonding process will be done in a special atmosphere to increase oxidation of the frame material and/or the glass. This special atmosphere could be a negative pressure, ambient pressure or positive pressure, with one or more gasses added to promote (instead of reduce) the oxidation of the frame material and/or the glass. The added gasses for promoting oxidation include, but are not limited to oxygen.

In some instances, it is envisioned that the joint between the windowpanes 5002 and 5004 and the spacer 5006 may include a chemical bond between the spacer material and the windowpane material. This chemical bond may be in addition to a true diffusion bond (i.e., atomic diffusion). In other instances, the chemical bond may be present with little or no evidence of atomic diffusion.

For some combinations of materials, surface finishes and process conditions, the diffusion bonding process between windowpanes and spacers in hermetically sealed multi-pane window assemblies may be facilitated by the use of intermediate layers (also known as "interlayers") of a dissimilar material placed between the windowpanes and the spacer during the diffusion bonding process. The interlayers are believed to act as one or more of the follows: as activators for the mating surfaces; as high ductility interfaces between two less-ductile base materials; as compensators for the stresses arising when a joint involves materials differing in thermal expansion characteristics; as accelerators for mass transfer and/or chemical reactions; as buffers to prevent the formation of undesirable phases in the joint. As previously described, the interlayers may comprise metals, metal alloys, glass materials, solder-glass materials, solder-glass in tape form, solder-glass in sheet form, solder-glass in paste form, paste applied by dispensing or by screen-printing onto either the windowpane or spacer, solder-glass in powder form, glass powder mixed with water, alcohol or another solvent and sprayed, brushed or otherwise applied onto either the interface area of the spacer or the interface area of the windowpane, ceramics, composite materials, woven materials encapsulated in a composite material, or a material composed of a combination of glass and metals and/or metal alloys.

After bonding, completed hermetically sealed multi-pane window assemblies may be used in almost all applications where conventional insulated glass windows are used. However, unlike conventional windows, the hermetically sealed window assemblies will not lose their gas-tight integrity. This makes the hermetically sealed window assemblies suitable for premium installations in residential and commercial buildings (e.g., to reduce warranty claims due to fogging or condensation between the panes), in appliances such as ovens, or for use in severe or hazardous environments (e.g., in chemical plants, nuclear plants, outer space, etc.).

Figure 53:
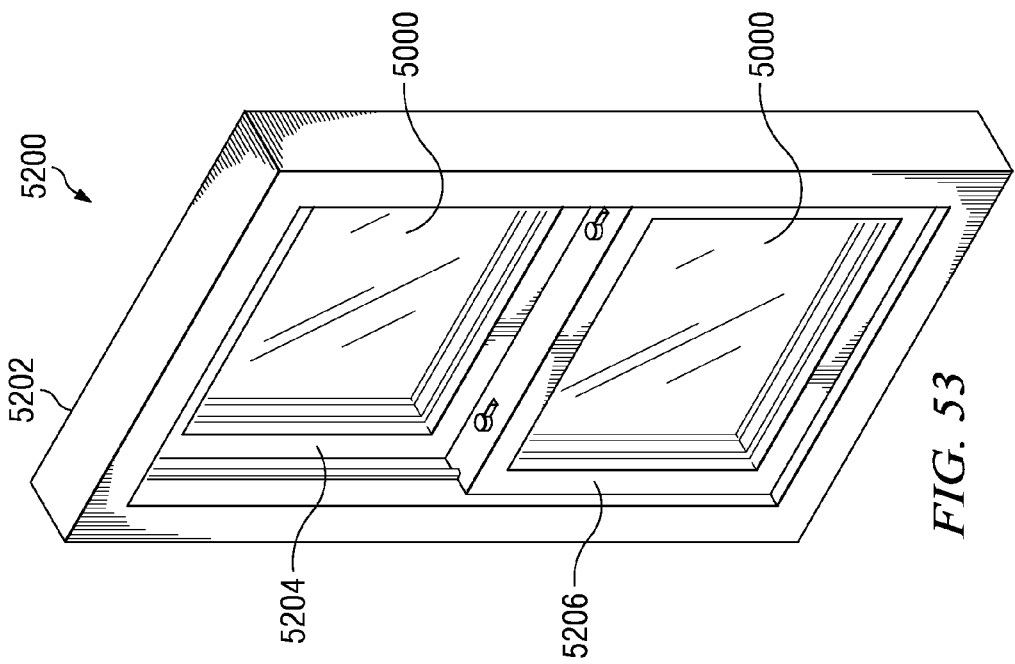
FIG. 53 is a perspective view of the assembled building window unit of FIG. 52.
Figure 52:
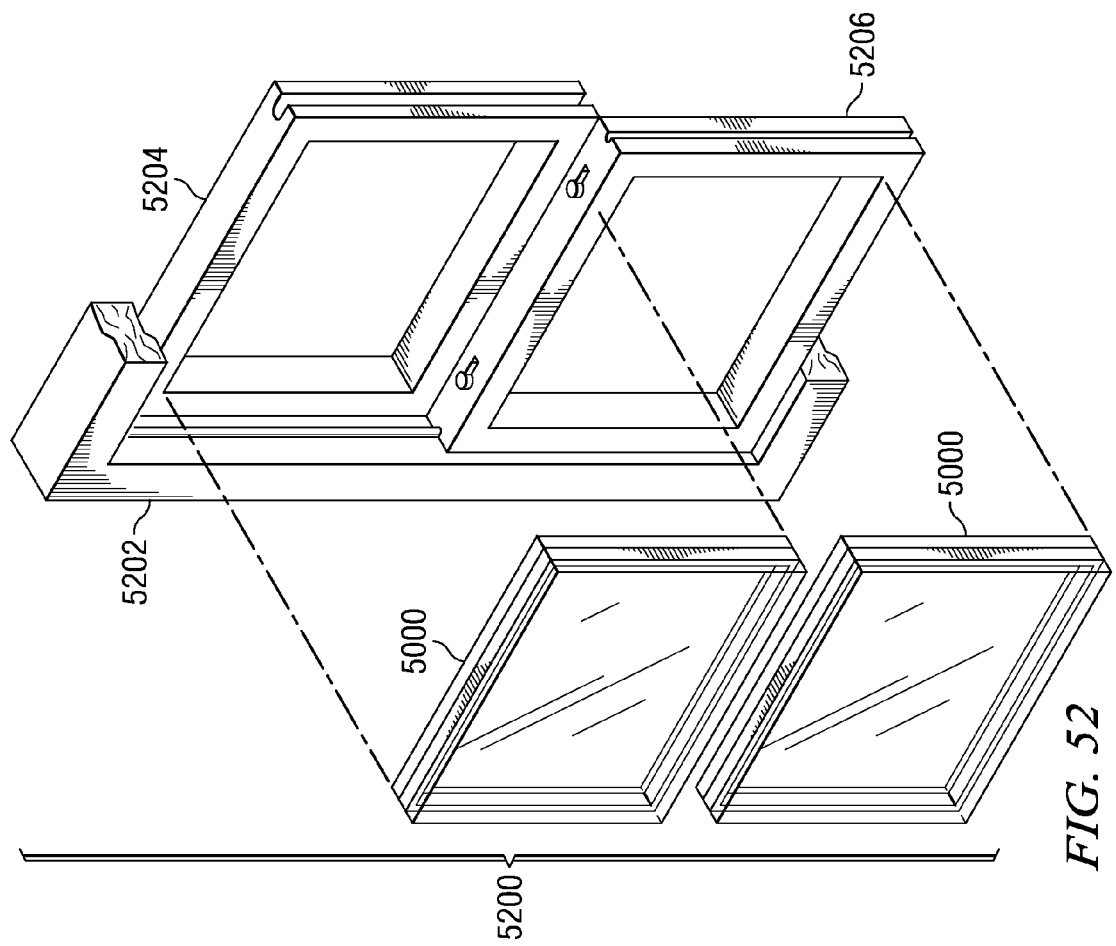
FIG. 52 is an exploded view of a building window unit including two double-pane hermetic window assemblies.

Referring now to FIGS. 52 and 53, there is illustrated a double-hung window unit equipped with a pair of hermetically sealed double-pane window assemblies similar to those shown in FIGS. 50 and 51. The double-hung unit 5200 includes upper and lower window frames 5202 and 5204, respectively, which are slidingly mounted within a frame/rail assembly 5206. A hermetically sealed double-pane window assembly 5000 is mounted in each window frame 5202 and 5204. The complete double-hung window unit 5200 (FIG. 53) can be installed into the rough-in frame of a building (not shown) as is a conventional window unit. It will be appreciated that the double-hung window unit is just one example, as hermetically sealed multi-pane window assemblies may also be used for, but not limited to, fixed frame windows, entry door windows, sliding glass doors, casement window assemblies and many other building and construction products.

Figure 54:
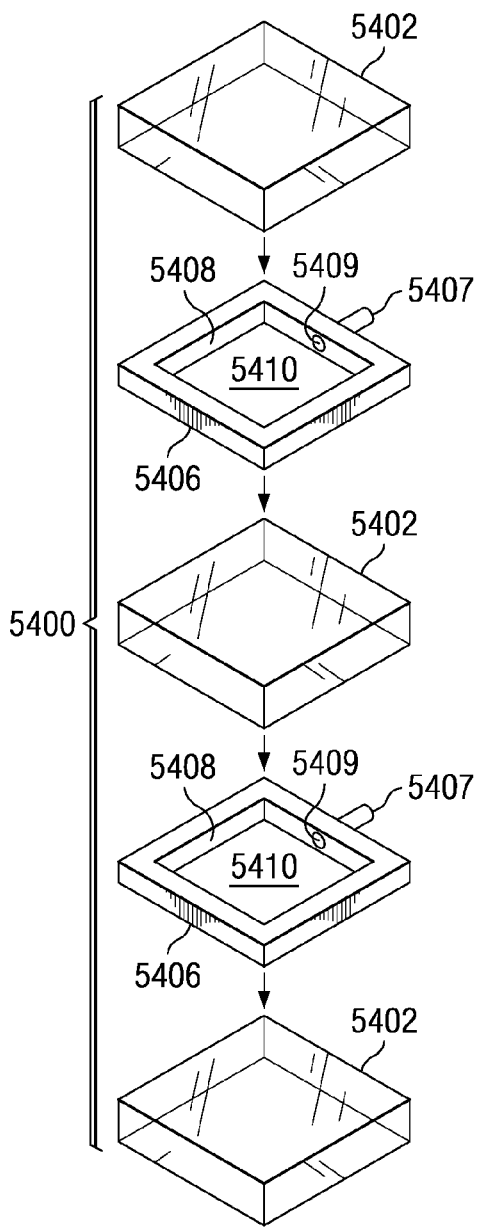
FIG. 54 is an exploded view of a triple-pane hermetic window assembly.
Figure 55:
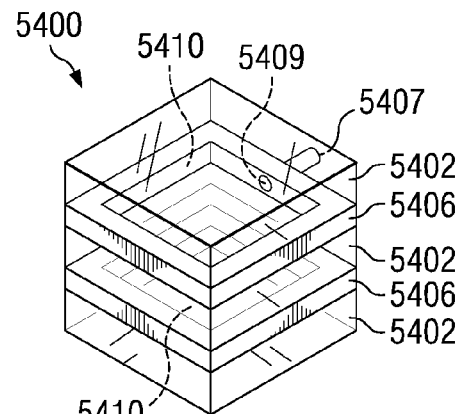
FIG. 55 is a perspective view of the assembled triple-pane hermetic window assembly of FIG. 54.

Referring now to FIGS. 54 and 55, there is illustrated another hermetically sealed multi-pane window assembly, namely, a hermetically sealed triple-pane window assembly 5400. It will be understood that the relative dimensions of the assembly 5400 have been exaggerated for purposes of illustration. Similar to the double-pane assembly 5000 previously described, the triple-pane assembly 5400 includes transparent windowpanes 5402 and spacers 5406 having a continuous sidewall 5408 that defines a gap cavity 5410 therewithin. In this embodiment, however, there are three windowpanes 5402 interleaved with two spacers 5406. Also in this embodiment, the spacers 5406 are provided with pinch-off tubes 5407 connected to passages 5409 through the spacer wall. As previously described, the pinch-off tubes will allow the atmosphere of the gap cavity 5410 to be adjusted after bonding.

The upper windowpanes 5402 and the spacers 5406 are stacked on the lower windowpane 5402 (as indicated by the arrows in FIG. 54). The stack is then joined as previously described to form a hermetic seal between each windowpane and the spacer. It will be appreciated that the methods and principles of fabrication for hermetically sealed two- and three-pane window assemblies disclosed herein may be easily extended to allow the fabrication of hermetically sealed window assemblies having 4, 5, 6 . . . n windowpanes interleaved with 3, 4, 5 . . . (n–1) spacers, respectively.

Figure 56:
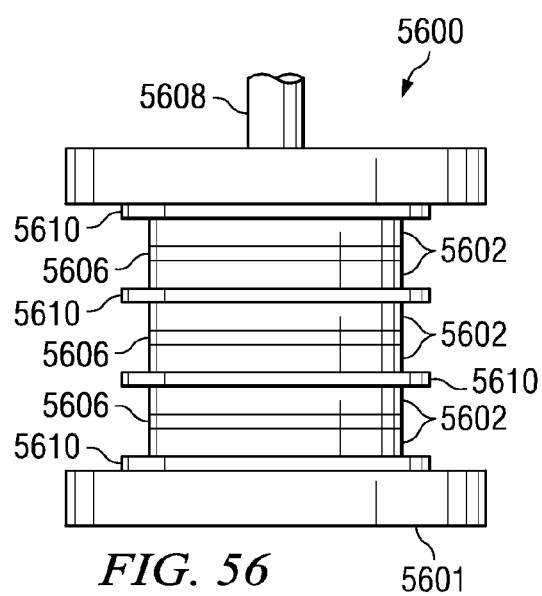
FIG. 56 illustrates the apparatus for fixturing multiple sets of hermetic window assemblies for simultaneous bonding.

Referring now to FIG. 56, there is illustrated one apparatus for fixturing multiple sets of window components for simultaneous diffusion bonding, thereby producing multiple hermetically sealed multi-pane insulated window assemblies simultaneously. The fixture apparatus 5600 includes a base 5601 upon which are stacked three sets of windowpanes 5602 and spacers 5606 similar to those described in FIGS. 50-51. A hydraulic or pneumatic ram 5608 supplies the pressure (i.e., load) against the top of the stack to press the windowpane and spacer elements together (against the base) during bonding. Separating the adjacent windowpanes (i.e., those belonging to different assemblies) are dividers 5610 formed of a material that will not bond to the windowpanes 5602, base 5601 or ram 5608 under the expected bonding conditions. The entire fixture apparatus is disposed inside a diffusion bonding chamber (not shown). The diffusion bonding chamber heats the fixture 5600 and its stacked components to bonding temperature, and causes the ram 5608 to apply bonding load (pressure) to the stacked components. The bonding temperature and pressure are maintained for the required bonding time necessary to produce a complete hermetic seal between all of the windowpanes 5602 and their respective spacers 5606. During the bonding process, the diffusion bonding chamber may be evacuated, pressurized, and/or filled with one or more gases as necessary to be sure the gap cavities of the assemblies have the desired contents, and/or to promote the bonding of the components. After bonding, the three hermetically sealed double-pane insulated window assemblies are complete. Of course, if the assemblies are equipped with valves or pinch-off tubes through the spacers as previously described, then the atmospheres of the gap cavities may still be adjusted as desired before the assemblies are finally hermetically sealed. It will be appreciated that similar apparatus and processes can be use to simultaneously produce large numbers of hermetically sealed multi-pane insulated window assemblies.

While diffusion bonding is believed to be the preferred method for joining the windowpanes to the sheets in a hermetically sealed multi-pane window assembly, another bonding apparatus, known as a Hot Isostatic Press ("HIP") may be used in lieu of the conventional diffusion bonding chamber with internal ram illustrated in FIG. 56. A Hot Isostatic Pressing (HIP) unit provides the simultaneous application of heat and high pressure. In the HIP unit a high temperature furnace is enclosed in a pressure vessel. Work pieces (e.g., the window assembly components) are heated and an inert gas, generally argon, applies uniform pressure. The temperature, pressure and process time are all controlled to achieve the optimum material properties.

Further, while diffusion bonding is believed preferred, many window-to-frame joining/bonding methods may be used to join the windowpanes to the sheets in a hermetically sealed multi-pane window assembly. These other methods include, but are not limited to, soldering, brazing, welding, electrical resistance heating (ERH), the use of metallization, solder preforms, etc. A large number of suitable methods are described herein in detail in connection with hermetic window assemblies and wafer-level packages, and therefore will not be repeated. It will however, be understood that such window-to-frame joining/bonding processes may be applicable to the fabrication of hermetically sealed multi-pane window assemblies.

Preferably, when fabricating hermetically sealed multi-pane insulated window assemblies, the coefficient of (linear) thermal expansion (CTE) of the spacer material(s) is matched as well as possible to the CTE of the associated glass windowpanes. The CTE of most glasses is fairly constant from approximately 273° K (0° Centigrade) up to the softening temperature of the glass. However, some metals and alloys have very different CTEs at different temperatures. Therefore, the average CTE of the spacer material(s) at the elevated glass-to-spacer bonding temperature should be matched as closely as possible to the average CTE of the glass over the same temperature range. The closer the average CTEs of the two materials, the lower will be the residual stresses in the spacer and the glass windowpanes after the assembly cools from the elevated bonding temperature back to ambient (room temperature).

The long-term reliability of the spacer-to-glass seal is affected by the degree of matching of the CTEs of the spacer material and the glass for the anticipated end-use environment. For example, if the window assembly is expected to be exposed to temperatures from −40° C. to 100° C. (−40° F. to 212° F.), then the spacer material and the glass material should have closely matched CTEs over this temperature range. If CTE of the spacer material cannot be exactly matched to the CTE of the glass material, then it is desirable that the CTE of the spacer material should be slightly greater than that of the glass. In such case (i.e., where the CTE of the spacer material exceeds that of the glass), the spacer would contract more than the glass during cool-down from the elevated bonding temperature back to ambient, resulting in the glass being in slight compression. This is preferable to the glass being in tension, since glass in tension is prone to cracking.

It is thus desirable when designing and fabricating hermetically sealed multi-pane insulated window assemblies to take into consideration data on the ranges of the coefficient of linear thermal expansion (CTE) of metals, metal of alloys and other spacer materials, along with data on the CTE values of glasses and other windowpane materials, so as to ensure the minimum post-bonding stresses, the maximum long-term reliability of the spacer-to-glass seals, and prevention of cracking of the glass windowpanes.

This disclosure further describes the attachment of two or more transparent windowpanes to a metallic or non-metallic spacer in order to create hermetic, thermally insulated window assemblies for residential and commercial building construction and other applications. The spacer maintains a gap or space between the pairs of windowpanes. This space may contain a gas, such as nitrogen or argon, or may be a partial or high vacuum.

A Vacuum Glazing Unit (VGU) is an Insulating Glass (IG) window unit that contains and maintains a partial vacuum inside the Insulating Glass Unit (IGU). A total vacuum would be the complete absence of any atoms or molecules inside the confined space. A total vacuum is today not practical to produce, so the term "partial vacuum" is used to denote an achievable level of vacuum or significantly reduced amount of atoms and molecules with a defined volume of space.

A vacuum-glazing unit (VGU) is a window assembly consisting of, at a minimum, two windowpanes with a space between them and a sealed frame assembly that is joined to the windowpanes and which, together with the windowpanes, defines, contains and maintains a volume of space that holds a practical level of vacuum. The purpose of this type of construction is to produce an IG window unit with the potential for a higher level of thermal insulation that can be obtained my most other constructions of IG units (IGUs). The VGU's higher level of thermal insulating capability when compared to gas-filled IGUs results from the substitution of the partial vacuum for the fill gas, since a vacuum is known to be the ultimate thermal insulator. Its ultimate insulating value comes from the absence or very low amount of atoms and/or molecules, therefore having very few substances in the volume of the vacuum to mechanically conduct or transfer thermal energy.

To make a VGU reliable and practical for installations in the outside-facing (exterior) walls and doors of buildings, the VGU must be able to withstand changes in temperature and barometric pressure, and differences in the building's inside and outside temperature and barometric pressure. Important factors for long-term insulating performance, reliability and durability of the VGU include the level of hermeticity of the components and assembled VGU, the strength and integrity of the hermetic attachment of the components forming the overall structure of the VGU, and maintaining a practical separation of the VGU's inside-facing and outside-facing windowpanes. Inside-facing refers to the side of the VGU that faces and is exposed to the inside (interior) of the building structure and outside facing refers to the side of the VGU that faces and is exposed to the outside (exterior) of the building structure.

Figure 57:
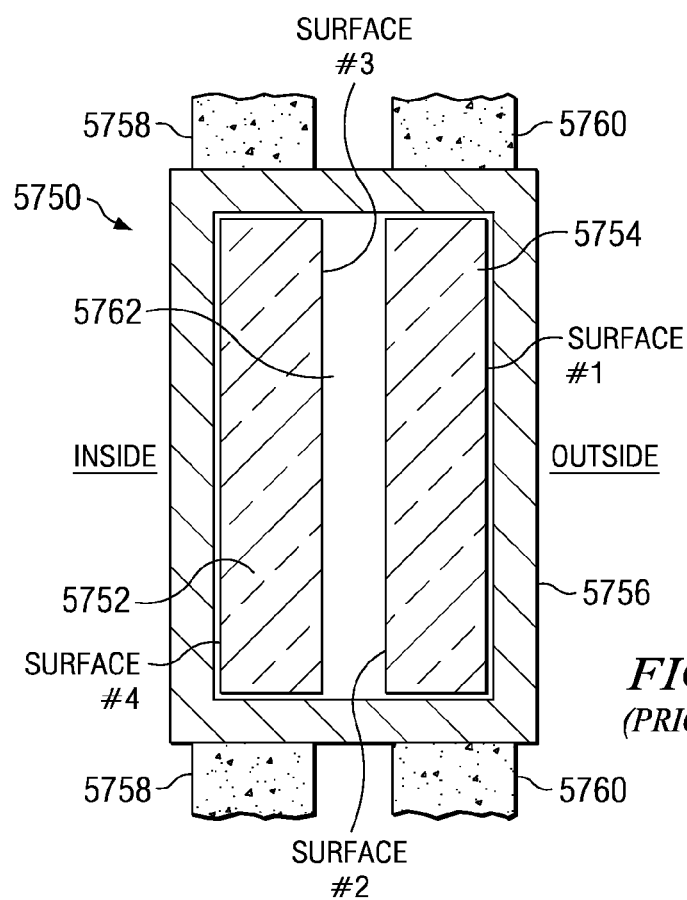
FIG. 57 is a double-pane vacuum glazing unit ("VGU") in accordance with the PRIOR ART.

Referring now to FIG. 57, there is illustrated a conventional double-pane VGU in accordance with the prior art for purposes of explaining the vocabulary commonly used in the building window industry for the windowpanes of a double-pane VGU, and which will sometimes be used herein. The VGU 5750 includes inner and outer window panes (also called "panes" or "lites") 5752 and 5754, respectively. In the industry, the outside pane 5754 is sometimes referred to as window #1 and the inside pane 5754 is sometimes referred to as window #2. A frame 5756 mounts the VGU in the building's inner and outer walls 5758 and 5760, respectively, and also maintains separation between the panes 5752 and 5754 to form an insulating gap (also called a "cavity") 5762. In the industry, the outside-facing surface of the outside windowpane 5754 is sometimes referred to as surface #1, the inside-facing surface of the outside windowpane is sometimes referred to as surface #2, the outside-facing surface of the inside windowpane 5752 is sometimes referred to as surface #3, and the inside-facing surface of the inside windowpane is sometimes referred to as surface #4.

The rate of expansion and contraction of a material per degree change in temperature is called the coefficient of thermal expansion (CTE) or thermal coefficient of expansion (TCE). CTE and TCE are typically expressed as Parts-Per-Million change in dimension per Degree Centigrade or Degree Fahrenheit change in temperature, or abbreviated as PPM/° C. or PPM/° F.

In general, the exterior of most buildings will see larger changes in temperature than the interior of the buildings due to daily outside weather changes. Because of this, the outside-facing surface of the VGU (surface #1) will be exposed to greater changes in temperature than the inside-facing surface (surface #4). If both the inside and outside facing windowpane have the same average CTE, the difference in temperature between them will cause the outside-facing windowpane to expand and contract more than the inside-facing windowpane. Any frame or seal mechanism holding the VGU together will have to compensate for the relative dimensional positions of the inside-facing and outside facing windowpanes. If the frame or seal mechanism is not compliant, that is, if it cannot compensate for the difference in location between the perimeters of the two windowpanes, then the bond attaching the frame or seal mechanism to the two windowpanes will incur stresses as a result of the effect of the relative changes in temperature between the inside-facing and outside-facing surfaces of the VGU. It is for this reason that the frame mechanism must be designed and constructed with special features. These features include having the frame member's CTE closely matched or similar to the windowpane or other item(s) to which it will be attached, and to be compliant in its design and use ductile materials in its construction. By incorporating these attributes, the frame member will be capable of expanding and contracting and thus acting like a spring to compensate for the difference in locations that the items to which the frame member is attached are trying to occupy.

Another attribute the frame member of the VGU should have is to be constructed of relatively low thermal conductivity material(s). This is because the frame member will conduct heat from the hotter surface it is attached (bonded, joined) onto, to the cooler surface onto which it has been attached (bonded, joined). Thus minimizing the thermal conductivity of this frame member minimizes the conduction of heat from one windowpane to the other windowpane of the VGU.

The preferred method of hermetically attaching the frame members to the windowpanes is by a process called diffusion bonding, a solid-state joining process. This process is also known as thermal-compression bonding (TC bonding). Diffusion bonding is a process by which a joint can be made between similar and dissimilar metals, alloys, and nonmetals, through the action of diffusion of atoms across the interface, brought about by the bonding pressure and heat applied for a specified length of time. The bonding variables (temperature, load and time) vary according to the kind of materials to be joined, surface finish, and the expected service conditions.

A very important distinction of diffusion bonding is the high quality of joints. It is the only process known to preserve the properties inherent in monolithic materials, in both metal-to-metal and nonmetal joints. With properly selected process variables (temperature, pressing load, and time), the material at and adjacent to the joint will have the same strength and plasticity as the bulk of the parent material(s). When the process is conducted in vacuum, the mating surfaces are not only protected against further contamination, such as oxidation, but are cleaned, because the oxides present dissociate, sublime, or dissolve and diffuse into the bulk of the material. A diffusion bonded joint is free from incomplete bonding, oxide inclusions, cold and hot cracks, voids, warpage, loss of alloying elements, etc. Since the edges are brought in intimate contact, there is no need for fluxes, electrodes, solders, filler materials, etc. Diffusion-bonded parts usually retain the original values of ultimate tensile strength, angle of bend, impact toughness, vacuum tightness, etc.

The bonding process for joining glass and other transparent and semi-transparent materials to a frame material may be done in vacuum or partial vacuum (an evacuated chamber), vacuum with the addition of one or more gases to increase or accelerate reduction of oxides (such as, but not limited to hydrogen), and vacuum with the addition of one or more inert gases such as argon.

The bonding process for joining glass to a frame material may be done in a special atmosphere to increase oxidation of the frame material and/or the glass. This special atmosphere could be a negative pressure, ambient pressure or positive pressure, with one or more gasses added to promote (instead of reduce) the oxidation of the frame material and/or the glass. The added gasses for promoting oxidation include, but are not limited to oxygen.

In some instances, the bond (joint) resulting from the bonding process will exhibit a chemical bond between the frame/spacer material and the glass. This chemical bond may be in addition to evidence of a diffusion bond (atomic diffusion). In other instances, the bond (joint) will exhibit little or no evidence of atomic diffusion.

Composition of the frame members joined to the windowpanes and/or to the internal spacer assembly. The frame members are hermetic structures composed of one or more materials. These materials include, but are not limited to: a glass material; a metal material; a metal alloy material; a ceramic material; composite materials; woven materials encapsulated in a composite material; and a material composed of a combination of two or more of the items listed above.

The frame members may be coated or plated to promote bonding (hermetically attaching) two or more frame materials to each other. These materials include, but are not limited to: a glass material; a metal material; a metal alloy material; ceramics; and composite materials.

The frame members may be coated or plated to promote bonding to the glass windowpane. These materials include, but are not limited to: a glass material; a metal material; a metal alloy material; a ceramic material; composite materials; woven materials encapsulated in a composite material; and a material composed of a combination of two or more of the items listed above.

A typical diffusion bonding process involves holding surface-prepared components together under load (i.e., bonding pressure) at an elevated temperature for a specified length of time. The specific values of the diffusion bonding parameters (i.e., pressure, temperature and time) may vary according to the kind of materials to be joined, their surface finish, and the expected service conditions. Generally speaking, however, the bonding pressures used are typically below those that will cause macrodeformation of the parent materials, and the temperature used is typically less than 80% of the parent material's melting temperature (in ° K). As previously described, in many cases, diffusion bonding is performed in a protective atmosphere or vacuum, however, this is not always required.

Assembly of a VGU with the use of intermediate layers (interlayers) is now described in further detail. The glass-to-frame seal may be made using one or more intermediate layers between the window and the frame assembly during the diffusion bonding process. These intermediate layers are hereafter referred to as interlayers. The interlayers may serve one or more of the following features: as activators for the mating surfaces; sometimes the interlayer material has a higher ductility in comparison to the base materials; as compensators for the stresses arising when a seal involves materials differing in thermal expansion; as accelerators for mass transfer and/or chemical reactions; as buffers to prevent the formation of undesirable phases; or other purposes not mentioned here. The interlayers may comprise: a glass material; a solder-glass material; solder-glass in tape form; solder-glass in sheet form; solder-glass in paste form (e.g., paste would be applied by dispensing or by screen-printing onto either the window component or the frame component); solder-glass in powder form (e.g., the glass powder would be mixed with water, or alcohol or another solvent and sprayed or brushed (painted) onto either the sealing area of the frame or the sealing area of the windowpane); a metal material; a metal alloy material; a material other than glass, glass-solder, metal or metal alloy, including, but not limited to: ceramics; composite materials; woven materials encapsulated in a composite material; or a material comprising a combination of glass and metals and/or metal alloys.

It is important to distinguish the use of diffusion bonding interlayers from the use of conventional solder alloys (in perform, paste and other forms) or solder glass (in perform, paste and other forms) and other processes. For purposes of this application, an interlayer is a material used between mating surfaces to promote the diffusion bonding of the surfaces by allowing the respective mating surfaces to diffusion bond to the interlayer or directly to one another. For example, with the proper interlayer material, the diffusion bonding temperature for the joint frame member and the interlayer material, and for the joint between the interlayer material and the windowpane, may be substantially below the diffusion bonding temperature of a joint formed directly between the frame member material and the windowpane material. Thus, use of the interlayer allows diffusion bonding together of the two or three assembly component layers at a temperature that is substantially below the diffusion bonding temperature that would be necessary for bonding those two or three component layer materials directly. The joint, which will preferably be hermetic, is still formed by the diffusion bonding process, i.e., none of the parent materials involved melts during the bonding process and the material of the interlayer diffuses atomically into the parent material. This distinguishes diffusion bonding using interlayers from other processes such as the use of solder alloy (in a variety of forms) or solder glass performs or paste, in which the solder material forms only a surface bond between the materials being joined. It is possible to use materials conventionally used for solders, for example, as interlayers for diffusion bonding. However, when used as interlayers they are used for their diffusion bonding properties and not as conventional solders.

The use of interlayers in the production of VGUs or other devices may provide additional advantages over and above their use as promoting diffusion bonding. These advantages include interlayers that serve as activators for the mating surfaces. Sometimes the interlayer materials will have a higher ductility in comparison to the base materials. The interlayers may also compensate for stresses that arise when the seal involves materials having different coefficients of thermal expansion or other thermal expansion properties. The interlayers may also accelerate the mass transfer or chemical reaction between the layers. Finally, the interlayers may serve as buffers to prevent the formation of undesirable chemical or metallic phases in the joint between components.

In some embodiments, a variation of diffusion bonding known as Liquid Phase diffusion bonding or sometimes, Transient Liquid Phase diffusion bonding (i.e., "TLP diffusion bonding") may be used for some or all of the bonds required in the bonded assemblies. In TLP diffusion bonding, solid state diffusional processes caused by the elevated pressure (i.e., load) and heat of the bonding process lead to a change in material composition (e.g., a new material phase) at the bond interface, and the initial bonding temperature is selected as the temperature at which this new phase melts. Alternatively, an interlayer of a material having a lower melting temperature than the parent material may be placed between the layers to be joined, and the initial bonding temperature is selected as the temperature at which the interlayer melts. Thus, a thin layer of liquid spreads along the interface to form a transient joint at a lower temperature than the melting point of either of the parent materials. The initial bonding temperature is then reduced slightly to a secondary temperature allowing solidification of the melt. This elevated temperature (i.e., the secondary temperature) and the elevated pressure (i.e., load) are maintained until the now-solidified transient joint material diffuses into the parent materials by solid-state diffusion, thereby forming a diffusion bond at the junction between the parent materials.

Sometimes the interlayer will not be a separate item from the two items to be joined, but rather be a material that has been applied to one or both of the surfaces of the to-be-mated surfaces of the items to be joined together. When the interlayer is pre-applied to one or both mating surfaced, the interlayer may be pre-applied by one of a variety of methods including, but not limited to spray deposition, vapor deposition, plating including solution bath plating, growing the interlayer material onto the to-be-mated item's surface, painting by brush or roller, and by many other means.

It will be appreciated that the terms "diffusion bonding" and "thermal compression bonding" (and its abbreviation "TC bonding") are often used interchangeably throughout this application and in the art. Metallurgists prefer the term "diffusion bonding", while the term "thermal compression bonding" is preferred in many industries (e.g., semiconductor manufacturing) to avoid possible confusion with other types of "diffusion" processes used in semiconductor manufacturing. Regardless of which term is used, as previously discussed, diffusion bonding refers to the family of bonding methods using heat, pressure, atmospheres and time alone to create a bond between mating surfaces at a temperature below the normal fusing temperature of either mating surface. In other words, neither mating surface is intentionally melted, and no chemical adhesives are used.

Figure 58A:
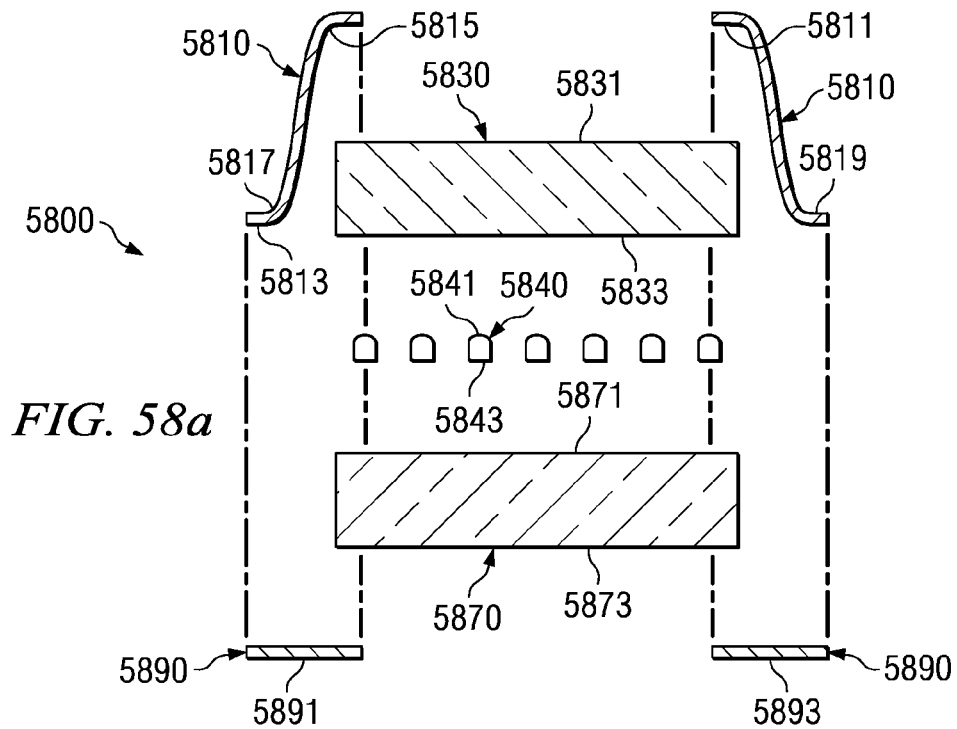
FIG. 58a is an exploded view of the components of a vacuum glazing unit in accordance with one embodiment.

The design and materials used for VGUs (and IGUs) can vary. Some variations are shown in FIGS. 58a though 96c. For purposes of describing these figures, "upper" and "lower" are used to describe the relative position of the components of the VGU instead of "inside", "inside facing", "indoor", "outside", outside facing", "outdoor", etc. Furthermore, the VGUs are shown illustrated in a horizontal view although they would be installed vertically in most situations, such as when installed in vertical walls and doors. Horizontal installations could include when the VGU is part of a skylight unit on a flat, horizontal portion of a ceiling or floor. It should be further noted that although the descriptions for the items and details in the figures use the terms "upper", "lower", "top" and "bottom" to describe the positional relationship of the items and details, the relative relationships of many items could often be reversed, such that the "upper" and "lower" items could be interchanged. Thus, the figures are not intended to imply which side of the VGU would face outdoors and which side would face indoors, or towards a particular direction once installed into the VGU's next higher assembly.

Figure 58B:
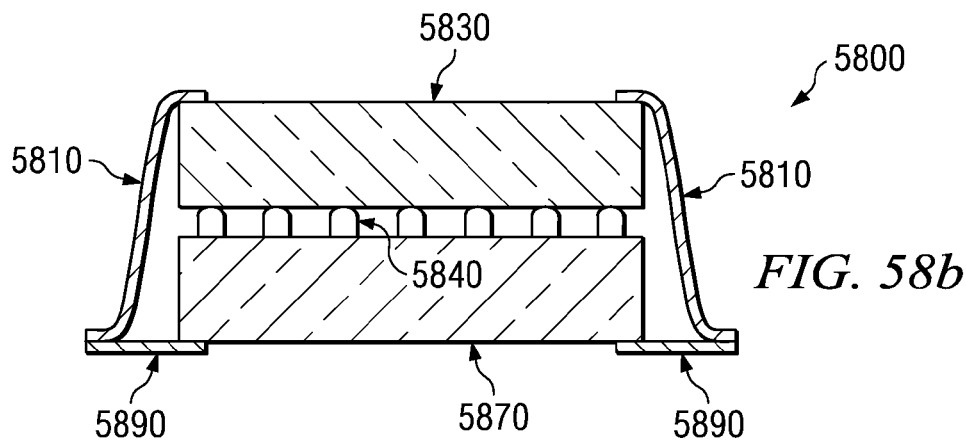

FIGS. 58a and 58b illustrate the basic concept and components of a vacuum glazing unit (VGU). The VGU 5800 comprises an upper frame member 5810, bonded to the top surface 5831 of an upper windowpane 5830. A lower frame member 5890 is bonded to the bottom surface 5873 of the lower windowpane 5870. Spacers/stand-offs 5840 are applied to the top surface 5871 of the lower windowpane 5870. These spacers are for the purpose of keeping the upper windowpane 5830 from coming in contact with the lower windowpane 5870.

The frame member 5810 is shown in a side view, cross section form. In its vertical form, it contains at least two radii, shown as upper, inside radius 5815 and lower, outside radius 5817. These radii provide compliancy to the frame member.

The spacers/stand-offs 5840 may be composed of a variety of materials and may be applied to the windowpane surface by a variety of means. These spacers should preferably be made with (composed of) a low thermal conductivity material, since they form a path of thermal conduction between the adjacent surfaces of the two windowpanes. They should outgas very little once included in the assembled and sealed VGU. They should be small enough to not be noticeable under almost any circumstances unless the observer is very close to the VGU. Their numbers and distribution must be sufficient to maintain a mechanical separation of the windowpanes' surfaces 5833 and 5871 from one another under all intended VGU installations.

The spacers/stand-offs 5840 may be applied to the surface 5871 of the windowpane 5870 by methods including, but not limited to ink-jet dispensing, stencil printing or screen printing, automated pick-and-place equipment where an adhesive might be used to hold the spacers/stand-offs 5840 in place after attachment to the surface 5871 and at least until the VGU is assembled and sealed, or by other means. If ink-jet dispensing is used to create the spacers/stand-offs 5840, each spacers/stand-off may be formed by the application of more than one drop of material. Multiple drops of jetted material could be used to make the desired area of spacer surface 5843 on the windowpane's surface 5871. Multiple drops of jetted material could be used to create the desired height of the spacer 5840. In some embodiments, the spacer's top surface 5841 is flat, while in other embodiments, the top surface 5841 would be not be flat, but rather would have a radius (be rounded or dome shaped) to minimize the contact area between it and the windowpane surface 5833.

Whenever a spacer is used to maintain separation of two windowpanes, the surface of the windowpane may be treated or coated with a substance to reduce any friction that could result from the relative movement of the spacer to the windowpane as a result of changes in temperature causing changes in the dimension, and thus relative location of the spacer(s) to the windowpane's surface. Friction where the spacer(s) surface 5841 moved relative to the windowpane's surface 5833 could result in physical damage (including causing scratches); and/or affect the optical appearance of one or both items; and/or affect the transparency of either or both the spacer(s) and the windowpane. Coatings to reduce friction and/or to reduce or eliminate the possibility of any of the damage described above include chemical vapor deposited diamond (CVD diamond). Additionally, materials such as sheet films could be applied to one or both surfaces (5833 and/or 5841).

Often, IG windows are coated on inside surfaces #2 and/or #3 with materials intended to enhance certain features of the IGU. These include low-emissivity (low-e) coatings, and chromatic or chromeric coatings such as electrochromic and polychromic coatings. These and other coatings in use today could also be applied to the inside surfaces #2 and/or #3 of the VGUs described herein.

Some IGUs are now offered with special coatings applied to the outside surfaces #1 and/or #4. These coatings provide features and functions including making the windows easier to clean. The VGUs described herein could also have widows with these and other coatings applied to outer facing surfaces #1 and #4.

Regardless of whether any coatings are applied to surfaces #1, #2, #3 or #4, if the coatings can withstand the diffusion bonding temperature(s) used to attach the frame member to the windowpane, then the coating may be applied to the windowpane prior to the diffusion bonding process. Should the coating(s) not be able to withstand the diffusion bonding temperature(s) used to attach the frame member to the windowpane, then the coating(s) would have to be applied to the surface(s) of the windowpane after performing the diffusion bonding process. The same would be applicable for any films applied to any surface of either windowpane.

Before bonding the frame member and the windowpane together, with or without the use of an interlayer, it may be necessary to remove any pre-applied coatings on the windowpane's surface where the two items will be joined. Coating removal methods could include chemical removal, mechanical abrasion including sanding or grinding, and/or laser ablation.

During the actual diffusion bonding process, the upper bonding surfaces 5811 of upper frame member 5810 are positioned against the top surface 5831 of the upper windowpane 5830. The bonding surfaces 5811 and the windowpane 5830 are pressed together with sufficient force to produce a predetermined contact pressure between the bonding surfaces and the windowpane along a first junction region, and the junction regions is heated to produce a predetermined temperature along the first junction region. The previous two steps may be conducted simultaneously or in either order, and further may be conducted in a vacuum or special atmosphere. The predetermined contact pressure and the elevated temperature are maintained until a diffusion bond is formed between the upper frame member 5810 and the upper windowpane 5830 around the periphery of the windowpane.

Similarly, the top bonding surfaces 5891 of lower frame member 5890 are positioned against the bottom surface 5873 of the lower windowpane 5870. The bonding surfaces 5891 and the windowpane 5870 are pressed together with sufficient force to produce a predetermined contact pressure between the bonding surfaces and the windowpane along a second junction region, and the junction regions is heated to produce a predetermined temperature along the second junction region. The previous two steps may be conducted simultaneously or in either order, and further may be conducted in a vacuum or special atmosphere. The predetermined contact pressure and the elevated temperature are maintained until a diffusion bond is formed between the lower frame member 5890 and the lower windowpane 5870 around the periphery of the windowpane.

Returning now to FIGS. 58*a* and 58*b*, once the frame members are attached to windowpanes and the spacers are applied to the lower windowpane, the unit is ready for final assembly. This entails the hermetic bonding of the lower surface 5813 of the upper frame member 5810, to the upper surface 5891 of the lower frame member 5893.

Figure 58C:
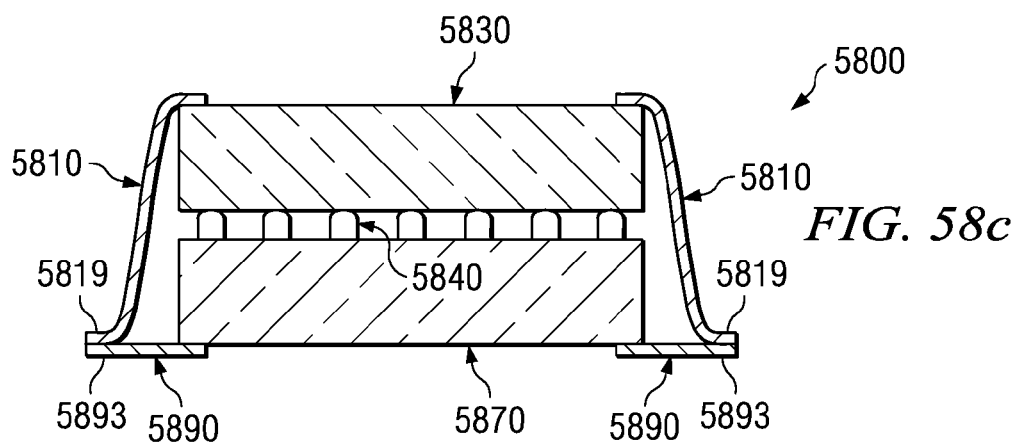

FIG. 58*c* points out the top surface 5819 of the upper frame's bottom edge/flange/foot and the bottom surface 5893 of the lower frame member. Heat can be applied simultaneously to both surfaces 5819 and 5893 to from a hermetic bond or joint that joins the upper frame member to the lower frame member. Heat application methods include electrical resistance seam welding, can welding, and laser welding. Often an additional material is pre-applied to one or both of the surfaces 5813 on the bottom of the upper frame member 5810 and to surface 5891 on the top of the lower frame member prior to bonding the two frame members to each other. One such common material is nickel. When nickel is pre-applied to one or both materials, the joint region is heated to a temperature sufficiently high enough to melt the nickel coating, and the resulting joint is a nickel solder joint. A common method of applying the nickel to the frame member, when the frame is made of a metal or metal alloy material, is to solution bath plate the nickel onto the frame member. Sometimes an additional, very thin metal or metal alloy is subsequently plated or otherwise applied on top or the nickel or other solder material. This is usually done for cosmetic purposed or to help prevent oxidation of the solder material prior to the soldering or brazing process that joins the two frame members together.

Figure 58D:
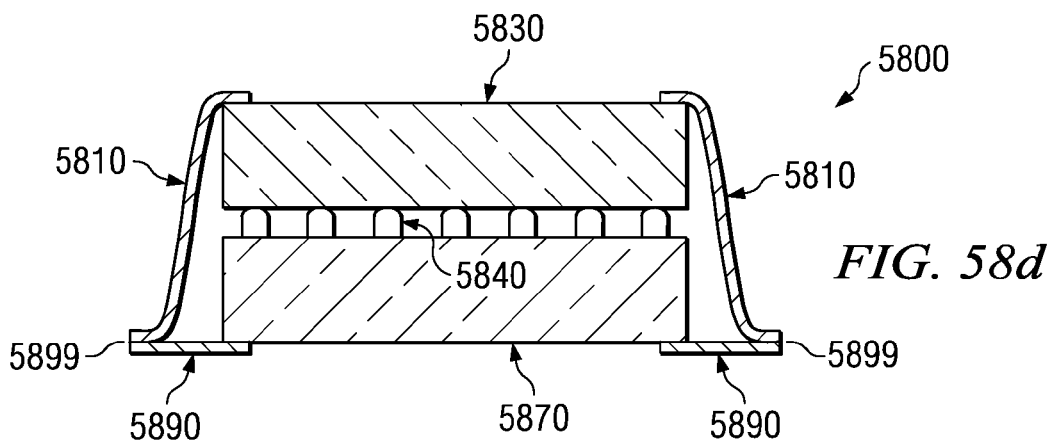

FIG. 58d shows the point of heat application to be at the junction of contact 5899 between the upper and lower frame members. Heat application methods include laser and forced air convection.

FIG. 58e shows the points of heat application to be at both the locations of FIG. 58c and FIG. 58d. This can be accomplished by one of, or a combination of heating methods, including laser, forced-air convection, heater bars (such as is used for hot-bar soldering of electronics), and seam welding where the electrodes contact all three surfaces.

In preferred embodiments, the frame members of the VGU are sealed together while in a vacuum environment, thereby "automatically" creating the desired vacuum within the gap, and eliminating the need for a pinch-tube, valve, etc. for evacuation of the VGU gap after it is assembled and sealed. In other embodiments, however, a pinch-tube or valve may be used, and the VGU gap may be evacuated after assembly.

While vacuum provides the best insulating properties for multi-pane insulating window assemblies, the physical configuration of the VGUs of the current invention will also benefit multi-pane insulating window assemblies that contain a fill gas or other insulating substances, e.g., aerogels, between the windowpanes. Having a compliant frame assembly that is also hermetically sealed is expected to extend the useful insulating life of these types (i.e., non-vacuum) of windows, too. Some fill gasses, like xenon, are more insulating than krypton, but currently too expensive for most consumers. It is anticipated that when multi-pane insulating window assemblies can be expected to hold an exotic fill gas for 20-50 years, the alternative fill gases would become practical to use. On the other hand, non-gas insulating alternatives such as aerogels may or may not need hermetic encapsulation like vacuum and gas-filled windows.

FIG. 58f shows a perspective view of one embodiment of a compliant frame member suitable for use in a VGU or IGU such as those described in connection with FIGS. 58a-58e. The frame 5808 is compliant in all three axes in a side region 5811 below a top flange 5812 and a bottom flange 5814. The top flange 5812 is adapted for bonding to the top surface of an upper windowpane (e.g., surface 5831 in FIG. 58a), and the bottom flange 5814 is adapted for bonding to the top surface of a lower frame member (e.g., surface 5891 in FIG. 58a). The side region 5811 may incorporate combinations of compliant shapes to provide the necessary multi-dimensional compliance. In the illustrated embodiment, the side region 5811 includes corrugations 5816, convex recurves 5818 and concave recurves 5820, however, it will be understood that other configurations are within the scope of the invention. The features of the frame member 5810 in FIGS. 58a-58e may correspond to the features of embodiment 5808 as follows: upper bonding surface 5811 (FIG. 58a) may be the reverse side of upper flange 5812 (FIG. 58f); upper radius 5815 (FIG. 58a) may be the reverse side of upper recurve 5818 (FIG. 58f); lower radius 5817 (FIG. 58a) may be the lower recurve 5820 (FIG. 58f); and lower bonding surface 5813 (FIG. 58a) may be the reverse side of lower flange 5814 (FIG. 58f).

Figure 59A:
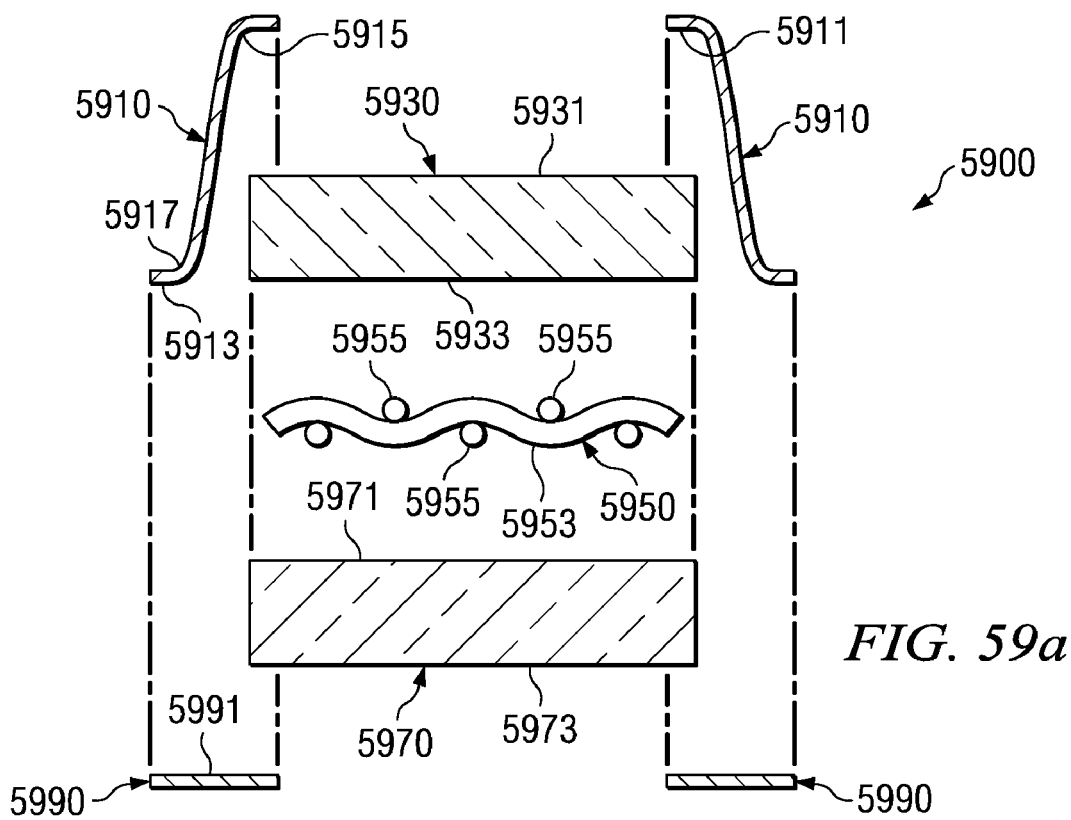
FIG. 59a is an exploded view of the components of a vacuum glazing unit incorporating a woven spacer in accordance with another embodiment.
Figure 59B:
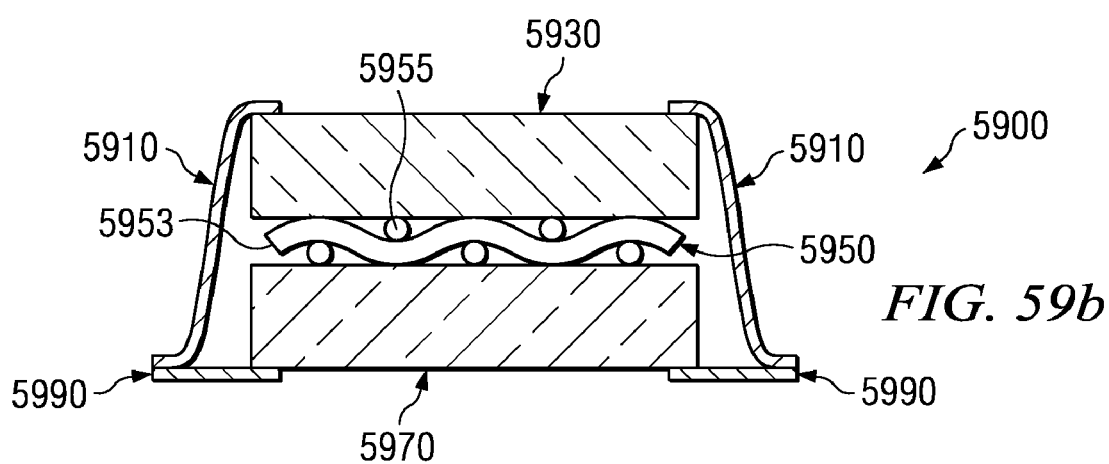

FIGS. 59a and 59b show, respectively, an exploded view and an assembled view of a VGU in accordance with another embodiment. The VGU 5900 is generally similar to the VGUs previously described herein, however, it comprises a woven spacer 5950 as further described below. The VGU 5900 further comprises an upper windowpane 5930 having a top surface 5931 and bottom surface 5933, and a lower windowpane 5970 having a top surface 5971 and a bottom surface 5973. The woven spacer 5950 includes warp fibers 5953 comprising generally parallel strands of a first fiber/filament interwoven with weft fibers 5955 comprising generally parallel strands of a second fiber/filament running generally perpendicular to the warp. The spacer maintains separation between the inner surfaces 5933 and 5971 of the windowpanes. The VGU 5900 is held together by an upper frame member 5910 and a lower frame member 5990. The upper frame member 5910 has a top bonding surface 5911 for hermetic bonding to the top surface 5931 of upper windowpane 5930, an upper inside radius 5915, a lower outside radius 5917 and a bottom bonding surface 5913. The lower frame member 5990 includes a top surface 5991 for hermetic bonding to the lower bonding surface 5913 of the upper frame member 5910, and for hermetic bonding to the bottom surface 5973 of the lower windowpane 5970.

One potential material for the warp fibers/filaments 5953 and weft fibers/filaments 5955 would be glass fiber such as is used for optical fiber. This type of fiber has several benefits, including abundant supply, availability in extremely small diameters, and a fair level of optical transparency. The points where the warp and weft fibers come in contact with each other are higher, taller, and thicker than the diameter of either the warp or weft fibers by themselves. It is these overlapping regions that provide the stand-offs that separate the upper windowpane 5930 from the lower windowpane 5970. It should be appreciated that employing only parallel warps or wefts between the windowpane surfaces 5933 and 5971 could maintain separation of the two windowpanes, but the surface contact area would be much greater that when using a woven spacer with the appropriate mesh spacing.

Figure 60A:
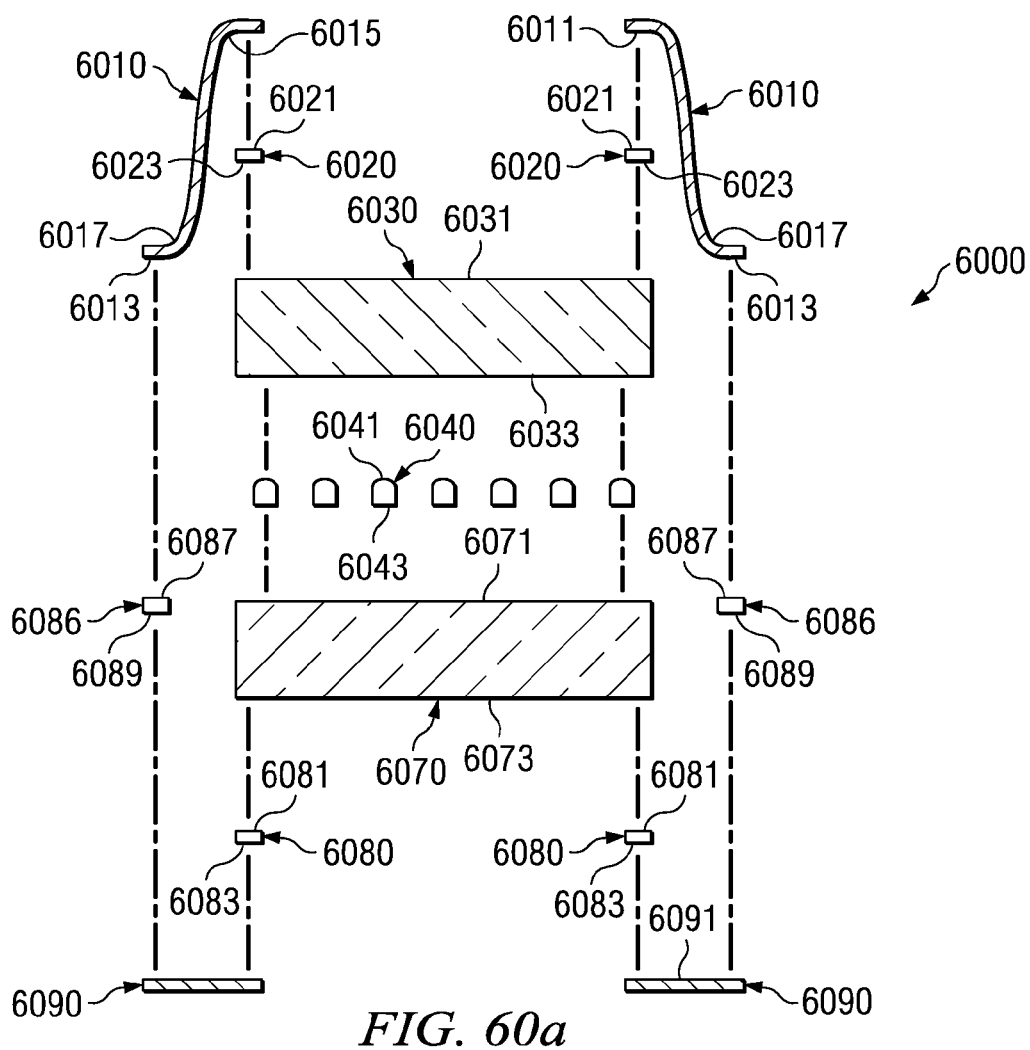
FIG. 60a exploded view of the components of a VGU with optional interlayers in accordance with another embodiment.
Figure 60B:
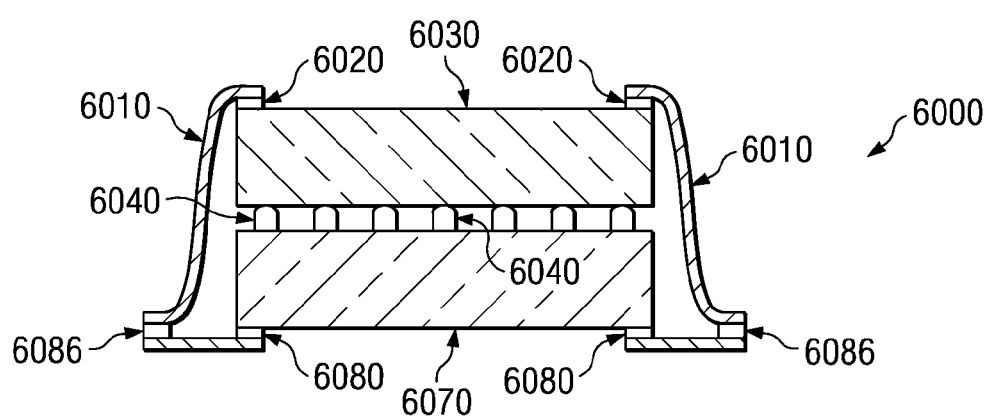

FIGS. 60a and 60b show, respectively, an exploded view and an assembled view of a VGU in accordance with another embodiment. The VGU 6000 is generally similar to the VGUs previously described herein, however, it comprises one or more interlayers 6020, 6080 and/or 6086 to facilitate diffusion bonding of the frame members and windowpanes. The reasons for using an interlayer are further described herein.

The VGU 6000 comprises an upper windowpane 6030 having a top surface 6031 and bottom surface 6033, and a lower windowpane 6070 having a top surface 6071 and a bottom surface 6073. A plurality of spacers 6040, each having a upper surface 6041 and lower surface 6043 are disposed between the inner surfaces 6033 and 6071 of the windowpanes to maintain their separation. The VGU 6000 is held together by an upper frame member 6010 and a lower frame member 6090. The upper frame member 6010 has a top bonding surface 6011 for hermetic bonding to the top surface 6031 of upper windowpane 6030, an upper inside radius 6015, a lower outside radius 6017 and a bottom bonding surface 6013. The lower frame member 6090 includes a top surface 6091 for hermetic bonding to the lower bonding surface 6013 of the upper frame member 6010, and for hermetic bonding to the bottom surface 6073 of the lower windowpane 6070. A first interlayer 6020 having upper surface 6021 and lower surface 6023 may be employed for diffusion bonding purposes between bonding surfaces 6011 and 6031 of the upper frame member 6010 and upper windowpane 6030, respectively. A second interlayer 6080 having upper surface 6081 and lower surface 6083 may be employed for diffusion bonding purposes between bonding regions 6073 and 6091 of the lower windowpane 6070 and lower frame member 6090, respectively. A third interlayer 6086 having upper surface 6087 and lower surface 6089 may be employed for diffusion bonding purposes between bonding surfaces 6013 and 6091 of the upper frame member 6010 and lower frame member 6090, respectively. Use of the interlayers is optional.

Figure 61A:
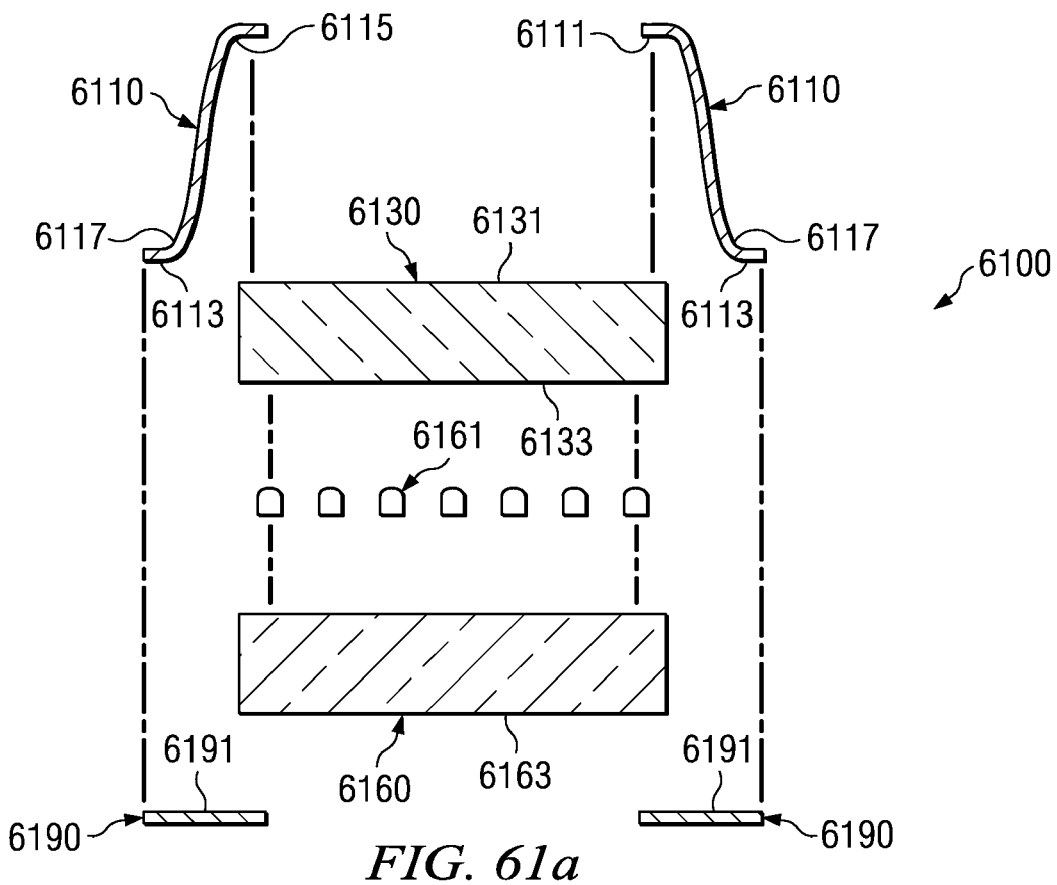
FIG. 61a is an exploded view of the components of a VGU with the spacers incorporated into the fabrication of the lower windowpane in accordance with another embodiment.
Figure 61B:
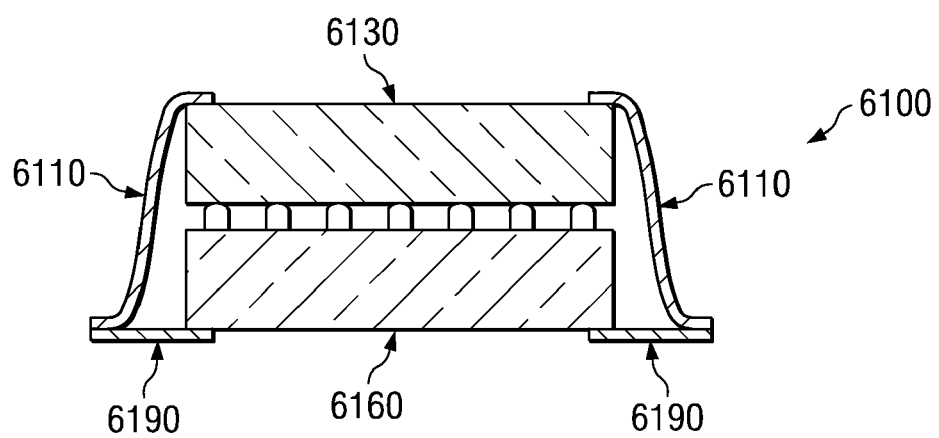

FIGS. 61a and 61b show, respectively, an exploded view and an assembled view of a VGU in accordance with another embodiment. The VGU 6100 is generally similar to the VGUs previously described herein, however, it comprises a windowpane that was fabricated to include integral spacers/standoffs that will be used to maintain the separation of the two windowpanes. Having the windowpane produced with integrated spacers mitigates the need for applying individual spacers to one of the windowpanes. The VGU 6100 comprises an upper windowpane 6130 having a top surface 6131 and bottom surface 6133, and a lower windowpane 6160 having a top surface with integral stand-offs 6161 and a bottom surface 6163. The integral stand-offs 6161 maintain the separation between the windowpanes. The VGU 6100 is held together by an upper frame member 6110 and a lower frame member 6190. The upper frame member 6110 has a top bonding surface 6111 for hermetic bonding to the top surface 6131 of upper windowpane 6130, an upper inside radius 6115, a lower outside radius 6117 and a bottom bonding surface 6113. The lower frame member 6190 includes a top surface 6191 for hermetic bonding to the lower bonding surface 6113 of the upper frame member 6110, and for hermetic bonding to the bottom surface 6163 of the lower windowpane 6160. Although FIGS. 61a and 61b show a VGU with spacers/stand-offs incorporated into the fabrication of the lower windowpane 6160, it will be appreciated that stand-offs could be fabricated into the upper windowpane, or into both windowpanes, in other embodiments.

Figure 62A:
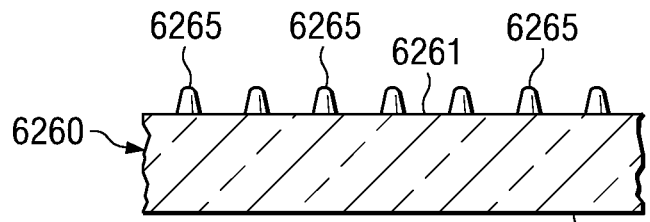
FIG. 62a is a side view of a windowpane with spacers on one of its surfaces that are incorporated into the windowpane's fabrication in accordance with another embodiment.
Figure 62B:
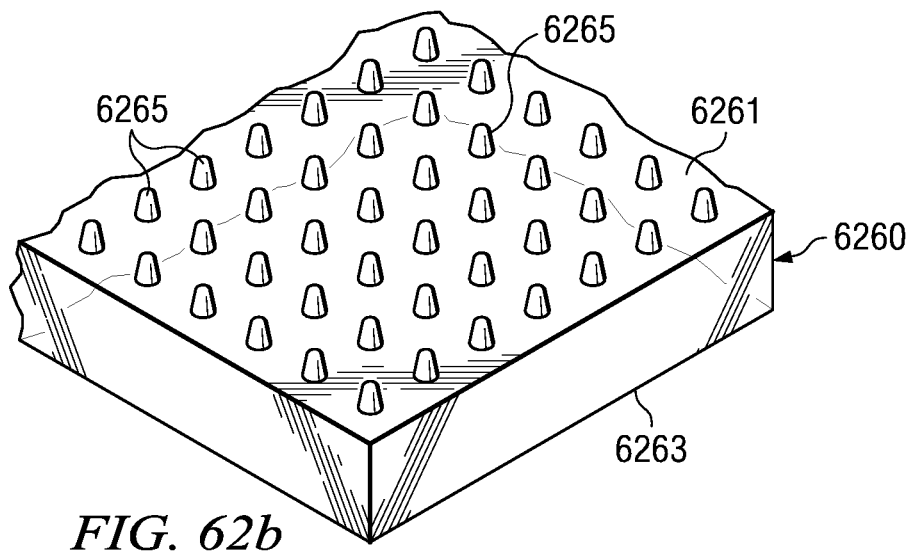
Figure 62C:
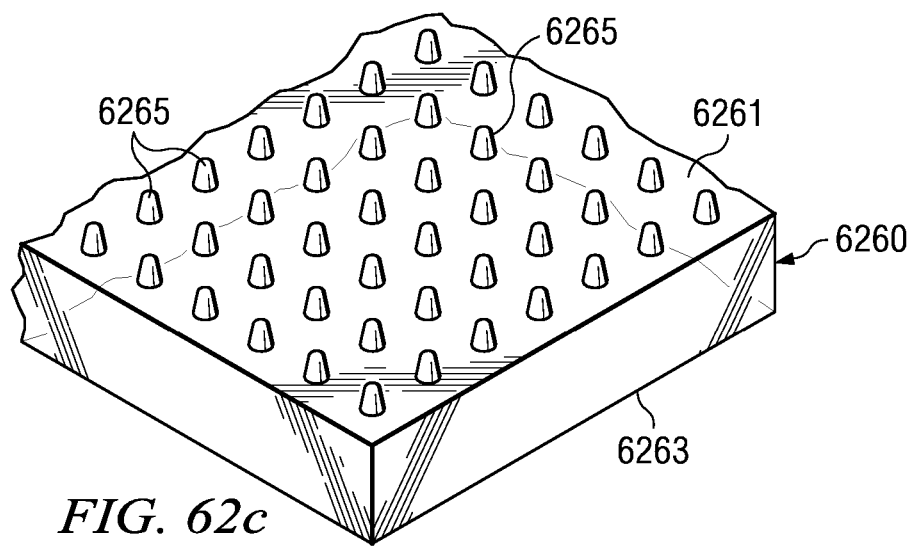

FIGS. 62a, 62b, and 62c illustrate embodiments of a windowpane, similar to the lower windowpane 6160 described in connection with FIGS. 61a and 61b, having spacers on one of its surfaces that were incorporated into the windowpane's fabrication. It will be appreciated that stand-offs are not necessarily drawn to scale, thus the proportions and relative spacing of the stand-offs may be different from that illustrated. Windowpane sheet 6260 comprises a substrate having a substantially flat top side 6261 and bottom side 6263, and a plurality of stand-off features 6265 extend upward from the top surface. In the illustrated embodiment, the stand-offs 6265 have a truncated conical configuration and an evenly arrayed distribution, but in other embodiments the stand-offs may have other configurations and/or distributions.

FIGS. 63a and 63b show, respectively, an exploded view and an assembled view of a VGU in accordance with another embodiment. The VGU 6300 is generally similar to the VGUs previously described herein, however, it comprises a transparent sheet center spacer unit 6350 that is fabricated with spacers/stand-off's as part of the spacer sheet stop and bottom sides to enhance the thermal performance (i.e., insulating properties) of the VGU. The spacer sheet with integrated spacers eliminates the need for applying individual spacers to one of the windowpanes.

The VGU 6300 comprises an upper windowpane 6330 having a top surface 6331 and bottom surface 6333, and a lower windowpane 6370 having atop surface 6371 and a bottom surface 6373. The spacer unit 6350 includes integral stand-offs 6351 on the upper surface, and stand-offs 6353 on the bottom surface. The spacer unit 6350 is placed between the windowpanes 6330 and 6370 to maintain the separation between them. The VGU 6300 is held together by an upper frame member 6310 and a lower frame member 6390. The upper frame member 6310 has a top bonding surface 6311 for hermetic bonding to the top surface 6331 of upper windowpane 6330, an upper inside radius 6315, a lower outside radius 6317 and a bottom bonding surface 6313. The lower frame member 6390 includes a top surface 6391 for hermetic bonding to the lower bonding surface 6313 of the upper frame member 6310, and for hermetic bonding to the bottom surface 6373 of the lower windowpane 6370. Although FIGS. 63a and 63b show a VGU with spacers/stand-offs incorporated into the fabrication of both sides of the spacer unit 6350, in other embodiments, the stand-offs may be incorporated into only the upper or lower surface of the spacer unit.

The spacer unit 6350 increases the thermal path of conduction between the upper windowpane 6330 and lower windowpane 6370 when compared to the previously described and employed methods of separating the two windowpanes. The sheet material of this spacer could be composed of glass, plastic sheet or film. The spacer stand-offs 6351 and 6353 could be made from a multitude of materials. As previously discussed, the spacers would preferably be made from a low thermal conductivity material. This spacer unit 6350 may be manufactured as a single piece or may be composed of a sheet or film material with the stand-offs later applied to it by means that include those mentioned previously in the description of the attachment of spacers 5840 for FIGS. 58a and 58b.

Figure 64A:
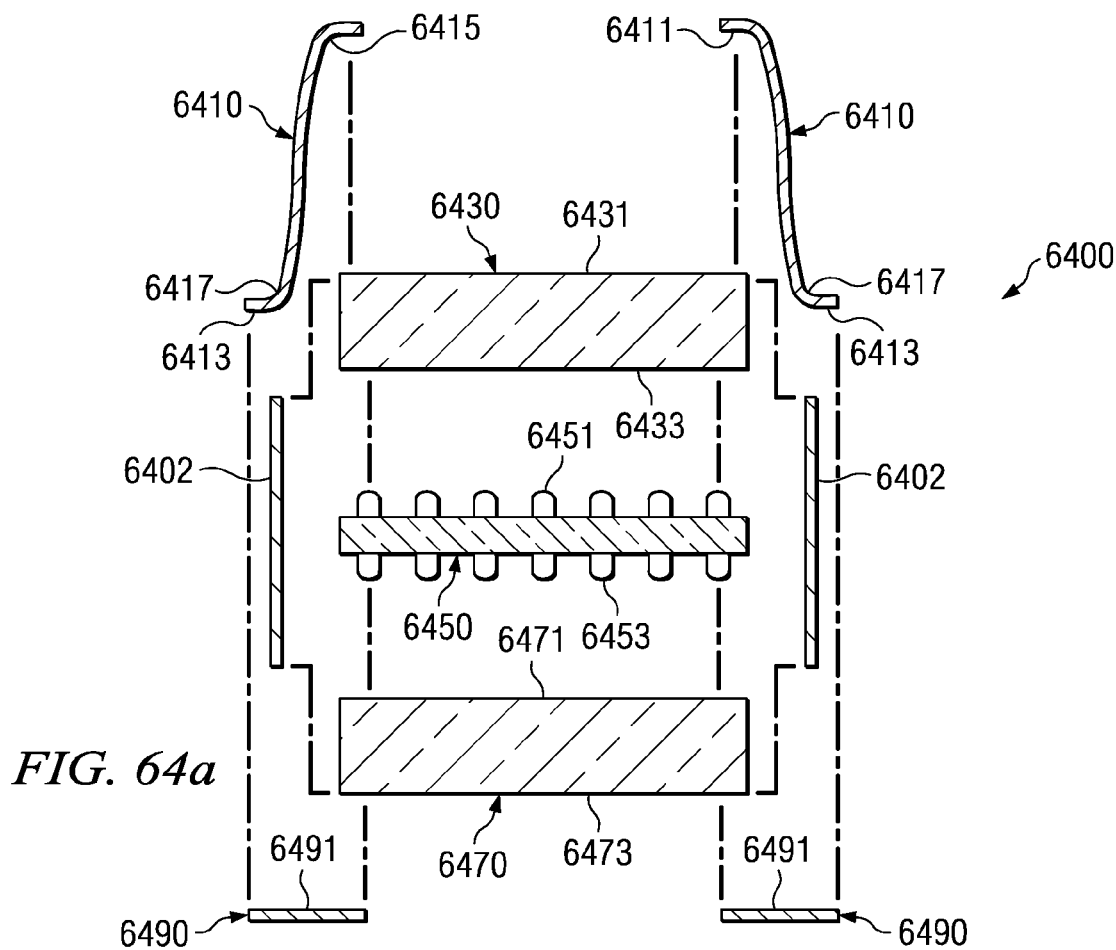
FIG. 64a is an exploded view of the components of a VGU with an optional member between the sealed frame members and the windowpanes in accordance with another embodiment.
Figure 64B:
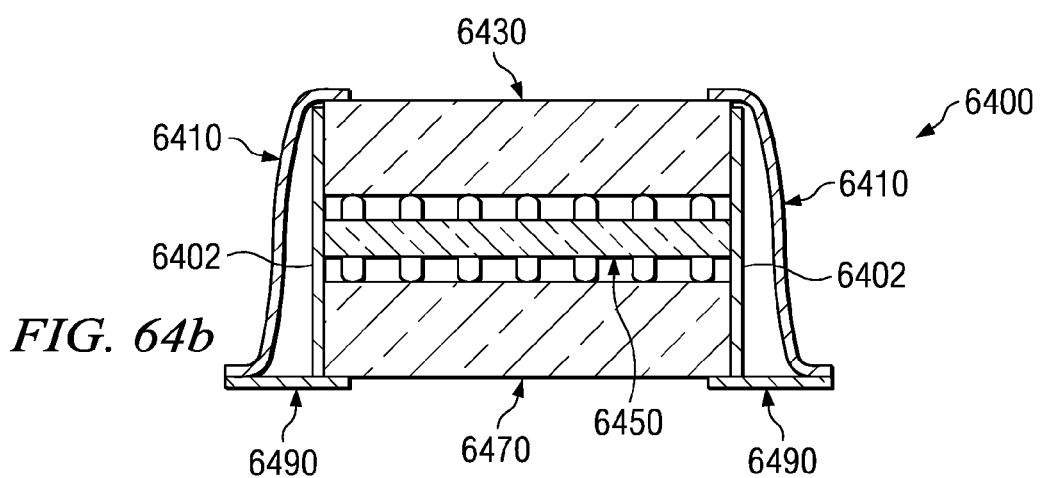

FIGS. 64a and 64b show, respectively, an exploded view and an assembled view of a VGU in accordance with yet another embodiment. The VGU 6400 is generally similar to the VGU 6300 previously described herein, however, it comprises a side shield member disposed between the sealed frame members and the windowpanes. The VGU 6400 comprises an upper windowpane 6430 having a top surface 6431 and bottom surface 6433, and a lower windowpane 6470 having a top surface 6471 and a bottom surface 6473. A spacer unit 6450 includes stand-offs 6451 on the upper surface and stand-offs 6453 on the bottom surface. The spacer unit 6450 is placed between the windowpanes 6430 and 6470 to maintain the separation between them. The side shield members 6402 are disposed along the sides of the windowpanes and spacer. The side shield members 6402 preferably have low thermal conductivity. In some embodiments, the shield members may be included for cosmetic purposes, e.g., to conceal the inner frame parts from observation through the windowpanes. In other embodiments, the shield members 6402 comprise "getters" (i.e., gettering material), which absorb or otherwise immobilize stray atoms or molecules in the vacuum space within the VGU. Even if the VGU is hermetically sealed, such atoms or molecules may appear in the vacuum due to out-gassing of one or more of the materials used on or inside the VGU. Such atoms or molecules may also come into the space contained within the VGU by slow penetration through an outside surface (e.g., windowpanes and frame members), through the bonds/joints between frame members and windowpanes and/or through the joint area of the upper and lower frame members.

The VGU 6400 is held together by an upper frame member 6410 and a lower frame member 6490. The upper frame member 6410 has a top bonding surface 6411 for hermetic bonding to the top surface 6431 of upper windowpane 6430, an upper inside radius 6415, a lower outside radius 6417 and a bottom bonding surface 6413. The lower frame member 6490 includes a top surface 6491 for hermetic bonding to the lower bonding surface 6413 of the upper frame member 6410, and for hermetic bonding to the bottom surface 6473 of the lower windowpane 6470.

Figure 65A:
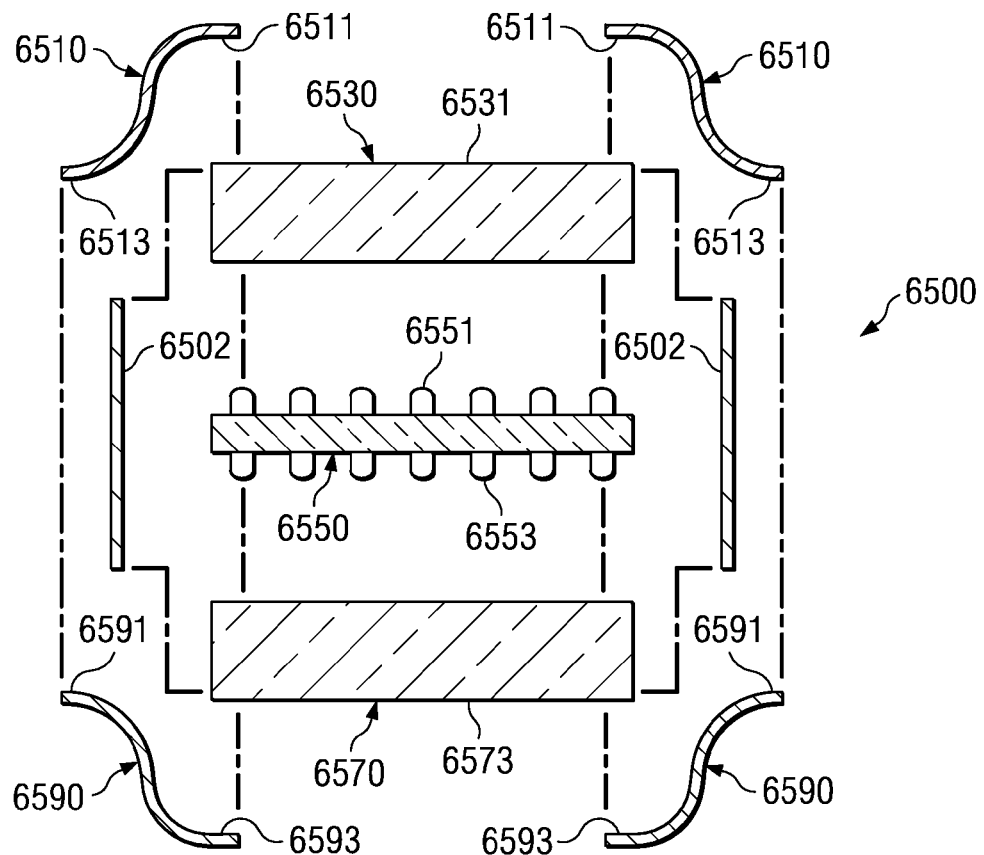
FIG. 65a is an exploded view of the components of a VGU with upper and lower frame members of similar shape and size in accordance with another embodiment.
Figure 65B:
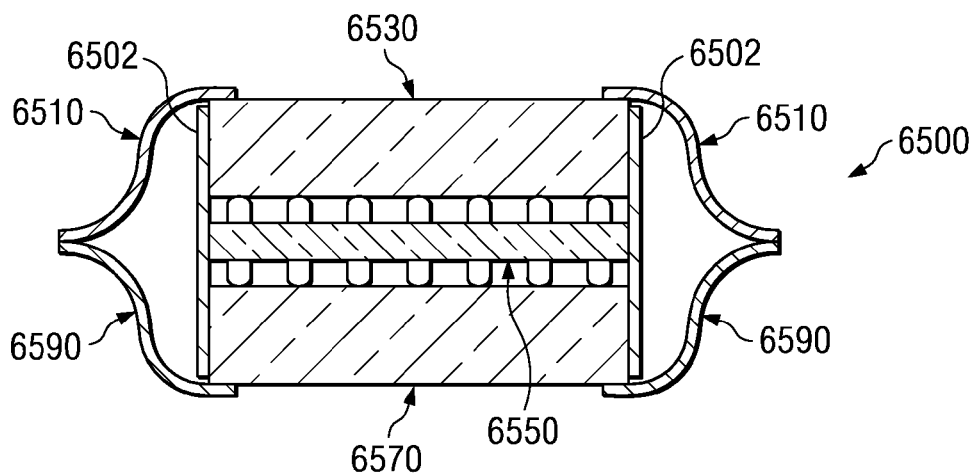

FIGS. 65a and 65b show, respectively, an exploded view and an assembled view of a VGU in accordance with a still further embodiment. The VGU 6500 is generally similar to the VGU 6400 previously described herein, however, it comprises upper and lower frame members that have a similar shape and size. The VGU 6500 comprises an upper windowpane 6530 and a lower windowpane 6570. A spacer unit 6550 includes stand-offs 6551 on the upper surface and stand-offs 6553 on the bottom surface. The spacer unit 6550 is placed between the windowpanes 6530 and 6570 to maintain the separation between them. Optional side shield members 6502 may be used along the sides of the windowpanes and spacer, however, these are not required. The VGU 6500 is held together by an upper frame member 6510 and a lower frame member 6590. Preferably, the upper and lower frame members 6510 and 6590 have identical shapes. This results in several advantages, including a reduction in parts count and process steps. The upper frame member 6510 has a top bonding surface 6511 for hermetic bonding to the top surface 6531 of upper windowpane 6530 and a bottom bonding surface 6513. The lower frame member 6590 includes a top surface 6591 for hermetic bonding to the lower bonding surface 6513 of the upper frame member 6510, and a bottom bonding surface 6593 for hermetic bonding to the bottom surface 6573 of the lower windowpane 6570.

Figure 66A:
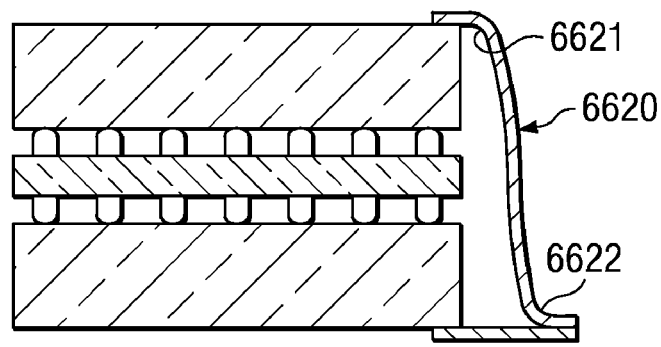
FIGS. 66a, 66b and 66c show three variations on the "gull-wing" cross-sectional profile of the frame member.
Figure 66B:
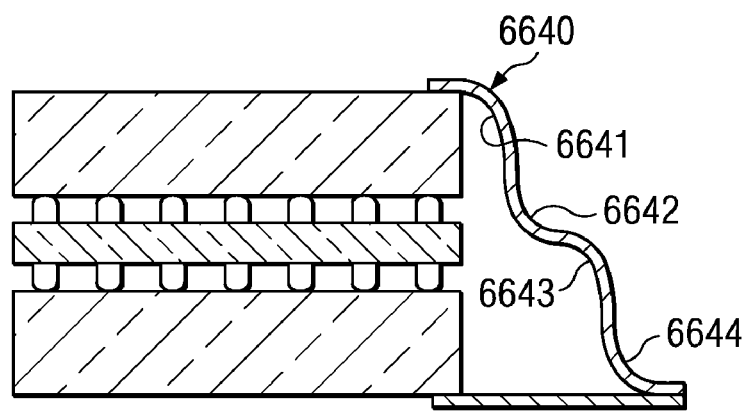
Figure 66C:
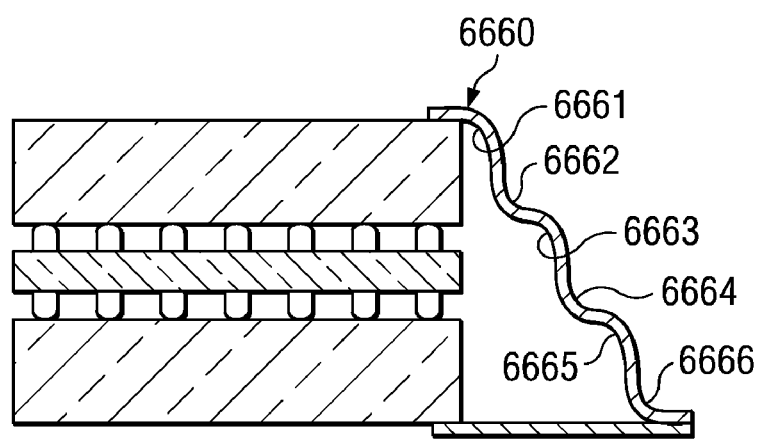

FIGS. 66a, 66b and 66c show three variations on frame member's cross-sectional form. Such frame members may be used for upper frame members as illustrated in FIGS. 58a-5a, 63a and 64a, or as both upper and lower frame members when symmetrical frame members are used as illustrated in FIG. 65a. FIG. 66a shows a frame member 6620 with two radii (denoted 6621 and 6622), as has been previously illustrated. Having more than two radii in the vertical component of the frame member may enable the frame member to be more compliant. FIG. 66b shows a frame member 6640 with four radii (denoted 6641, 6642, 6643 and 6644), and FIG. 66c shows a frame member 6660 with six radii (denoted 6661, 6662, 6663, 6664, 6665 and 6666).

Figure 67A:
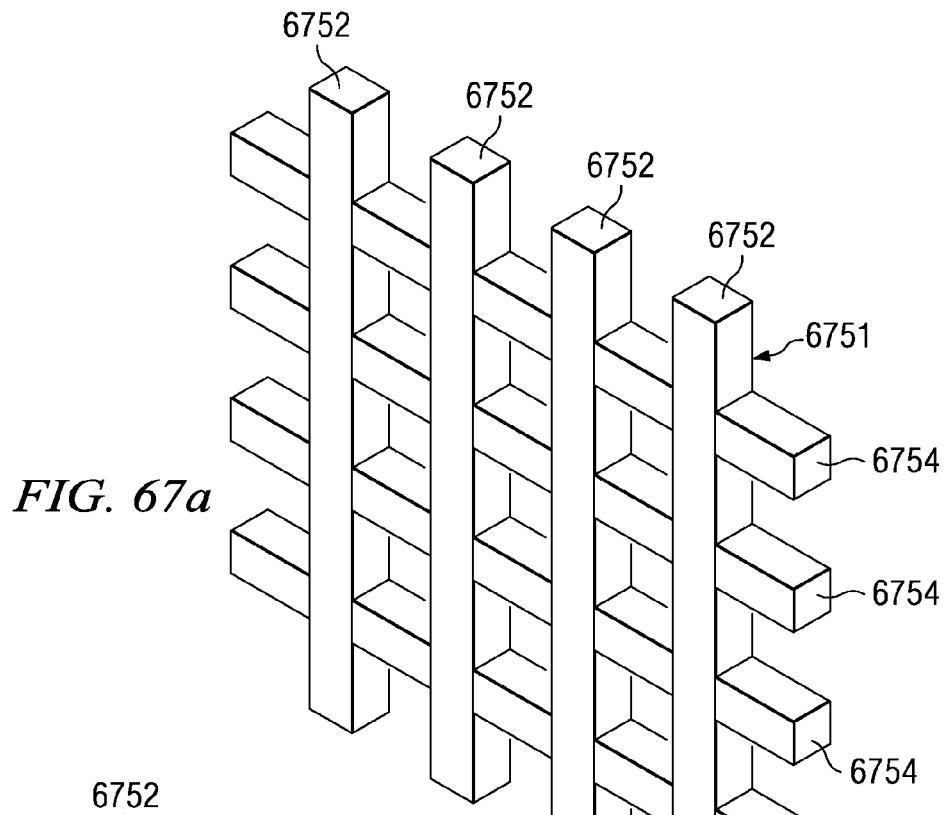
FIG. 67a is a perspective view of an assembly of horizontal and vertical muntin bars in accordance with another embodiment.
Figure 67B:
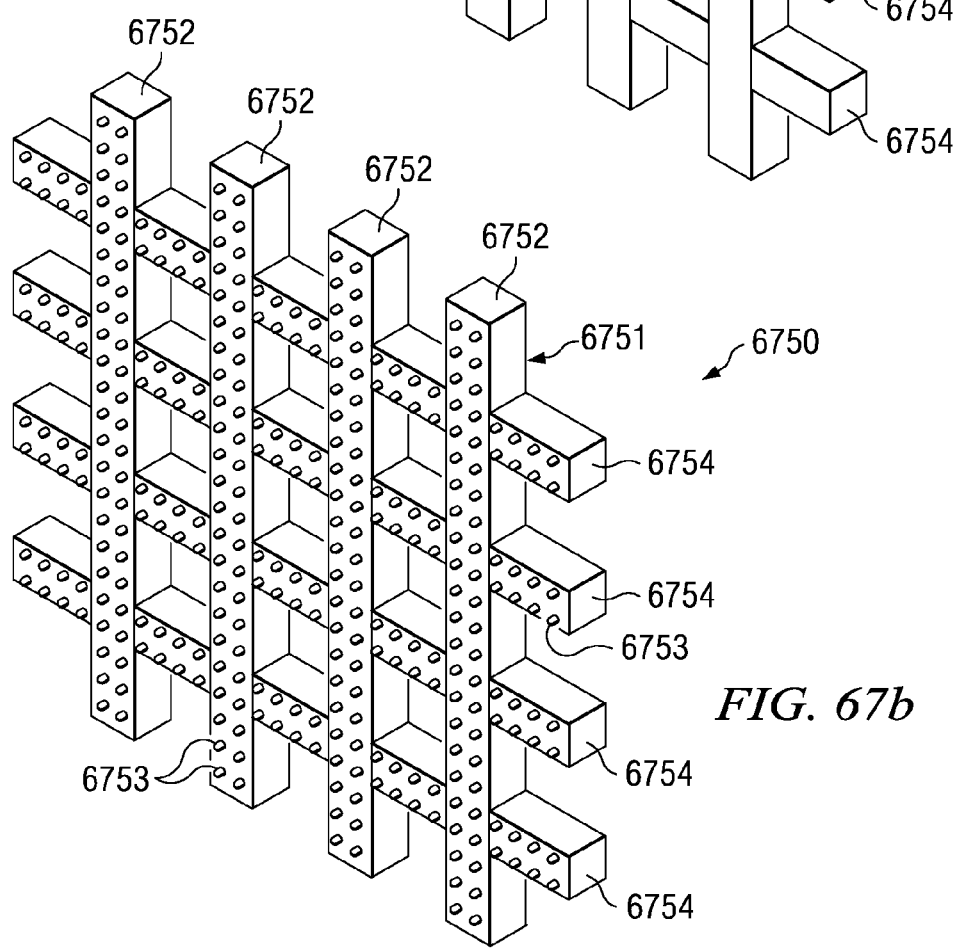
FIG. 67b is a perspective view of an assembly of horizontal and vertical muntin bars with standoffs in accordance with another embodiment.
Figure 67C:
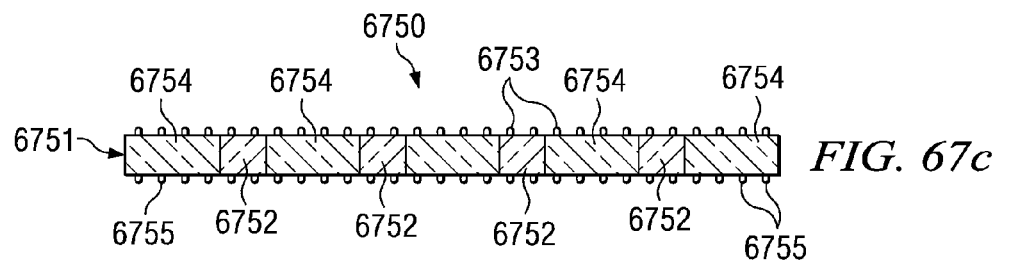
FIG. 67c is a side view of the muntin bar assembly of FIG. 67b.
Figure 67D:
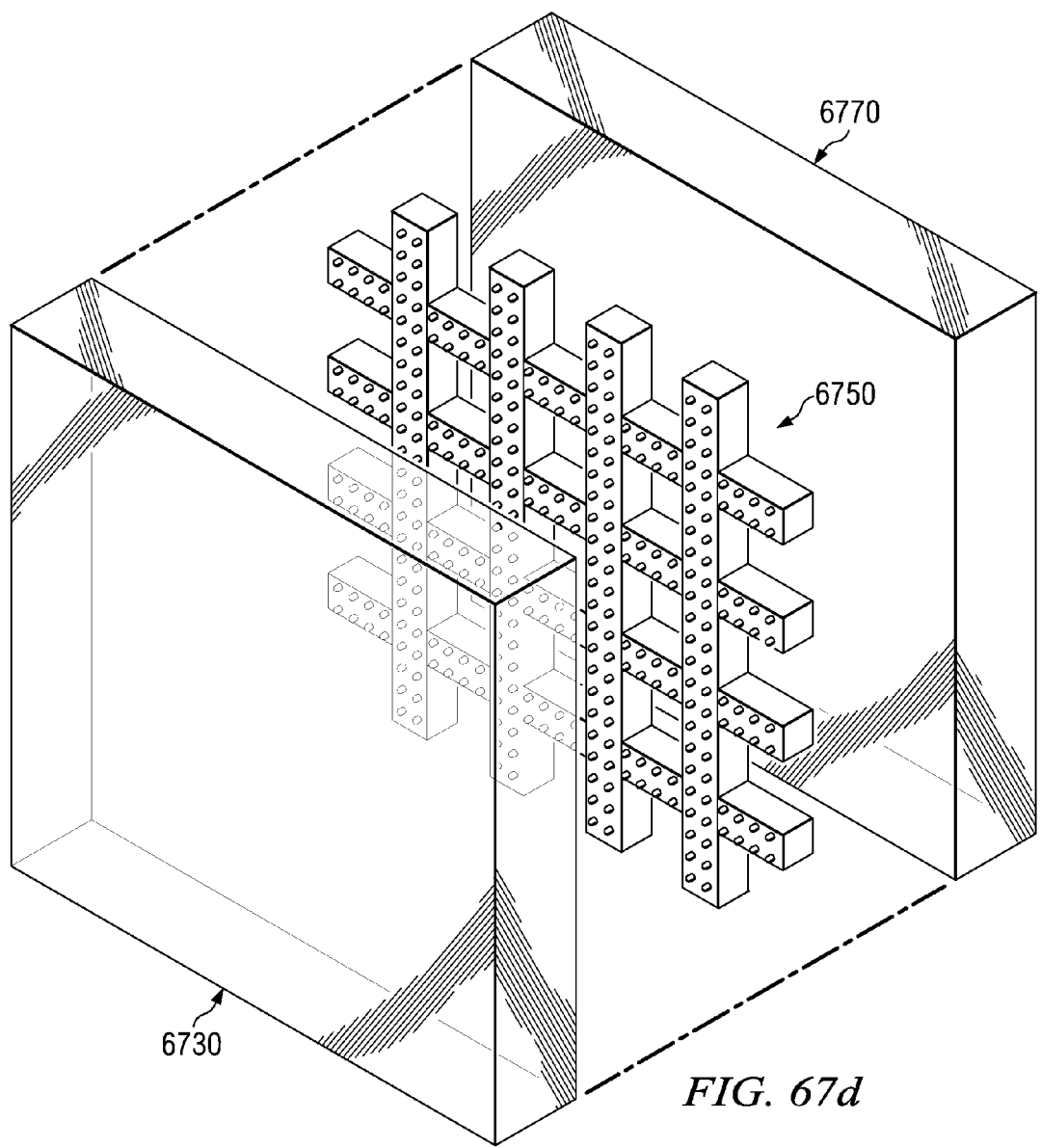
FIG. 67d is an exploded view of the muntin bar assembly of FIG. 67b positioned between the upper windowpane and the lower windowpane to form a sub-assembly.
Figure 67E:
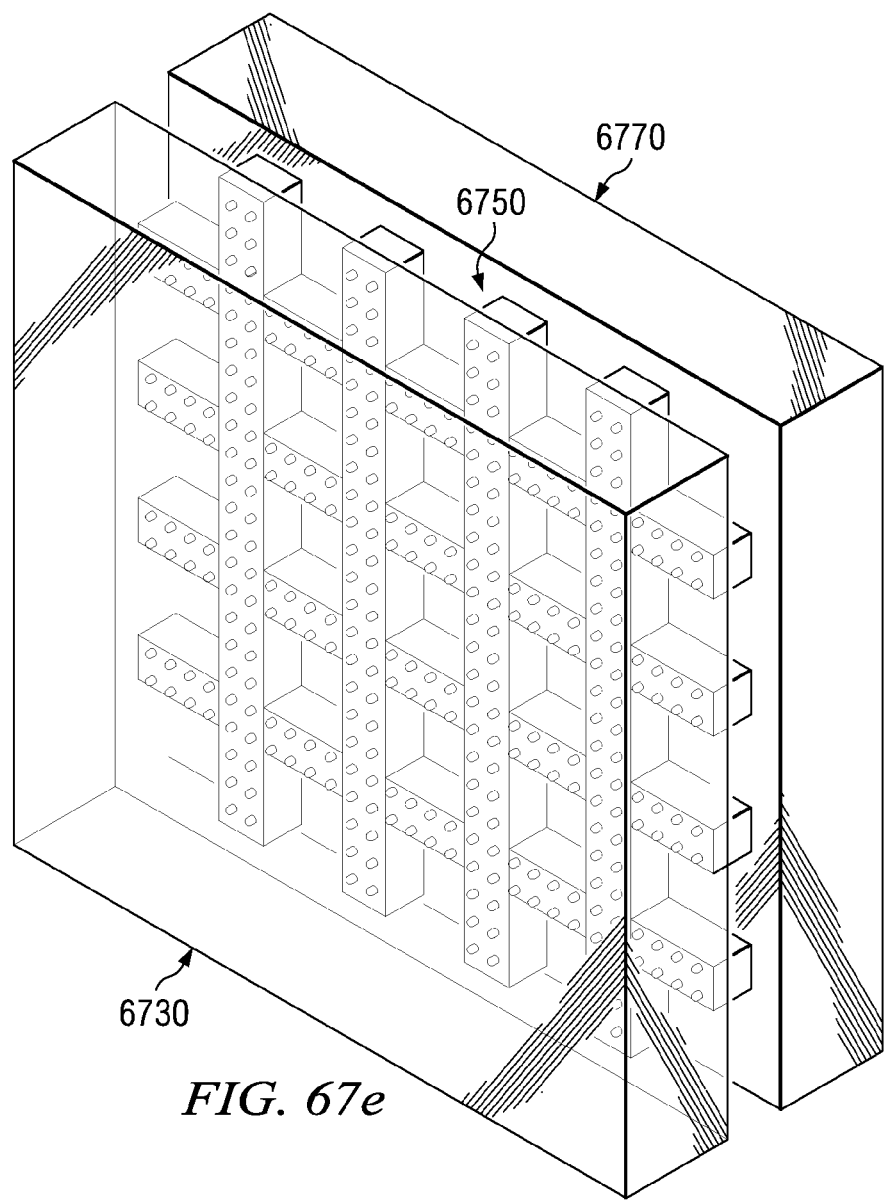
FIG. 67e is an assembled perspective view of the sub-assembly of FIG. 67d.
Figure 67F:
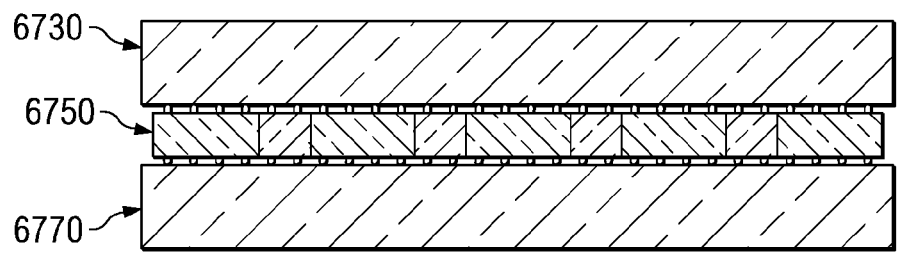
FIG. 67f is an assembled side view of the sub-assembly of FIG. 67d.

FIGS. 67a through 67f illustrate a muntin assembly suitable for use as the spacer assembly to maintain windowpane separation in a VGU, as well as for cosmetic appearances. Referring first to FIG. 67a, there is illustrated a muntin grid unit 6751 comprising a first plurality of parallel muntin bars 6752 disposed perpendicularly to a second plurality of parallel muntin bars 6754. FIG. 67b illustrates a muntin assembly 6750 comprising the muntin grid unit 6751 and a plurality of spacers/stand-offs 6753 and 6755 (see FIG. 67c) disposed on at least one side surface of the muntin grid unit. FIG. 67c illustrates a side view of the muntin assembly 6750 having stand-offs 6753 and 6755 on both sides. FIG. 67d is an exploded view, in perspective, of the muntin bar assembly 6750 disposed between an upper VGU windowpane 6730 and a lower VGU windowpane 6770. FIG. 67e is a perspective view of the muntin bar assembly 6750 disposed between, and in contact with the upper windowpane 6730 and the lower windowpane 6770. FIG. 67f is a side view of the muntin bar assembly 6750 disposed between the upper windowpane 6730 and the lower windowpane 6770.

Figure 67G:
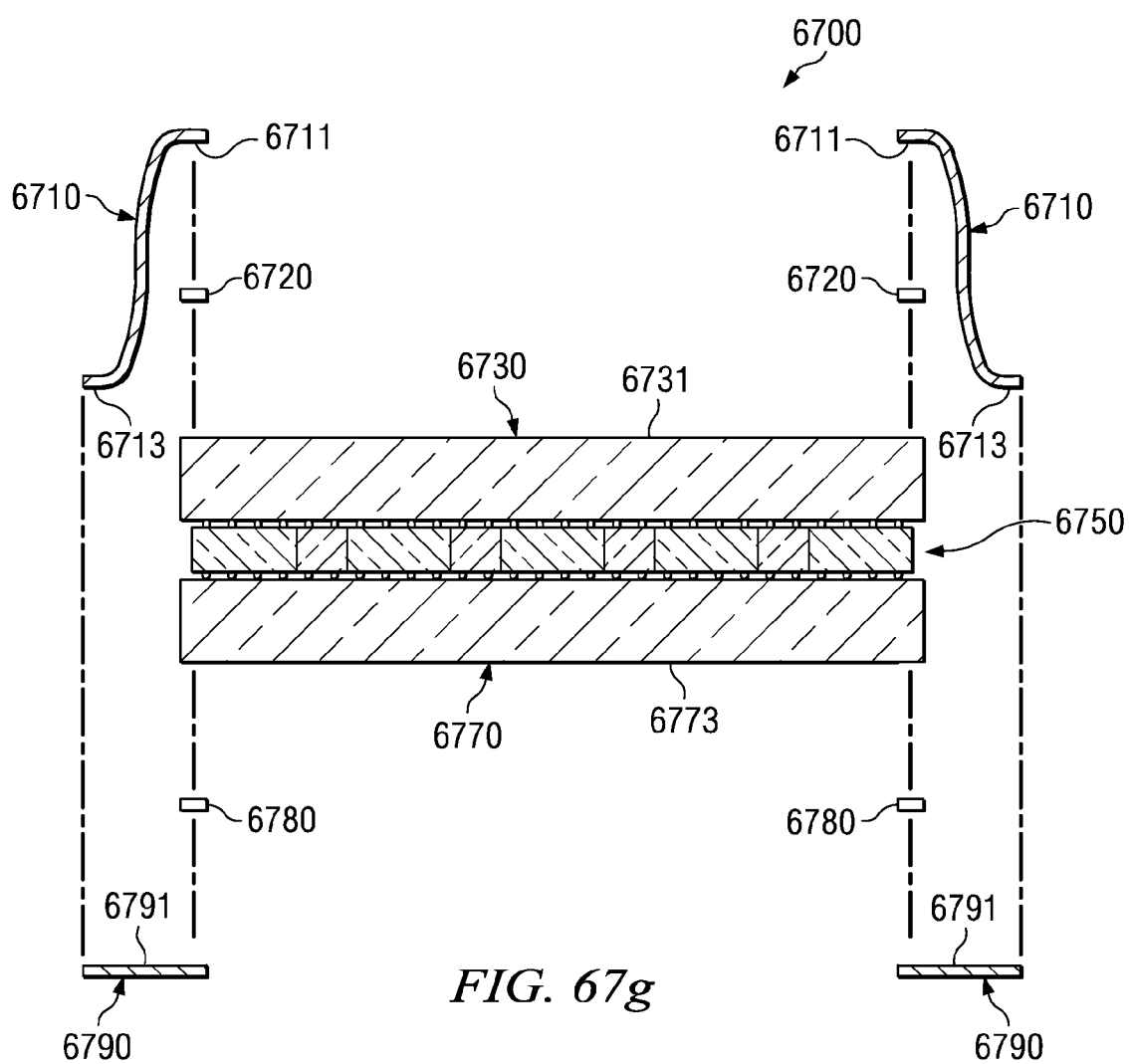
FIG. 67g is an exploded view showing components of a VGU utilizing the muntin and window pane sub-assembly of FIG. 67f.
Figure 67H:
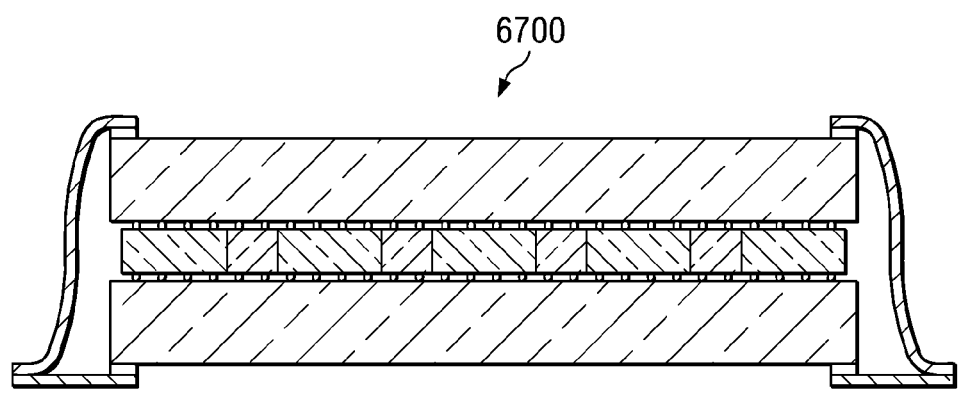
FIG. 67h is an assembled view showing the VGU of FIG. 67g.

FIGS. 67g and 67h show, respectively, an exploded view and an assembled view of a VGU in accordance with yet another embodiment. The VGU 6700 comprises the upper windowpane 6730 having a top surface 6731 and the lower windowpane 6770 having a bottom surface 6773. The muntin assembly 6750 having stand-offs on the upper and lower surface is disposed between the windowpanes 6730 and 6770 to maintain the separation between them. The VGU 6700 is held together by an upper frame member 6710 and a lower frame member 6790. The upper frame member 6710 has a top bonding surface 6711 for hermetic bonding to the top surface 6731 of upper windowpane 6730 and a bottom bonding surface 6713. The lower frame member 6790 includes a top surface 6791 for hermetic bonding to the lower bonding surface 6713 of the upper frame member 6710, and for hermetic bonding to the bottom surface 6773 of the lower windowpane 6770. Optionally, interlayers, 6720 and 6780 may be used to facilitate bonding of the upper and lower frame member to the respective windowpanes.

Figure 68A:
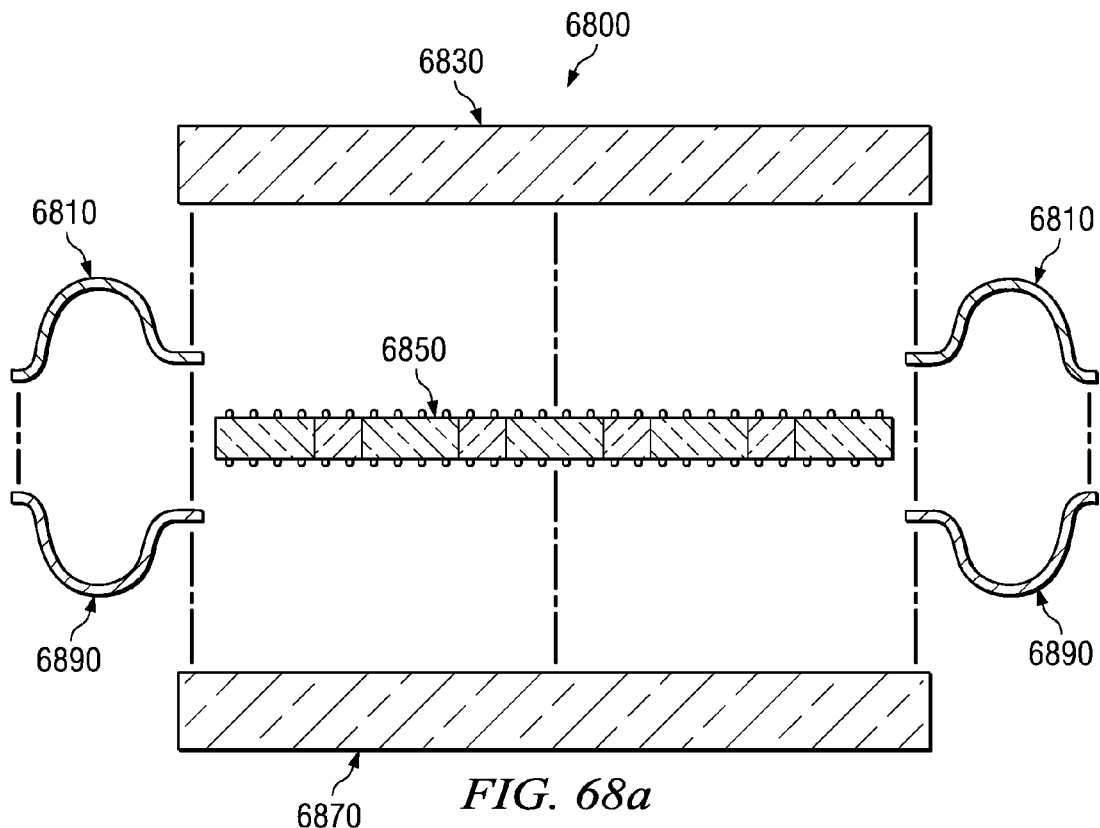
FIG. 68a is an exploded view of a VGU with frame members bonded to the inner (inside) surfaces of the windowpanes in accordance with another embodiment.
Figure 68B:
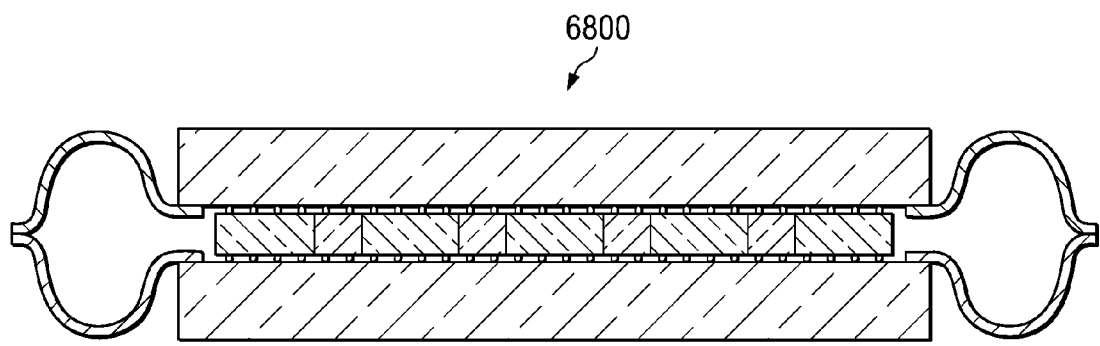

FIGS. 68a and 68b show a VGU 6800 with an internal muntin assembly 6850 and with frame members 6810 and 6890 bonded to the inner (inside) surfaces of the upper and lower windowpanes 6830 and 6870, respectively. Mounting frame members 6810 and 6890 to the inner (inside) surfaces of the upper and lower windowpanes 6830 and 6870 may be done when there is sufficient space between the two windowpanes to accommodate the thickness of the two frame members. The muntin assembly 6850 illustrated in this embodiment provides the necessary space. FIG. 68a is an exploded view of the VGU with the upper and lower frame members 6810 and 6890 bonded to the inner (inside) surfaces of the windowpanes 6830 and 6870. FIG. 68b is the assembled VGU with its frame members bonded to the inner (inside) surfaces of the windowpanes.

Figure 69A:
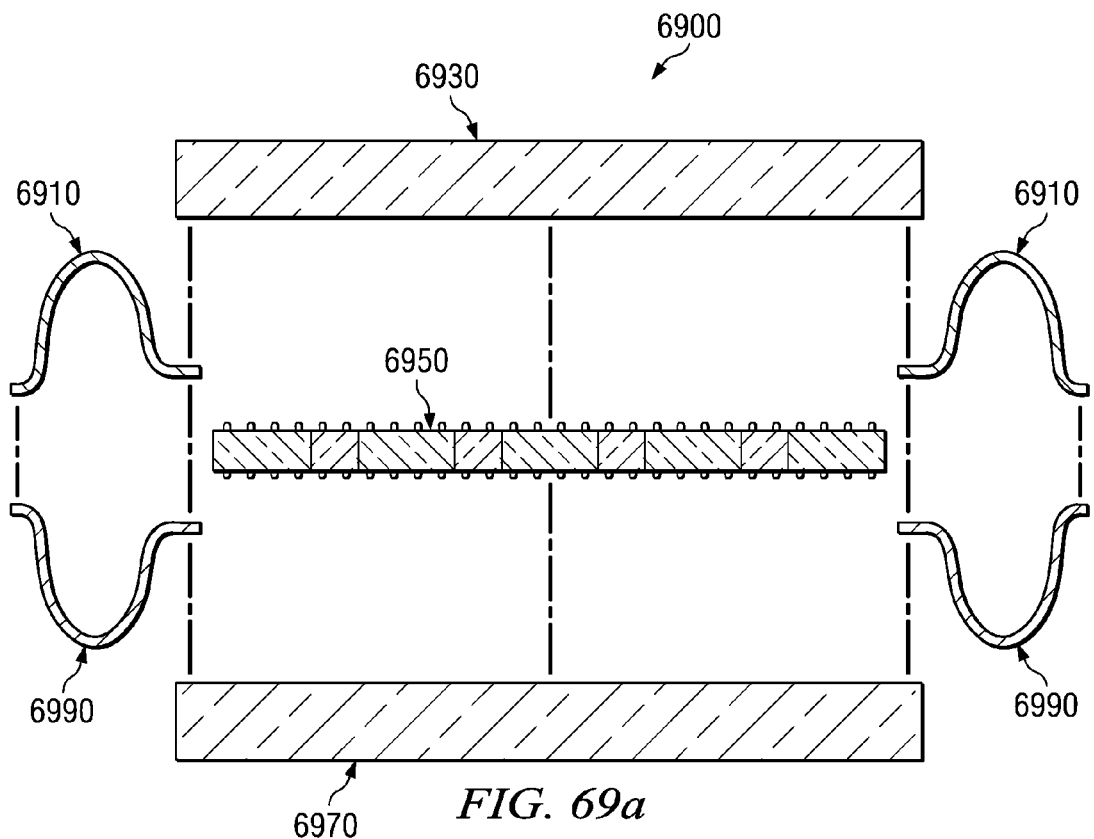
FIG. 69a is an exploded view of a VGU with an internal muntin assembly and with inside-the windowpane bonded frame members that extend past the outer surfaces of the upper and lower windowpanes in accordance with another embodiment.
Figure 69B:
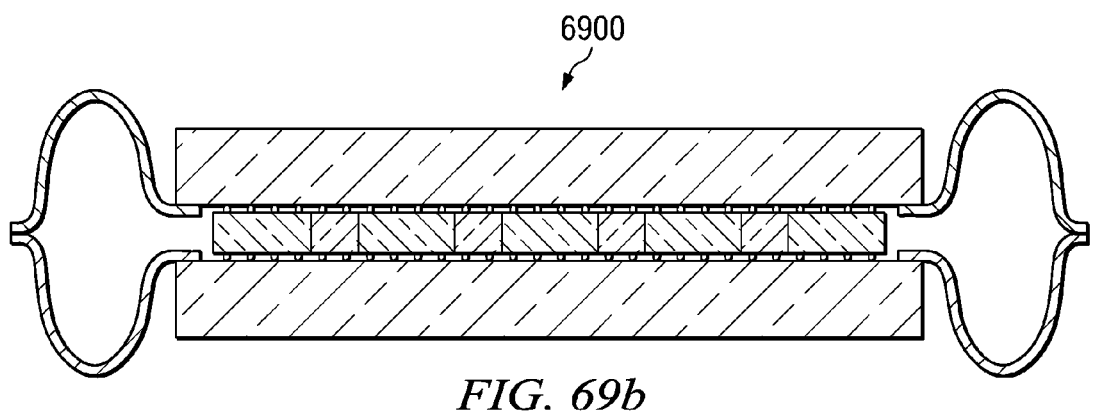

FIGS. 69a and 69b show a VGU 6900 with an internal muntin assembly 6950 and with inside-the windowpane bonded frame members 6910 and 6990 that extend past (i.e., above and below) the outer surfaces of the upper and lower windowpanes 6930 and 6970. This is in contrast to FIGS. 68a and 68b, in which the inside-the windowpane bonded frame members 6810 and 6890 do not extend above or below the outer surfaces of the respective upper and lower windowpanes 6830 and 6870.

FIGS. 70a and 70b show a VGU 7000 with inside-the-windowpane bonded frame members 7010 and 7090, similar to those of FIGS. 68a and 68b. The VGU 7000 includes optional upper and lower interlayers 7020 and 7040 disposed between the respective upper and lower frame members 7010 and 7090 and the respective upper and lower windowpanes 7030 and 7070 to facilitate and/or enhance bonding. FIG. 70a is an exploded view of VGU 7000 with inside-the-windowpane bonded frame members and optional interlayers between the frame members and the windowpanes. FIG. 70b is the assembled view of the VGU. It will be appreciated that the interlayers 7020 and 7040 may or may not actually be visible after bonding, depending upon whether the interlayer material has been completely incorporated into the bond.

Figure 71A:
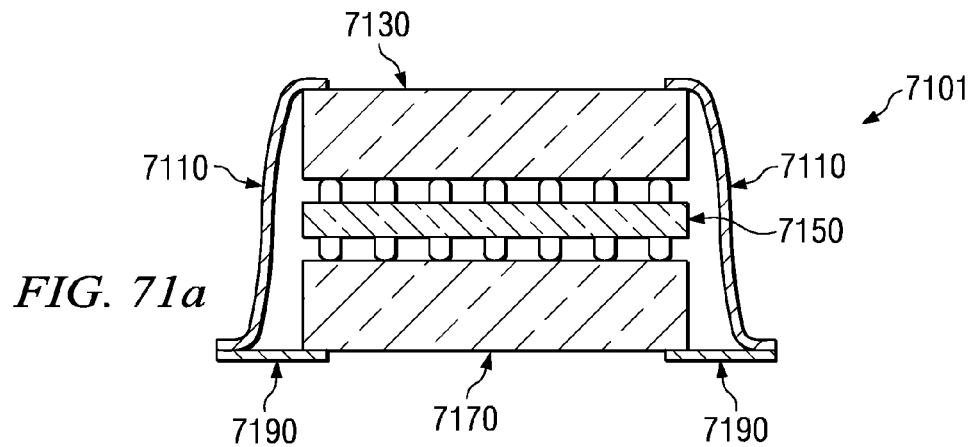
Figure 71B:
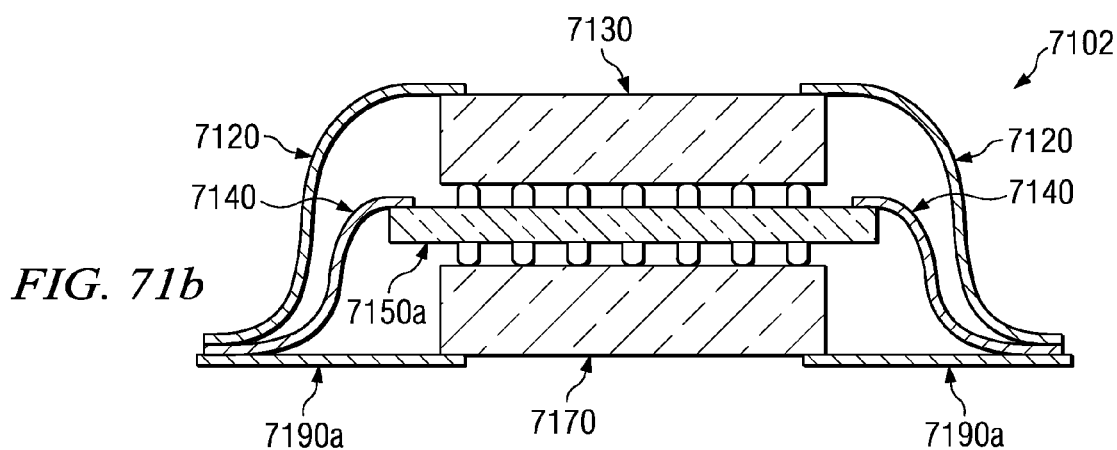
Figure 71C:
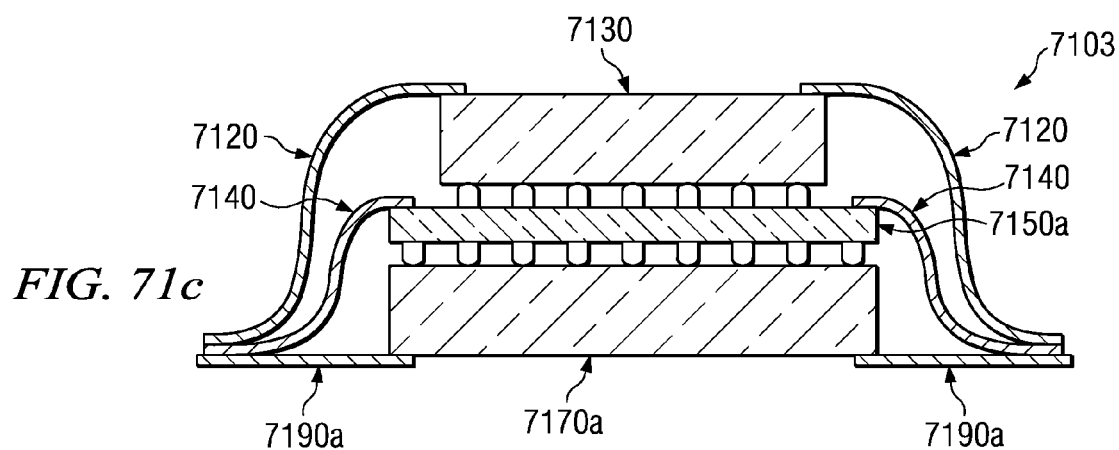

FIGS. 71a, 71b and 71c illustrate examples of VGUs using an additional, intermediate frame members bonded to the center spacer assembly. In some cases, using these additional frame members provides added benefits to the VGU. Specifically, FIG. 71a illustrates a VGU 7101 comprising upper and lower windowpanes 7130 and 7170, a center spacer unit 7150, and upper and lower frame members 7110 and 7190, similar to that of FIGS. 63a and 63b.

FIG. 71b illustrates a VGU 7102, similar to VGU 7101, except the spacer unit (now denoted 7150a) extends past the sides of the upper windowpane 7130 and lower windowpane 7170, and the lower frame member (now denoted 7190a) has also been extended. This configuration provides the exposed surface area on both the top and bottom of spacer unit 7150a to attach center frame member 7140 onto either surface, and provides additional space on the lower frame member 7190a to allow bonding of both an extended upper frame member 7120 and the center frame member. In the illustrated embodiment, the center frame member 7140 is shown attached to the top surface of the spacer unit 7150a, but it may be attached to the bottom surface in other embodiments.

FIG. 71c illustrates a VGU 7103, similar to VGU 7102, except that both the spacer unit 7150a and the lower windowpane (now denoted 7170a) extend past the sides of the upper window unit 7130. Again, intermediate frame member 7140 is attached to the top surface of the spacer unit 7150a.

Figure 72A:
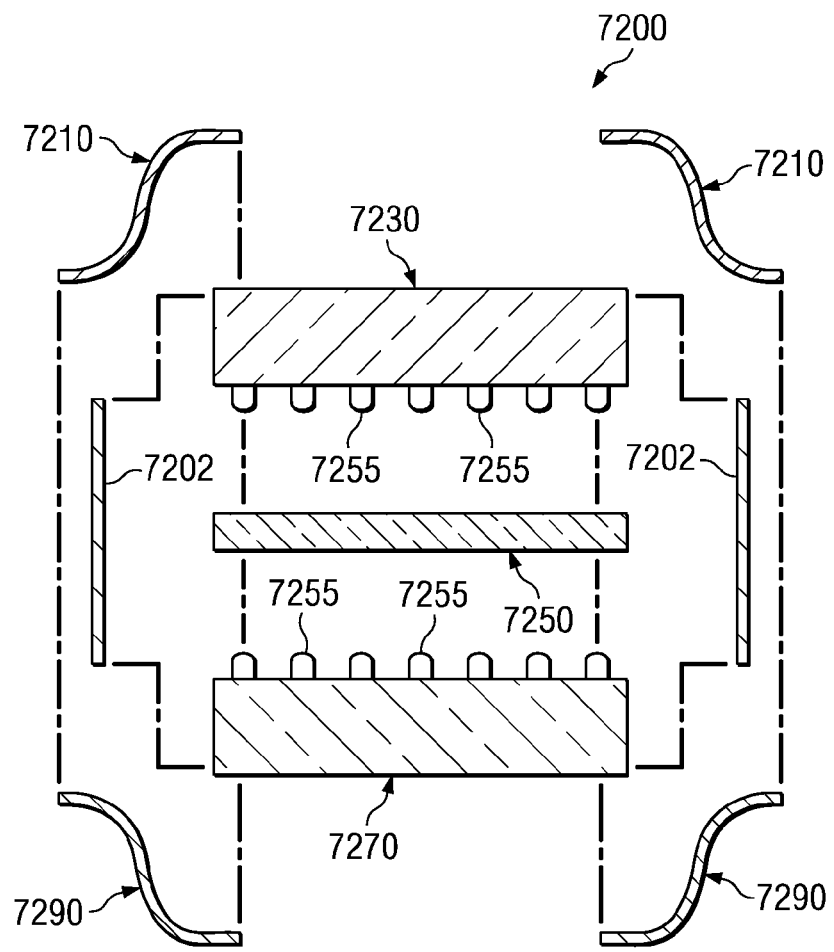
Figure 72B:
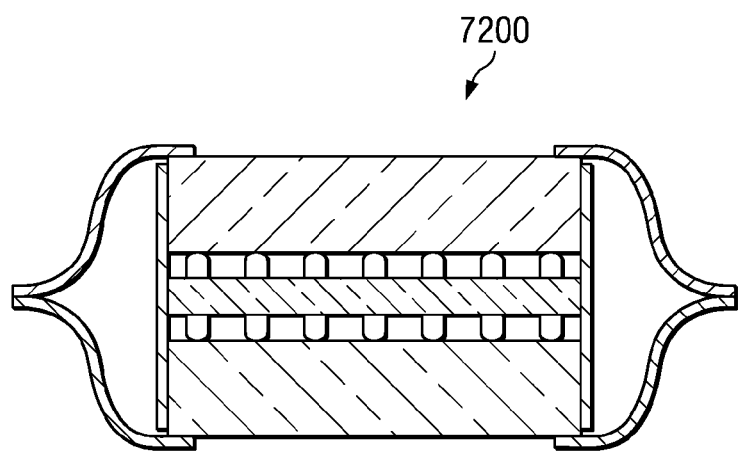

FIGS. 72a and 72b show, respectively, an exploded view and an assembled view of a VGU in accordance with yet another embodiment. The VGU 7200 is similar to that described in connection with FIGS. 65a and 65b, except in this embodiment a flat spacer sheet 7250 of transparent material is positioned between the windowpane sheets 7230 and 7270, and the stand-offs 7255 are built-on to the inner surfaces of the windowpane sheets. The stand-offs 7255 may be formed as an integral part of the windowpanes 7230 and 7270 (e.g., molded on or embossed during manufacturing) or they may be applied to the windowpane separately (e.g., by adhesive) after manufacture of the windowpane. The latter option, i.e., post-manufacture attachment of the stand-offs, allows the inner surfaces of the windowpanes 7230 and 7270 to be coated (e.g., with low-emissivity or other coatings) while still flat, with the stand-offs 7255 being applied after coating. The spacer sheet 7250 may be made of glass, plastic sheets or films, or other transparent materials. The spacer sheet 7250 may be made of a material which inherently has special emissivity, insulating, or other physical properties (e.g., breakage resistance), or it may be coated with other materials to provide the desired properties. The upper and lower frame members 7210 and 7290 are diffusion bonded to the windowpanes 7230 and 7270 as previously described. Optional seal/getter members 7202 may be provided within the package as previously described.

It will be appreciated that alternative windowpane shapes may be used. The pairs of windowpanes do not need to be flat. They may be concave or convex in shape. Each of the windowpanes may have a different shape, as long as each windowpane mates intimately with the frame member, e.g., during the bonding process, the surface of glass is in intimate contact with the surface of the frame member to which it is bonded.

It will also be appreciated that alternative windowpane materials may be used. The windowpane material need not be glass. It could be a different transparent or non-transparent material, including, but not limited to quartz, sapphire, silicon and even metals, metal alloys, and ceramics.

As an alternative to conventional diffusion bonding chambers with internal rams, another apparatus that is suitable for diffusion bonding the windowpanes to the strength-reinforcing layers to form laminated strength-reinforced window assemblies is known as a Hot Isostatic Press ("HIP"). A HIP unit provides the simultaneous application of heat and high pressure. In the HIP unit, the work pieces (e.g., the window assembly components) are typically sealed inside a vacuum-tight bag, which is then evacuated. The bag with work pieces inside is then sealed within a pressure containment vessel or apparatus, which in turn is a part of, or is contained within, a high temperature furnace. A gas, typically argon, is introduced into the vessel around the bagged parts and the furnace turned on. As the furnace heats the pressure vessel, the temperature and pressure of the gas inside simultaneously increase. The gas pressure supplies great force pressing the bagged parts together, and the gas temperature supplies the heat necessary to allow bonding to occur. A HIP unit allows the temperature, pressure and process time to all be controlled to achieve the optimum material properties.

In some embodiments, the CTE's of the materials to be bonded together may be matched. The Coefficient of Linear Thermal Expansion (CTE) of the frame material(s) must be properly matched to the glass windowpanes to which the frame is bonded. The CTE of most glasses is fairly constant from approximately 273° K (0° Centigrade) up to the glass' softening temperature. However, some metals and alloys have different CTEs at different temperatures.

The average CTE of the frame material(s) from the elevated glass-to-frame bonding temperature should be closely matched to that of the glass' average CTE over the same temperature range. The closer the average CTEs of the two materials, the lower will be the residual stresses in the frame and the glass windowpanes after the assembly cools from the elevated bonding temperature back to ambient (room temperature).

Also critical for long-term reliability of the frame-to glass seal in some embodiments is the close matching of the CTEs of the frame material(s) to the glass for the anticipated end-use environment. For example, if the window assembly is expected to be exposed to temperatures from minus 40° C. to plus 100° C. (minus 40° F. to plus 212° F.) then the frame material(s) and the glass material should have closely matched CTEs over this temperature range.

In many embodiments, it is desirable that if CTE of the frame's material(s) cannot be exactly matched to the CTE of the glass material, then the CTE of the frame's material(s) should be slightly greater than that of the glass. In this situation where the CTE of the frame material(s) exceeds that of the glass, the frame would contract more than the glass during cool-down from the elevated bonding temperature back to ambient, resulting in the glass being in slight compression. This is preferable to the glass being in tension, since glass in tension is prone to cracking.

There are other methods than diffusion bonding that could be employed to attach hermetically the frame member to the windowpane of the VGU. These include: using solder glass, employed primarily between the frame member and the windowpane where the two are to be joined, and then localized or global heating the two parts to form a solder joint; and localized or global heating the two parts to from a fusion joint. Although these and other methods may be used to attach frame members to a windowpane in construction of the described and illustrated VGUs, the preferred method of attachment is diffusion bonding and/or transient liquid phase diffusion bonding.

The current invention uses an established, commercially available, technology called diffusion bonding for a proprietary, patent pending application to hermetically join glass windowpanes directly to their compliant (spring-like) metal or metal alloy sleeve/frame component. No glues, adhesives or epoxy materials will be used between the glass and frame component. The attachment will be permanent and more hermetic (gas-tight) than any other attachment method.

Figure 73A:
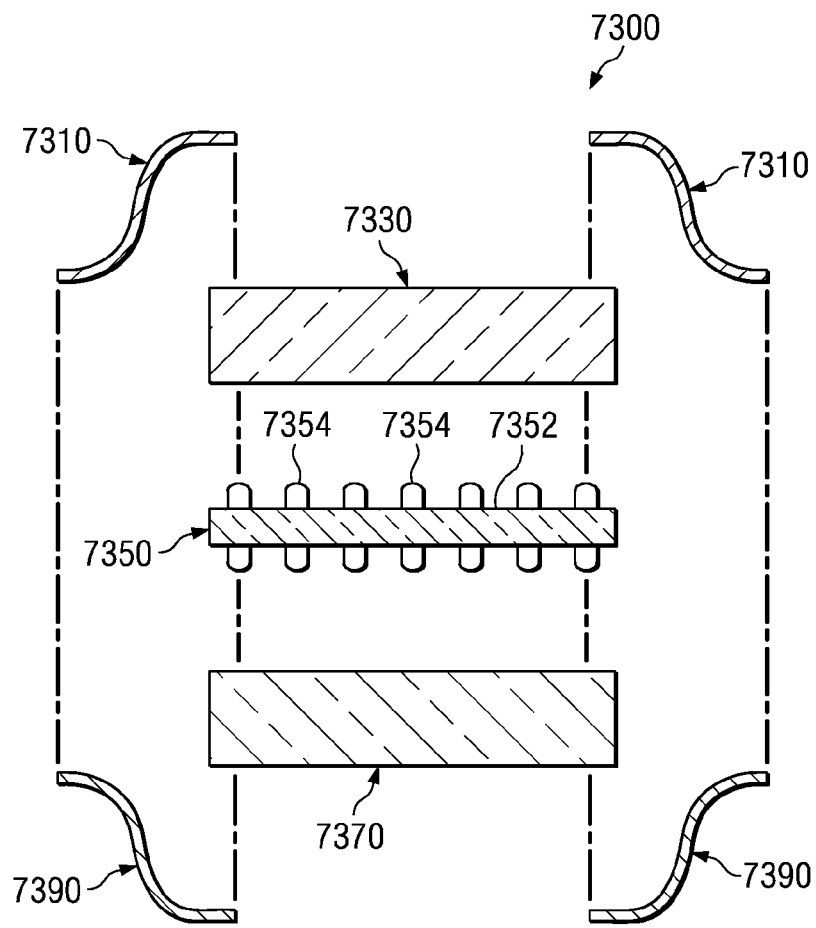
Figure 73B:
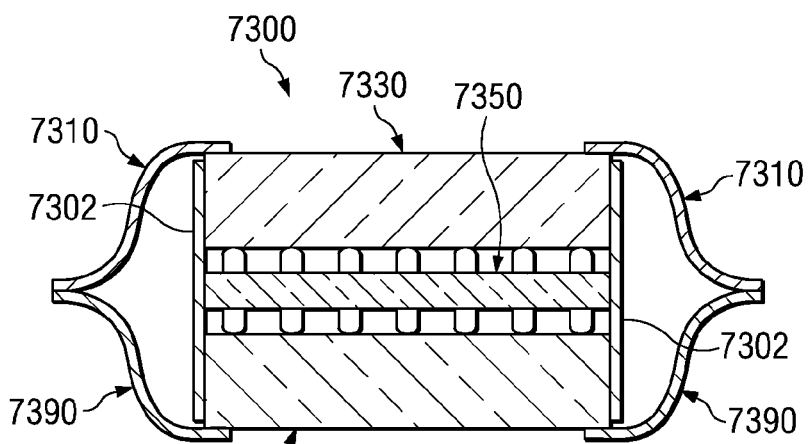

Referring now to FIGS. 73a and b, the components of one embodiment of a vacuum-containment IG unit are illustrated, FIG. 73a being an exploded view and FIG. 73b being an assembled view. The IGU 7300 comprises an upper windowpane (i.e., lite) 7330 and a lower windowpane 7370 separated by a transparent spacer unit 7350 disposed therebetween. The edges of the windowpanes 7330 and 7370 are hermetically sealed together using metal or metal alloy frame components 7310 and 7390 as further described below. The cavity between the windowpanes 7330 and 7370 contains a vacuum or partially evacuated atmosphere.

Figure 73C:
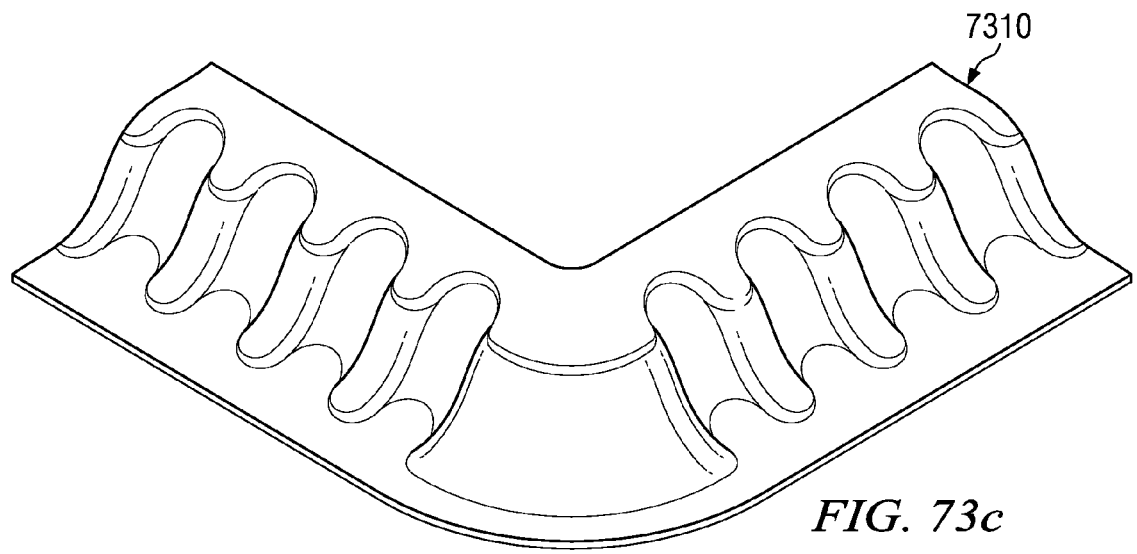

Referring now to FIG. 73c, one embodiment of the compliant metal frame/sleeve member 7310 and 7390 is shown. It is designed to be flexible in all three axes, allowing the glass lites 7330 and 7390 to expand and contract independently of each other without them or the sleeve-to lite bond region experiencing any significant stresses. Thus it acts similar to an accordion bellows, expanding and contracting as it is pulled and pushed. This sleeve unit can be made to extend very little from the sides of the upper and lower windowpanes.

Item 7302 is shown as an optional feature of the IGU 7300. It is a gettering material, such as is made by SAES Getters. Getters are used in high reliability hermetic packaging to absorb atoms and molecules that are outgased from materials, or to absorb any gas that might leak into the package over an extremely long period of time.

The spacer unit 7350 is preferably formed of transparent glass, but may also be formed of transparent polymer materials such as plastics or resins. In certain embodiments described herein, other transparent materials may be used. The spacer unit 7350 comprises a sheet-like substrate portion 7352 having integrally-formed stand-offs (also known as "pillars") 7354 projecting from one and/or both sides of the substrate portion. The structure may be similar to a plastic chair mat found in offices on the carpet under roller chairs, except that it may have stand-offs on both its top and bottom surfaces. The stand-offs 7354 are disposed generally evenly across the surface of the substrate portion 7352 so as to provide generally even support to the adjacent windowpane. When viewed from above, the stand-offs 7354 will preferably be disposed in an orderly array (see FIGS. 77-79), however, this is not required as long as they provide adequate support to prevent the windowpane from cracking.

For purposes of this application, the term "integrally formed" is used to mean that the stand-offs 7354 are formed by manipulating the body of the substrate portion 7352 itself, e.g., by casting, embossing, stamping, etching, etc., rather than by first forming the stand-offs separately from the substrate portion and then attaching them onto the substrate portion later. While the stand-offs 7354 and substrate portion 7352 will generally be composed of the same material when formed, the stand-offs and/or the substrate portion may be further processed, e.g., by heat treatment, chemical treatment, polishing, etc., to modify their characteristics after formation.

Figure 74:
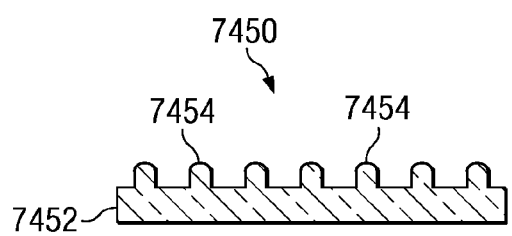

Referring now to FIG. 74, a spacer unit 7450 in accordance with one embodiment is shown. The spacer unit 7450 comprises a transparent sheet-like substrate portion 7452 having integrally-formed stand-offs 7454 projecting from one side. In this embodiment, the unit 7450 is formed of transparent glass, however, other materials may be used in other embodiments.

Figure 75:
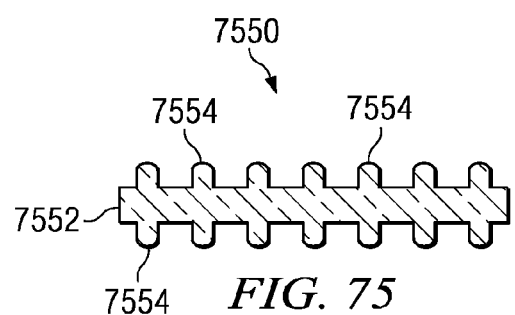

Referring now to FIG. 75, a spacer unit 7550 in accordance with another embodiment is shown. The spacer unit 7550 comprises a transparent sheet-like substrate portion 7552 having integrally-formed stand-offs 7554 projecting from both sides of the substrate portion. The unit 7550 is this embodiment is also formed of transparent glass, however, other materials may be used in other embodiments.

Figure 76:
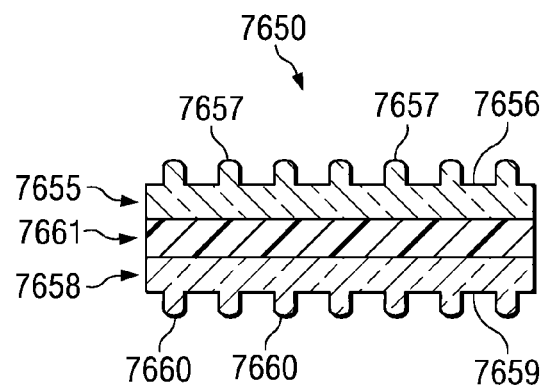

Referring now to FIG. 76, a spacer unit 7650 in accordance with yet another embodiment is shown. In this embodiment, the spacer unit 7650 has a substrate portion formed of multiple discrete layers. A top layer 7655 includes an upper substrate portion 7656 with integral upper stand-offs 7657, similar to that previously described in FIG. 74. A bottom layer 7658 includes a lower substrate portion 7659 with integral lower stand-offs 7660, also similar to that previously described, although it is not necessary that the top layer 7655 and bottom layer 7658 be formed of the same material. Disposed in a "sandwiched" configuration between the upper and lower substrate portions 7656 and 7659 is a layer of discrete material 7661. In this embodiment, the top and bottom layers 7655 and 7658 are formed of transparent glass, while the middle layer 7661 is formed of a transparent plastic material such as Lexan. The discrete material layer 7661 may have different thermal conductivity, sound transmission, breakage resistance or other properties than the adjacent layer(s). The discrete material may be a glass, plastic, polymer, resin, adhesive or other material. Its form may be that of a free-standing sheet or film, or it may be a material that is sprayed on or otherwise applied to the free surface (i.e., the one without stand-offs) of one of the substrate portions. It will be appreciated that, while the embodiment shown includes three layers, other embodiments could include only two layers, e.g., only the top layer 7655 and the discrete layer 7661, or only the bottom layer 7658 and the discrete layer 7661, or only the top layer 7655 and the bottom layer 7658. Similarly, multiple discrete internal layers (i.e., without stand-offs) could be used to provide the spacer-unit 7650 with four or more total layers.

In some embodiments, performance-enhancing coatings may be "embedded" within the multi-layer laminated spacer 7650. For example, coatings may be applied to the inner surfaces of the upper substrate portion 7656 and/or lower substrate portion 7659, or to the surfaces of center layer 7661. These coatings may include low-emissivity coatings, U-V absorbing or reflecting coatings, color tints, electrochromatic coatings, electrochromeric coatings, anti-reflective coatings and/or other performance-enhancing coatings. After the coatings are applied to the desired surface, the layers of the spacer 7650 are laminated together. In this manner, the coatings, which are often very thin films, are protected from physical damage caused by relative movement between the windowpanes and the spacer. If the same coating was applied to the inside surface of the windowpane, it could be damaged by contact and/or movement of the stand-offs on the spacer unit.

Referring again to FIGS. 74, 75 and 76, performance-enhancing coatings may be applied to either side of the spacer units, e.g., spacer-units 7450, 7550, and 7650, instead of to the inner surfaces (i.e., surfaces #2 and #3) of the window panes themselves. These coatings on the spacer unit may include low-emissivity coatings, U-V absorbing or reflecting coatings, color tints, electro-chromatic coatings, anti-reflective coatings and/or other performance-enhancing coatings. In some cases, all coatings will be applied to a single side of the spacer unit, while in other cases selected coatings may be applied on a first side of the spacer unit, and other coatings may be applied to the other side of the spacer unit. In the case of multi-layer spacer units 7650 (e.g., FIG. 76), coatings may be placed on the free side of the substrate portions and/or on the intermediate layers.

Placing the performance-enhancing coatings on the spacer unit 7450, 7550 or 7650 may be advantageous because the spacer system (i.e., spacer unit) will often be at a different temperature than either the bulk of window #1 or window #2, and as such, will be expanding and contacting from its center less than window #1 and more than window #2. Having coatings, such as low-e, on the spacer's substrate surfaces instead of the IG unit's surfaces #2 and/or #3 will eliminate the potential of the coatings being scratched and damaged by the differential movements of the IG Unit's components. In addition, special coatings may be used to enhance the durability of surfaces #2 and #3, in order to reduce abrasion by the movements of the spacer stand-offs. Coatings such as diamond-like coatings (DLC) will be used to ensure that the glass surfaces remain scratch-free for long periods of time. DLC and other coatings are already in use to provide scratch resistance and resistance to other damage. Another advantage of the proposed spacer system is that the thicker the spacer's substrate, the greater will be the unit's thermal resistance, and thus, the overall insulating value of the resulting IG unit.

The stand-offs of the spacer unit, e.g., spacer 7450, 7550 or 7650 may have cross sections (when seen from above) that are circular, tapered, or of other shapes. Referring now to FIGS. 77 and 78, in some embodiments, the stand-offs may have a cross-section (seen from above) resembling a cross or "plus" sign ("+") to provide the physical separation between the inside surfaces of the IG unit's windowpanes (surfaces #2 and #3) and the substrate portion of the spacer unit. In the embodiment shown in FIG. 77, the spacer unit 7750 includes a substrate 7752 and a plurality of stand-offs 7754, all made of glass and integrally formed. The "+" shaped standoffs 7754 have horizontal and vertical members that are about 0.5" in length, and their wall thickness and height are within the range from about 25 microns to about 50 microns (0.001" to 0.002"). An average human hair is about 75 microns (0.003") thick. The extremely small width and height of the glass stand-offs, along with their transparency, will make them practically invisible. In the embodiment shown in FIG. 78, the spacer unit 7850 also comprises a substrate 7852 and a plurality of "+" shaped stand-offs 7854. Both are made of glass, however, in this embodiment, the substrate 7852 is formed as a flat sheet, and then the stand-offs 7854 are affixed onto the substrate later.

Referring now to FIG. 79, in an alternative embodiment, the spacer unit 7950 comprises stand-offs 7954 having a cross-section resembling the letter "C" that are arranged in an array across the surface of the substrate portion 7952. The standoffs can be of any shape and size as long as they are strong enough to support the force of the IGU's windowpanes pressing inward due to the atmospheric pressure's force on the outside of these two windowpanes.

The standoffs must also be strong enough (of adequate material composition and dimensions) so as to retain their size enough that they continue to function as required to keep the two windowpanes from coming into contact with the substrate of the spacer unit, and thus provide a direct thermal path. Also, the standoffs must be designed to have enough surface area so that the static load on the windowpanes they're supporting does not cause either windowpane to crack, break or otherwise fail.

It is desirable to minimize the overall area of contact between the spacer unit and windowpanes in order to minimize the conductive path through the spacer system and maximize the insulating value of the IG unit. However, spacers may experience extremely high loading (pressure) from windows #2 and #3 on their surface because the outside of the IG unit is at 14.7 psi (ambient or 1 atmosphere air pressure) while the inside of the unit, with its vacuum, is at near zero psi. Accordingly, the surface area for each stand-off must be selected such that their area loading on the windows #1 and #2 would not produce micro-cracks or break the windows, or compress them to a point where they would not be maintaining the separation intended.

In one embodiment, IGUs may be assembled as follows: First, the flexible (i.e., compliant) metal sleeves (also called "bellows") are hermetically bonded to windows #1 and #2 to make window sub-assemblies. Next, the spacer system (if used) is placed in between the two window sub-assemblies. Next, the sleeves are hermetically bonded together in a vacuum, so that the entire IG unit is sealed in this vacuum and will not require an evacuation tube and a post-assembly evacuation step. While diffusion bonding is preferred for the hermetic bonding, other methods such as solder glass bonding may be used in some embodiments.

Either electrical resistance seam welding or laser welding are among alternatives to hermetically seal the sleeves to each other. A prime consideration for this step is to minimize the heat-affected zone so as not to thermal shock and crack the glass lites. Moderating the heat rate of either process will alleviate this possibility. In addition, copper plates or other material could be placed on the top and bottom surfaces of the unit to act as a heat sink during the sealing process.

Referring now to FIG. 80, there is illustrated an insulated glass unit (IGU) having a floating spacer unit that maintains separation of the lites (i.e., windowpanes). The IGU 8000 includes lites 8002 and 8004, which are spaced apart from one another by spacer 8006. The gap or space 8008 between lites 8002 and 8004 may be filled with a gas or gas mixture or it may contain a vacuum or partial vacuum to yield the desired insulating properties. Flexible sleeves 8010 and 8012 are hermetically bonded to lites 8002 and 8004, respectively, at one end and are hermetically bonded to one another at the other end to keep the fill-gas or gas mixture (or vacuum) inside the IGU space 8008. The spacer 8006 is allowed to float, i.e., it is not bonded to both of the lites, although it may be bonded by adhesive or other means to one of the two lites. The position of the spacer 8006 between the two lites 8002 and 8004 is maintained by retaining rods, or bars, 8014 so that it stays in position centered between the two lites. Each retaining bar 8014 is attached to the spacer 8006 at one end and to the flexible sleeves 8010 and/or 8012 at the other end. Preferably, the retaining bar 8014 is attached to the flexible sleeves by crimping therebetween, or other mechanical means, which will not affect the hermetic bond between the sleeves.

Referring now to FIG. 81, there is illustrated a three-pane IGU in accordance with another embodiment. The IGU 8100 includes lites 8102, 8104, and 8106. Preferably, the IGU 8100 is gas-filled. Compliant frames (i.e., bellows) 8108, 8110, and 8112 are hermetically bonded to one of the lites at a first end and then bonded to one or both of the other frames at the other end to provide a hermetic seal for maintaining the fill-gas in the sealed spaces 8114 and 8116 between the lites. The IGU 8100 relies on the mechanical strength of the frames 8108, 8110, and 8112 (rather than a spacer) to maintain the desired spacing between the lites. Accordingly, this configuration may be less suitable for use where vacuum levels in spaces 8114 and 8116 and/or compressive loads on the unit are high.

Referring now to FIG. 82, there is illustrated a three-pane IGU in accordance with another embodiment suitable for use with higher vacuum levels and/or compressive loads than the embodiment shown in FIG. 81. The IGU 8200 includes lites 8202, 8204, and 8206, each attached to a respective compliant frame 8208, 8210, and 8212. The frames are hermetically bonded to the lites at a first end and to each other at a second end to maintain hermetically sealed spaces 8214 and 8216 between the lites. As in the embodiment described in connection with FIG. 80, the spacers 8218 and 8220 float, i.e., they are not bonded to both of the adjacent lites, although they may be bonded to one of the two adjacent lites. In the embodiment illustrated in FIG. 82, the spacer 8218 is actually disposed on the inner end of the compliant sleeve 8210, accordingly, the height of spacer 8218 must be slightly less than the height of spacer 8220 if the spacing between the lites is to be identical. In other embodiments (e.g., FIG. 87) the spacer may be mounted inside the sleeve bonding area such that the two spacers may have the same thickness. The spacers 8218 and 8220 are held in position by retainer bars 8222 and 8224, respectively, which extend from the spacers to the compliant frame as previously discussed. It will be noted that the retainer bars 8222 and 8224 are preferably compliant to allow relative movement with the lites.

Referring now to FIG. 83, the two-lite IGU 8000 of FIG. 80 is shown from above to illustrate further details. It will be appreciated that, for purposes of illustration, the size of the window-area relative to the frame-area is very small; however, this is to better illustrate details of the frame, and should not be considered a limitation of the invention. FIG. 83 shows how the lites 8002, 8004, and spacer 8006 are positioned between the compliant frames or sleeves 8010 and 8012. The compliant frames are hermetically bonded to the glass lites along interior bonding surface 8310 and are bonded to one another along exterior bonding surface 8312. The floating spacer 8006 is maintained in position by retainer bars 8014, one or more of which may be mounted along each edge of the spacer. The retainer bar inside end 8314 is attached to the spacer and the retainer bar outside end 8316 extends outward where it may be crimped or otherwise connected to the compliant frames 8010 and/or 8012.

Referring now to FIG. 84, there is illustrated a two-pane IGU in accordance with another embodiment. The IGU 8400 is substantially similar to that shown in FIGS. 80 and 83. It includes lites 8002 and 8004 disposed on either side of a spacer 8406 to define an interior space 8008. Compliant frames or sleeves 8010 and 8012 are hermetically bonded to the outside surfaces of the lites at one end and to one another at the other end to hermetically seal the fill-gasses in space 8008. The spacer unit 8406 differs from the spacer 8006 shown in FIG. 80 in that the spacer of this embodiment includes internal reinforcement 8408. In the illustrated embodiment, the reinforcement 8408 comprises an X-shaped internal web, however, other configurations may be used. Preferably, the spacer 8406 is an extruded article having the reinforcement 8408 as an integrally formed part. The retaining bars 8014 of this embodiment have contours designed to make them compliant such that the spacer 8406 may float with respect to the lites 8002 and 8004. The retaining bar 8014 further includes a connector feature 8410 positioned at the interior end and adapted to connect to the spacer 8406 as further described herein.

Referring now to FIGS. 85 and 86, an enlarged, cross-sectional view of a portion of the spacer unit 8406 is shown to better illustrate the internal reinforcement and connection aspects of the current invention. The outer wall 8506 of the spacer includes a connector feature 8504 adapted to cooperate with the connector feature 8410 of the retaining bar 8014. In the illustrated embodiment, the spacer connector feature 8504 comprises a slot 8508 of width "w" formed in the wall 8506 and the retainer bar connector feature 8410 comprises a pair of spaced-apart discs 8510 and 8512 formed on the end of the retainer bar 8014. The width "w" is selected to be sufficient to accept bar 8014, but the discs 8510 and 8512 both have a diameter d>w. As best seen in FIG. 85, the connector feature 8410 on the retainer bar 8014 can be moved into the connector feature 8508 on the spacer as indicated by arrow 8514. In the connected configuration shown in FIG. 86, the retainer bar 8014 is attached to the spacer 8406 to prevent movement in either direction.

Referring now to FIGS. 87 and 88, there is illustrated a three-lite IGU having internally bonded frames in accordance with another embodiment. The IGU 8700 includes lites 8702, 8704, and 8706 separated by spacers 8708 and 8710 to form spaces 8712 and 8714. Compliant frames 8716, 8718, and 8720 are hermetically bonded at one end to the inner surfaces of the lites 8702, 8704, and 8706, respectively, and to one another at the outer ends to hermetically seal the fill-gas or vacuum in the spaces 8712 and 8714. Retainer bars 8722 connected between the spacers and frames are used to hold the spacers in place with respect to the lites.

In the embodiment illustrated in FIG. 87, the spacers 8708 and 8710 are adapted to accommodate the internally bonded frames of IGU 8700. The upper spacer 8708 is dimensioned to be slightly smaller than the width of the lites, thereby being disposed inwardly of the inner frame ends and avoiding contact with the bonded frame ends. As best seen in FIG. 88, the lower spacer 8710 has a stepped configuration within inset portions 8724 on the ends which allow the spacer to avoid contact with the frame ends bonded to the adjacent inner surfaces of the lites 8704 and 8706. It will be appreciated that the illustrated configurations are only examples, and not limiting. Many other configurations for internally and externally mounting compliant frames will be understood to be within the scope of the invention.

Referring now to FIGS. 89 through 93, there are illustrated IGUs with holding blocks in accordance with additional embodiments. The holding blocks are adapted to support a significant fraction of the weight of an IGU having flexible sleeves (i.e., frames) when the IGU is mounted vertically in a window or door frame system. Preferably, the holding block will be configured to minimize contact with the flexible sleeve so as to reduce thermal transfer therebetween. This also allows the sleeve to move as necessary to accommodate relative movement of the window lites.

Referring first to FIG. 89, there is illustrated a two-lite IGU suitable for use with a holding block. The IGU 8900 comprises lites 8902 and 8904 separated by spacer unit 8906. In this embodiment, the spacer unit 8906 comprises a transparent sheet 8908 having a plurality of stand-offs 8910 projecting from each side. Compliant frame members 8912 and 8914 are hermetically bonded to the inner surfaces of the lites 8902 and 8904 at a first end 8916, and hermetically bonded to one another at a second end 8918 to form the hermetically sealed cavity 8920 between the lites. The spacer unit 8906 may be held in position using retainer bars (not shown) as previously described, or using other means described herein.

Referring now to FIG. 90, there is illustrated the IGU 8900 installed on a holding block. When viewed on end, the holding block 9000 is seen to include a base-portion 9001 and riser portions 9002 and 9004 projecting upwardly from the base portion to define a sleeve cavity 9008. Each riser portion 9002 and 9004 has a bearing surface 9010 disposed at the upper end. The holding block 9000 is dimensioned such that when the IGU 8900 is positioned on the block, the edges of the lites 8902 and 8904 are supported on the bearing surfaces 9010 of their respective risers 9002 and 9004, and the compliant sleeves 8912 and 8914 (which are hermetically bonded together) are positioned within the sleeve cavity 9008. Preferably, the bonded sleeves 8912 and 8914 will not touch the walls of the cavity 9008 so that their movement will not be constrained and so as to minimize thermal transfer. However, a significant fraction (if not all) of the weight of the IGU will be supported by the riser and base portions of the block. The holding block 9000 may be formed of metals such steel or aluminum, but preferably is formed of a non-metal material having lower thermal conductivity, e.g., wood, vinyl, PVC, fiberglass, polyethylene, etc. Although not required, in a preferred embodiment, the holding block 9000 will be formed by extrusion. In other embodiments, rolling, milling, routing or other forming processes may be used to form the holding block.

Referring now to FIG. 91*a*, the IGU 8900 and holding block 9000 are illustrated after installation in a channel frame, such as a building window frame or door frame. The channel frame 9100 includes a base portion 9101 and riser portions 9102 and 9104 projecting upwardly from the base to define a channel 9108. The channel frame 9100 is dimensioned such that the entire holding block 9000 and a portion of the IGU 8900 fit within the channel 9108. In this manner, the channel frame 9100 provides both vertical and horizontal support for the IGU 8900. The channel frame 9100 may be formed of metals such as steel or aluminum, but preferably is formed of a non-metal material having lower thermal conductivity, e.g., wood, vinyl, PVC, fiberglass, polyethylene, etc.

It will be appreciated that the channel frame 9100 may be a conventional U-shaped window frame or door frame. In such cases, the holding block 9000 acts as an adapter to allow the IGU 8900 having external compliant seal frames (e.g., frames 8912 and 8914) to be installed in new construction or in an existing structure.

Referring now to FIG. 91b, it will further be appreciated that in some embodiments, the holding block and the channel frame may be combined into a unitary combine frame. Combined frame 9150 is one example of a unitary frame and holding block. A combined frame may be used in new construction for the support of IGUs (e.g., IGU 8900) with external compliant frames without requiring a separate holding block.

Referring now to FIG. 92, there is illustrated a perspective view of a holding block of one embodiment. The holding block 9200 is substantially similar in cross-section to block 9000 previously described. The block 9200 is preferably formed by extrusion, although other known methods of fabrication may be used. The block 9200 has a length, denoted L, which in some cases may be equal to the length of the associated IGU. In other cases, however, the length L may be only a fraction of the length of the IGU, and multiple blocks 9200 may be disposed along the edge of the IGU for support.

Referring now also to FIG. 93, to provide additional insulation effect, thermal break slots 9202 may be formed through the base portion 9001 of the holding block 9200. These slots reduce the cross-sectional area of the material connecting the sides of the block 9200 to reduce heat transfer from one side of the block to the other.

Referring now to FIG. 94a, there is illustrated a two-pane IGU incorporating anchor spacers in accordance with another embodiment. The IGU 9400 includes panes (i.e., "lites") 9402 and 9404 separated by a spacer unit 9406 to form a gap cavity 9408. Compliant frames 9410 and 9412 are hermetically bonded to the interior surface of the panes 9402 and 9404 at one end, and are hermetically bonded together at the other end. Spacer anchors 9414 are provided at each end of the spacer 9406, extending into the cavity 9416 between the frame members 9410 and 9412. The spacer anchors 9414 have profile features that trap a portion of the anchor within the compliant frame cavity 9416 when the IGU is assembled.

In the illustrated embodiment, the profile features include notched-proximal end 9418, which accommodates the width of the inner ends of the frames members 9410 and 9412, and a flared distal end 9420 which has an expanded profile that substantially fills the width between the frame members as they extend from the inner bonding point. It will be appreciated that many other profile features could be used depending on the profiles of the frame members.

During assembly of the IGU 9400, the frame members 9410 and 9412 are first hermetically bonded to their respective panes 9402 and 9404. Next, the spacer 9406 with anchors 9414 is placed in positioned between the two sub-assemblies. The two window sub-assemblies are then hermetically bonded together along the outer frame joint, thereby trapping the anchors 9414 in place between the frame members 9410 and 9412. The trapped spacer anchors 9414 prevent the spacer 9406 from moving any significant distance in either direction between the two window panes.

The configuration illustrated in FIG. 94a is typical of a gas-filled IGU having an "open" spacer unit 9406 (see, e.g., FIG. 83). In such IGUs, the pressure differential across the windowpanes is low enough that direct support is not required for the interior portions of the windowpanes. In other embodiments, however, including low pressure IGUs or vacuum IGUs (i.e., VGUs), direct support of the interior portions of the windowpanes is required. In such embodiments, an IGU substantially similar to IGU 9400 may be used, except that the open spacer unit 9406 having spacer anchors 9414 may be replaced with a stand-off type spacer unit (e.g., such as shown in FIGS. 63a-65a, 74-76 or 89-91a) having spacer anchors 9414. The stand-off type spacer is placed between the windowpanes to maintain their separation, and the contoured spacer anchors 9414 are attached to the edges of the spacer to maintain the position of the spacer between the windowpanes by locking into the cavity between the frame members as previously described.

Referring now to FIG. 94b, there is illustrated an IGU having no spacer at all in accordance with another embodiment. The IGU 9450 includes panes 9452 and 9454, which are spaced apart from one another to form a gap cavity 9458. Compliant frames (i.e., bellows) 9460 and 9462 are hermetically bonded to the interior surface of the panes 9452 and 9454 at one end, and are hermetically bonded to each other at the other end. Although compliant, the frames 9460 and 9462 along the sides of the IGU may provide enough mechanical stiffness (or "spring") to maintain separation of the panes 9452 and 9454 without requiring mechanical spacers. In such cases, a separate spacer unit, whether an open unit disposed around the periphery of the cavity or a stand-off unit disposed between the panes, may not be required. Typically, IGUs not having an internal spacer unit will be gas- or air-filled insulating glass units, since the gas pressure within the cavity 9458 will reduce the differential pressure across the panes, thereby reducing the stiffness required in the frames 9460 and 9462 to maintain separation.

Referring now to FIG. 95, there is illustrated a three-pane IGU incorporating split anchor spacers in accordance with yet another embodiment. The IGU 9500 includes panes (i.e., "lites") 9502, 9503 and 9504 separated by a spacer units 9506 and 9507 to form a gap cavities 9508 and 9509. Compliant frames 9510 and 9512 are hermetically bonded to the interior surface of the outer panes 9502 and 9504 at one end, and are hermetically bonded together at the other end. Spacer anchors 9514 are provided at each end of the spacer 9506 and 9507, extending into the cavity 9516 between the frame members 9510 and 9512. The spacer anchors 9514 of this embodiment are similar in most ways to the two-pane anchors 9414 previously described. However, the spacer anchors 9514 of this embodiment have different profile features on each side. In particular, when the IGU is assembled, the outward facing surfaces have features 9517 and 9518 that trap a portion of the anchor within the compliant frame cavity 9516, and the inward facing surfaces have features 9520 that support the center pane 9503.

During assembly of the IGU 9500, the frame members 9510 and 9512 are first hermetically bonded to their respective outer panes 9502 and 9504 to form outer window sub-assemblies. Next, the spacers 9506 and 9507 with split anchors 9514 are placed on either side of the center pane 9503 to form a center sub-assembly. The center sub-assembly is next positioned between the two outer window sub-assemblies. The two outer window sub-assemblies are then hermetically bonded together along the outer frame joint, thereby trapping the anchors 9514 (with the associated spacers and the center pane) in place between the frame members 9510 and 9512. The trapped spacer anchors 9514 prevent the spacers 9506 and 9507, and the center pane 9503, from moving any significant distance in either direction between the two outer window panes.

Referring now to FIGS. 96a, 96b and 96c, there is illustrated an IGU that includes flexible metal sleeves attached to the outside-facing or inside-facing surfaces of glass windowpanes in accordance with yet another embodiment. Whereas the flexible sleeve systems previously described herein have a flexible portion that extends past the outside perimeter of the windowpanes to which they are attached, in this embodiment the flexible components of the IGU are hermetically attached to the inside facing surfaces of the two windowpanes (i.e., industry nomenclature surfaces #2 and #3), and the flexible portions are "flush" with the outside perimeter, i.e., disposed substantially within the outside perimeter of the IGU. The hermetic attachment may be by diffusion bonding or through the use of solder glass. This configuration may look similar to known gas-filled IGUs that use a spacer along the inside perimeter, however the current embodiment has significant differences. First, the flexible metal spacer is diffusion bonded or attached via solder glass to form a hermetic attachment to the inside-facing surface of each of the two windowpanes. Known IGU systems employ a non-hermetic adhesive or epoxy to bond the spacer unit to the insider of the windowpanes. Second, the spacer in this concept is flexible in all three axes, X, Y and Z, to allow the two windowpanes to expand and contract due to the effects of temperature changes on both sides of the IGU (i.e., inside the wall and outside the wall containing the IGU). When there is significant pressure differential between the inside and outside of the IGU (e.g., when the IGU contains a vacuum or reduced-pressure gas), a transparent spacer system must be used in the IGU to keep the panes mechanically separated. The spacer system also provides the depth required for the flexible sleeves to reside between the windowpanes.

Referring now specifically to FIG. 96*a*, in the illustrated embodiment the IGU 9600 comprises an upper lite 9602, upper flexible frame member 9604, lower flexible frame member 9606 and lower lite 9608. It will be appreciated that the frame members 9604 and 9606 are dimensioned to fit within the outside perimeter of the lites, and each frame member has upper and lower bonding surfaces. The outward bonding surface of each of the flexible frame members 9604 and 9606 is hermetically attached to the respective lites 9602 and 9608, preferably using diffusion bonding or soldering using solder glass, to form a pair of window sub-assemblies 9612 and 9614.

Referring now to FIG. 96*b*, a transparent spacer unit 9610 is placed between the window sub-assemblies 9612 and 9614. In the illustrated embodiment, the spacer unit 9610 comprises a transparent sheet with an array of stand-offs on each side, however, the spacer units of other embodiments may utilize other configurations previously described herein. The inward bonding surfaces of the two sub-assemblies 9612 and 9614 are next hermetically attached to one another, preferably using diffusion bonding or solder glass, thereby forming a hermetic cavity therebetween and trapping the spacer 9610 within.

Referring now to FIG. 96*c*, the completed IGU 9600 is shown. It will be appreciated that the frame members 9604 and 9606 do not extend beyond the periphery of the lites. It will further be appreciated that the desired atmosphere in the cavity of the IGU, e.g., vacuum, reduced-pressure atmosphere or fill-gas, may be placed in the IGU by various methods. First, the bonding of the two sub-assemblies 9612 and 9614 may be performed directly in an appropriate atmosphere (e.g., vacuum, reduced pressure, etc.) such that the desired fill is "trapped" in the cavity at bonding. Alternatively, a pinch-tube or other such port (not shown) may be incorporated into one of the frame members. In this case, the cavity may be evacuated and/or filled with the appropriate fill-gas via the pinch-tube after bonding. The pinch-tube may then be hermetically sealed by known means.

It is envisioned that some embodiments of the invention will be insulated glass units having metal sleeves and an electrochromatic or electrochromeric coatings on one or more inside surfaces of the windowpanes. An electrical connection from outside the hermetically sealed unit to the coating on the inside of the unit may be required to control the coating, and in such cases the connection through the metal sleeve must also be hermetic. To maintain hermeticity and also, electrical insulation between the feedthrough wire and the metal frame, a glass-to-metal seal may be used. The use of feedthroughs using glass-to-metal seals is known in the electronic packaging industry. The materials chosen preferably have properties of wettability by glass, matched temperature coefficient of expansion, and low outgassing rates at relevant temperatures, thereby making them suitable for use in vacuum systems.

In a still further embodiment, a VGU would comprise an indicator for indicating whether the desired vacuum or reduced pressure atmosphere is still contained within the inter-pane cavity of the VGU, i.e., that the VGU has not developed a leak. One such embodiment includes an indicator disposed in the interior cavity of the VGU, the indicator changing color if the vacuum level decreases and/or outside air enters the cavity. The indicator may be incorporated on a label or other article disposed along the perimeter of the VGU so that it will be visible through the inside windowpane.

In yet another embodiment, a gas-filled IGU would comprise an indicator for indicating the integrity of the IGU's seals, i.e., whether the desired fill-gas had leaked out and/or whether gas has been exchanged between the interior and exterior of the IGU. Preferably, the indicator would comprise a color-changing article such as a label, visible through the inside windowpane. More preferably, a characteristic of the color, e.g., intensity or hue, would indicate the relative magnitude of the leak and/or loss of insulating properties.

While the invention has been shown or described in a further variety of its forms, it should be apparent to those skilled in the art that it is not limited to these embodiments, but is susceptible to still further changes without departing from the scope of the invention.

In particular, it will be appreciated that the invention may be practiced using various gases, including air, nitrogen, argon, krypton, xenon and mixtures of such gases, to fill the gap between the windowpanes instead of a vacuum. The gases within the gap may be at a reduced or partial pressure, in which case the spacer assemblies described herein may still be necessary, or they may be at ambient or higher pressure, in which case the spacer assemblies described herein may be omitted. In other embodiments, the spacer assemblies described herein may be replaced by simplified spacer assemblies disposed only around the periphery of the windowpanes.

What is claimed is:

1. A hermetically sealed multi-pane window assembly comprising:
   a first windowpane sheet formed of a transparent material and having a periphery and a pre-bond surface finish;
   a first sealing member having an inner edge, an outer edge and a first center portion therebetween, the inner edge being bonded to the first windowpane sheet around the periphery to create a hermetic seal therebetween while maintaining the pre-bond surface finish of the first windowpane sheet;
   a second windowpane sheet formed of a transparent material and having a periphery and a pre-bond surface finish;
   a second sealing member having an inner edge, an outer edge and a second center portion therebetween, the inner edge being bonded to the second windowpane sheet around the periphery to create a hermetic seal therebetween while maintaining the pre-bond surface finish of the second windowpane sheet;

a spacer assembly disposed between the first and the second windowpane sheets for maintaining a gap therebetween, the spacer being slidably movable with respect to at least one of the first and second windowpane sheets;

wherein at least one of the first center portion and the second center portion has, when viewed in the direction of the edge of the respective windowpane sheet to which it is bonded, a convolute cross-section including at least one radius of curvature on one side of the respective center portion and at least two radii of curvature on the other side of the same center portion, and further wherein the cross-section is asymmetrical, with respect to a plane defined by the center of the gap between the windowpane sheets, to the cross-section of the center portion of the other sealing member;

the outer edge of the first sealing member being hermetically attached to the outer edge of the second sealing member; and whereby a hermetically sealed cavity containing the spacer assembly is formed between the first and the second windowpanes.

2. A hermetically sealed window assembly in accordance with claim 1, wherein the hermetically sealed cavity between the first and the second windowpanes contains a vacuum.

3. A hermetically sealed window assembly in accordance with claim 2, wherein the vacuum within the hermetically sealed cavity between the first and the second windowpanes is a partial vacuum.

4. A hermetically sealed window assembly in accordance with claim 1, wherein the hermetically sealed cavity between the first and the second windowpanes contains a gas.

5. A hermetically sealed window assembly in accordance with claim 4, wherein the gas within hermetically sealed cavity between the first and the second windowpanes is one of air, nitrogen, argon, krypton and xenon.

6. A hermetically sealed window assembly in accordance with claim 1, wherein the hermetically sealed cavity between the first and the second windowpanes contains an aerogel.

7. A hermetically sealed multi-pane window assembly in accordance with claim 1, wherein at least one of the first and the second seal members is adapted to be compliant with lateral expansion and contraction of the attached windowpane sheet.

8. A hermetically sealed window assembly in accordance with claim 1, wherein at least one of the first and the second seal members is formed of a metal.

9. A hermetically sealed window assembly in accordance with claim 1, wherein the spacer assembly comprises a plurality of discrete stand-off members attached to an inner surface of one of the windowpane sheets.

10. A hermetically sealed window assembly in accordance with claim 9, wherein the spacer assembly further comprises a plurality of discrete stand-off members attached to an inner surface of another of the windowpane sheets and a spacer sheet disposed between the stand-off members of the two windowpane sheets.

11. A hermetically sealed window assembly in accordance with claim 1, wherein the spacer assembly comprises a plurality of stand-off members formed on an inner surface of one of the windowpane sheets during manufacture of the windowpane sheet.

12. A hermetically sealed window assembly in accordance with claim 1, wherein the spacer assembly comprises a sheet having a plurality of stand-off members formed on opposite sides thereof facing the inner surfaces of the windowpane sheets.

13. A hermetically sealed window assembly in accordance with claim 1, wherein the spacer assembly comprises a plurality of generally parallel strands of a first fiber.

14. A hermetically sealed window assembly in accordance with claim 13, wherein the first fiber is formed of a glass material.

15. A hermetically sealed window assembly in accordance with claim 13, wherein the spacer assembly further comprises a plurality of generally parallel strands of a weft fiber interwoven with the strands of the first fiber.

16. A hermetically sealed window assembly in accordance with claim 15, wherein one of the first fiber and the weft fiber is formed of a glass material.

17. A hermetically sealed window assembly in accordance with claim 1, wherein at least three successive radii of curvature of the convolute cross-section are disposed on alternating sides of the center portion, counting from the inner edge to the outer edge.

18. A hermetically sealed window assembly in accordance with claim 1, wherein the convolute cross-section includes at least two radii of curvature on one side of the center portion and at least two radii of curvature on the other side of the center portion, and wherein the successive radii, counting from the inner edge to the outer edge, are disposed on alternating sides of the center portion.

19. A hermetically sealed window assembly in accordance with claim 1, wherein both center portions include convolute cross sections.

20. A hermetically sealed multi-pane window assembly comprising:

a first windowpane formed of a transparent material and having a periphery and a pre-bond surface finish;

a first sealing member having an inner edge, an outer edge and a first center portion disposed therebetween, the inner edge hermetically sealed to the first windowpane around the periphery;

a second windowpane formed of a transparent material and having a periphery and a pre-bond surface finish, the second windowpane being spaced-apart from the first windowpane to define a gap therebetween;

a second sealing member having an inner edge, an outer edge and a second center portion disposed therebetween, the inner edge being hermetically sealed to the second windowpane around the periphery, and the outer edge being hermetically attached to the outer edge of the first sealing member; and at least one of the first and second sealing members having, when viewed in the direction of the edge of the respective windowpane to which it is bonded, a convolute cross-section including at least one radius of curvature on one side of the respective center portion and at least two radii of curvature on the other side of the same center portion, and wherein the cross-section is asymmetrical, with respect to a plane defined by the center of the gap, to the cross-section of the center portion of the other sealing member to enable relative movement between the first and second windowpanes;

whereby a hermetically sealed cavity is formed between the first and the second windowpanes and the first windowpane and the second windowpane both retain their pre-bond surface finishes.

21. A window assembly in accordance with claim 20, wherein the first windowpane is hermetically sealed to the first sealing member using a soldering process.

22. A window assembly in accordance with claim 21, wherein the soldering process utilizes a solder glass material.

23. A window assembly in accordance with claim 20, further comprising a third windowpane disposed between the first and second windowpanes such that the sealed cavity is subdivided into a first cavity between the first and third windowpanes and a second cavity disposed between the second and third windowpanes.

24. A window assembly in accordance with claim 23, wherein the first cavity is hermetically sealed from the second cavity.

25. A window assembly in accordance with claim 20, further comprising:
   a spacer assembly disposed between the first and second windowpane sheets for maintaining a gap therebetween; and
   the spacer assembly floating with respect to at least one of the first and second windowpanes.

26. A window assembly in accordance with claim 25, further comprising:
   a viewing area defined across the center of the windowpanes where visibility through the window assembly is not blocked by the sealing members; and
   wherein the spacer assembly is disposed around the periphery of the windowpanes and occupies less than 10% of the viewing area.

27. A window assembly in accordance with claim 25, further comprising:
   a viewing area defined across the center of the windowpanes where visibility through the window assembly is not blocked by the sealing members; and
   wherein the spacer is disposed between the windowpanes and occupies at least 10% of the viewing area.

28. A window assembly in accordance with claim 25, wherein the spacer assembly comprises a muntin assembly including a plurality of horizontal and vertical muntin bars.

29. A window assembly in accordance with claim 25, wherein the spacer assembly comprises a plurality of generally parallel strands of a first fiber.

30. A window assembly in accordance with claim 29, wherein the first fiber is formed of a glass material.

31. A window assembly in accordance with claim 29, wherein the spacer assembly further comprises a plurality of generally parallel strands of a weft fiber interwoven with the strands of the first fiber.

32. A window assembly in accordance with claim 31, wherein one of the first fiber and the weft fiber is formed of a glass material.

33. A window assembly in accordance with claim 20, wherein:
   the inner edges of the first and second sealing members are each sealed to the inward-facing surfaces of the respective first and second windowpanes; and
   the outer edges of the sealing members extend outwardly past the periphery of the windowpanes to define a seal member profile having an interior cavity.

34. A window assembly in accordance with claim 33, further comprising:
   spacer anchors disposed at the periphery of the spacer assembly and having an anchor profile;
   the anchor profile adapted to fit within the seal member profile such that lateral movement of the spacer assembly is substantially restricted by the spacer anchor.

35. A window assembly in accordance with claim 33, further comprising:
   a holding block including a base portion, riser portions projecting upwardly from the base portion to define a seal cavity therebetween, and bearing surfaces disposed at the top of the riser portions;
   the holding block being dimensioned to fit against the edge of the window assembly such that when the edges of the first and second windowpanes bear against the bearing surfaces, the outwardly extending portions of the seal members fit within the seal cavity.

* * * * *